US006930511B2

(12) United States Patent
Or-Bach

(10) Patent No.: US 6,930,511 B2
(45) Date of Patent: *Aug. 16, 2005

(54) ARRAY OF PROGRAMMABLE CELLS WITH CUSTOMIZED INTERCONNECTIONS

(75) Inventor: Zvi Or-Bach, San Jose, CA (US)

(73) Assignee: eASIC Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/915,556

(22) Filed: Aug. 11, 2004

(65) Prior Publication Data

US 2005/0012520 A1 Jan. 20, 2005

Related U.S. Application Data

(63) Continuation of application No. 10/452,049, filed on Jun. 3, 2003, now Pat. No. 6,819,136, which is a continuation of application No. 09/803,373, filed on Mar. 12, 2001, now Pat. No. 6,756,811, which is a continuation-in-part of application No. 09/659,783, filed on Sep. 11, 2000, now Pat. No. 6,331,790, which is a continuation-in-part of application No. PCT/IL00/00149, filed on Mar. 10, 2000.

(51) Int. Cl.[7] .............................................. H03K 19/173
(52) U.S. Cl. ............................ 326/41; 326/101; 326/37
(58) Field of Search ............................... 326/37–41, 101

(56) References Cited

U.S. PATENT DOCUMENTS

| | | |
|---|---|---|
| 3,473,160 A | 10/1969 | Wahlstrom |
| 4,197,555 A | 4/1980 | Uehara et al. |
| 4,706,216 A | 11/1987 | Carter |
| 4,910,417 A | 3/1990 | El Gamal et al. |
| 4,933,738 A | 6/1990 | Or-bach et al. |
| 4,937,475 A | 6/1990 | Rhodes et al. |
| 5,132,571 A | 7/1992 | McCollum et al. |
| 5,157,627 A | 10/1992 | Gheewala |
| 5,179,534 A | 1/1993 | Pierce et al. |
| 5,191,241 A | 3/1993 | McCollum et al. |
| 5,260,597 A | 11/1993 | Or-bach et al. |
| 5,341,041 A | 8/1994 | El Gamal |
| 5,343,403 A | 8/1994 | Beidle et al. |
| 5,357,560 A | 10/1994 | Nykerk |
| 5,377,225 A | 12/1994 | Davis |
| 5,404,033 A | 4/1995 | Wong et al. |
| 5,420,544 A | 5/1995 | Ishibashi |
| 5,432,719 A | 7/1995 | Freeman et al. |
| 5,488,316 A | 1/1996 | Freeman et al. |
| 5,495,486 A | 2/1996 | Gheewala |
| 5,512,765 A | 4/1996 | Gaverick |
| 5,526,278 A | 6/1996 | Powell |
| 5,550,839 A | 8/1996 | Buch et al. |
| 5,565,694 A | 10/1996 | Huang et al. |
| 5,566,123 A | 10/1996 | Freidin et al. |
| 5,581,098 A | 12/1996 | Chang |
| 5,581,200 A | 12/1996 | Gudger |
| 5,585,602 A | 12/1996 | Bernstein |
| 5,598,109 A | 1/1997 | Leong et al. |
| 5,631,577 A | 5/1997 | Freiden et al. |
| 5,751,165 A | 5/1998 | Yoeli et al. |
| 5,781,031 A | 7/1998 | Bertin et al. |
| 5,781,033 A | 7/1998 | Galbraith et al. |
| 5,801,547 A | 9/1998 | Kean |
| 5,825,202 A | 10/1998 | Tavana et al. |
| 5,825,203 A | 10/1998 | Kusunoki et al. |
| 5,861,325 A | 1/1999 | Bernstein |
| 5,872,448 A | 2/1999 | Osann, Jr. |

(Continued)

Primary Examiner—Lam T. Mai
(74) Attorney, Agent, or Firm—Venable LLP; Jeffrey W. Gluck

(57) ABSTRACT

A logic array may include an array of programmable cells having a multiplicity of inputs and a multiplicity of outputs; and customized interconnections providing permanent direct interconnections among at least a plurality of the multiplicity of inputs and at least a plurality of the multiplicity of outputs.

18 Claims, 73 Drawing Sheets

U.S. PATENT DOCUMENTS

| | | |
|---|---|---|
| 5,920,789 A | 7/1999 | Bernstein |
| 5,940,727 A | 8/1999 | Bernstein |
| 5,959,466 A | 9/1999 | McGowan |
| 5,986,467 A | 11/1999 | Trimberger |
| 5,999,016 A | 12/1999 | McClintock et al. |
| 6,014,038 A | 1/2000 | How et al. |
| 6,054,872 A | 4/2000 | Fudanuki et al. |
| 6,066,960 A | 5/2000 | Pedersen |
| 6,075,380 A | 6/2000 | Lane |
| 6,130,554 A | 10/2000 | Kolze et al. |
| 6,150,807 A | 11/2000 | Osann, Jr. |
| 6,150,838 A | 11/2000 | Wittig et al. |
| 6,154,053 A | 11/2000 | New |
| 6,169,416 B1 | 1/2001 | Eaton et al. |
| 6,194,912 B1 | 2/2001 | Or-Bach |
| 6,236,229 B1 | 5/2001 | Or-Bach |
| 6,242,767 B1 | 6/2001 | How et al. |
| 6,245,634 B1 | 6/2001 | Or-Bach |
| 6,252,792 B1 | 6/2001 | Marshall et al. |
| 6,255,845 B1 | 7/2001 | Wong et al. |
| 6,311,316 B1 | 10/2001 | Huggins et al. |
| 6,331,733 B1 | 12/2001 | Or-Bach et al. |
| 6,331,789 B2 | 12/2001 | Or-Bach |
| 6,331,790 B1 * | 12/2001 | Or-Bach et al. ............... 326/41 |
| 6,353,352 B1 | 3/2002 | Sharpe-Geisler |
| 6,433,585 B1 | 8/2002 | Patel et al. |
| 6,476,493 B2 | 11/2002 | Or-Bach et al. |
| 6,476,636 B1 | 11/2002 | Lien et al. |
| 6,756,811 B2 * | 6/2004 | Or-Bach ...................... 326/41 |
| 6,819,136 B2 * | 11/2004 | Or-Bach ...................... 326/41 |

\* cited by examiner

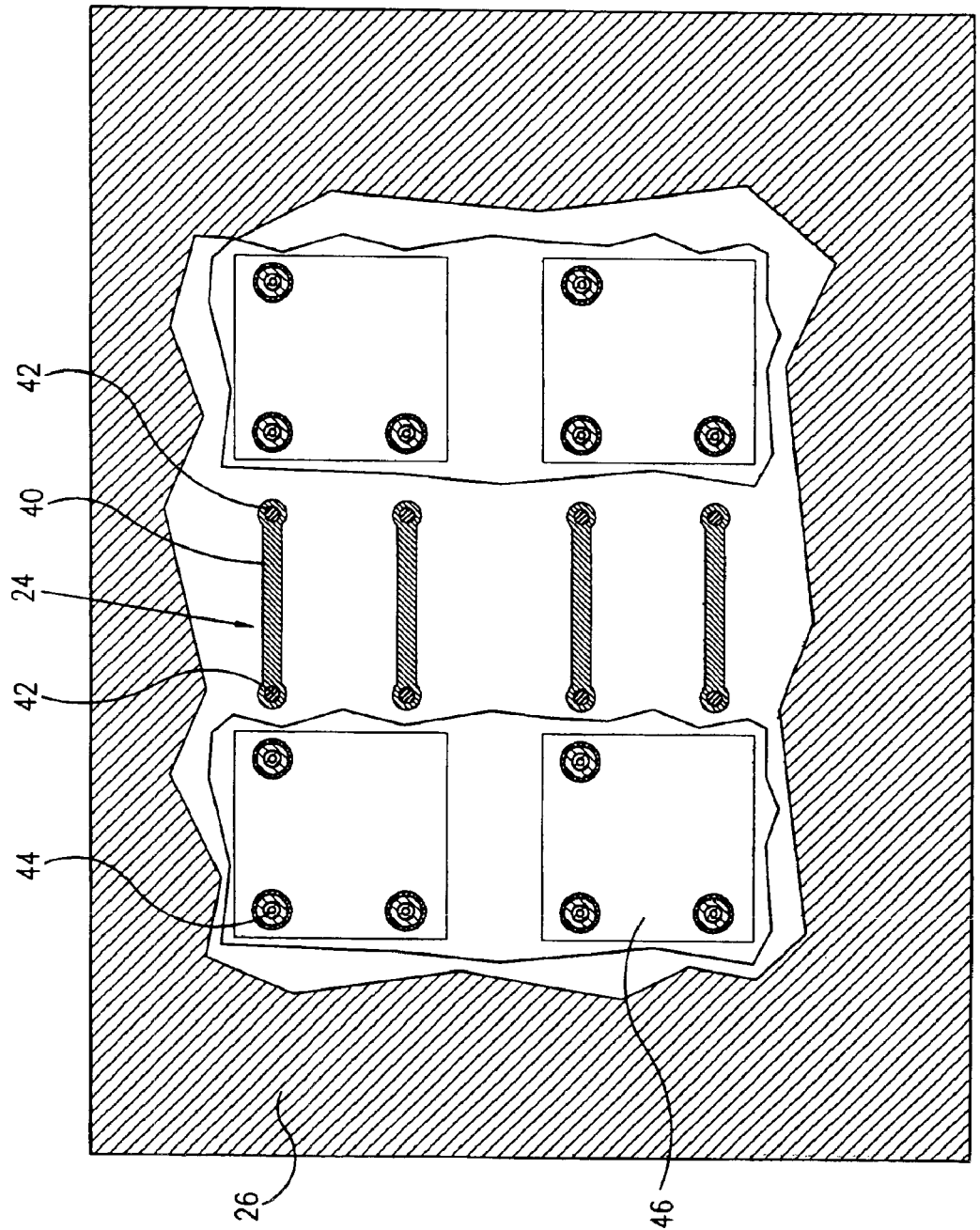

LOOK UP TABLE
2 INPUTS 1 OUTPUT

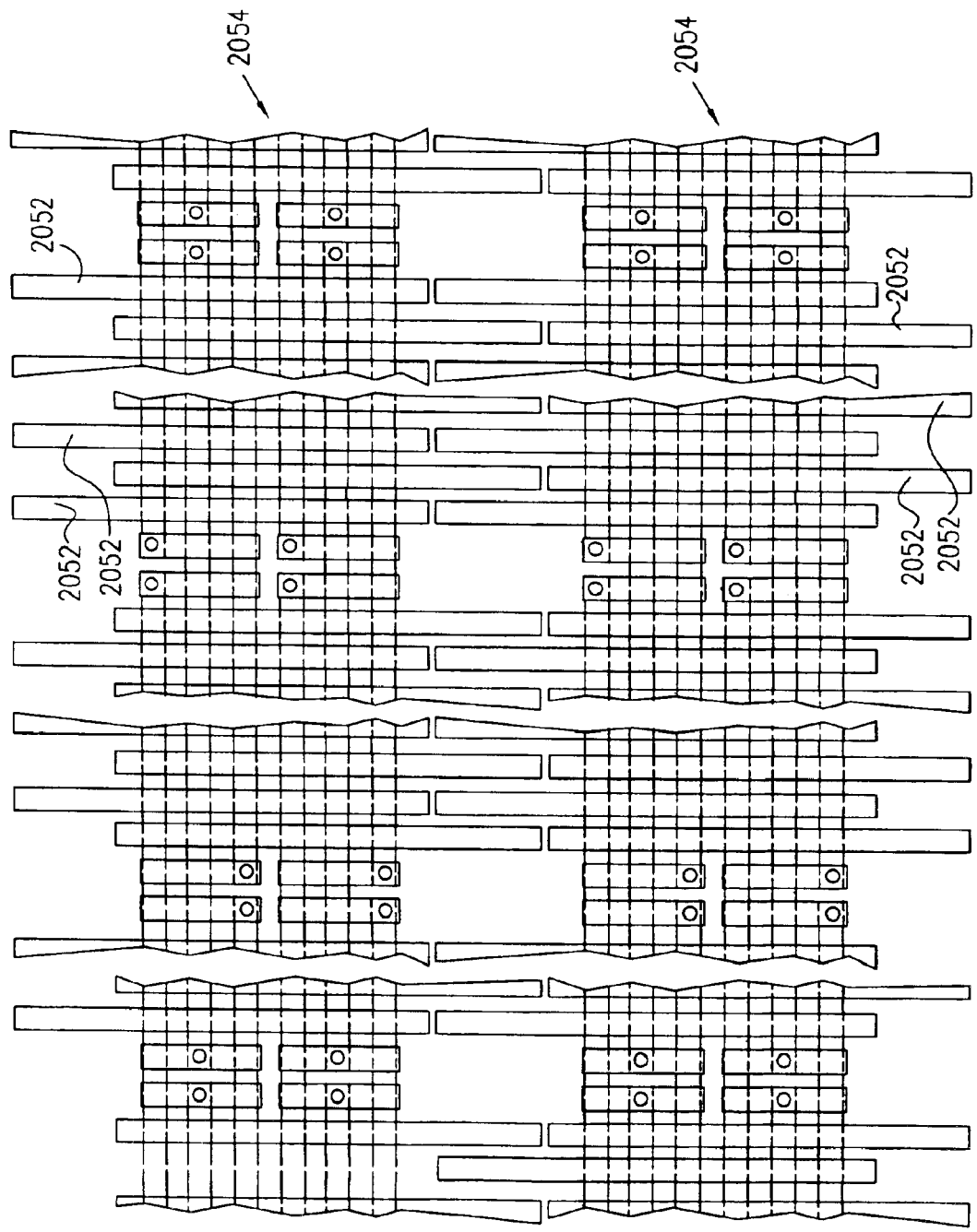
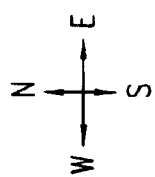
FIG. 21

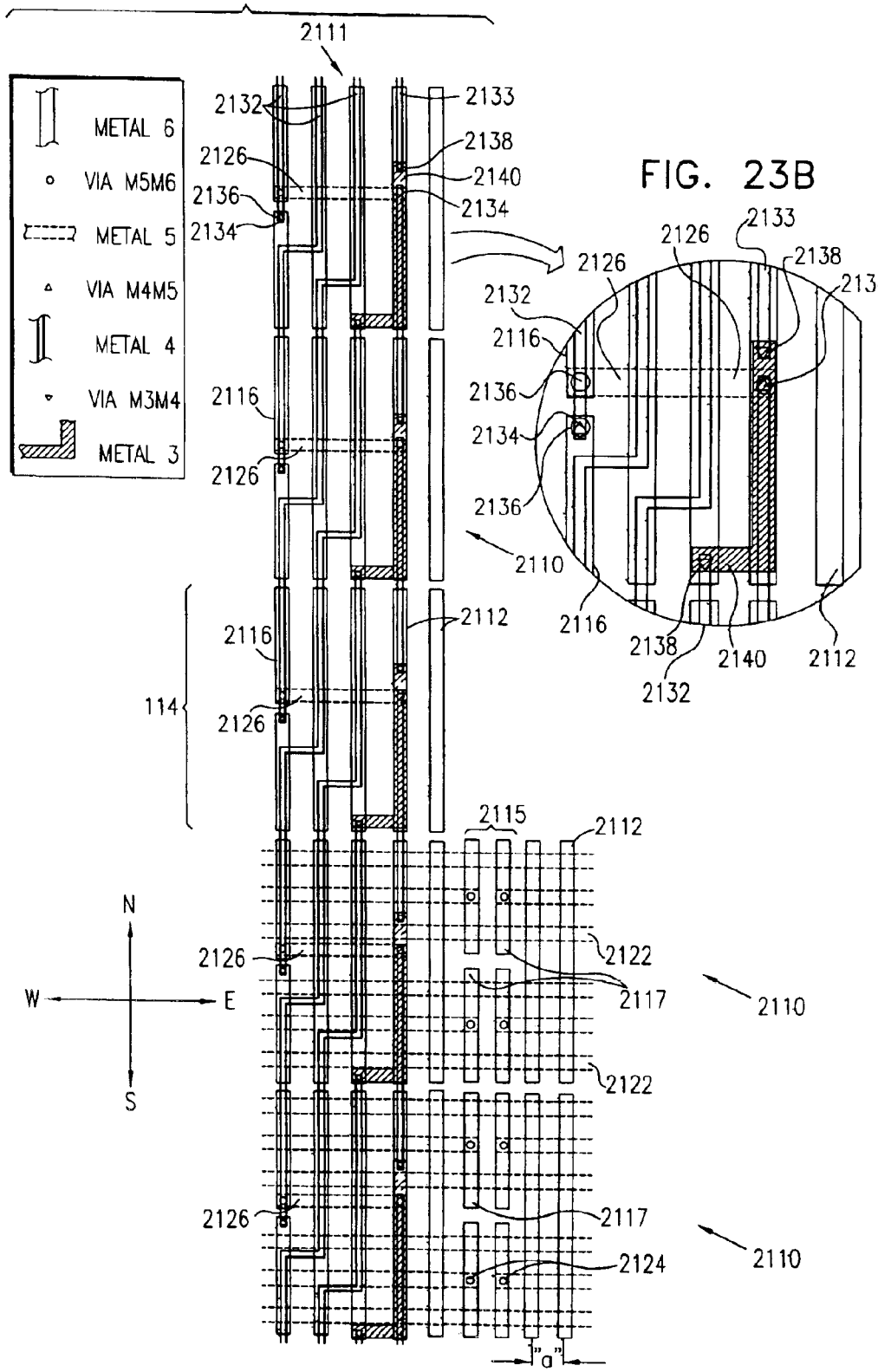

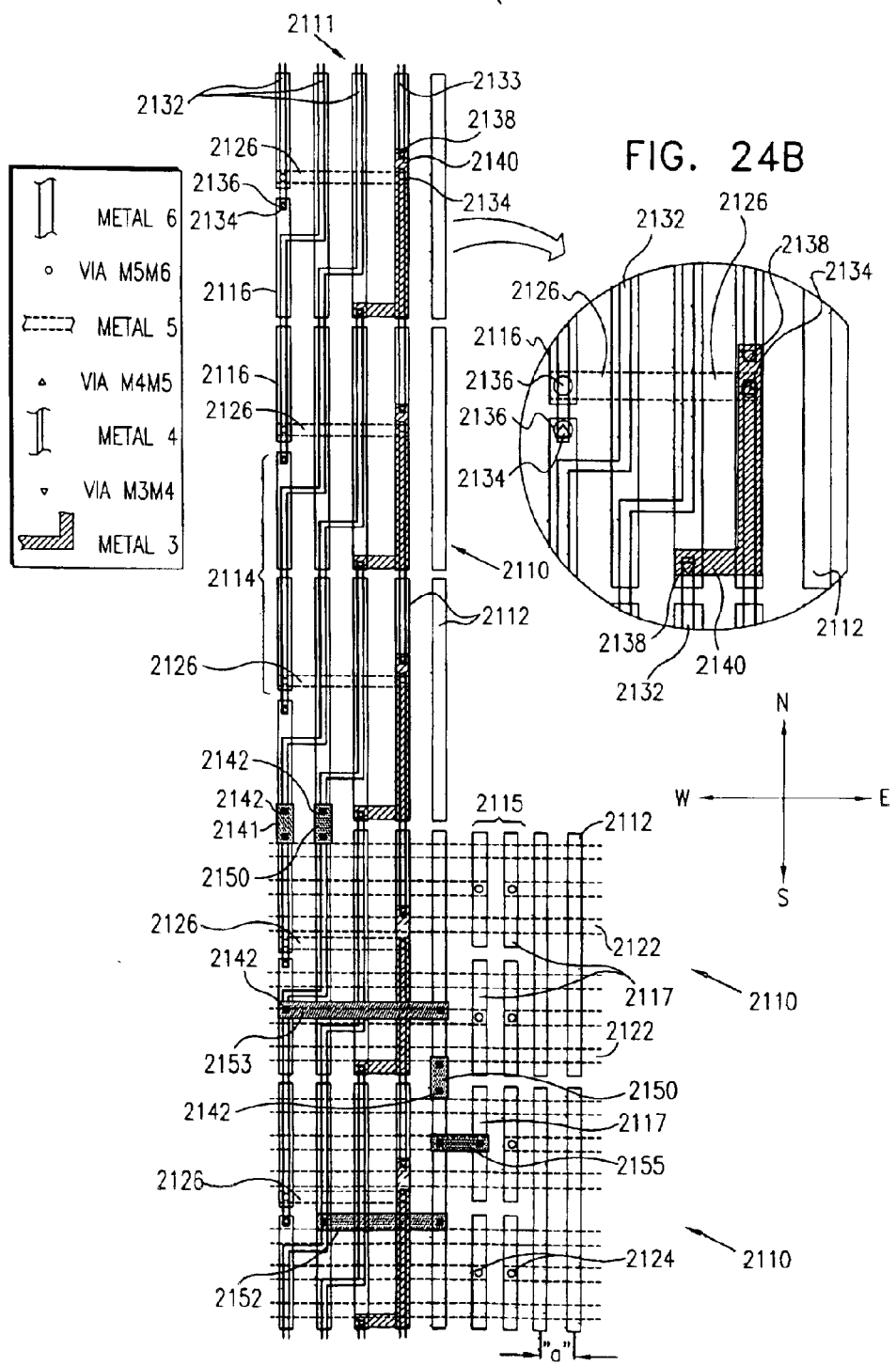

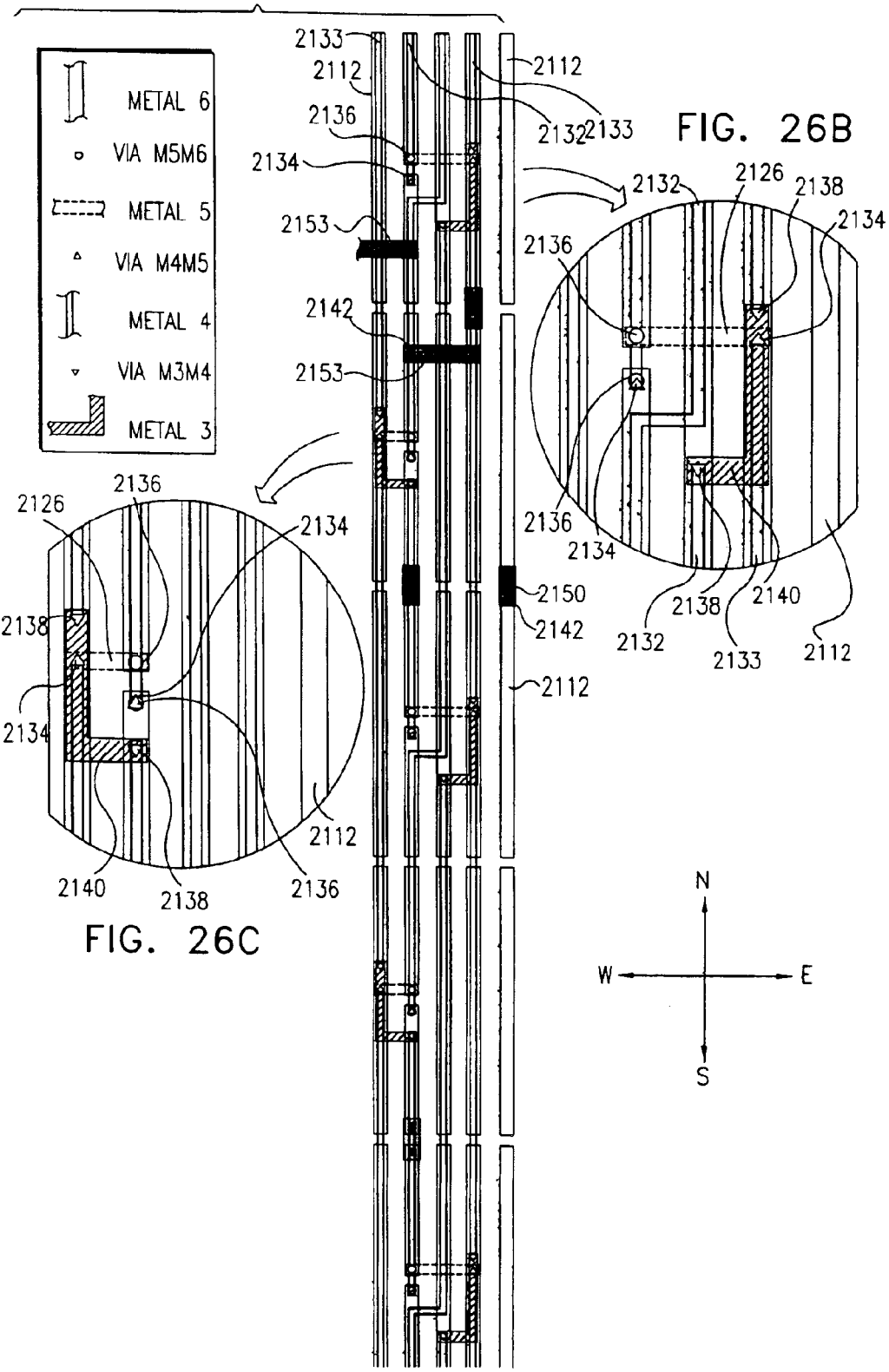

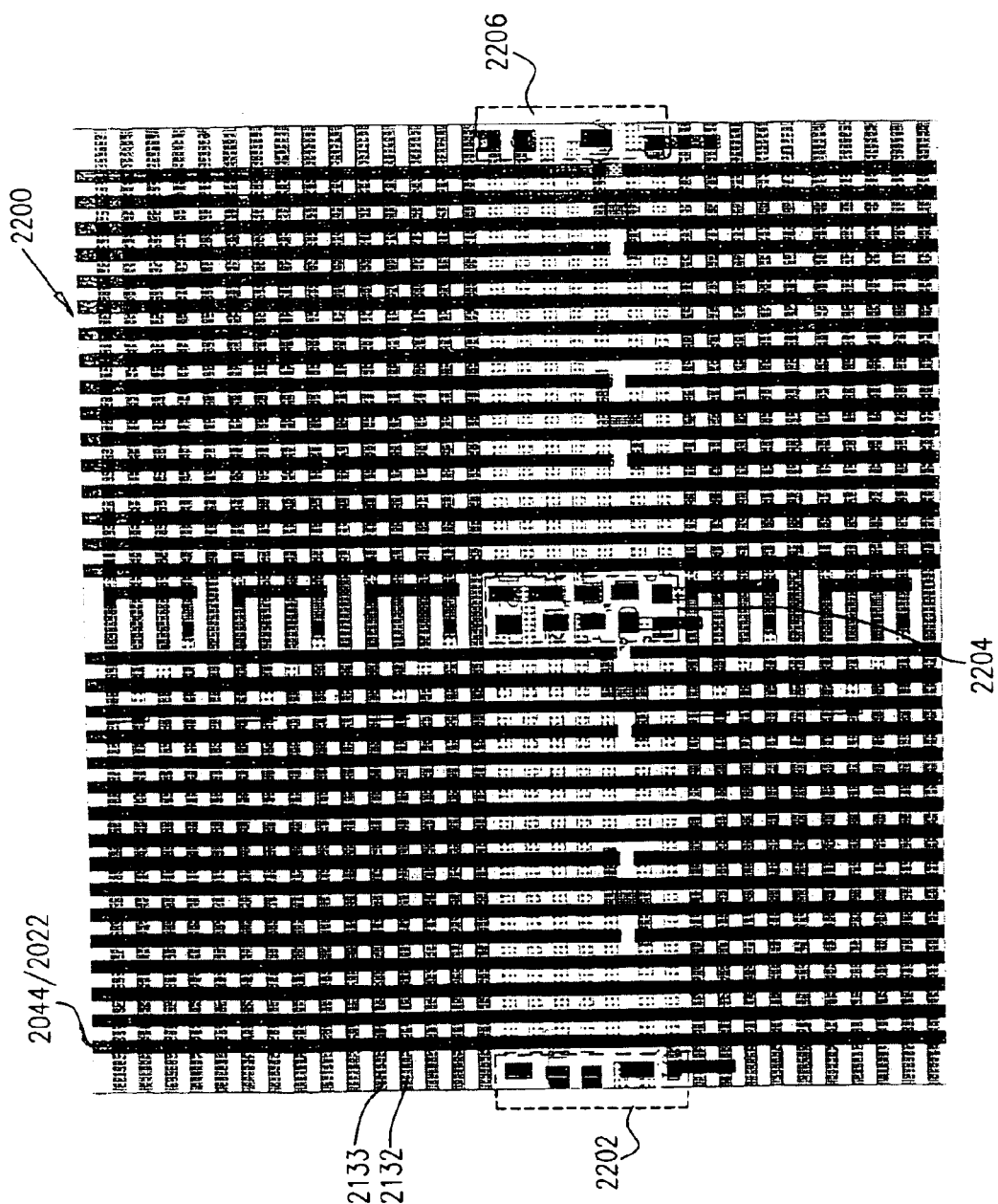
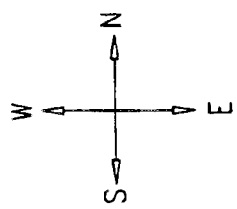
FIG. 30

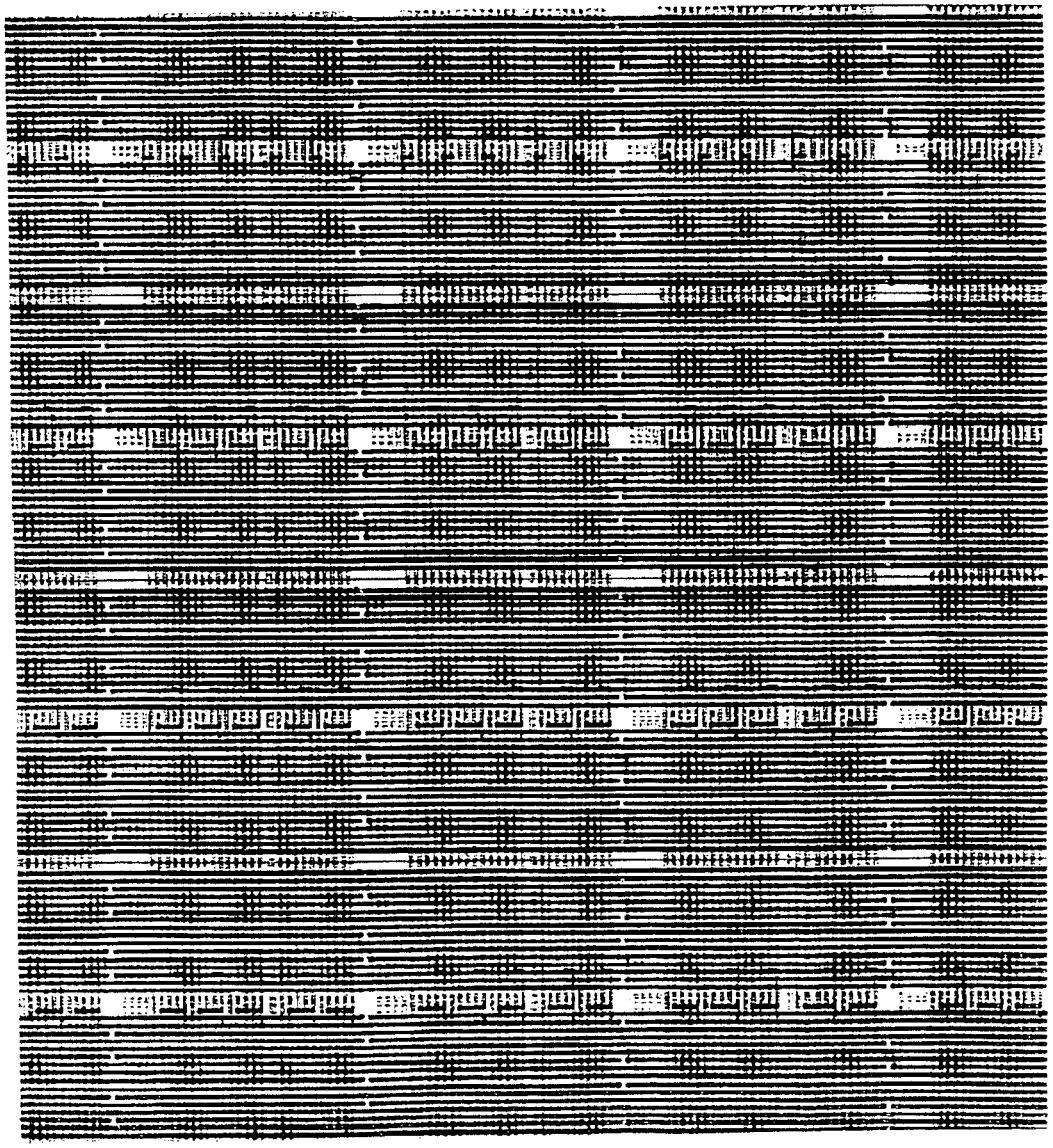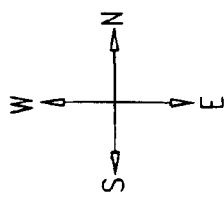
FIG. 38

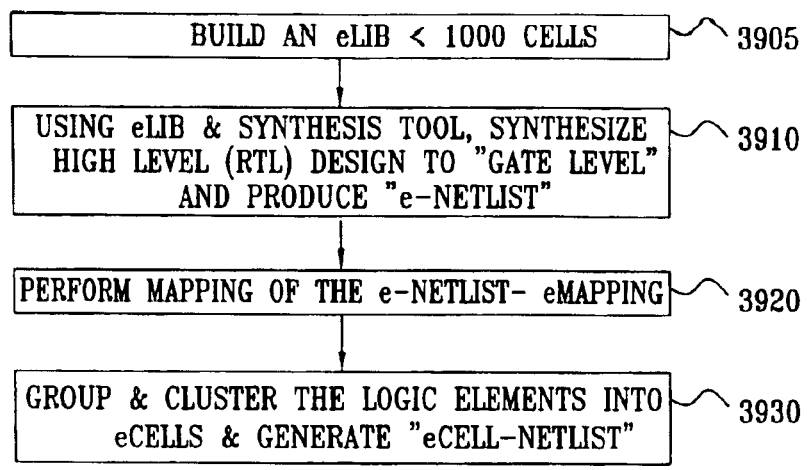
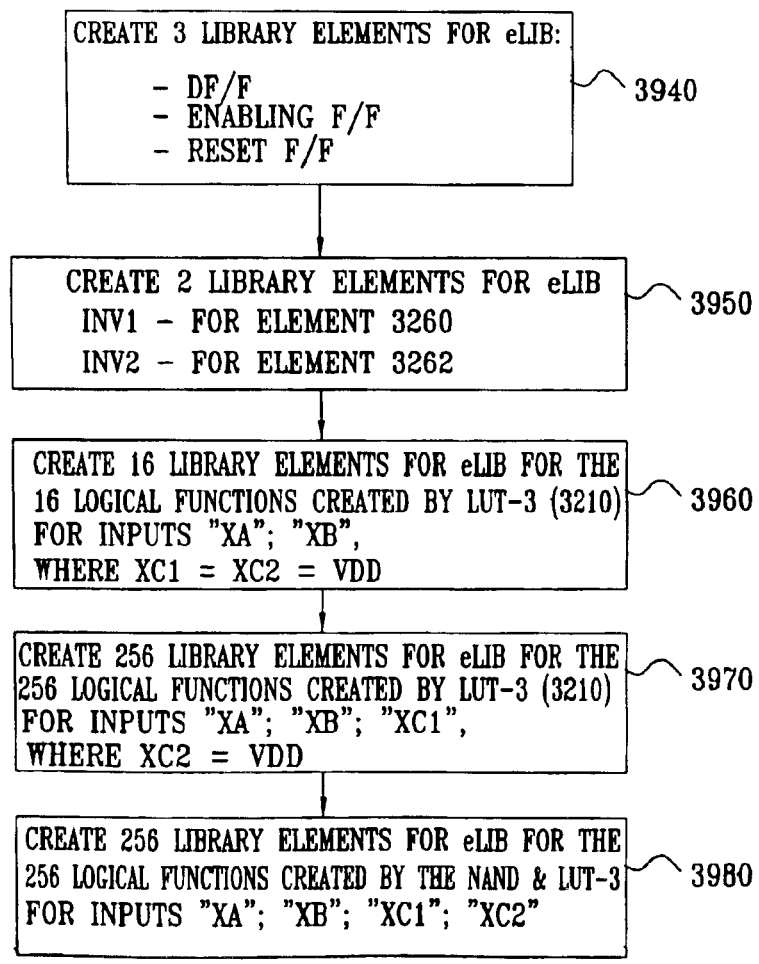

FIG. 57A
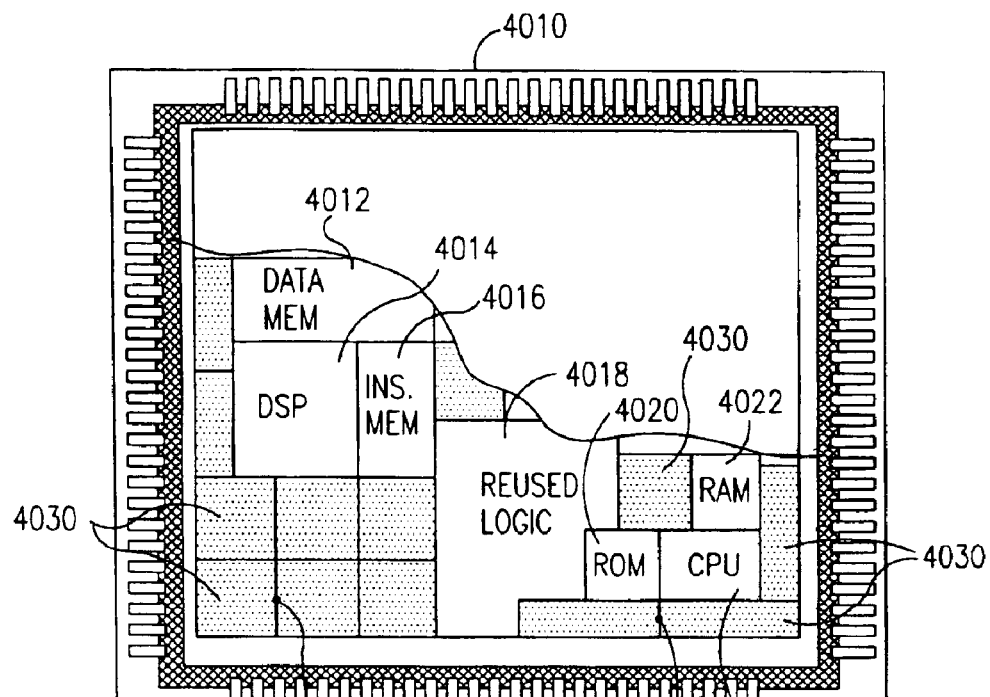
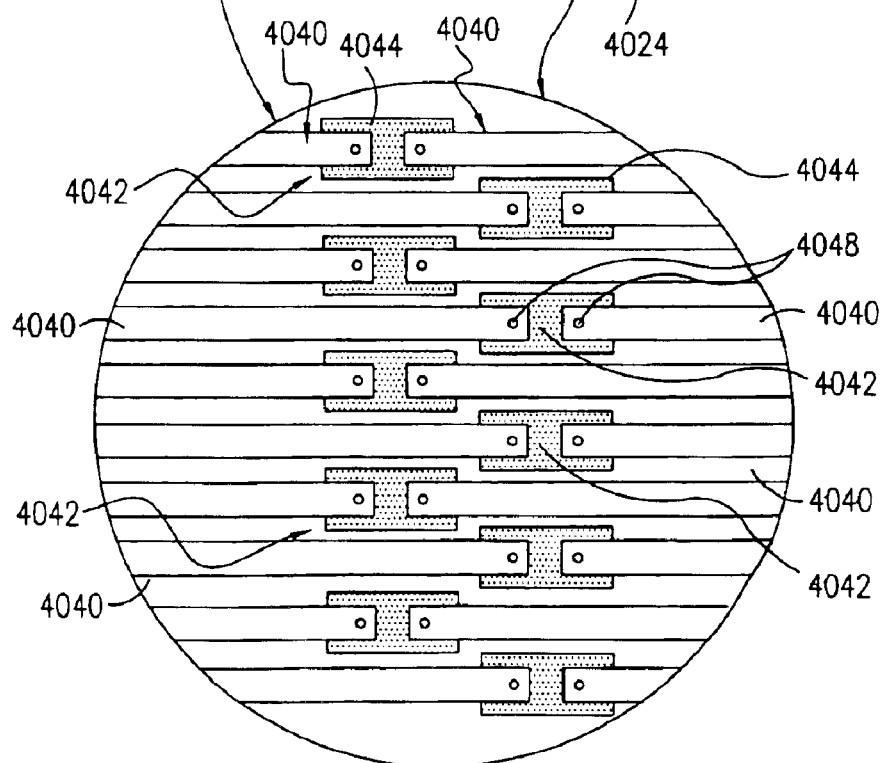
FIG. 57B

FIG. 58A   FIG. 58B   FIG. 58C
  
FIG. 59A   FIG. 59B
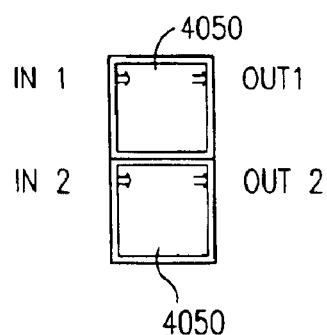 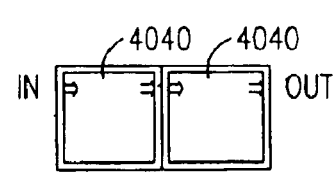
FIG. 60A
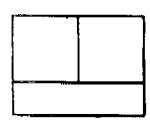
FIG. 60B
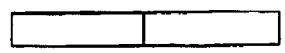

FIG. 61
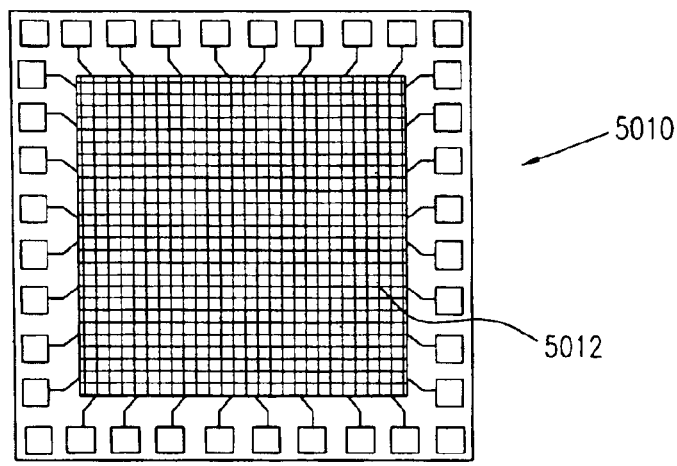
FIG. 62A
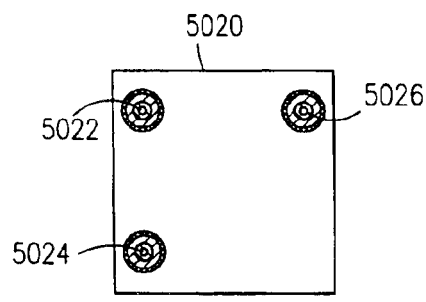
FIG. 62B
| LUT | | 5027 |
|---|---|---|
| A B | C | |
| 0 0 | $b_1$ | |
| 0 1 | $b_2$ | |
| 1 0 | $b_3$ | |
| 1 1 | $b_4$ | |
FIG. 62C
| LUT | | 5028 |
|---|---|---|
| A B | C | |
| 0 0 | 1 | |
| 0 1 | 1 | |
| 1 0 | 1 | |
| 1 1 | 0 | |
FIG. 62D
| LUT | | 5029 |
|---|---|---|
| A B | C | |
| 0 0 | 0 | |
| 0 1 | 0 | |
| 1 0 | 0 | |
| 1 1 | 0 | |

FIG. 63B
FIG. 63C
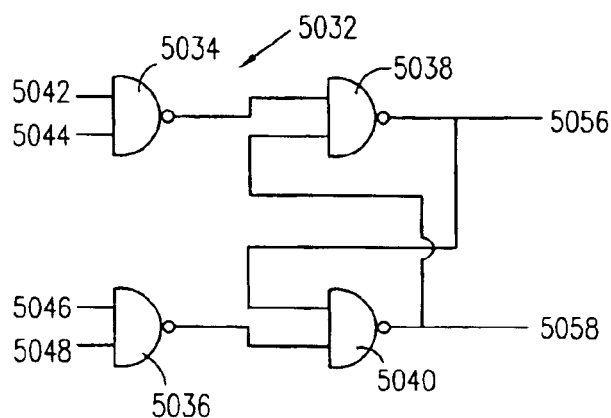
FIG. 64A
| LUT I | | |
|---|---|---|
| A | B | C |
| 0 | 0 | 0 |
| 0 | 1 | 0 |
| 1 | 0 | 0 |
| 1 | 1 | 0 |
| LUT II III IV | | |
|---|---|---|
| A | B | C |
| 0 | 0 | 1 |
| 0 | 1 | 1 |
| 1 | 0 | 1 |
| 1 | 1 | 0 |
FIG. 64B
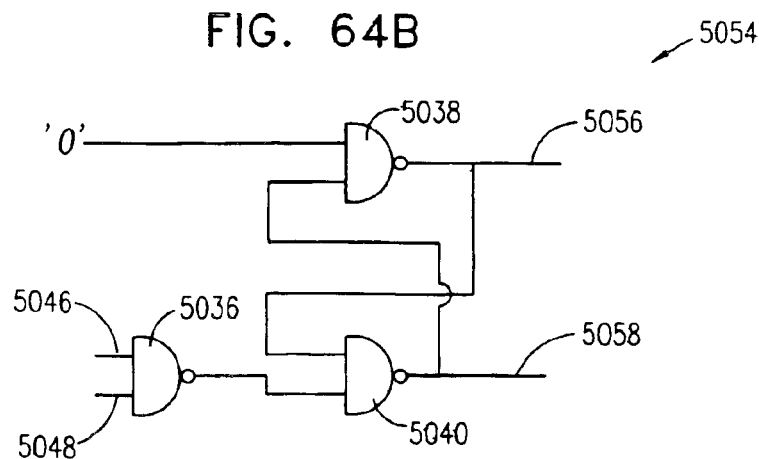

| LUT | I |
|-----|---|
| A B | C |
| 0 0 | 1 |
| 0 1 | 1 |
| 1 0 | 1 |
| 1 1 | 1 |

5060

| LUT | II III IV |
|-----|---|
| A B | C |
| 0 0 | 1 |
| 0 1 | 1 |
| 1 0 | 1 |
| 1 1 | 0 |

5062

| LUT I | | 5072 |
|---|---|---|
| A B | C | |
| 0 0 | 0 | |
| 0 1 | 0 | |
| 1 0 | 0 | |
| 1 1 | 1 | |

| LUT II III IV | | 5074 |
|---|---|---|
| A B | C | |
| 0 0 | 1 | |
| 0 1 | 1 | |
| 1 0 | 1 | |
| 1 1 | 0 | |

| LUT | I |
|-----|---|
| A B | C |
| 0 0 | 1 |
| 0 1 | 0 |
| 1 0 | 1 |
| 1 1 | 0 |

5078

| LUT | II III IV |
|-----|-----------|
| A B | C |
| 0 0 | 1 |
| 0 1 | 1 |
| 1 0 | 1 |
| 1 1 | 0 |

5080

ARRAY OF PROGRAMMABLE CELLS WITH CUSTOMIZED INTERCONNECTIONS

REFERENCE TO RELATED APPLICATIONS

This application is a continuation of assignee's co-pending application, U.S. Ser. No. 10/452,049, filed on Jun. 3, 2003 is now a U.S. Pat. No. 6,819,136, which is a continuation of assignee's application, U.S. Ser. No. 09/803,373, filed on Mar. 12, 2001, now U.S. Pat. No. 6,756,811, which is a continuation-in-part of assignee's pending application U.S. Ser. No. 09/659,783, filed on Sep. 11, 2000, now U.S. Pat. No. 6,331,790, which is a continuation-in-part of assignee's PCT International Application No. PCT/IL00/00149, filed Mar. 10, 2000, all of which are incorporated by reference herein.

FIELD OF THE INVENTION

The present invention relates to integrated circuit devices as well as to methods for personalizing and programming such devices, methods for finding faulty logic in integrated circuit devices and apparatus and techniques for the design and manufacture of semiconductor devices.

BACKGROUND OF THE INVENTION

Various types of customizable integrated circuits and programmable integrated circuits are known in the art. Customizable integrated circuits include gate arrays, such as laser programmable gate arrays, commonly known as LPGA devices, which are described, inter alia in the following U.S. Pat. Nos.: 4,924,287; 4,960,729; 4,933,738; 5,111,273; 5,260,597; 5,329,152; 5,565,758; 5,619,062; 5,679,967; 5,684,412; 5,751,165; 5,818,728. Devices of this type are customized by etching or laser ablation of metal portions thereof.

There are also known field programmable gate arrays, commonly known as FPGA devices, programmable logic devices, commonly known as PLD devices, as well as complex programmable logic devices, commonly known as CPLD devices. Devices of these types are programmable by application of electrical signals thereto.

It has been appreciated in the prior art that due to the relatively high silicon real estate requirements of FPGA devices, they are not suitable for many high volume applications. It has therefore been proposed to design functional equivalents to specific programmed FPGA circuits. Such functional equivalents have been implemented in certain cases using conventional gate arrays. The following U.S. Patents show such implementations: U.S. Pat. Nos. 5,068,063; 5,526,278 & 5,550,839.

Programmable logic devices are known in which programmable look up tables are employed to perform relatively elementary logic functions. Examples of such devices appear in U.S. Pat. Nos. 3,473,160 and 4,706,216. Multiplexers are also known to be used as programmable logic elements. Examples of such devices appear in U.S. Pat. Nos. 4,910,417, 5,341,041 and 5,781,033. U.S. Pat. Nos. 5,684,412, 5,751,165 and 5,861,641 show the use of multiplexers to perform customizable logic functions.

Problems of clock skew in gate arrays are well known. U.S. Pat. No. 5,420,544 describes a technique for reducing clock skew in gate arrays which employs a plurality of phase adjusting devices for adjusting the phase at various locations in gate arrays. Various clock tree design structures have been proposed which produce relatively low clock skew.

PCT Published Patent Application WO 98/43353 describes a functional block architecture for a gate array.

U.S. Pat. No. 5,825,202 and U.S. Pat. No. 5,959,466 describes an integrated semiconductor device comprising a FPGA portion connected to a mask-defined application specific logic area.

Various types of gate arrays are well known in the art. Gate arrays comprise a multiplicity of transistors, which are prefabricated. A specific application is achieved by customizing interconnections between the transistors.

Routing arrangements have been proposed for reducing the number of custom masks and the time needed to manufacture gate arrays by prefabricating some of the interconnection layers in two-metal layer gate array devices. Prior art devices of this type typically employ three custom masks, one each for the first metal layer, via layer and second metal layer.

U.S. Pat. No. 4,197,555 to Uehara describes a two-metal layer gate array device wherein the first and second metal layers are pre-fabricated and the via layer is customized. Uehara also shows use of pre-fabricated first metal and via layers and customization of the second metal layer.

U.S. Pat. Nos. 4,933,738; 5,260,597 and 5,049,969 describe a gate array which is customized by forming links in one or two prefabricated metal layers of a two-metal layer device.

U.S. Pat. No. 5,404,033 shows customization of a second metal layer of a two-metal layer device.

U.S. Pat. No. 5,581,098 describes a gate array routing structure for a two-metal layer device wherein only the via layer and the second metal layer are customized by the use of a mask.

Dual mode usage of Look-Up-Table SRAM cell to provide either a logic function or memory function has been proposed for FPGA devices in U.S. Pat. Nos. 5,801,547, 5,432,719 and 5,343,403.

Programmable and customizable logic arrays, such as gate arrays, are well known and commercially available in various sizes and at various levels of complexity. Recently cores of such logic arrays have become available.

Conventionally, cores are provided by a vendor based on customer's specifications of gate capacity, numbers of input/output interfaces and aspect ratio. Each core is typically compiled by the vendor for the individual customer order. Even though the cores employ modular components, the compilation of the cores requires skilled technical support and is a source of possible errors.

Examples of prior art proposals which are relevant to this technology include Laser-programmable System Chips (LPSC), commercially available from Lucent Technologies Inc., and Programmable Logic Device (PLD) cores, commercially available from Integrated Circuit Technology Corp. of California.

Integrated circuits are prone to errors. The errors may originate in the design of an integrated circuit in a logically incorrect manner, or from faulty implementation.

A debugging process is required to detect these errors but fault-finding is a difficult process in integrated circuit devices due to the inaccessibility of the individual gates and logic blocks within the integrated circuit device.

The designer needs an apparatus and method for observing the behavior of an integrated circuit device, while the device is in its "working environment". Furthermore, in order to isolate and determine a faulty area or section of an integrated circuit device, a designer needs to be able to control the inputs to the faulty area or section (controllability), and also to be able to observe the output from the faulty area (observability). In a typical integrated circuit device, controllability and observability are severely limited due to the inaccessibility of the device and the sequential nature of the logic.

The prior art teaches methods for enhancing the controllability and the observability of an integrated circuit device. A method suggested by Eichelberger et al., in "A Logic Design Structure for LSI Testability", Proceeding of the 14th Design Automation Conference, June 1977, is to use a "scan chain" method. In this method of Eichelberger, storage elements are tied together in one or more chains. Each of these chains is tied to a primary integrated circuit pin. Special test clocks allow arbitrary data to be entered and scanned in the storage elements independent of the device's normal function.

The following US patents are believed to represent the current state of the art: U.S. Pat. Nos. 5,179,534; 5,157,627, and 5,495,486.

Semiconductor devices, such as ASICs, have traditionally been manufactured by ASIC design and fabrication houses having both ASIC design and fabrication capabilities. Recently, however, the design and fabrication functionalities have become bifurcated, such that a customer may bring his fab-ready design to a fabrication house, having no design capability. The customer may employ conventionally available cell libraries, such as those available, for example, from Artisan or Mentor Graphics together with known design rules, to design their own devices.

Semiconductor design modules having specific functions, known as cores, are also available for integration by a customer into his design. An example of a commercially available core is a CPU core, commercially available from ARM Ltd. of Cambridge, England.

Cores may be provided in a variety of forms. For example, a "soft core" may be in the form of a high level schematic, termed RTL, while a "hard core" may be at a layout level and be designed to specific fabrication design rules.

Conventional ASIC design flow is based on the use of synthesis software that assists a design-engineer to convert the design from high-level description code (RTL) to the level of gate netlist. Such a software tool is available from Synopsys Inc., 700 E. Middlefield, Mountain View, Calif., USA, and commercially available under the name of "Design Compiler". While software tools, such as "Design Compiler" are highly complex, they are limited by, for example, the number of logic functions, called "Library Functions", which may be used for gate level implementation.

For example, "Design Compiler" can use up to about 1,000 logic functions. This relatively small number of logic functions limits the usefulness of "Design Compiler" with eCells. The term "eCell" is defined hereinbelow. A typical eCell may be configured to perform more than 32,000 different logic functions.

Therefore there is a necessity in the art to provide a tool for synthesizing an eCell.

SUMMARY OF THE INVENTION

The present invention seeks to provide an improved integrated circuit which, contrary to the teachings of the prior art, is both Customizable and programmable, and an improved integrated circuit which employs look up tables to provide highly efficient logic cells and logic functionalities.

Additionally, the present invention seeks to provide a multiple layer interconnection structure for a gate array device which has significant advantages over prior art structures, and employs at least three metal interconnection layers. customization is preferably realized by customization of a via layer and a layer overlying that via layer. Furthermore, the present invention seeks to provide a truly modular logic array to be used as core and to be embedded in a system-on-chip (SoC), which is composed of a combination of identical modular logic array units which are arranged in a desired mutual arrangement without the requirement of compilation.

The following terms, which are used in the present specification and claims, are defined as follows:

"eCell" is the building block of a configurable logic cell array. Typically, it is equivalent to about 15 ASIC logic gates.

"eUnit" is the structure of an array of 16×16 eCells with additional circuitry to support dual-port RAM mode XDEC and YDEC.

"RAW" is a structure of 16 eCells within an eUnit of cells, which include a line-type structure that is parallel to the XDEC.

"CK-tree" or "Clock-tree" is a metal connecting structure that spreads across the logic to deliver the clock signal to the Flip/Flops (F/Fs) within that logic.

"½-eCore" is an array of 2×4 or 4×2 eUnits with additional circuits to support a clock driver, scan driver and counter with the logic to support loading the LUT's RAM for the set-up mode.

"eCore" is a structure comprising two ½-eCores to provide an array of either 4×4 eUnits or an array of 2×8 eUnits.

The present invention also seeks to provide an apparatus and method for adding controllability to fault-finding and debugging of an integrated circuit device, and in particular to a Look-Up-Table (LUT) logic device, without any change to the rest of the circuit. LUT units are used in many FPGA devices and also used in eASIC core devices, such as those of eASIC of San Jose, Calif., USA, and described in U.S. patent applications Ser. Nos. 09/265,998 and 09/310,962. Adding controllability to a RAM based LUT logic allows the debugging of integrated circuit devices within the working environment of the device. Although the present invention is described with respect to a 2-bit LUT, it is appreciated that the present method is also applicable to 3-bit, 4-bit and even larger LUT devices.

Additionally, the present invention seeks to provide a method for automatic distribution and licensing of semiconductor device cores, particularly "hard cores", as well as a modifiable core particularly suitable for use in the method. As the price of tooling and manufacturing such S.O.C.'s is rapidly growing, and may be expected to exceed the $1 m mark for a 0.12 micron process, it is desirable to share and spread the costs of tooling among several customers. Thus, in accordance with yet another preferred embodiment of the present invention, the method for designing and manufacturing semiconductors may also involve an entity which provides the various services and resources required by a customer to design a required S.O.C. In the present specification and claims, the entity which provides this service is termed a "Virtual ASIC" entity.

An effective way for organizing this service is for the Virtual ASIC entity to collect many different S.O.C. designs, which have been developed by other companies and include a wide range of previously built-in options. Each entry into the library or data bank, includes the S.O.C. identification in addition to the identification of the individual core included in it. The Virtual ASIC entity would then store all the information in a data bank or library and make it available to different customers.

A customer wishing to design an S.O.C., chooses a device, from the data bank, which is similar to his design requirements. The customer finalizes his own S.O.C. design based on the device design and data stored in the library. A completed S.O.C. design bears the S.O.C. identification, in addition to the identification of the individual core included in it. On completing the design of the S.O.C., the customer may update the data bank held by the Virtual ASIC entity with his S.O.C. design and data.

As described hereinabove, these design S.O.C.'s may include dedicated computerized functionalities, such as processors, DSP, and programmable and/or customizable logic.

Using various methods, adding mask tags, a Virtual ASIC entity may calculate the costs for NRE and production which may result from the wafer costs, the royalty obligations due to the various bodies which provided the cores, and due to the S.O.C. integrator as well as the other service and customization charges.

Thus, the customer is now able to review the technical capabilities of the chip, the required NRE and the production costs of his design. If the all the requirements of the customer are fulfilled, the customer can proceed and order the chip.

It is appreciated that such a service may be provided over the Internet to a customer who wishes to implement his own application based on the similar S.O.C. devices which are stored in the data bank of the Virtual ASIC.

The customer may include his own software code for the processors and/or the DSP and program and/or customize the logic to meet his own particular needs and requirements.

There is thus provided in accordance with a preferred embodiment of the present invention a personalizable and programmable integrated circuit device including at least first and second programmable logic cells and at least one permanent electrical conductive path interconnecting the at least first and second programmable logic cells for personalization of the integrated circuit device, wherein the at least first and second programmable logic cells are programmable by the application of an electrical signal thereto.

Further in accordance with a preferred embodiment of the present invention the programmable logic cells include a programmable look-up table.

Still further in accordance with a preferred embodiment of the present invention the a personalizable and programmable integrated circuit device includes at least first and second metal layers and a via layer to provide connection between the first metal layer and the second metal layer and wherein at least one of the first metal, second metal and via layers includes a repeating pattern. Preferably, at least one of the first metal, second metal and via layers include a custom pattern.

There is provided in accordance with a preferred embodiment of the present invention an integrated circuit device including at least first, second and third metal layers and a first via layer to provide connection between the first metal layer and the second metal layer and a second via layer to provide connection between the second metal layer and the third metal layer and wherein at least the first metal and the second metal layer include a repeating pattern and wherein at least one of the first via, second via and third metal layers include a custom pattern.

There is provided in accordance with another preferred embodiment of the present invention an integrated circuit device including at least first, second and third metal layers and a first via layer to provide connection between the first metal layer and the second metal layer and a second via layer to provide connection between the second metal layer and the third metal layer and wherein at least the first metal and the third metal layer include a repeating pattern and wherein at least one of the first via, second via and third metal layers include a custom pattern.

Further in accordance with a preferred embodiment of the present invention the device also includes a fourth metal layer.

Still further in accordance with a preferred embodiment of the present invention the fourth metal layer includes a repeating pattern.

Additionally in accordance with a preferred embodiment of the present invention the fourth metal layer includes a repeating pattern.

Preferably, the custom pattern is a via layer.

Further in accordance with a preferred embodiment of the present invention the custom pattern is prepared with direct write e-beam lithography.

Still further in accordance with a preferred embodiment of the present invention the first metal layer repeating pattern includes strips extending generally in parallel to a first axis.

Further in accordance with a preferred embodiment of the present invention the third metal layer repeating pattern includes strips extending generally in parallel to a first axis.

Still further in accordance with a preferred embodiment of the present invention at least two vias of first via layer are overlying at least one of the strips connecting the strips to second metal layer.

Additionally in accordance with a preferred embodiment of the present invention the at least two vias are at a distance greater than 6 times than the distance between two adjacent the strips.

Further in accordance with a preferred embodiment of the present invention the strips are stepped strips and are in a band of generally equal length strips.

Still further in accordance with a preferred embodiment of the present invention at least two vias are in propinquity to a beginning and an end of the at least one of the strips.

There is also provided in accordance with a preferred embodiment of the present invention the semiconductor device includes a substrate, at least first, second and third metal layers are formed over the substrate, the second metal layer including a plurality of generally parallel bands extending parallel to a first axis, each band including a multiplicity of second metal layer strips extending perpendicular to the first axis and at least one via connecting at least one second metal layer strip with the first metal layer underlying the second metal layer.

Further in accordance with a preferred embodiment of the present invention the third metal layer includes at least one third metal layer strip extending generally perpendicular to the second metal layer strips and being connected thereto by a via.

Still further in accordance with a preferred embodiment of the present invention the third metal layer includes at least one third metal layer strip extending generally parallel to the second metal layer strips and connecting two coaxial second metal layer strips by vias.

Preferably, the first metal layer includes at least one first metal layer strip extending generally perpendicular to the second metal layer strips and is connected thereto by a via.

Additionally in accordance with a preferred embodiment of the present invention the semiconductor device also includes at least one third metal layer strip extending parallel to the second metal layer strip and connecting two coaxial second metal layer strips.

Further in accordance with a preferred embodiment of the present invention the via includes a repeating pattern of vias.

Further in accordance with a preferred embodiment of the present invention the semiconductor device further includes relatively short second metal layer strips extending parallel to the first axis and located between the bands.

Still further in accordance with a preferred embodiment of the present invention the semiconductor device also includes at least one third metal layer strip extending parallel to the second metal layer strip and connecting two coaxial second metal layer strips.

Further in accordance with a preferred embodiment of the present invention the semiconductor device further includes a custom via layer connecting at least one of the second metal layer strip to the third metal layer.

Preferably, the third metal layer is a custom layer.

There is further provided in accordance with yet another preferred embodiment of the present invention a semiconductor device including a substrate, at least first, second and third metal layers formed over the substrate, the first metal layer including a plurality of generally parallel bands extending parallel to a first axis, each band including a multiplicity of first metal layer strips extending perpendicular to the first axis and at least one via connecting at least one third metal layer strip with the second metal layer underlying the third metal layer.

Further in accordance with a preferred embodiment of the present invention the second metal layer includes at least one second metal layer strip extending generally perpendicular to the first metal layer strips and being connected thereto by a via.

Still further in accordance with a preferred embodiment of the present invention the second metal layer includes at least one second metal layer strip extending generally parallel to the first metal layer strips and connecting two coaxial first metal layer strips by vias.

Additionally in accordance with a preferred embodiment of the present invention the third metal layer includes at least one third metal layer strip extending generally parallel to the first metal layer strips and having conductive path thereto.

Further in accordance with a preferred embodiment of the present invention the semiconductor device also includes at least one second metal layer strip extending parallel to the first metal layer strip and connecting two coaxial first metal layer strips.

Still further in accordance with a preferred embodiment of the present invention at least one via includes a repeating pattern of vias.

Additionally in accordance with a preferred embodiment of the present invention the semiconductor device further includes relatively short first metal strips extending parallel to the first axis and located between the bands.

Preferably, the semiconductor device further includes at least one second metal layer strip extending parallel to the first metal layer strip and connecting two coaxial first metal layer strips.

Further in accordance with a preferred embodiment of the present invention the semiconductor device also includes a custom via layer connecting at least one of the first metal layer strip to the second metal layer.

Still further in accordance with a preferred embodiment of the present invention the second metal layer is a custom layer.

There is further provided in accordance with a preferred embodiment of the present invention a method for the design and the manufacture of a semiconductor device. The method includes producing a fab-ready design for the semiconductor device by importing into the design at least one core for a remote source the core bearing an identification indicium, utilizing the fab-ready design to fabricate the semiconductor device and reading the identification indicium to indicate the preparation of the at least one core therein.

Further in accordance with a preferred embodiment of the present invention the importing step includes communication of the core via a communication link.

Still further in accordance with a preferred embodiment of the present invention the reading step is associated with a reporting step of the quantities of the core fabrication.

There is also provided in accordance with a preferred embodiment of the present invention a customizable and programmable integrated circuit device including at least first and second programmable logic cells, and at least two electrical conductive paths interconnecting the at least first and second programmable logic cells, at least a portion of which can be removed for customization of the integrated circuit device, wherein the at least first and second programmable logic cells are programmable by the application of an electrical signal thereto.

Further in accordance with a preferred embodiment of the present invention, at least one of the at least two conductive paths defines a short circuit between outputs of the at least first and second programmable logic cells.

Still further in accordance with a preferred embodiment of the present invention the integrated circuit device is integrated into a larger device.

Additionally in accordance with a preferred embodiment of the present invention at least a majority of the at least one of the at least two electrical conductive paths interconnecting the at least first and second programmable logic cells constitutes repeated subpatterns.

There is presented in accordance with yet another preferred embodiment of the present invention, a method for customization and programming of an integrated circuit device which includes providing an inoperative integrated circuit device, wherein the circuit device includes at least first and second programmable logic cells, and at least two electrical conductive paths interconnecting the at least first and second programmable logic cells, removing at least a portion of the at least two electrical conductive paths for customization of the integrated circuit devices, programming at least one of the at least first and second programmable logic cells by applying an electrical signal thereto, wherein the step of programming includes programming logic functions of the at least first and second programmable logic cells by the application of an electrical signal thereto.

There is also provided in accordance with a further preferred embodiment of the present invention a logic cell for use in a logic array, the logic cell includes at least one look-up table including a plurality of LUT inputs and at least one output, and at least one logic gate having a plurality of logic inputs and an output coupled to one of the plurality of LUT inputs.

Additionally in accordance with a preferred embodiment of the present invention a customizable and programmable integrated circuit device wherein at least a majority of the at least one interconnection path constitutes repeated subpatterns.

Further in accordance with a preferred embodiment of the present invention the logic cell also includes a multiplexer connected to an output of at least one look-up table and an inverter selectably connectable to at least one of an output of the multiplexer and an output of the look-up table.

Still further in accordance with a preferred embodiment of the present invention the logic cell also includes a metal interconnection layer overlying at least a portion of the cell for providing a custom interconnection between components thereof.

There is also provided in accordance with a preferred embodiment of the present invention a semiconductor device including a logic array including a multiplicity of identical logic cells, each identical logic cell comprising at least one look-up table, a metal connection layer overlying the multiplicity of identical logic cells for providing a permanent customized interconnect between various inputs and outputs thereof.

Further in accordance with a preferred embodiment of the present invention the logic cell comprises at least one multiplexer and the at least one look-up table provides an input to the at least one multiplexer.

Still further in accordance with a preferred embodiment of the present invention, also including at least one logic gate connected to at least one input of the look-up table. Preferably at least one multiplexer is configured to perform a logic operation on the outputs from the at least one pair of look-up tables.

Additionally in accordance with a preferred embodiment of the present invention the look-up table is programmable.

Still further in accordance with a preferred embodiment of the present invention the logic cell includes at least one simple logic gate selectably connected to at least one logic cell output.

Moreover in accordance with a preferred embodiment of the present invention the logic array also includes a flip-flop for receiving an output from the multiplexer.

There is further provided in accordance with yet another preferred embodiment of the present invention a semiconductor device including a logic array comprising a multiplicity of identical logic cells, each identical logic cell including at least one flip-flop, and a metal connection layer overlying the multiplicity of identical logic cells for interconnecting various inputs and outputs thereof in a customized manner.

Further in accordance with a preferred embodiment of the present invention, the semiconductor device also includes a clock tree providing clock inputs to at least one of the at least one flip-flop of the multiplicity of identical logic cells.

Still further in accordance with a preferred embodiment of the present invention each logic cell receives a scan signal input which determines whether the cell operates in a normal operation mode or a test operation mode, wherein in a test operation mode nearly each flip-flop receives an input from an adjacent flip-flop thereby to define a scan chain.

Additionally in accordance with a preferred embodiment of the present invention the clock tree comprises a clock signal and an inverted clock signal.

There is further provided in accordance with yet another preferred embodiment of the present invention a semiconductor device including a substrate, at least first, second and third metal layers formed over the substrate, the second metal layer including a plurality of generally parallel bands extending parallel to a first axis, each band comprising a multiplicity of second metal layer strips extending perpendicular to the first axis, and at least one via connecting at least one second metal layer strip with the first metal layer underlying the second metal layer.

Further in accordance with a preferred embodiment of the present invention the third metal layer includes at least one third metal layer strip extending generally perpendicular to the second metal layer strips and being connected thereto by a via. Alternatively, the third metal layer includes at least one third metal layer strip extending generally parallel to the second metal layer strips and connecting two coaxial second metal layer strips by vias.

Still further in accordance with a preferred embodiment of the present invention the customizable logic core is customized for a specific application.

Additionally, the first metal layer comprises at least one first metal layer strip extending generally perpendicular to the second metal layer strips and being connected thereto by a via. Preferably the semiconductor device also includes at least one third metal layer strip extending parallel to the second metal layer strip and connecting two coaxial second metal layer strips.

Still further in accordance with a preferred embodiment of a semiconductor device the at least one via includes a repeating pattern of vias.

There is also provided in accordance with another preferred embodiment of the present invention a semiconductor device including a substrate, at least first, second, third and fourth metal layers formed over the substrate, the second metal layer comprising a plurality of generally parallel bands extending parallel to a first axis, each band comprising a multiplicity of long strips extending parallel to the first axis, the long strips including at least one of straight strips and stepped strips, at least one electrical connection between at least one strip in the second metal layer to the third metal layer, which overlies the second metal layer, and wherein the second metal layer includes a repeating pattern.

Further in accordance with a preferred embodiment of the present invention the strips of the second metal layer are connected to one of the third metal layer and the fourth metal layer, both of which overlie the second metal layer, by at least two electrical connections.

Still further in accordance with a preferred embodiment of the present invention the semiconductor device forms part of a larger semiconductor device.

Additionally in accordance with a preferred embodiment of the present invention the first metal layer comprises a plurality of generally parallel bands extending parallel to a first axis, each band comprising a multiplicity of long strips extending parallel to the first axis, the long strips including at least one of straight strips and stepped strips, at least one electrical connection between at least one strip in the first metal layer to the third metal layer, which overlies the first metal layer. Preferably the first metal layer comprises a repeating pattern.

There is provided in accordance with a preferred embodiment of the present invention an ASIC including at least one modular logic array which is constructed of a plurality of modular logic array units physically arranged with respect to each other to define a desired aspect ratio.

Further in accordance with a preferred embodiment of the present invention each modular logic array unit includes a generally circumferential border at which it is stitched onto any adjacent modular logic array unit.

Still further in accordance with a preferred embodiment of the present invention each logic array unit comprises between 10,000 and 200,000 gates.

Additionally in accordance with a preferred embodiment of the present invention each logic array unit has its own clock input.

There is further provided in accordance with a preferred embodiment of the present invention a data file for an ASIC which includes at least a reference to a plurality of identical modular data files, each corresponding to a logic array unit and data determining the physical arrangement of the logic units with respect to each other.

There is also provided in accordance with yet another preferred embodiment of the present invention a method for producing an ASIC including the step of providing a plurality of modular logic array units physically arranged with respect to each other to define a desired aspect ratio.

Further in accordance with a preferred embodiment of the present invention each modular logic array unit includes a generally circumferential border at which it is stitched onto any adjacent modular logic array unit.

Still further in accordance with a preferred embodiment of the present invention each logic array unit comprises between 10,000 and 200,000 gates.

There is also provided in accordance with another preferred embodiment of the present invention a method of producing a data file for an ASIC which includes the following steps combining without compiling together a plurality of identical modular data files, each corresponding to a logic array unit and data determining the physical arrangement of the logic units with respect to each other.

Further in accordance with a preferred embodiment of the present invention each logic array unit comprises between 10,000 and 200,000 gates.

Still further in accordance with a preferred embodiment of the present invention each logic array unit has its own clock input.

There is further provided in accordance with yet another preferred embodiment of the present invention a method of debugging an integrated circuit comprising logic gates in the form of look up tables, wherein each logic table comprises at least two data bits, the method includes modifying at least one of the data bits of one of the logic gates and examining the effect of the modification on an output of the integrated circuit without changing the routing. Preferably the modification is made into a high level language data file. Additionally or alternatively the high level language data file is used to modify a second data file corresponding to the data bits of at least some of the logic gates.

Furthermore the modified second data file as applied to at least some of the logic gates to modify at least some of the data bits thereof.

There is provided in accordance with yet another preferred embodiment of the present invention a method for fault detection of an Integrated Circuit (IC) including the steps of providing a first data file of a high level language with at least two signals defining a logic function, providing a second data file corresponding to the bit stream of a Look-Up-Table used to implement the logic function and modifying the second data file according to an user input signal to modify an output signal from the Look-Up-Table without changing the routing.

There is provided in accordance with another preferred embodiment of the present invention a method for design and manufacture of semiconductors including the steps of producing a fab-ready design for a semiconductor device by importing into the design at least one core from a remote source, the core bearing an identification indicium, utilizing the fab-ready design to fabricate the semiconductor device, and reading the identification indicium from the semiconductor device design to indicate incorporation of the at least one core therein.

Further in accordance with a preferred embodiment of the present invention the importing step includes communication of the core via the Internet.

Still further in accordance with a preferred embodiment of the present invention the reading step is associated with a reporting step which preferably includes reporting to an entity identified in the indicium data selected from the group consisting of the quantities of cores fabricated and the sizes the cores fabricated.

Preferably the producing step comprises interaction between a customer and a core provider's web site.

Additionally in accordance with a preferred embodiment of the present invention the plurality of the devices are stored as a library. Preferably the identification indicium of each of the plurality of devices includes an identification code of the ownership of the device.

Moreover in accordance with a preferred embodiment of the present invention the devices include a programmable and customizable logic core.

There is also provided in accordance with a preferred embodiment of the present invention a semiconductor device including a plurality of pins, and customizable programmable logic containing a multiplicity of logic cells and a multiplicity of electrical connections between the multiplicity of logic cells, at least some of the multiplicity of logic cells being programmable by means of electrical signals supplied thereto via at least some of the plurality of pins, and at least some of the multiplicity of electrical connections being customized for a particular logic function by lithography carried out in the course of manufacture of the semiconductor device.

There is also provided in accordance with a preferred embodiment of the present invention, a method of producing a semiconductor device including a plurality of pins and customizable programmable logic containing a multiplicity of logic cells and a multiplicity of electrical connections between the multiplicity of logic cells, including the steps of defining, on a semiconductor substrate, a multiplicity of logic cells which are programmable by means of electrical signals supplied thereto via at least some of the plurality of pins, forming the multiplicity of electrical connections over the semiconductor substrate by lithography, and in the course of the forming step, customizing at least some of the multiplicity of electrical connections for a specific logic function by lithography.

Further in accordance with a preferred embodiment of the present invention, the method also includes the step of programming at least some of the multiplicity of logic cells by means of electrical signals supplied thereto via at least some of the plurality of pins.

There is further provided in accordance with yet another preferred embodiment of the present invention a method for recycling integrated circuit designs including the steps of providing an integrated circuit design including multiple design elements from a design proprietor, removing at least part of the multiple design elements from the integrated circuit design, supplying the integrated circuit design having removed therefrom the at least part of the multiple design elements to a design recipient, utilizing the integrated circuit design having removed therefrom the at least part of the multiple design elements by the design recipient to create a second integrated circuit design, providing compensation from the design recipient to the design proprietor for the use of the integrated circuit design having removed therefrom the at least part of the multiple design elements.

There is also provided in accordance with another preferred embodiment of the present invention, a method for distributing integrated circuit designs including the steps of causing a proprietor of integrated circuit designs to make them available to potential users for use and inspection, embedding in the integrated circuit designs identification information when enables an integrated circuit fab to identify the source of the designs in an integrated circuit fabricated on the basis thereof, causing the integrated circuit fab to identify the source of the integrated circuit designs using the identified information, and causing the integrated circuit fab to pay compensation to the proprietor based at least in part on identification of the integrated circuits.

There is provided in accordance with yet another preferred embodiment of the present invention an integrated circuit device including a semiconductor substrate defining a multiplicity of semiconductor elements, a plurality of metal layers formed over the semiconductor substrate by lithography, at least the semiconductor substrate being designed such that the functionality of the multiplicity of semiconductor elements as being either logic or memory is determined by the configuration of the plurality of metal layers.

Further in accordance with a preferred embodiment of the present invention the at least the semiconductor substrate is designed such that the functionality of the multiplicity of semiconductor elements as being either logic or memory is determined solely by the configuration of the plurality of metal layers.

There is also provided in accordance with yet another preferred embodiment of the present invention an integrated circuit device including a semiconductor substrate, and a plurality of metal layers formed over the semiconductor substrate and defining programmable logic including at least one ferroelectric element.

There is further provided in accordance with yet another preferred embodiment of the present invention an integrated circuit device including a semiconductor substrate, and a plurality of metal layers formed over the semiconductor substrate and being designed to enable routing connections including at least three metal layers to be customized by forming vias.

There is also provided in accordance with yet another preferred embodiment of the present invention a semiconductor device a plurality of pins and customizable programmable logic containing a multiplicity of logic cells and a multiplicity of electrical connections within the multiplicity of logic cells, at least some of the multiplicity of logic cells being programmable by means of electrical signals supplied thereto via at least some of the plurality of pins and by customization of the electrical connections.

Further in accordance with a preferred embodiment of the present invention a semiconductor device, which also includes a multiplicity of electrical connections between the multiplicity of logic cells, at least some of the multiplicity of electrical connections being customized for a particular logic function by lithography carried out in the course of manufacture of the semiconductor device.

There is also provided in accordance with yet another preferred embodiment of the present invention a semiconductor device including a plurality of look up tables, each having a look up table output, a multiplexer having a plurality of inputs receiving the look up table outputs of the plurality of look up tables, and a switch arranged in series between at least one of the look up table outputs and an input of the multiplexer, the switch enabling one of at least two of the following inputs to be supplied to the input of the multiplexer: logic zero, logic 1, and the output of the look up table.

Further in accordance with a preferred embodiment of the present invention, the semiconductor device and also includes a flip flop receiving an output of the multiplexer and wherein the switch enables one of at least two of the following inputs to be supplied to the input of the multiplexer: logic zero, logic 1, the output of the look up table and the output of the flip flop.

There is further provided in accordance with yet another preferred embodiment of the present invention a method of employing synthesis software for integrated circuit design including the steps of defining for the synthesis software a multiplicity of 2-input and 3-input logic functions, operating the synthesis software utilizing the multiplicity of 2-input and 3-input logic functions to provide a circuit design, mapping at least some of the logic functions for implementation by a multiplexer in a semiconductor device including a plurality of look up tables, each having a look up table output, a multiplexer having a plurality of inputs receiving the look up table outputs of the plurality of look up tables, and a switch arranged in series between at least one of the look up table outputs and an input of the multiplexer, the switch enabling one of at least two of the following inputs to be supplied to the input of the multiplexer: logic zero, logic 1, and the output of the look up table.

There is also provided in accordance with another preferred embodiment of the present invention a customizable and programmable integrated circuit including at least first and second programmable logic cells each having at least one input and at least one output, and at least one permanent interconnection path interconnecting at least one output of at least one of the first and second programmable logic cells with at least one input of at least one of the first and second programmable logic cells.

Further in accordance with a preferred embodiment of the present invention the at least first and second programmable logic cells are programmable by the application of an electrical signal thereto. Preferably the logic functions of the at least first and second programmable logic cells are programmable by the application of an electrical signal thereto.

Still further in accordance with a preferred embodiment of the present invention the at least one interconnection path defines a short circuit between outputs of the at least first and second programmable logic cells.

Additionally in accordance with a preferred embodiment of the present invention the integrated circuit device comprises a stand-alone device.

Moreover in accordance with a preferred embodiment of the present invention the integrated circuit device is integrated into a larger device.

There is further provided in accordance with a preferred embodiment of the present invention a customizable logic array device including an array of programmable cells having a multiplicity of inputs and a multiplicity of outputs, and customized interconnections permanently interconnecting at least a plurality of the multiplicity of inputs and at least a plurality of the multiplicity of outputs.

There is also provided in accordance with a preferred embodiment of the present invention an array of field programmable gates having permanent customized connections.

Further in accordance with a preferred embodiment of the present invention the permanent customized connections are mask defined.

There is further provided in accordance with yet another preferred embodiment of the present invention a basic cell in a mask programmable gate array, the basic cell comprising at least one programmable logic cell.

Further in accordance with a preferred embodiment of the present invention the programmable logic cell comprises a Look-Up-Table. Preferably the Look-Up-Table comprises a mask programmable memory cell.

Still further in accordance with a preferred embodiment of the present invention the Look-Up-Table includes the following at least two inputs, and an electronic circuit which provides high speed response to changes in one of the two inputs with respect to the response time of changes to the other input.

Additionally in accordance with a preferred embodiment of the present invention the Look-Up-Table is programmed at least twice during a testing process.

There is thus provided in accordance with a preferred embodiment of the present invention a customizable and programmable integrated circuit device including: at least first and second programmable logic cells, and at least two electrical conductive paths interconnecting the at least first and second programmable logic cells, at least a portion of which can be removed for customization of the integrated circuit device.

There is additionally provided in accordance with a preferred embodiment of the present invention a customizable and programmable integrated circuit device including: at least first and second programmable logic cells, and at least one customizable electrical conductive path interconnecting the at least first and second programmable logic cells, the conductive path defining a short circuit between outputs of the at least first and second programmable logic cells.

There is further provided in accordance with a preferred embodiment of the present invention a selectably configurable and field programmable integrated circuit device including: at least first and second field programmable logic cells, and at least two electrical conductive paths interconnecting the at least first and second programmable logic cells, at least a portion of which can be removed for selectable configuration of the integrated circuit devices.

Preferably, the at least first and second programmable logic cells are programmable by the application of an electrical signal thereto.

In accordance with a preferred embodiment of the present invention, functions of the at least first and second programmable logic cells are programmable by the application of an electrical signal thereto and logic functions of the at least first and second programmable logic cells are programmable by the application of an electrical signal thereto.

Preferably at least one of the at least two conductive paths defines a short circuit between outputs of the at least first and second programmable logic cells.

There is also provided in accordance with a preferred embodiment of the present invention a selectably configurable and programmable integrated circuit device including: at least first and second programmable logic cells, and at least two selectably configurable electrical conductive paths interconnecting the at least first and second programmable logic cells, at least one of which defines a short circuit between outputs of the at least first and second programmable logic cells.

Preferably, the at least first and second programmable logic cells are programmable by the application of an electrical signal thereto.

In accordance with a preferred embodiment of the present invention, functions, preferably comprising logic functions, of the at least first and second programmable logic cells are programmable by the application of an electrical signal thereto.

Preferably, programming of the first and second programmable logic cells may take place following selectable configuration of the device.

There is additionally provided in accordance with a preferred embodiment of the present invention a selectably configurable and programmable integrated circuit device wherein programming of the first and second programmable logic cells may take place following selectable configuration of the device.

In accordance with a preferred embodiment of the present invention the first and second programmable logic cells may be reprogrammed.

There is also provided in accordance with a preferred embodiment of the present invention a method for customization and programming of an integrated circuit device including: providing an inoperative integrated circuit device including: at least first and second programmable logic cells, and at least one electrical conductive path interconnecting the at least first and second programmable logic cells, removing at least a portion of the electrical conductive path for customization of the integrated circuit devices.

Preferably, the method also includes the step of programming at least one of the at least first and second programmable logic cells by applying an electrical signal thereto.

In accordance with a preferred embodiment of the present invention, the step of programming includes programming functions, preferably including logic functions, of the at least first and second programmable logic cells by the application of an electrical signal thereto.

Preferably, the step of removing includes eliminating a short circuit between outputs of the at least first and second programmable logic cells by etching at least one conductive layer.

There is also provided in accordance with a preferred embodiment of the present invention a method for customization and programming of an integrated circuit device including: providing an inoperative integrated circuit device including at least first and second programmable logic cells, and at least two electrical conductive paths interconnecting the at least first and second programmable logic cells, removing at least a portion of the at least two electrical conductive paths for eliminating a short circuit between outputs of the at least first and second programmable logic cells.

There is additionally provided in accordance with a preferred embodiment of the present invention a method for selectable configuration and programming of an integrated circuit device including providing an inoperative integrated circuit device including at least first and second programmable logic cells, and at least two electrical conductive paths interconnecting the at least first and second programmable logic cells, removing at least a portion of the at least two electrical conductive paths for selectable configuration of the integrated circuit device.

There is further provided a method for selectable configuration and programming of an integrated circuit device including providing an inoperative integrated circuit device including at least first and second programmable logic cells, and at least two electrical conductive paths interconnecting the at least first and second programmable logic cells, and removing at least a portion of the at least two electrical conductive paths for eliminating a short circuit between outputs of the at least first and second programmable logic cells.

There is additionally provided in accordance with a preferred embodiment of the present invention a customizable and programmable integrated circuit device including: at least first and second programmable logic cells which are programmable by application thereto of an electrical signal, and at least two electrical conductive paths interconnecting the at least first and second programmable logic cells, at least a portion of which can be removed by etching for customization of the integrated circuit device.

There is further provided in accordance with a preferred embodiment of the present invention a customized programmable integrated circuit device including at least first and second programmable logic cells which are programmable by application thereto of an electrical signal, and at least two electrical conductive paths interconnecting the at least first and second programmable logic cells, at least a portion of which has been removed by etching during customization of the integrated circuit device.

It is appreciated that the integrated circuit device may comprise a conventional integrated circuit device having only a portion thereof constructed and operative in accordance with the present invention to be both customizable and programmable.

The present invention seeks to provide an improved integrated circuit which employs look up tables to provide highly efficient logic cells and logic functionalities.

There is thus provided in accordance with a preferred embodiment of the present invention a logic cell for use in a logic array, the logic cell including: at least one look-up table including a plurality of LUT inputs and at least one output, and at least one logic gate having a plurality of logic inputs and an output coupled to one of the plurality of LUT inputs.

According to one embodiment of the invention, the logic gate is a 2-input logic gate. According to an alternative embodiment of the invention, the logic gate is a NAND gate.

Preferably, the at least one look-up table includes at least one pair of look-up tables.

In accordance with a preferred embodiment of the invention, the logic cell also includes a multiplexer receiving outputs from the at least one pair of look-up tables.

In accordance with another preferred embodiment of the invention, the at least one look-up table includes first and second pairs of look-up tables, the logic cell also including first and second multiplexers, each multiplexer receiving outputs from a pair of look-up tables.

Preferably, the logic cell also includes a third multiplexer receiving outputs from the first and second multiplexers.

Additionally in accordance with a preferred embodiment of the present invention, the logic cell also includes a flip-flop for receiving an output from the first multiplexer.

In accordance with an alternative embodiment of the present invention, the logic cell also includes a multiplexer connected to an output of at least one look-up table and an inverter selectably connectable to at least one of an output of the multiplexer and an output of the look-up table.

The look-up table is preferably a programmable look-up table.

In accordance with a preferred embodiment of the present invention, the logic cell also includes a metal interconnection layer overlying at least a portion of the cell for providing a custom interconnection between components thereof.

There is also provided in accordance with a preferred embodiment of the present invention a semiconductor device including a logic array including a multiplicity of identical logic cells, each identical logic cell including at least one look-up table, a metal connection layer overlying the multiplicity of identical logic cells for providing a permanent customized interconnect between various inputs and outputs thereof.

Preferably each device includes at least one multiplexer and the at least one look-up table provides an input to the at least one multiplexer.

Additionally, each device preferably also includes at least one logic gate connected to at least one input of the look-up table.

According to one embodiment of the invention, the logic gate is a 2-input logic gate. According to an alternative embodiment of the invention, the logic gate is a NAND gate connected to an input of the at least one look-up table.

Preferably, the at least one look-up table includes at least one pair of look-up tables.

In accordance with a preferred embodiment of the present invention, the at least one multiplexer receives outputs from the at least one pair of look-up tables. Preferably, the at least one multiplexer is configured to perform a logic operation on the outputs from the at least one pair of look-up tables.

In accordance with an embodiment of the invention, the at least one look-up table includes first and second pairs of look-up tables and the at least one multiplexer includes first and second multiplexers, each multiplexer receiving outputs from a pair of look-up tables.

Preferably, the look-up table is programmable.

In accordance with a preferred embodiment of the present invention, the device includes at least one simple logic gate selectably connected to at least one logic cell output.

Preferably, the simple logic gate is a two—input logic gate. Alternatively it may be an inverter or a buffer.

The device preferably also includes a multiplexer connected to an output of at least one look-up table and an inverter selectably connectable to an output of the at least one multiplexer.

In accordance with a preferred embodiment of the present invention, the device also includes a metal interconnection layer overlying at least a portion of the cell for providing a custom interconnection between components thereof.

There is also provided in accordance with a preferred embodiment of the present invention a logic array including at least one logic cell, the logic cell including: at least one look-up table including a plurality of LUT inputs and at least one output, and at least one logic gate having a plurality of logic inputs and an output coupled to one of the plurality of LUT inputs.

The at least one look-up table is preferably a programmable look-up table.

According to one embodiment of the invention, the logic array is a 2-input logic gate. According to an alternative embodiment of the invention, the logic gate is a NAND gate.

Preferably, the at least one look-up table includes at least one pair of look-up tables.

In accordance with a preferred embodiment of the, invention, the logic array also includes a multiplexer receiving outputs from the at least one pair of look-up tables.

In accordance with another preferred embodiment of the invention, the at least one look-up table includes first and second pairs of look-up tables, the logic cell also including first and second multiplexers, each multiplexer receiving outputs from a pair of look-up tables.

Preferably, the logic array also includes a third multiplexer receiving outputs from the first and second multiplexers.

Additionally in accordance with a preferred embodiment of the present invention, the logic array also includes a flip-flop for receiving an output from the first multiplexer.

In accordance with an alternative embodiment of the present invention, the logic array also includes a multiplexer connected to an output of at least one look-up table and an inverter selectably connectable to at least one of an output of the multiplexer and an output of the look-up table.

In accordance with a preferred embodiment of the present invention, the logic array also includes a metal interconnection layer overlying at least a portion of the cell for providing a custom interconnection between components thereof.

The logic array may be integrated into a larger device also formed on the same substrate.

There is additionally provided in accordance with a preferred embodiment of the present invention a semiconductor device including a logic array including a multiplicity of identical logic cells, each identical logic cell including at least one flip-flop, and a metal connection layer overlying the multiplicity of identical logic cells for interconnecting various inputs and outputs thereof in a customized manner.

The semiconductor device may also include a clock tree providing clock inputs to at least one of the at least one flip-flop of the multiplicity of identical logic cells.

Each logic cell in the semiconductor device may also receive a scan signal input which determines whether the cell operates in a normal operation mode or a test operation mode, wherein in a test operation mode nearly each flip-flop receives an input from an adjacent flip-flop thereby to define a scan chain.

The logic cell preferably includes a programmable look-up table.

The present invention seeks to provide a multiple layer interconnection structure for a gate array device which has significant advantages over prior art structures.

The present invention employs at least three metal interconnection layers. Customization is preferably realized by customization of a via layer and a layer overlying that via layer.

There is thus provided in accordance with a preferred embodiment of the present invention a semiconductor device including a substrate, at least first, second and third metal layers formed over the substrate, the second metal layer including a plurality of generally parallel bands extending parallel to a first axis, each band including a multiplicity of second metal layer strips extending perpendicular to the first axis, and at least one via connecting at least one second metal layer strip with the first metal layer underlying the second metal layer.

Preferably the at least one via includes a repeating pattern of vias.

Further in accordance with a preferred embodiment of the present invention the third metal layer includes at least one third metal layer strip extending generally perpendicular to the second metal layer strips and being connected thereto by a via.

Still further in accordance with a preferred embodiment of the present invention the third metal layer includes at least one third metal layer strip extending generally parallel to the second metal layer strips and connecting two coaxial second metal layer strips by vias.

Additionally in accordance with a preferred embodiment of the present invention the first metal layer underlying the second metal layer includes a multiplicity of first metal layer strips extending generally parallel to the multiplicity of second metal layer strips. Furthermore, at least one of the first metal layer strips is electrically connected at ends thereof to different second metal layer strips for providing electrical connection therebetween.

Further in accordance with a preferred embodiment of the present invention the second metal layer strips include both relatively long strips and relatively short strips, at least one of the relatively short strips being connected to the first metal layer by a via. Preferably the relatively short second metal layer strips are arranged in side by side arrangement. Alternatively the relatively short second metal layer strips are arranged in spaced coaxial arrangement.

Additionally or alternatively the third metal layer includes a bridge connecting adjacent pairs of the relatively short second metal layer strips.

Still further in accordance with a preferred embodiment of the present invention the third metal layer includes at least one third metal layer strip extending perpendicular to the second metal layer strips and being connected thereto by a via. Furthermore, the third metal layer includes at least one third metal layer strip extending parallel to the second metal layer strips and connecting two coaxial second metal layer strips by vias.

Additionally in accordance with a preferred embodiment of the present invention the first metal layer comprises at least one first metal layer strip extending generally perpendicular to the second metal layer strips and being connected thereto by a via. Preferably the third metal layer includes at least one third metal layer strip extending perpendicular to the second metal layer strips and being connected thereto by a via.

Moreover in accordance with a preferred embodiment of the present invention the first metal layer includes first metal layer strips extending generally perpendicular to the second metal layer strips, the first metal layer strips being electrically connected at ends thereof by the vias to the second relatively short metal layer strips.

Still further in accordance with a preferred embodiment of the present invention the third metal layer comprises at least one third metal layer strip extending parallel to the second metal layer strips and connecting two coaxial second metal layer strips by vias.

Additionally in accordance with a preferred embodiment of the present invention also including at least one third metal layer strip extending parallel to the second metal layer strip and connecting two coaxial second metal layer strips.

There is also provided in accordance with a preferred embodiment of the present invention a semiconductor device including a substrate, at least first, second and third metal layers formed over the substrate, the second metal layer including a multiplicity of second metal layer strips extending perpendicular to the first axis, adjacent ones of the second metal layer strips having ends which do not lie in a single line.

Further in accordance with a preferred embodiment of the present invention the second metal layer strips are interlaced with one another.

Still further in accordance with a preferred embodiment of the present invention the third metal layer includes at least one third metal layer strip extending generally perpendicular to the second metal layer strip and being connected thereto by a via.

Additionally in accordance with a preferred embodiment of the present invention the third metal layer includes at least one third metal layer strip extending generally parallel to the second metal layer strips and connecting two coaxial second metal layer strips by vias.

There is provided in accordance with yet another preferred embodiment of the present invention a semiconductor device including a substrate, at least first, second and third metal layers formed over the substrate, the second metal layer including a plurality of generally parallel bands extending parallel to a first axis, each band comprising a multiplicity of second metal layer strips extending perpendicular to the first axis, and a plurality of mutually parallel relatively short second metal layer strips extending generally parallel to the first axis.

Further in accordance with a preferred embodiment of the present invention the third metal layer includes at least one third metal layer strip extending generally perpendicular to the second metal layer strips and being connected thereto by a via. Preferably at least one of the third metal strips connects two second metal layer strips by means of vias.

Still further in accordance with a preferred embodiment of the present invention the third metal layer includes at least one third metal layer strip extending generally parallel to the second metal layer strips and connecting two coaxial second metal layer strips by vias. Preferably at least one of the third metal strips connects two second metal layer strips by means of vias.

Additionally in accordance with a preferred embodiment of the present invention including at least one via connecting at least one second metal layer strip with the first metal layer underlying the second metal layer.

There is provided in accordance with yet another preferred embodiment of the present invention a semiconductor device including a substrate, at least first, second, third and fourth metal layers formed over the substrate, the second metal layer including a plurality of generally parallel bands extending parallel to a first axis, each band comprising a multiplicity of long strips extending parallel to the first axis, the long strips including at least one of straight strips and stepped strips, at least one electrical connection between at least one strip in the second metal layer to the third metal layer, which overlies the second metal layer.

Preferably the second metal layer comprises a repeating pattern.

Further in accordance with a preferred embodiment of the present invention the strips of the second metal layer are connected to one of the third metal layer and the fourth metal layer, both of which overlie the second metal layer, by least two electrical connections.

Alternatively most of the strips of the second metal layer are connected to one of the third metal layer and the fourth metal layer, both of which overlie the second metal layer, by least two electrical connections.

Further in accordance with a preferred embodiment of the present invention at least one of the strips of the second metal layer is electrically connected to another one of the strips of the second metal layer which is non-adjacent thereto.

Preferably the device forms part of a larger semiconductor device.

Still further in accordance with a preferred embodiment of the present invention the first metal layer includes a plurality of generally parallel bands extending parallel to a first axis, each band comprising a multiplicity of long strips extending parallel to the first axis, the long strips including at least one of straight strips and stepped strips, and at least one electrical connection between at least one strip in the first metal layer to the third metal layer, which overlies the first metal layer.

Additionally in accordance with a preferred embodiment of the present invention the first metal layer includes a repeating pattern.

Further in accordance with a preferred embodiment of the present invention the strips of the first metal layer are connected to one of the third metal layer and the fourth metal layer, both of which overlie the first metal layer, by least two electrical connections.

Alternatively most of the strips of the first metal layer are connected to one of the third metal layer and the fourth metal layer, both of which overlie the first metal layer, by least two electrical connections.

Further in accordance with a preferred embodiment of the present invention at least one of the strips of the first metal layer is electrically connected to another one of the strips of the first metal layer which is non-adjacent thereto.

Additionally in accordance with a preferred embodiment of the present invention the semiconductor device forms part of a larger semiconductor device.

The present invention seeks to provide a truly modular logic array to be used as core and to be embedded in a system-on-chip, which is composed of a combination of identical modular logic array units which are arranged in a desired mutual arrangement without the requirement of compilation.

There is thus provided in accordance with a preferred embodiment of the present invention a modular logic array which is constructed of a plurality of modular logic array units physically arranged with respect to each other to define a desired aspect ratio.

There is also provided in accordance with a preferred embodiment of the present invention a data file for a modular logic array which comprises at least a reference to a plurality of identical modular data files, each corresponding to a logic array unit and data determining the physical arrangement of the logic units with respect to each other.

In accordance with one embodiment of the present invention, each modular logic array unit includes a generally circumferential border at which it is stitched onto any adjacent modular logic array unit.

Preferably the stitching is effected by removable conductive strips formed in a relatively high metal layer which are connected by vias to strips in a relatively lower metal layer, thereby to removably bridge gaps therebetween.

There is also provided in accordance with a preferred embodiment of the present invention an application specific integrated circuit (ASIC) including at least one modular logic array which is constructed of a plurality of modular logic array units physically arranged with respect to each other to define a desired aspect ratio.

Further in accordance with a preferred embodiment of the present invention each modular logic array unit includes a generally circumferential border at which it is stitched onto any adjacent modular logic array unit.

Still further in accordance with a preferred embodiment of the present invention adjacent modular logic array units display stitching at a common border thereof, the stitching being effected by removable conductive strips formed in a relatively high metal layer which are connected by vias to strips in a relatively lower metal layer, thereby to removably bridge gaps therebetween.

Additionally in accordance with a preferred embodiment of the present invention at least two adjacent modular logic array units are arranged to have their scan inputs and scan outputs in parallel. Alternatively or additionally at least two adjacent modular logic array units are arranged to have their scan inputs and scan outputs in series.

Moreover in accordance with a preferred embodiment of the present invention, the ASIC includes modular logic array units of at least two different geometrical configurations.

Preferably, each logic array unit includes between 10,000 and 200,000 gates.

Further in accordance with a preferred embodiment of the present invention each logic array unit has an area of between 0.5 square millimeter and 6 square millimeters.

Additionally in accordance with a preferred embodiment of the present invention each logic array unit has its own clock input and clock output. Furthermore each logic array unit has its own scan input and scan output.

There is also provided in accordance with yet another preferred embodiment of the present invention, a data file for an ASIC which includes at least a reference to a plurality of identical modular data files, each corresponding to a logic array unit and data determining the physical arrangement of the logic units with respect to each other.

Further in accordance with a preferred embodiment of the present invention each modular logic array unit includes a generally circumferential border at which it is stitched onto any adjacent modular logic array unit.

Still further in accordance with a preferred embodiment of the present invention adjacent modular logic array units display stitching at a common border thereof, the stitching being effected by removable conductive strips formed in a relatively high metal layer which are connected by vias to strips in a relatively lower metal layer, thereby to removably bridge gaps therebetween.

Additionally in accordance with a preferred embodiment of present invention at least two adjacent modular logic array units are arranged to have their scan inputs and scan outputs in parallel. Alternatively or additionally at least two adjacent modular logic array units are arranged to have their scan inputs and scan outputs in series.

Further in accordance with a preferred embodiment of the present invention, a data file which includes modular logic array units of at least two different geometrical configurations. Preferably each logic array unit comprises between 10,000 and 200,000 gates.

Moreover in accordance with a preferred embodiment of the present invention each logic array unit has an area of between 0.5 square millimeter and 6 square millimeters.

Still further in accordance with a preferred embodiment of the present invention each logic array unit has its own clock input and clock output.

Additionally each logic array unit has its own scan input and scan output.

There is also provided in accordance with yet another preferred embodiment of the present invention, a method for producing an ASIC including the steps of providing a plurality of modular logic array units physically arranged with respect to each other to define a desired aspect ratio.

Further in accordance with a preferred embodiment of the present invention each modular logic array unit includes a generally circumferential border at which it is stitched onto any adjacent modular logic array unit.

Still further in accordance with a preferred embodiment the present invention wherein adjacent modular logic array units are stitched at a common border thereof, stitching being effected by removable conductive strips formed in a relatively high metal layer which are connected by vias to strips in a relatively lower metal layer, thereby to removably bridge gaps therebetween.

Additionally in accordance with a preferred embodiment of the present invention at least two adjacent modular logic array units are arranged to have their scan inputs and scan outputs in parallel.

Furthermore at least two adjacent modular logic array units are arranged to have their scan inputs and scan outputs in series.

Moreover in accordance with a preferred embodiment of the present invention and including modular logic array units of at least two different geometrical configurations.

Still further in accordance with a preferred embodiment of the present invention each logic array unit comprises between 10,000 and 200,000 gates. Furthermore each logic array unit has an area of between 0.5 square millimeter and 2 square millimeters.

Further in accordance with a preferred embodiment of the present invention each logic array unit has its own clock input and clock output. Additionally each logic array unit has its own scan input and scan output.

There is provided in accordance with another preferred embodiment of the present invention a method of producing a data file for an ASIC which includes combining without compiling together a plurality of identical modular data files, each corresponding to a logic array unit and data determining the physical arrangement of the logic units with respect to each other.

Further in accordance with a preferred embodiment of the present invention each modular logic array unit includes a generally circumferential border at which it is stitched onto any adjacent modular logic array unit.

Still further in accordance with a preferred embodiment of the present invention a method of adjacent modular logic array units display stitching at a common border thereof, the stitching being effected by removable conductive strips formed in a relatively high metal layer which are connected by vias to strips in a relatively lower metal layer, thereby to removably bridge gaps therebetween.

Additionally in accordance with a preferred embodiment the present invention at least two adjacent modular logic array units are arranged to have their scan inputs and scan outputs in parallel. Furthermore at least two adjacent modular logic array units are arranged to have their scan inputs and scan outputs in series.

Moreover in accordance with a preferred embodiment of the present invention including modular logic array units of at least two different geometrical configurations.

Preferably each logic array unit comprises between 10,000 and 200,000 gates.

Additionally in accordance with a preferred embodiment of the present invention each logic array unit has an area of between 0.5 square millimeter and 6 square millimeters.

Still further in accordance with a preferred embodiment of the present invention each logic array unit has its own clock input and clock output. Additionally each logic array unit has its own scan input and scan output.

There is thus provided in accordance with a preferred embodiment of the invention a method of testing an integrated circuit comprising logic gates in the form of look up tables, wherein each logic table comprises at least two data bits, the method comprising modifying at least one of the data bits of one of the logic gates, and examining the effect of the modification on an output of the integrated circuit.

Further in accordance with a preferred embodiment of the present invention the logic gates are formed into groups within the integrated circuit, each group having at least two inputs and at least one output. Preferably the logic gates do not have independent inputs or independent outputs.

Additionally in accordance with a preferred embodiment of the present invention the modification is made into a high level language data file. Preferably the high level language data file is used to modify a second data file corresponding to the data bits of at least some of the logic gates. Additionally or alternatively the modified second data file as applied to at least some of the logic gates to modify at least some of the data bits thereof.

Moreover in accordance with a preferred embodiment of the present invention the step of selecting a modification of a given logic gate within a group to have the effect of neutralizing the effect of the given logic gate on an output of the group. Preferably the group is arranged as a flip-flop.

The present invention seeks to provide a method for automatic distribution and licensing of semiconductor device cores, particularly "hard cores" as well as a modifiable core particularly suitable for use in the method.

There is thus provided in accordance with a preferred embodiment of the present invention a method for design and manufacture of semiconductors including producing a fab-ready design for a semiconductor device by importing into the design at least one core from a remote source, the core bearing an identification indicium, utilizing the fab-ready design to fabricate the semiconductor device and reading the identification indicium from the semiconductor device to indicate incorporation of the at least one core therein.

In accordance with a preferred embodiment of the present invention, there is provided a programmable or customizable core structure which can be incorporated in a design for a semiconductor device and which enables a user to assemble therewithin both conventional cores and programmable and customizable elements associatable therewith.

In accordance with a preferred embodiment of the present invention, the importing step includes communication of the core via a communications link, preferably the Internet.

Preferably, the reading step is associated with a reporting step which preferably includes reporting to an entity identified in the indicium the quantities and/or sizes of cores fabricated. This reporting step is preferably carried out by the fabrication facilities, preferably the foundry or mask shop as defined hereinbelow.

As the price of tooling and manufacturing such S.O.C's is rapidly growing, and may be expected to exceed the $1 m mark for a 0.12 micron process, it is desirable to share and spread the costs of tooling amongst several customers.

Thus, in accordance with yet another preferred embodiment of the present invention, the method for designing and manufacturing semiconductors may also include the use of a company or body which provides the various services and resources required by a customer to design a required system on a chip.

In the present specification and claims, the company which provides this service is known as a "Virtual ASIC" company.

An effective way for organizing this service is for the Virtual ASIC company to collate many different S.O.C. designs, which have been developed by other companies and include a wide range of previously built-in options. Each entry into the library or data bank, includes the S.O.C. identification in addition to the identification of the individual core included in it. The Virtual ASIC company would then store all the information in a data bank or library and make it available to different customers.

A customer wishing to design an S.O.C., chooses a device, from the data bank, which is similar to his design requirements. The customer finalizes his own S.O.C. design based on the device design and data stored in the library. A completed S.O.C. design bears the S.O.C. identification, in addition to the identification of the individual core included in it. On completing the design of the S.O.C., the customer may update the data bank held by the Virtual ASIC company with his S.O.C. design and data.

As described by the previous embodiments of the present invention, these design S.O.C.'s may include dedicated computerized functions, such as processors, DSP, and programmable and/or customizable logic.

Using different methods, such as known in the art computer codes, the Virtual ASIC company may calculate the costs for NRE and production which may result from the wafer costs, the royalty obligations to the various bodies which provided the cores, and to the S.O.C. integrator and the other service and customization charges.

Thus, the customer is now able to review the technical capabilities of the chip, the required NRE and the production costs of his design. If the all the requirements of the customer are fulfilled, the customer now go ahead and order the chip.

It is appreciated that such a service may be provided over the Internet to a customer who is interested to implement his own application based on the similar S.O.C. devices which are stored in the data bank of the Virtual ASIC.

The customer may include his own software code for the processors and/or the DSP and to program and/or customize the logic to meet the customer's own particular needs and requirements.

BRIEF DESCRIPTION OF THE DRAWINGS

The present invention will be understood and appreciated more fully from the following detailed description, taken in conjunction with the drawings in which:

FIG. 2 is a more detailed illustration of a portion of the integrated circuit device of FIG. 1 including both customizable and programmable portions;

FIG. 21 is a schematic illustration corresponding to FIGS. 15 & 17 but showing a variation in the arrangement of the middle of the three metal layers;

FIGS. 23A and 23B schematically illustrate the lower four of the top five metal layers of a cell array device constructed and operative in accordance with another preferred embodiment of the present invention, prior to customization;

FIGS. 24A and 24B show a schematic illustration corresponding to FIGS. 23A and 23B following customization thereof in accordance with a preferred embodiment of the present invention;

FIGS. 26A, 26B, and 26C show a schematic illustration corresponding to FIGS. 25A, 25B, and 25C following customization thereof in accordance with a preferred embodiment of the present invention;

FIG. 30 illustrates a single routing cell unit, comprising layers M4 to M6 and I/O contacts in accordance with a preferred embodiment of the present invention;

FIG. 38 illustrates the layers M3, M4, M5, M6 and M7 in a 4×4 cell matrix, in accordance with a preferred embodiment of the present invention;

FIG. 54 is a flowchart illustrating a method for using the code "Design Compiler" for programming the cell 3200 of FIG. 39 to perform more than 32,000 different logic functions, in accordance with a preferred embodiment of the present invention;

FIG. 55 presents the typical steps useful in implementing step 3905 in the flowchart of FIG. 54;

FIGS. 57A and 57B show a simplified illustration of a typical system on chip device comprising a plurality of identical logic array modules in accordance with a preferred embodiment of the present invention;

FIGS. 58A, 58B and 58C are simplified illustrations of three different embodiments of logic array modules useful in the present invention;

FIGS. 59A and 59B are simplified illustrations of two different arrangements of identical logic array modules useful in accordance with the present invention; and FIGS. 60A and 60B are simplified illustrations of logic array modules tiled together in two different arrangements.

FIG. 61 is a simplified illustration of a programmable Integrated Circuit (IC) device constructed and operative according to a preferred embodiment of the present invention;

FIG. 62A is a shows a simplified representation of the layout of the connecting pins of a simplified of a LUT device constructed and operative according to a preferred embodiment of the present invention;

FIG. 62B shows the truth table of a typical LUT-2 device;

FIGS. 62C and 62D show the truth tables of a LUT device before and after reprogramming, in accordance with a preferred embodiment of the present invention;

FIG. 63B is a schematic drawing of the device shown of FIG. 63A;

FIG. 63C is the truth table of the device shown in FIGS. 63A and 63B;

FIG. 64A shows the truth tables of the LUT units of the device of FIG. 63A after LUT device 34 is forced to "0";

FIG. 64B is a schematic drawing of the device whose truth table is shown in FIG. 64A;

DETAILED DESCRIPTION OF PREFERRED EMBODIMENTS

Figure 1A:
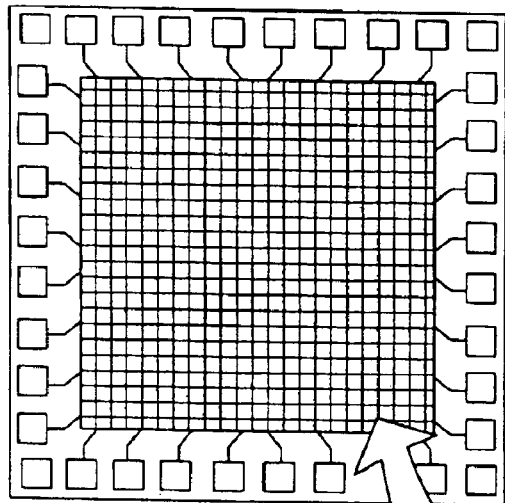
FIGS. 1A and 1B show a simplified illustration of a customizable and programmable integrated circuit device constructed and operative in accordance with a preferred embodiment of the present invention.
Figure 1B:
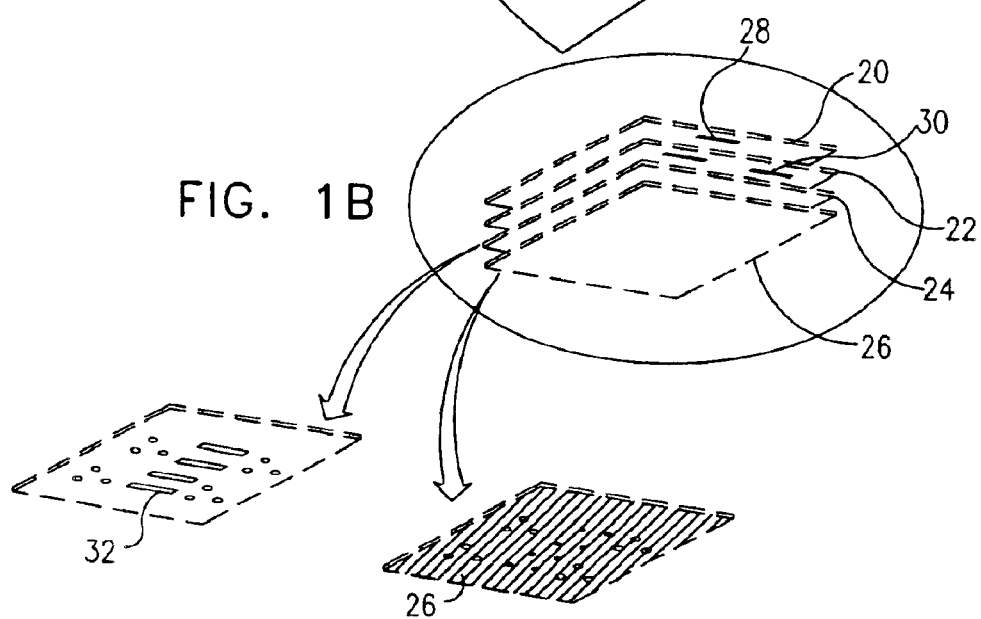

Reference is now made to FIGS. 1A and 1B, which together show a simplified illustration of a customizable and programmable integrated circuit device constructed and operative in accordance with a preferred embodiment of the present invention. The integrated circuit device of FIGS. 1A and 1B may be a stand-alone device or may alternatively be integrated into a larger device. In the latter case, the device may constitute a customizable and programmable portion of a system on a chip. The present invention relates to both of the above implementations, notwithstanding that the following description, for the sake of simplicity and conciseness, describes only the stand-alone device.

FIGS. 1A and 1B illustrate a device typically including four metal layers, designated by reference numerals 20, 22, 24 and 26.

Preferably, the top metal layer 26 is a customizable metal layer and may be a generally unpatterned solid layer of metal which may readily be configured by employing conventional lithography and removal of portions of the metal layer by conventional etching, or other methods such as CMP.

Preferably one or more of metal layers 20, 22 and 24 may comprise pre-patterned electrically conductive paths 28, 30 and 32 respectively. The term "electrically conductive path" excludes semiconductor connections and antifuses in series therewith. Preferably all or most of each metal layer 20, 22 and 24 which comprises pre-patterned electrically conductive paths constitutes repeated sub-patterns.

Layer 26 and the conductive paths 32 on layer 24 together provide customizable portions of the integrated circuit device, while the underlying conductive paths 28 and 30 on respective layers 20 and 22 cooperate with transistors in silicon layers adjacent thereto to provide the electrically programmable logic part of the integrated circuit device.

Reference is now made to FIG. 2, which is a more detailed illustration of portions of the integrated circuit device of FIGS. 1A and 1B including both customizable and programmable portions. FIG. 2 shows unpatterned layer 26 and thereunder patterned layer 24. On layer 24 there are shown a plurality of bridges 40 communicating between adjacent vias 42, which in turn are connect to layer 26.

Layer 24 also includes sections of vias 44 which communicate between layers 20 and 22 and layer 26. Vias 44 interconnect various electrically programmable logic units, which are designated schematically as blocks 46 and are typically located on and underlying layers 20 and 22 and their underlying silicon layers Electrically programmable logic units 46 typically comprise conventional field programmable logic units, which may include, for example, RAMs, Flash Memories, PROMs and antifuse links.

Figure 9:
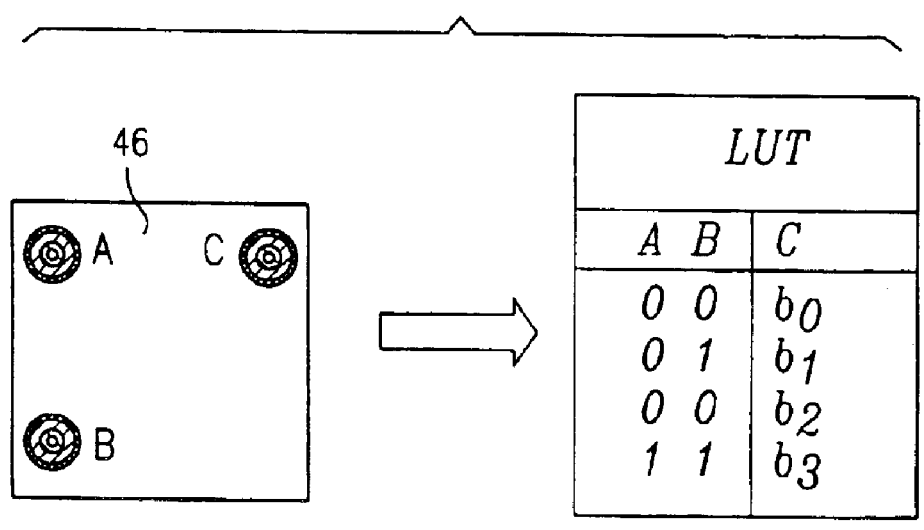
FIG. 9 is a Look Up Table illustrating part of the functionality of the circuitry of FIGS. 2–4.

FIG. 9 is a simplified table indicating part of the functionality of a typical logic unit 46, such as a RAM, having address inputs A and B connected to layer 26 by respective vias 44 which are labeled A and B and an output C, also connected to layer 26 by a via 44, which is labeled C.

It may be seen from FIG. 9 that output C has a different value b0, b1, b2 and b3 for each of four different combinations of inputs A and B. The logic unit 46 may thus be programmed by suitable selection of the values b0, b1, b2 and b3 output in response to the various input combinations provided to inputs A and B. Such logic unit has been found to be very useful in programmable logic and is known in the art as Look-Up-Table (LUT).

Figure 3:
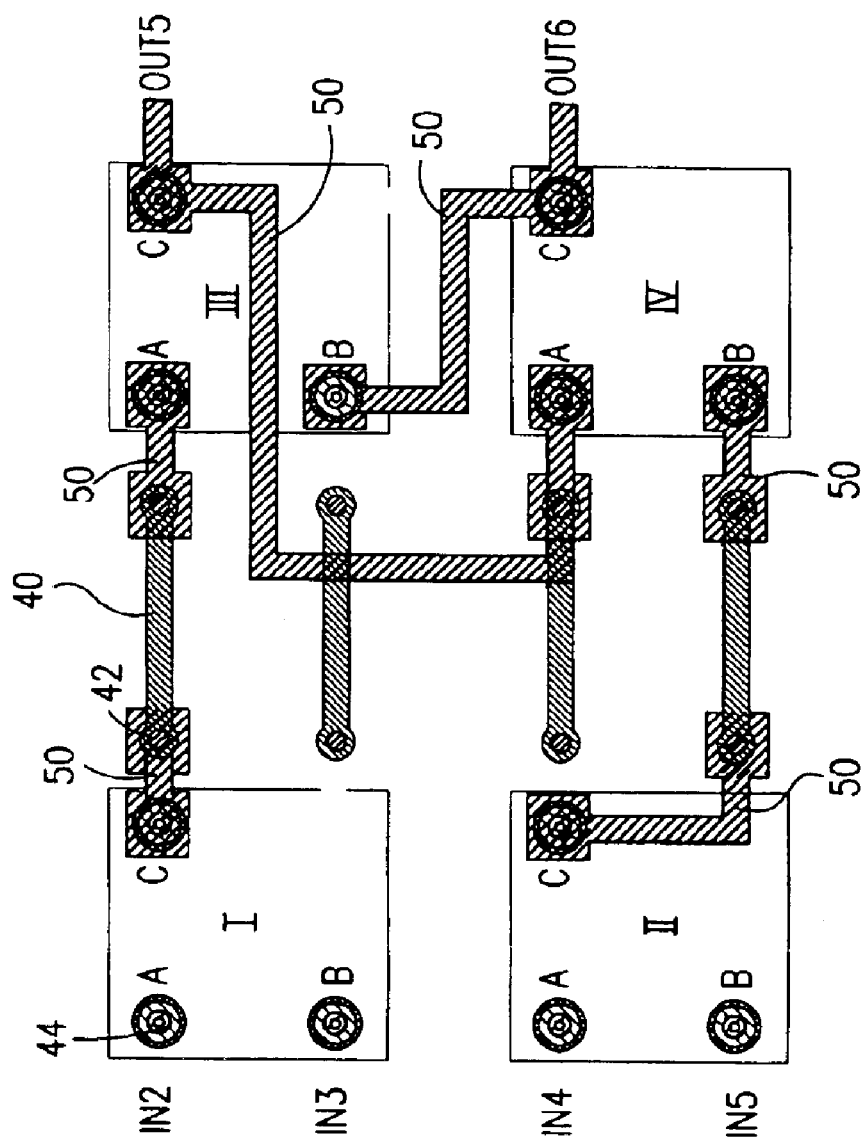
FIG. 3 is an illustration of the circuitry of FIG. 2 following customization for one type of functionality.
Figure 4:
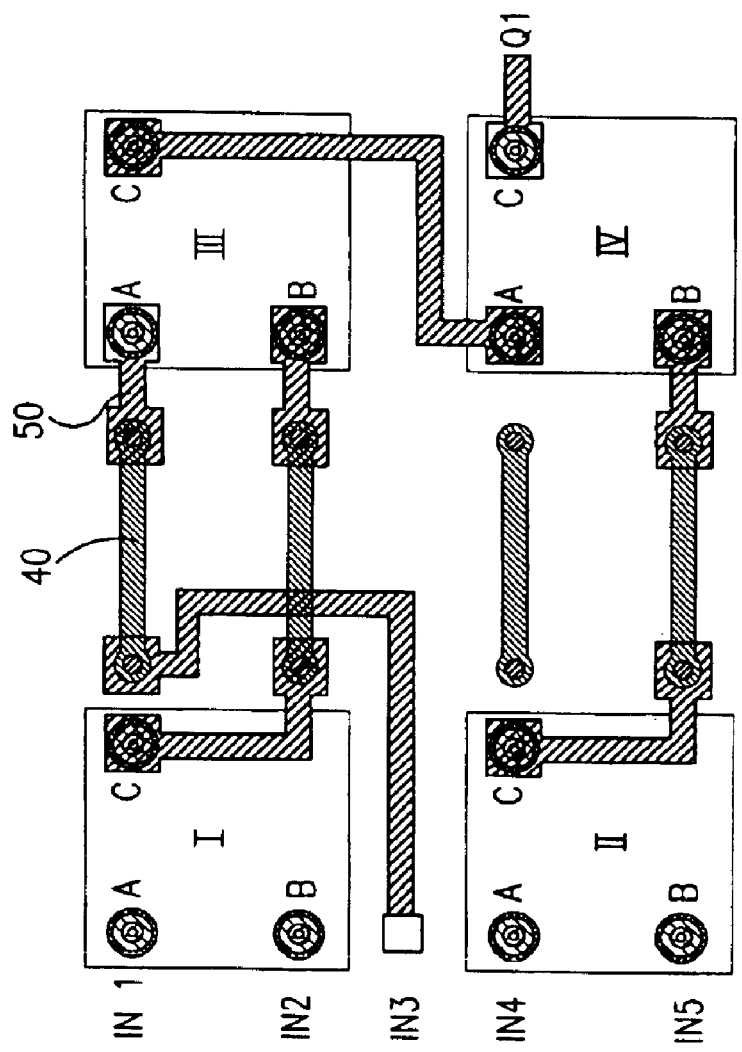
FIG. 4 is an illustration of the circuitry of FIG. 2 following customization for another type of functionality.

Reference is now made to FIG. 3, which is an illustration of the circuitry of FIG. 2 following customization for one type of functionality. It is seen that most of layer 26 has been removed, leaving only electrically conductive pathways 50, which interconnect various vias 42 and 44. FIG. 4, which is an illustration of the circuitry of FIG. 2 following customization for another type of functionality shows a different pattern of conductive pathways 50.

Figure 5:
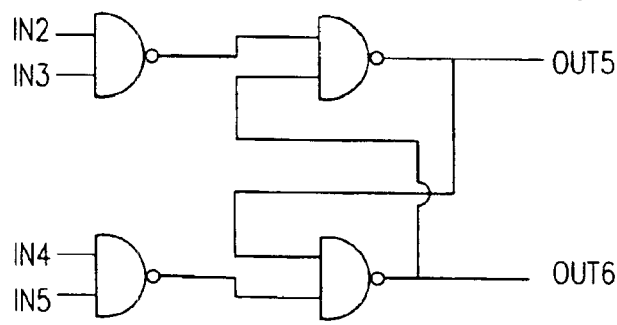
FIG. 5 is an equivalent circuit illustrating the circuitry of FIG. 3 following customization and programming for one type of functionality.
Figure 6:
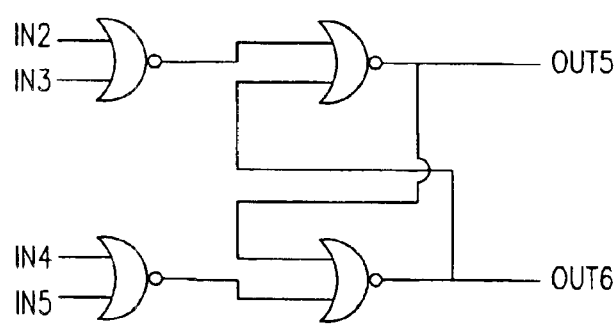
FIG. 6 is an equivalent circuit illustrating the circuitry of FIG. 3 following customization and programming for another type of functionality.

Reference is now made to FIG. 5, which is an equivalent circuit illustrating the circuitry of FIG. 3 following customization and programming for one type of functionality. FIG. 5 shows the logic function produced by the circuitry of FIG. 3 when all of the logic units 46 thereof are programmed identically in accordance with the look-up table shown therein. FIG. 6 shows that when all the logic units 46 thereof are programmed in accordance with the look-up table shown therein, different from look-up table of FIG. 5, a different logic function results.

Figure 7:
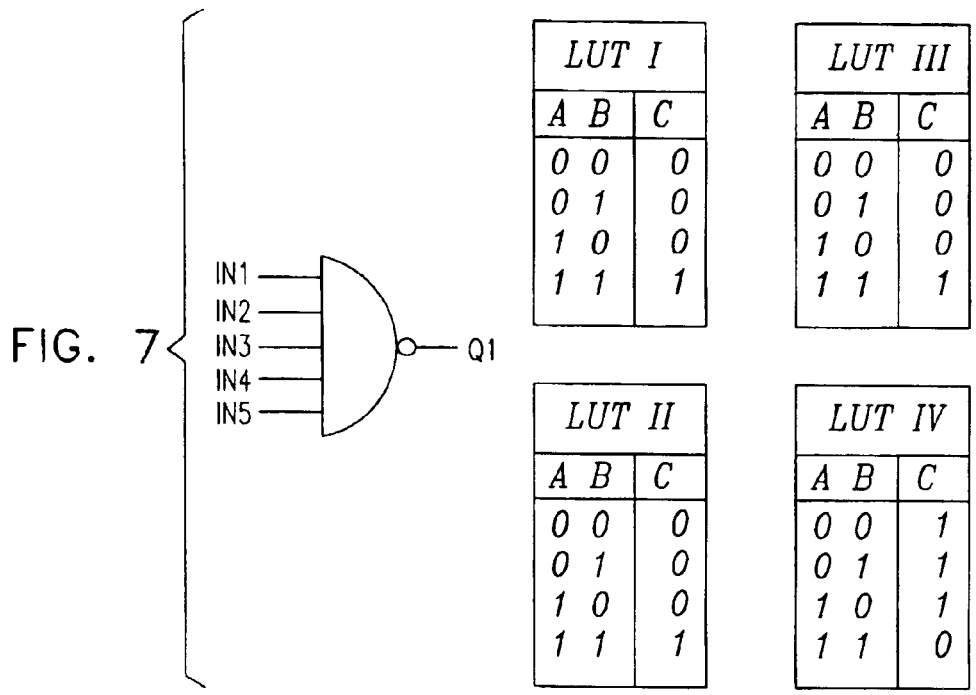
FIG. 7 is an equivalent circuit illustrating the circuitry of FIG. 4 following customization and programming for one type of functionality.

Reference is now made to FIG. 7, which is an equivalent circuit illustrating the circuitry of FIG. 4 following customization and programming for one type of functionality. FIG. 7 shows the logic function produced by the circuitry of FIG. 4 when the various logic units are programmed in accordance with the look-up tables shown therein.

Figure 8:
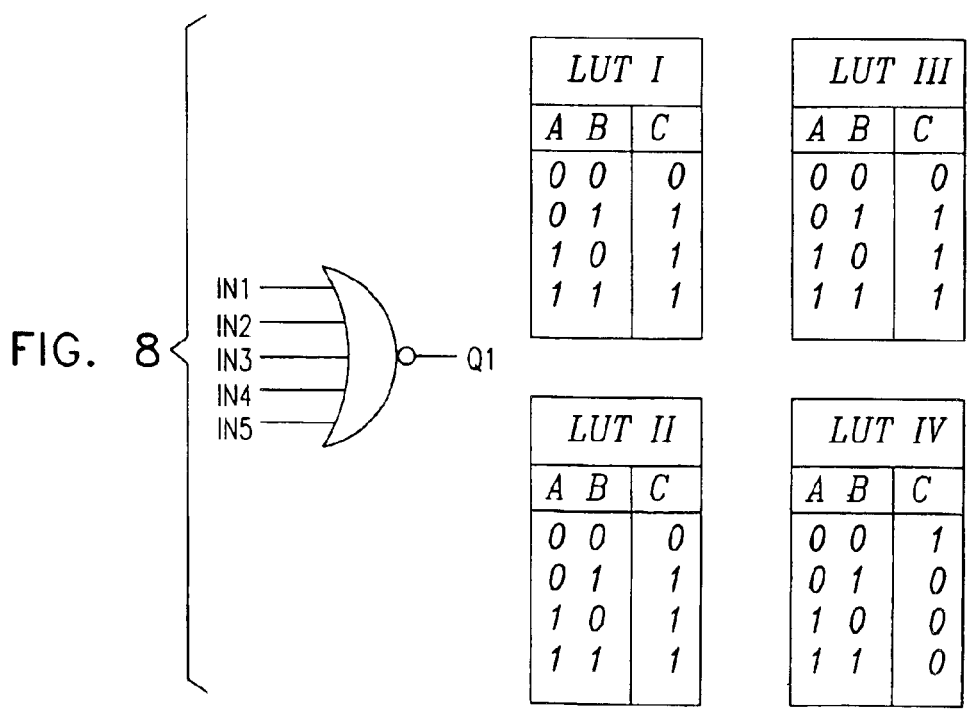
FIG. 8 is an equivalent circuit illustrating the circuitry of FIG. 4 following customization and programming for another type of functionality.

FIG. 8 shows that when the various logic units of FIG. 4 is programmed in accordance with the look-up tables shown therein differently from the look-up tables of FIG. 7, a different logic function results.

In accordance with another preferred embodiment of the present invention, there is provided a customizable logic array device including a substrate having at least one gate layer and typically at least first, second and third metal layers formed thereon, wherein the gate layer includes a multiplicity of identical unit logic cells. It is appreciated that the customizable logic array device may be integrated into a larger device also formed on the same substrate.

The present invention also provides a customizable logic array device including an array of cells, the device having at least one transistor layer, including a multiplicity of transistors, formed on a substrate and at least one interconnection layer which connects the transistors to define the array of cells, each of the cells having a multiplicity of inputs and at least one output.

There are preferably provided additional interconnection layers, at least one of which is custom made to interconnect the inputs and outputs of the various cells to provide a custom logic function. Preferably at least some of the cells are identical.

Figure 10:
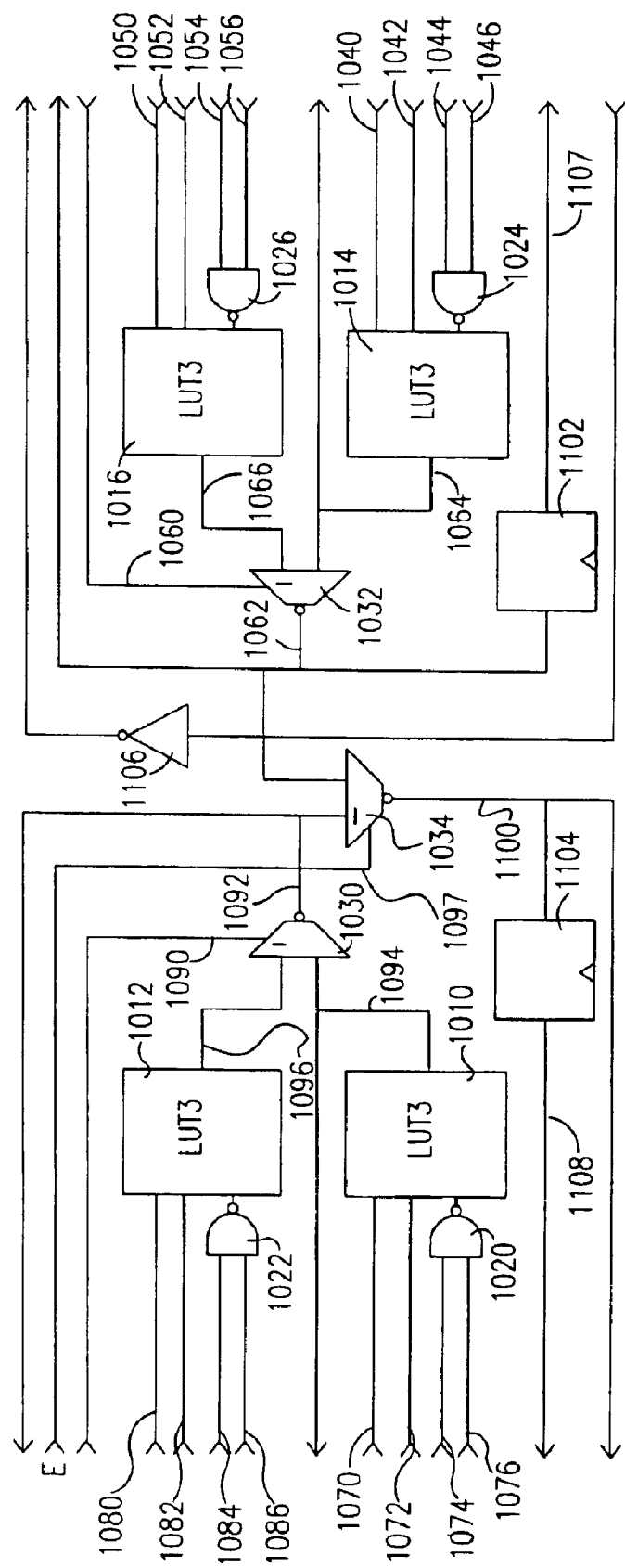
FIG. 10 is a simplified illustration of the gate layer of a logic cell constructed and operative in accordance with one preferred embodiment of the present invention.

Reference is now made to FIG. 10, which illustrates a cell preferably forming part of a gate layer of a logic array device constructed and operative in accordance with a preferred embodiment of the present invention. The logic device preferably comprises an array of cells. Each cell includes cell inputs 1040, 1042, 1044, 1046, 1050, 1052, 1054, 1056, 1060, 1070, 1072, 1074, 1076, 1080, 1082, 1084, 1086, 1090, 1097, and cell outputs 1062, 1064, 1092, 1094, 1100, 1102, 1108. Each cell comprising 3-input look-up tables (LUT3s), respectively designated by reference numerals 1010, 1012, 1014 and 1016. Coupled to a first input of each look-up table, hereinafter referred to as a LUT input, is a 2-input NAND gate. The NAND gates are designated by respective reference numerals 1020, 1022, 1024 and 1026.

Alternatively, any other suitable type of logic gate, such as, for example, a NOR, AND, OR, XOR or 3-input logic gate, may be employed instead of a NAND gate.

Outputs of LUTs 1010 and 1012 are supplied as inputs to a multiplexer 1030, while outputs of LUTs 1014 and 1016 are supplied as inputs to a multiplexer 1032. The outputs of multiplexers 1030 and 1032 are supplied to a multiplexer 1034. Multiplexers 1030, 1032 and 1034 are preferably inverting multiplexers, as shown.

A NAND fed four-input LUT may be realized by connecting respective inputs 1040, 1042, 1044 and 1046 of LUT 1014 and NAND gate 1024 to respective inputs 1050, 1052, 1054 and 1056 of LUT 1016 and NAND gate 1026. The inputs of the resulting NAND fed four-input LUT are inputs

1040, 1042, 1044 & 1046 and the select input to multiplexer 1032, which is designated by reference numeral 1060. The output of the NAND fed four-input LUT is the output of multiplexer 1032, which is designated by reference numeral 1062.

A NAND fed four-input LUT may be realized by connecting respective inputs 1070, 1072, 1074 and 1076 of LUT 1010 and NAND gate 1020 to respective inputs 1080, 1082, 1084 and 1086 of LUT 1012 and NAND gate 1022. The inputs of the resulting NAND fed four-input LUT are inputs 1070, 1072, 1074 & 1076 and the select input to multiplexer 1030, which is designated by reference numeral 1090. The output of the NAND fed four-input LUT is the output of multiplexer 1030, which is designated by reference numeral 1092.

It is further appreciated that if the output of LUT 1014, designated by reference numeral 1064, is connected to the select input 1060, multiplexer 1032 performs a NAND logic function on the output of LUT 1014 and the output of LUT 1016, designated by reference numeral 1062.

Similarly, if the output of LUT 1010, designated by reference numeral 1094, is connected to the select input 1090 of multiplexer 1030, multiplexer 1030 performs a NAND logic function on the output of LUT 1010 and the output of LUT 1012, designated by reference numeral 1092.

It is appreciated that other logic functions may be generated by multiplexers 1030 and 1032. For example, if input 1060 and output 1066 are connected together, a NOR logic function is performed on outputs 1064 and 1066, having an output at output 1062.

A NAND fed five-input LUT may be realized by connecting respective inputs 1040, 1042, 1044, 1046 and 1060 of one NAND fed four-input LUT with inputs 1070, 1072, 1074, 1076 and 1090 of the other NAND fed four-input LUT. The inputs of the resulting NAND fed five-input LUT are inputs 1040, 1042, 1044, 1046 and 1060 as well as the E select input to multiplexer 1034, designated by reference numeral 1097. The output of the NAND fed five-input LUT is designated by reference numeral 1100.

It is additionally appreciated that if the output 1062 of multiplexer 1032 is connected to input 1097, multiplexer 1034 performs a NAND logic function on the output 1092 of multiplexer 1030 and the output 1062 of multiplexer 1032.

It is further appreciated that if the output 1092 of multiplexer 1030 is connected to input 1097, multiplexer 1034 performs a NOR logic function on the output 1092 of multiplexer 1030 and the output 1062 of multiplexer 1032.

Preferably a flip flop 1102 is coupled to the output 1062 of multiplexer 1032 and a flip flop 1104 is coupled to the output 1100 of multiplexer 1034.

Additionally, an inverter 1106 is provided for selectable interconnection to one of the cell outputs 1062, 1064, 1092, 1094, 1107, 1108 and 1100. Inverter 1106 could be used to change the polarity of a logic signal to provide a desired logic function. Inverter 1106 could also be used to buffer certain signals to effectively drive a relatively heavy load, such as in cases where a single output is supplied to multiple inputs or along a relatively long interconnection path. It is appreciated that alternatively or additionally any other one or more suitable logic gate, such as for example, a NAND, NOR, XOR or XNOR gate, may be provided in the cell.

It is appreciated that various interconnections between inputs and outputs of various components of the cell described hereinabove and between inputs and outputs of various cells of the logic array are preferably achieved by one or more selectably configurable overlying metal layers, which are preferably mask configurable. A permanent customized interconnect is thus provided.

Figure 11:
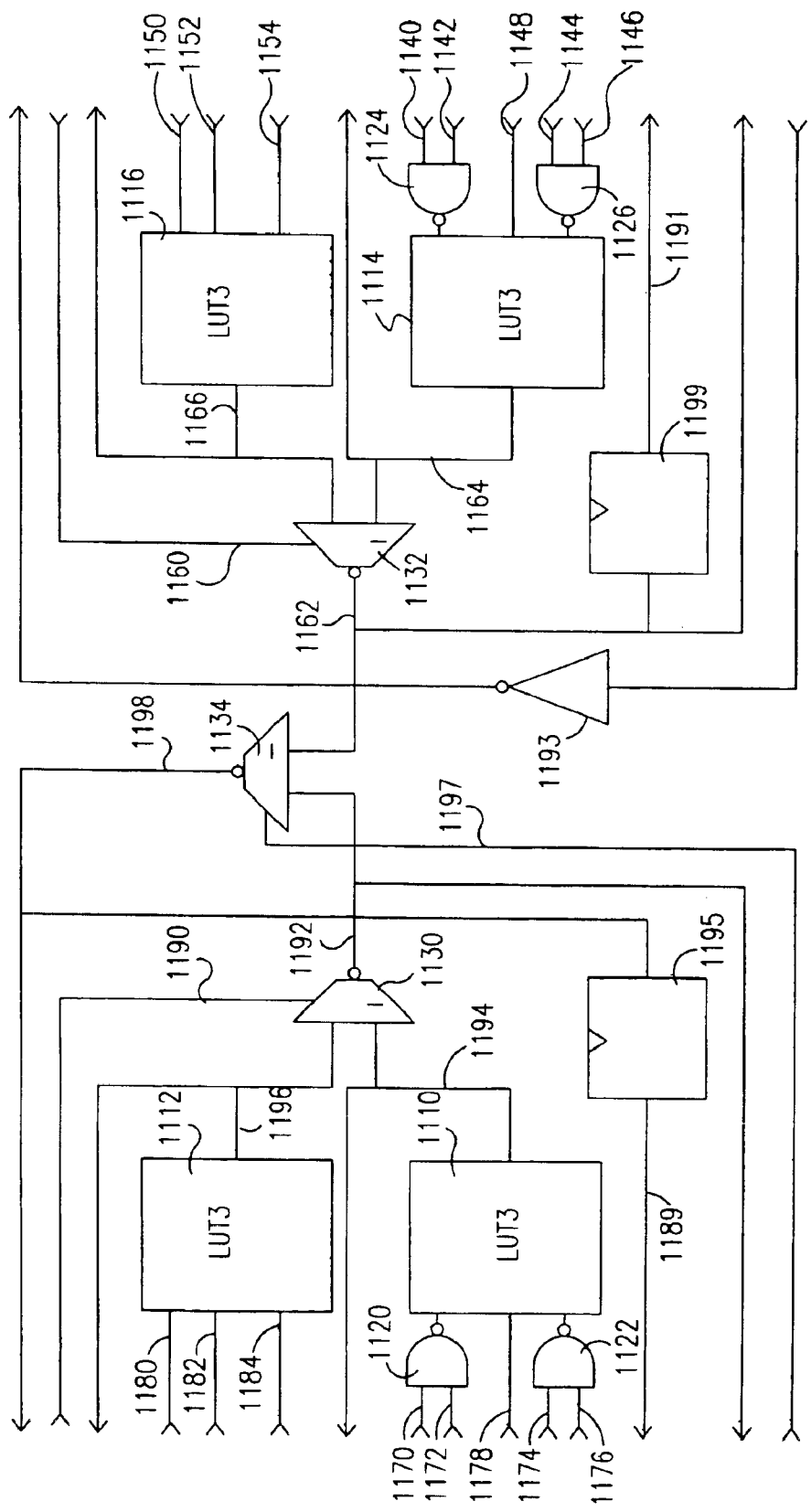
FIG. 11 is a simplified illustration of the gate layer of a logic cell constructed and operative in accordance with another preferred embodiment of the present invention.

Reference is now made to FIG. 11, which illustrates a cell preferably forming part of a gate layer of a logic array device constructed and operative in accordance with another preferred embodiment of the present invention. The cell of FIG. 11 is presently believed by the inventor to be superior in certain respects to the cell of FIG. 10. The logic device preferably comprises an array of cells, each cell comprising 4-input look-up tables (LUTs), respectively designated by reference numerals 1110, 1112, 1114 and 1116. Coupled to first and second inputs of each of look-up tables 1110 and 1112, hereinafter referred to as a LUT inputs, is a 2-input NAND gate. The NAND gates are designated by respective reference numerals 1120, 1122, 1124 and 1126.

Alternatively, any other suitable type of logic gate, such as, for example, a NOR, AND, OR, XOR or 3-input logic gate may be employed instead of the NAND gates.

Outputs of LUTs 1110 and 1112 are supplied as inputs to a multiplexer 1130, while outputs of LUTs 1114 and 1116 are supplied as inputs to a multiplexer 1132. The outputs of multiplexers 1130 and 1132 are supplied to a multiplexer 1134. Multiplexers 1130, 1132 and 1134 are preferably inverting multiplexers, as shown.

A four-input LUT may be realized by connecting respective inputs 1140, 1142, and 1144 and 1146 of the NAND gates 1124 and 1126, and then connecting inputs 1140, 1144, and 1148 of LUT 1114 to respective inputs 1150, 1152 and 1154 of LUT 1116. The inputs of the resulting four-input LUT are inputs 1140, 1144 & 1148 and the select input to multiplexer 1132, which is designated by reference numeral 1160. The output of the four-input LUT is the output of multiplexer 1132, which is designated by reference numeral 1162.

A four-input LUT may be realized by connecting the inputs 1170, 1172, and 1174, 1176 of NAND gates 1120 and 1122, and then connecting inputs 1170, 1174 and 1178 of LUT 1110 to respective inputs 1180, 1182 and 1184 of LUT 1112. The inputs of the resulting four-input LUT are inputs 1170, 1174 & 1178 and the inputs to multiplexer 1130, which is designated by reference numeral 1190. The output of the four-input LUT is the output of multiplexer 1130, which is designated by reference numeral 1192.

It is further appreciated that if the output of LUT 1116, designated by reference numeral 1166, is connected to the select input 1160, multiplexer 1132 performs a NAND logic function on the output of LUT 1114 and the output of LUT 1116.

Similarly, if the output of LUT 1112, designated by reference numeral 1196, is connected to the select input 1190 of multiplexer 1130, multiplexer 1130 performs a NAND logic function on the output of LUT 1110 and the output of LUT 1112. It is appreciated that other logic functions may be generated by multiplexers 1130 and 1132. For example, if input 1160 and output 1164 are connected together, a NOR logic function is performed on outputs 1164 and 1166, having an output at output 1162.

It is additionally appreciated that if the output 1162 of multiplexer 1132 is connected to input 1197, multiplexer 1134 performs a NOR logic function on the output 1192 of multiplexer 1130 and the output 1162 of multiplexer 1132.

It is further appreciated that if the output 1192 of multiplexer 1130 is connected to input 1197, multiplexer 1134 performs a NAND logic function on the output 1192 of multiplexer 1130 and the output 1162 of multiplexer 1132.

Preferably a flip flop 1199 is coupled to the output 1162 of multiplexer 1132 and a flip flop 1195 is coupled to the output 1198 of multiplexer 1134.

Additionally an inverter 1193 is provided for selectable interconnection to one of the cell outputs 1162, 1166, 1192, 1196, 1191, 1189 and 1198. Inverter 1193 could be used to change the polarity of a logic signal to provide a desired logic function. Inverter 1193 could also be used to buffer certain signals to effectively drive a relatively heavy load, such as in cases where a single output is supplied to multiple inputs or along a relatively long interconnection path. It is appreciated that alternatively or additionally any other one or more suitable logic gate, such as for example, a NAND, NOR, XOR or XNOR gate, may be provided in the cell.

It is appreciated that various interconnections between inputs and outputs of various components of the cell described hereinabove and between inputs and outputs of various cells of the logic array are preferably achieved by one or more selectably configurable overlying metal layers, which are preferably mask configurable. A permanent customized interconnect is thus provided.

Figure 12:
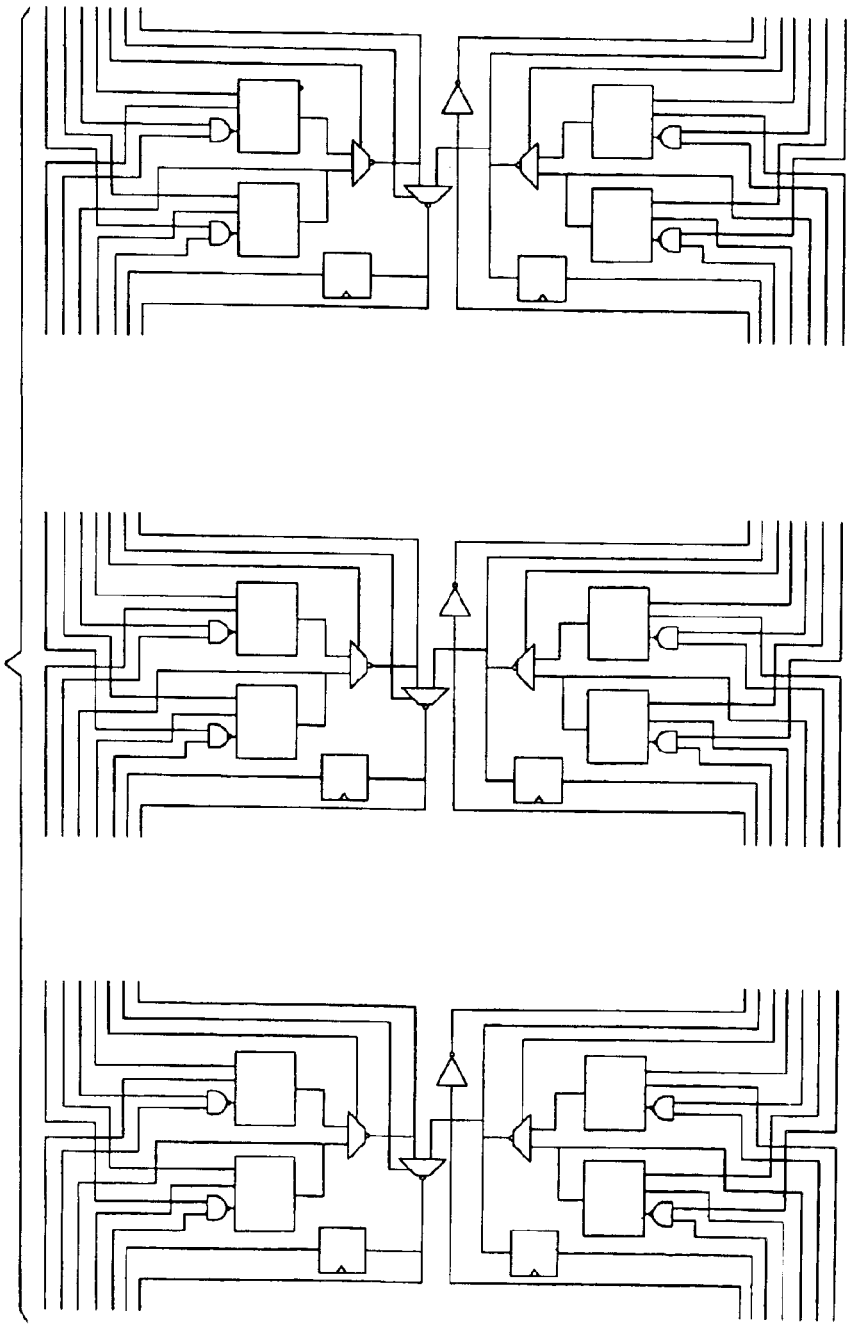
FIG. 12 is a simplified illustration of a gate layer of a plurality of logic cells which constitute a portion of a logic array in accordance with a preferred embodiment of the present invention.

Reference is now made to FIG. 12, which is an illustration of a plurality of the cells of FIG. 10, which constitute a portion of a logic array, preferably a customizable logic array, in accordance with a preferred embodiment of the present invention. It is appreciated that alternatively, FIG. 12 could include a plurality of the cells of FIG. 11.

Figure 13:
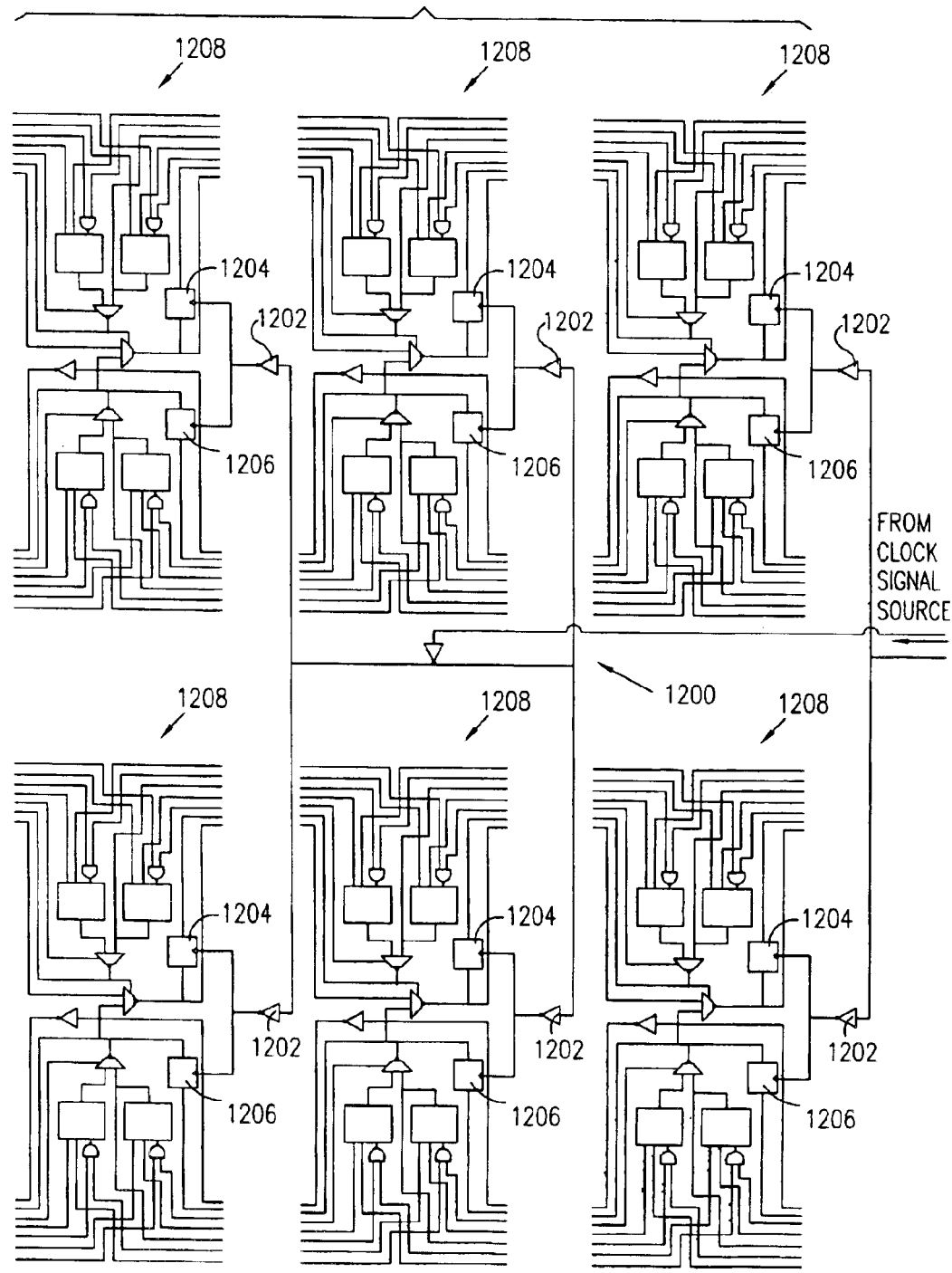
FIG. 13 is a simplified illustration of a gate layer of a plurality of logic cells which constitute a portion of a logic array and incorporate a clock tree in accordance with a preferred embodiment of the present invention.

Reference is now made to FIG. 13, which is a simplified illustration of a gate layer of a plurality of logic cells which constitute a portion of a logic array and incorporate a clock tree in accordance with a preferred embodiment of the present invention.

As seen in FIG. 13, a clock tree distribution circuit, generally indicated by reference numeral 1200, provides clock signals from a clock signal source (not shown) via an inverter 1202 to each pair of flip-flops 1204 and 1206 in each logic cell 1208. Although the logic cell of FIG. 10 is shown, it is appreciated that alternatively and preferably, the logic cell of FIG. 11 may be employed. It is appreciated that the structure of FIG. 13 is very distinct from the prior art wherein a clock tree distribution circuit is implemented in at least one custom interconnection layer.

In accordance with a preferred embodiment of the present invention, three metal layers, such as metal 1, metal 2 and metal 3 are typically standard. Three additional metal layers, such as metal 4, metal 5 and metal 6 may be used for circuit customization for a specific application. In logic arrays of this type, it is often desirable to provide a multiplicity of clock domains. Each such clock domain requires its own clock distribution tree. Connection of the clock domains can be readily achieved by suitable customization of an upper metal layer, such as metal 6.

It is appreciated that the number of cells connected to a given distribution tree may vary greatly, from tens of cells to thousands of cells. This variation can be accommodated easily using the structure of the present invention.

It is appreciated that each flip flop in each cell has approximately the same interconnection load on the clock distribution tree.

Multiple phase lock loops (PLLs) may be employed to adjust the phase of each clock tree with respect to an external clock.

Figure 14:
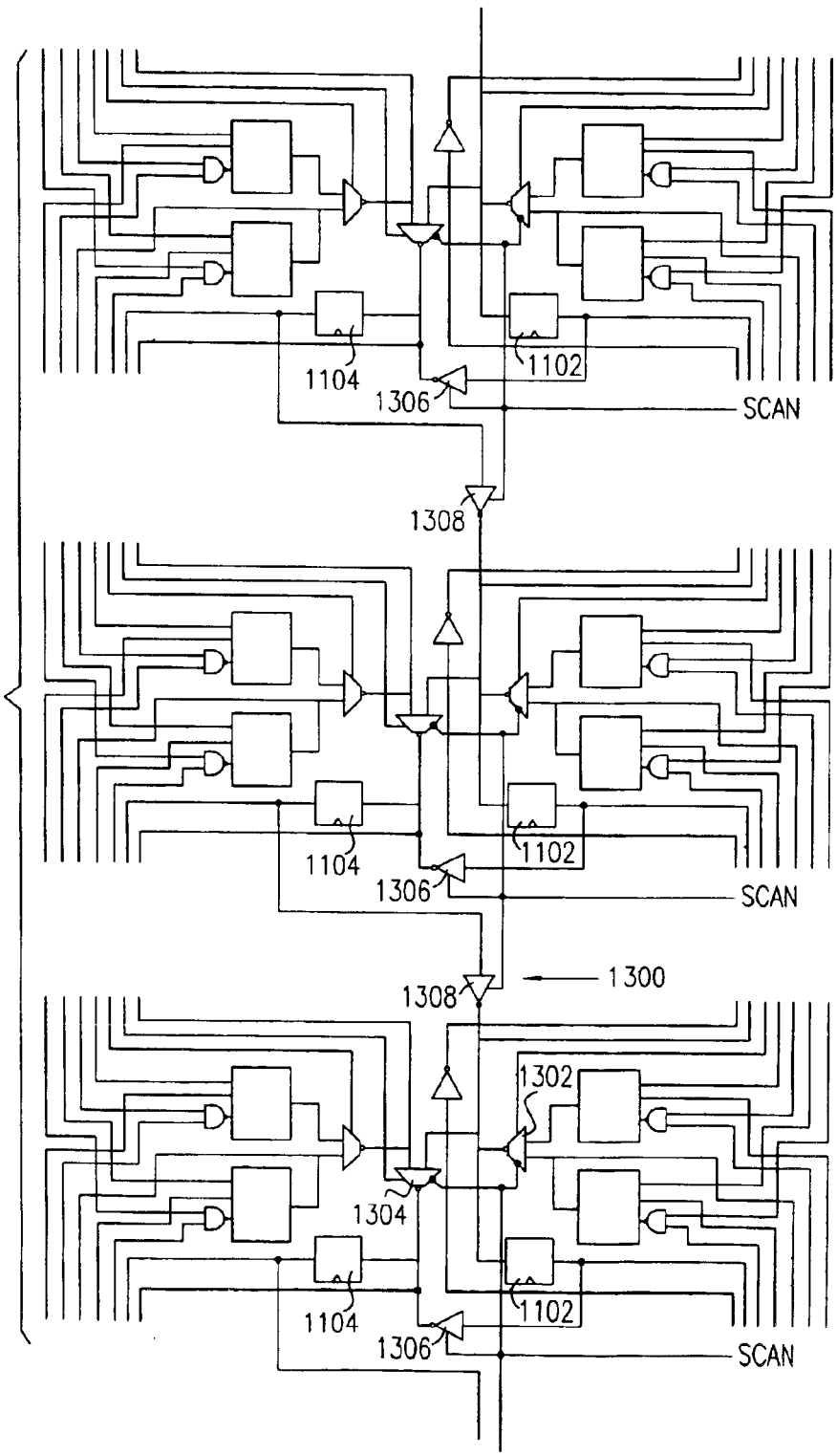
FIG. 14 is a simplified illustration of a gate layer of a plurality of logic cells which constitute a portion of a logic array and incorporate a scan chain in accordance with a preferred embodiment of the present invention.

Reference is now made to FIG. 14, which is a simplified illustration of a gate layer of a plurality of logic cells which constitute a portion of a logic array and incorporate a scan chain in accordance with a preferred embodiment of the present invention. Although the cells of FIG. 10 are shown in FIG. 14, it is appreciated that alternatively, the cells of FIG. 11 may be employed.

In the prior art scan chains, which provide test coverage for integrated circuits, are known to involve not insignificant overhead in terms both of real estate and performance. Conventionally, scan chains are usually inserted either as part of a specific circuit design or during post processing.

In accordance with the present invention, as shown in FIG. 14, a scan chain 1300 is implemented as part of the basic structure of a logic cell array. The invention thus obviates the need to insert scan chains either as part of a specific circuit design or during post processing. A multiplicity of scan chains can be integrated in a logic cell array in accordance with a preferred embodiment of the present invention.

Connection of the scan chains can be readily achieved by suitable customization of an upper metal layer, such as metal 6.

In the embodiment of FIG. 14, multiplexers 1032 and 1034 are preferably replaced by corresponding 3-state multiplexers 1302 and 1304. A pair of 3-state inverters 1306 and 1308 are provided in each cell and are connected as shown. During normal operation of the array, the scan signal is a logic "low" or "0", thus enabling multiplexers 1302 and 1304 and disabling inverters 1306 and 1308.

During testing of the array, the scan signal is a logic "high" or "1" and the multiplexers 1302 and 1304 are disabled while the inverters 1306 and 1308 are enabled. In such a scan mode the output of flip flop 1102 of a given cell is fed to the input of flip flop 1104 of that cell and the output of flip flop 1104 is fed to the input of flip flop 1102 of the adjacent cell, thus creating a scan chain.

It is appreciated that additional multiplexers may also be employed in this embodiment.

FIGS. 15–29 illustrate variations of repeating routing patterns of the top metal layers of the cell array. These patterns are repeated multiple times in an actual circuit. The pre-customized circuits may or may not form a part of a larger integrated circuit device. For reasons of practicality, an entire semiconductor device including such circuits cannot be illustrated to a resolution which enables the routing structure thereof to be discerned.

Figure 15:
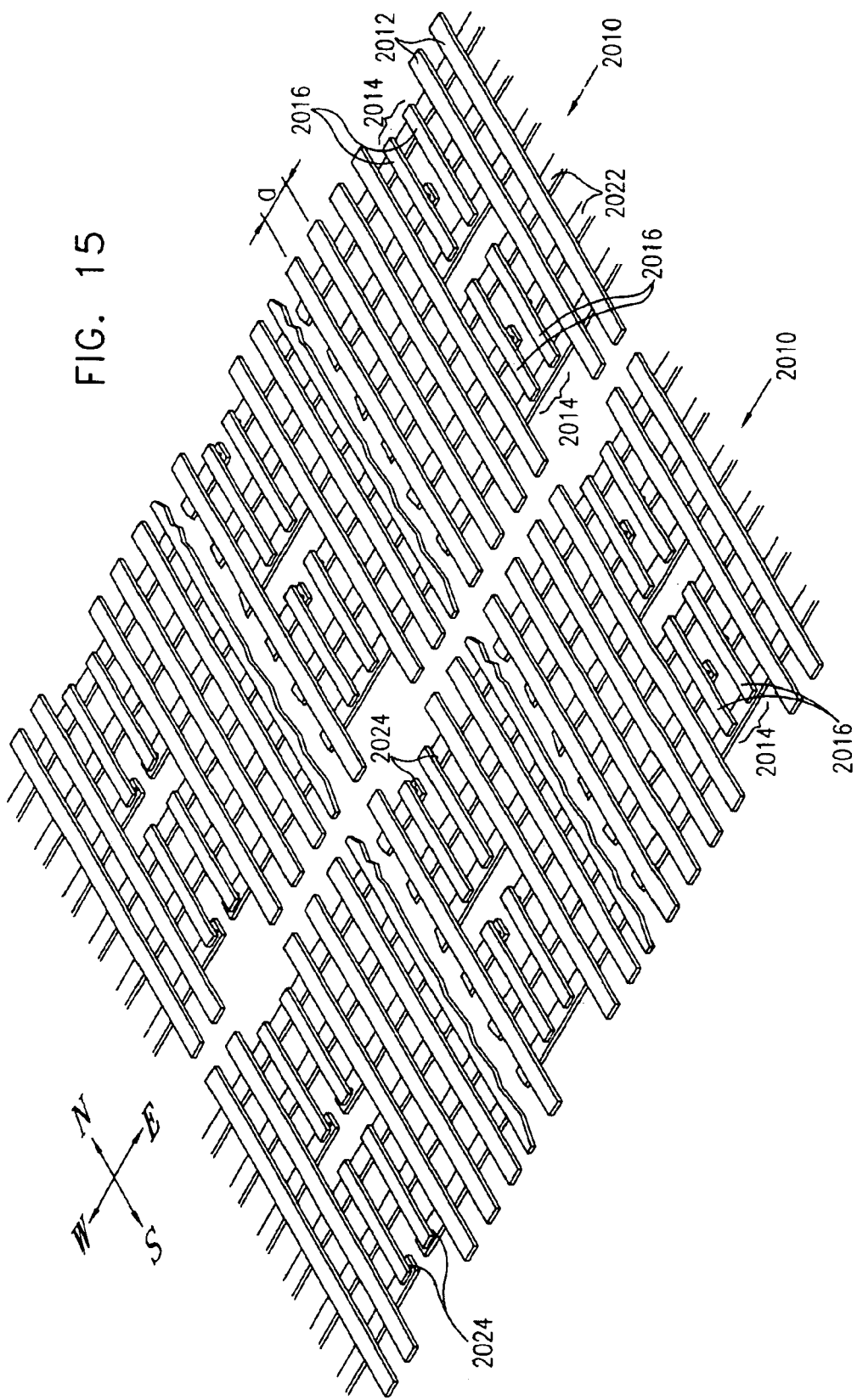
FIG. 15 is a pictorial illustration of the lower two of the top three metal layers of a cell array device constructed and operative in accordance with a preferred embodiment of the present invention, prior to customization.
Figure 17:
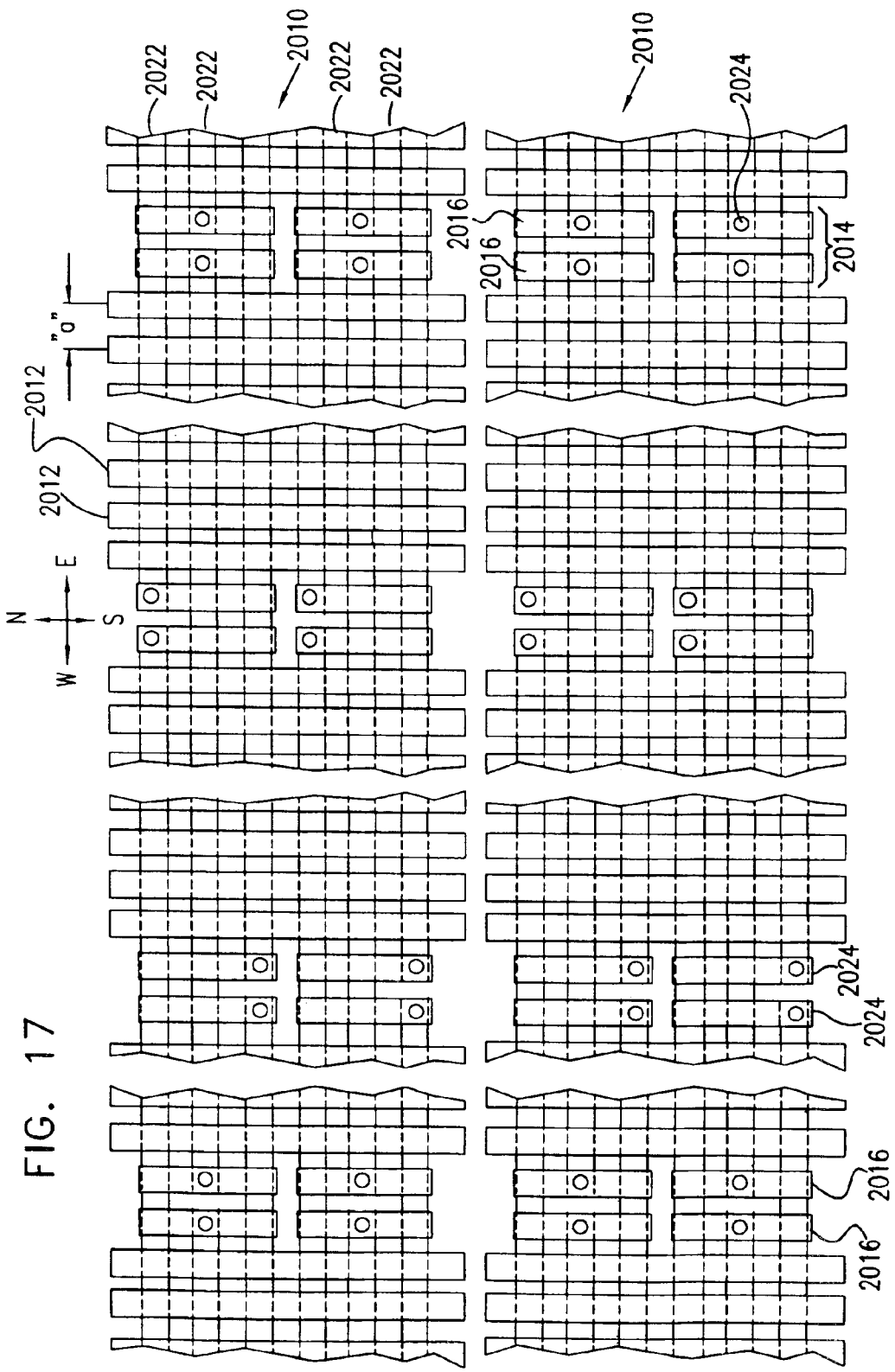
FIG. 17 is a schematic illustration corresponding to FIG. 15.

Reference is now made to FIG. 15, which is a pictorial illustration of the lower two of the top three metal layers of a cell array device constructed and operative in accordance with a preferred embodiment of the present invention, prior to customization and to FIG. 17 which is a schematic illustration corresponding thereto.

In accordance with a preferred embodiment of the invention, the cell array device of FIG. 15, when customized, includes a total of seven metal layers, identified as M1–M7, the top metal layer being identified as M7. Metal layers M1–M3 are employed for constructing logic units or cells. Layers M4–M7 are employed for routing signals between cells. Generally metal layers M6 and M7 are employed for relatively short or local routing paths, while metal layers M4 and M5 are employed for long or global routing. Typically metal layers M4 and M6 provide routing generally in North-South directions, in the sense of FIG. 17, while metal layers M5 and M7 provide routing generally in East-West directions.

FIGS. 15–29 shows various arrangements which provide such routing and in which metal layers M1–M6 are fixed.

Customization is carried out only on vias connecting metal layers M6 and M7, here termed M6M7 vias, or on both M6M7 vias and on metal layer M7.

In FIG. 15, the top metal layer M7 is not shown, inasmuch as this metal layer is added during customization, as will be described hereinbelow with reference to FIG. 16 and to FIG. 18, which is a schematic illustration corresponding thereto.

The basic structure shown in FIG. 15 comprises an M6 metal layer which comprises multiple spaced bands 2010 of parallel evenly spaced metal strips 2012, the center lines of which are preferably separated one from the other by a distance "a". At a given periodicity, typically every twenty strips 2012, a plurality of pairs 2014 of short strips 2016 is provided. The number of pairs 2014 of short strips 2016 and their length is a matter of design choice. Strips 2012 and 2016 are shown running North-South.

Underlying the M6 metal layer is an M5 metal layer comprising parallel evenly spaced metal strips 2022 extending East-West in the sense of FIG. 15 in bands 2010. In the illustrated embodiment of FIG. 15, strips 2022 each underlie three pairs 2014 of short strips 2016 and are each connected at opposite ends thereof by means of an M5M6 via 2024 to a strip 2016. It is noted that adjacent ones of strips 2022 begin and end at strips 2016 of different pairs 2014, such that each pair 2014 of strips 2016 is connected to strips 2022 extending along a different axis. It is appreciated that each strip 2016 preferably is connected to only a single strip 2022.

It is appreciated that the embodiment of FIG. 15 is merely exemplary in that, for example, each strip 2016 may overlie more than three strips 2022 and thus each strip 2022 may underlie more than three pairs 2014 of short strips 2016.

Figure 16:
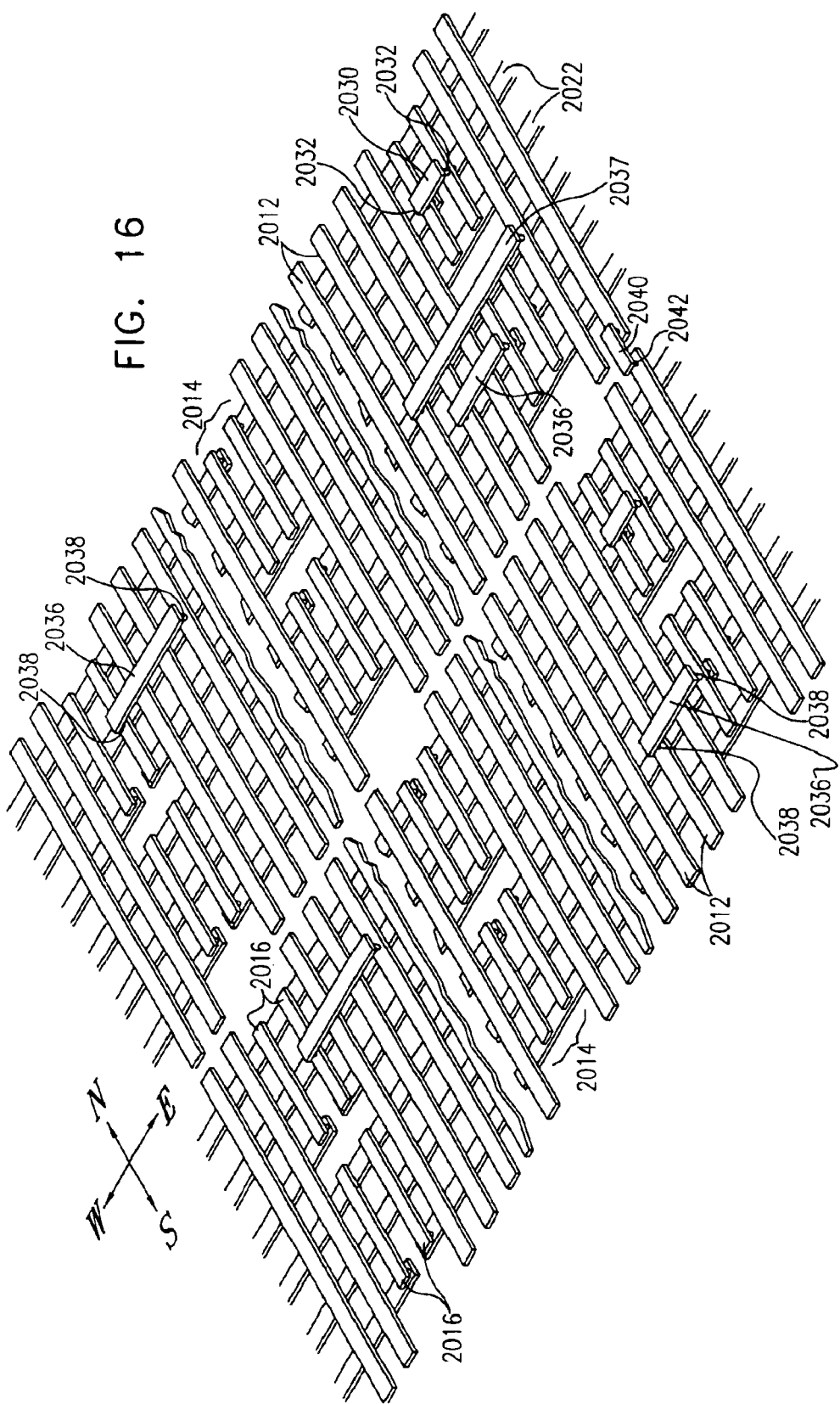
FIG. 16 is a pictorial illustration corresponding to FIG. 15 following customization thereof in accordance with a preferred embodiment of the present invention.

Reference is now made to FIG. 16, which is a pictorial illustration corresponding to FIG. 15 following customization thereof. It is seen that in FIG. 16 an M7 layer is added for customization of the cell array. The M7 layer may include a bridge 2030 connected by M6M7 vias 2032 to adjacent strips 2016 of a pair 2014, thus effectively connecting two strips 2022 lying along the same elongate axis.

The M7 layer may also provide another type of connection, such as connections 2036 between one of strips 2016 and a strip 2012, by means of M6M7 vias 2038. This type of connection provides a circuit connection between a strip 2022 and a strip 2012.

The M7 layer may additionally provide a further type of connection, such as connections 2040 between strips 2012 in two adjacent bands 2010, by means of M6M7 vias 2042. This type of connection provides a North-South circuit connection by means of strips 2012.

Figure 18:
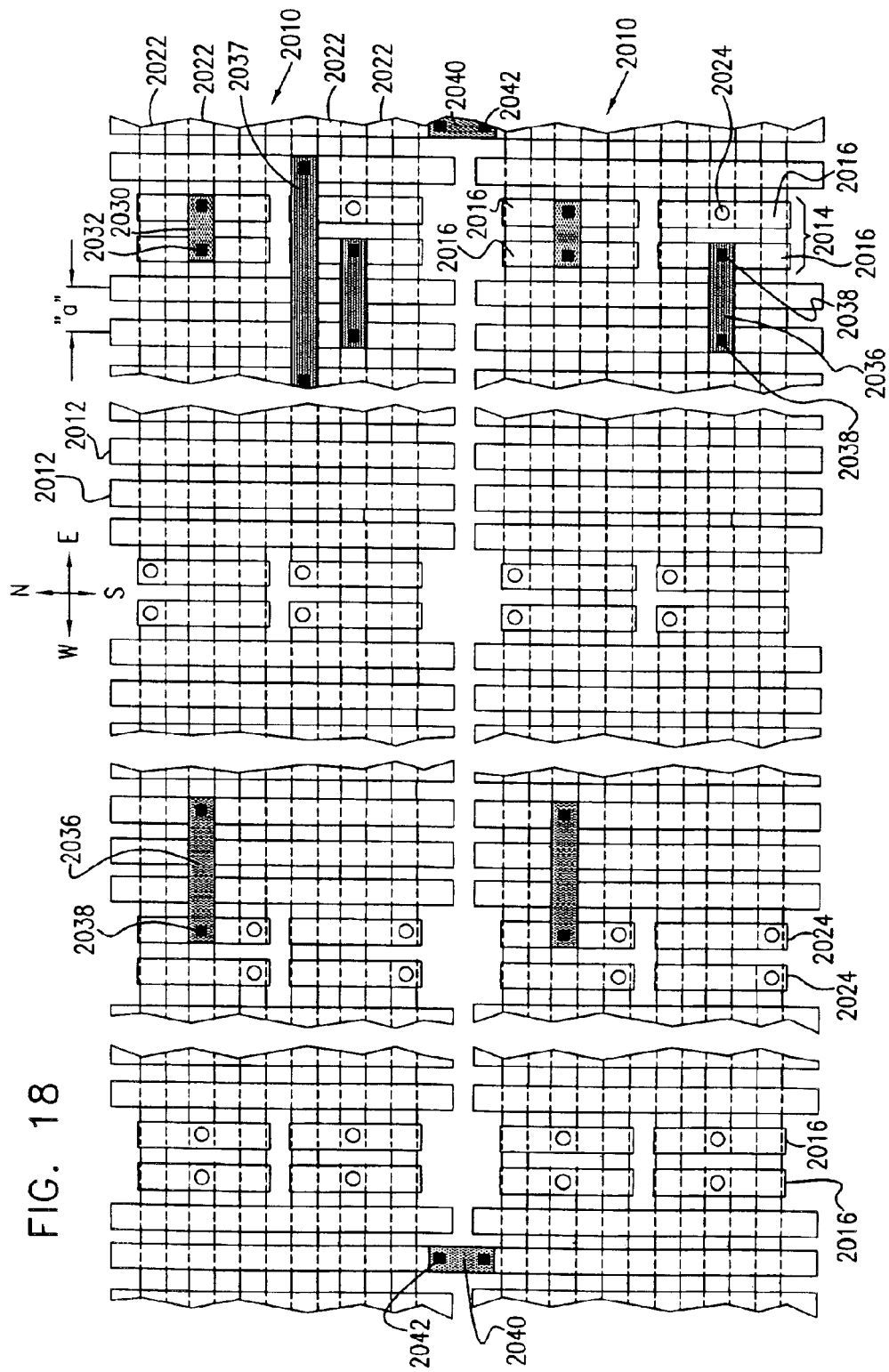
FIG. 18 is a schematic illustration corresponding to FIG. 16.

It is appreciated that the customized structure of FIGS. 16 & 18 enables a signal received along a strip 2022 to be conveyed in an East-West direction via strips 2022 and to be coupled to a strip 2012 at an appropriate East-West location. In accordance with a preferred embodiment of the present invention, in the customization of the structure of FIGS. 15 & 17, in each band 2010, a single elongate axis is employed for placement of bridges 2030 for interconnecting underlying strips 2022 to provide East-West routing and for placement of connections 2036 between strip 2012 and strip 2022 for long routing of signals in East-West directions, as shown in FIGS. 16 & 18. The other parallel East-West elongate axes are employed for shorter East-West routing.

Figure 19:
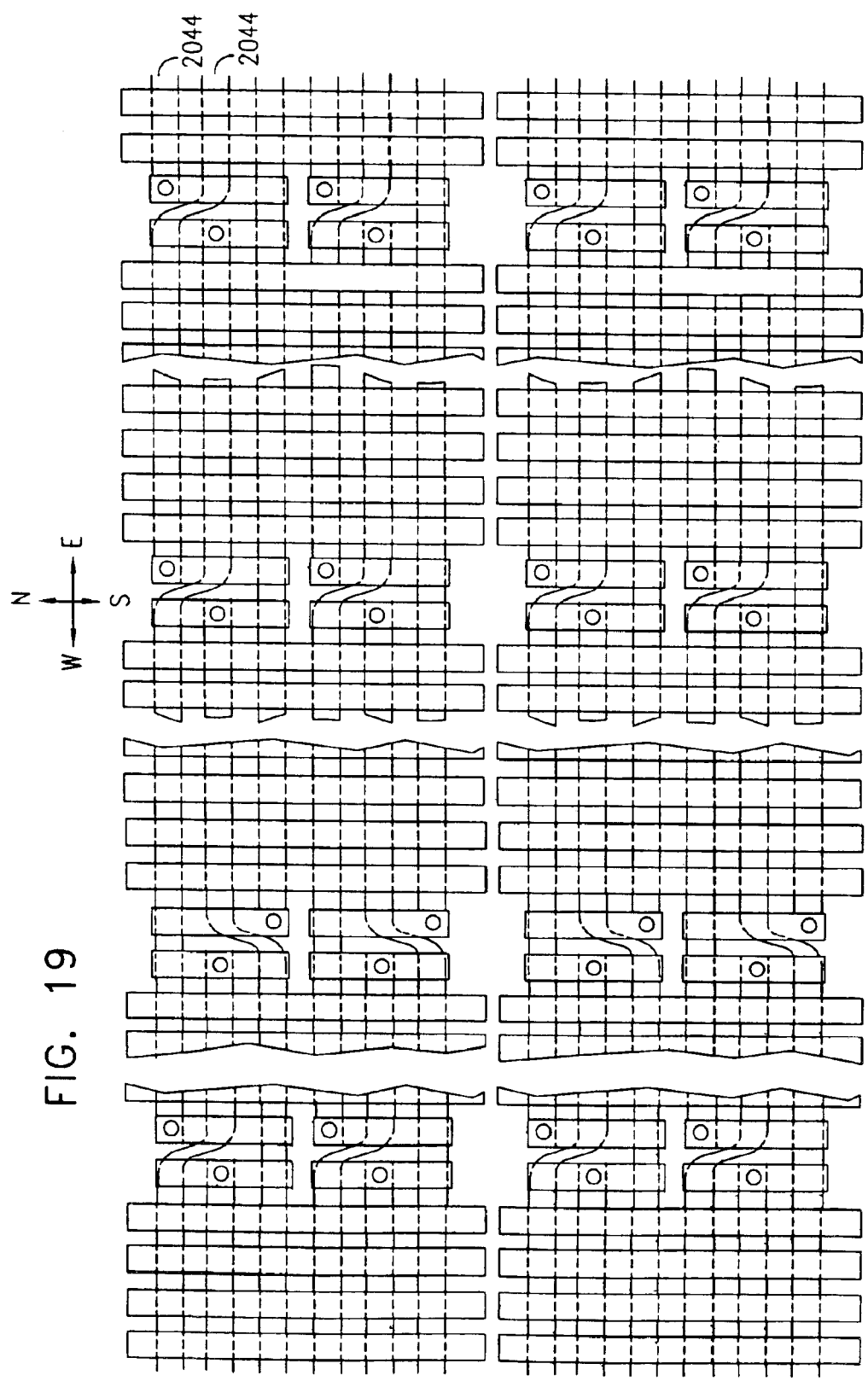
FIG. 19 is a schematic illustration corresponding to FIGS. 15 & 17 but showing a variation in the arrangement of the lowest of the three metal layers.
Figure 20:
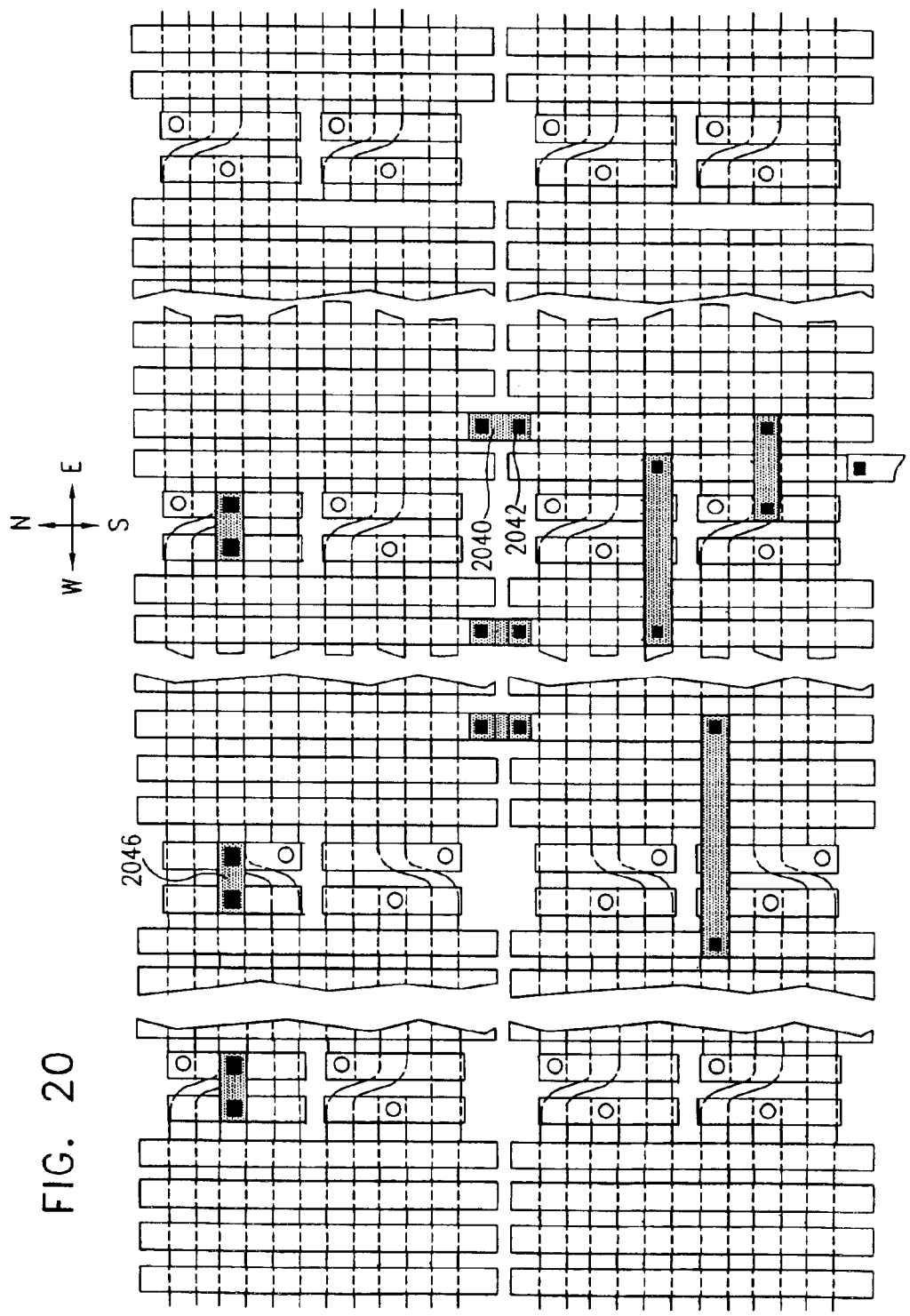
FIG. 20 is a schematic illustration corresponding to FIG. 19 following customization thereof in accordance with a preferred embodiment of the present invention.

Reference is now made to FIG. 19, which is a schematic illustration corresponding to FIGS. 15 & 17 but showing a variation in the arrangement of the lowest of the three metal layers. This variation is provided principally to help overcome problems of signal crosstalk between signals traveling alongside each other along strips 2022 over a relatively long distance. In the arrangement of FIG. 19, each strip 2044, corresponding to strip 2022 (FIGS. 15 & 17) shifts its elongate axis at least one location therealong. As seen in FIG. 20, customization of the embodiment of FIG. 19 may include bridges 2046 between adjacent strips 2016 of a pair 2014, which provide a continuation of East-West routing and also produce a switch between the longitudinal axes of two adjacent strips 2044, thus decreasing crosstalk. This is accomplished by limiting the distance that signals travel alongside each other by means of switching and mixing the order of the long routing conductors.

It is appreciated that although the shift is shown embodied in the M5 metal layer, it may be carried out using appropriate vias and an underlying metal layer.

Reference is now made to FIG. 21, which is a schematic illustration corresponding to FIGS. 15 & 17 but showing a variation in the arrangement of the middle of the top three metal layers. This arrangement is provided in order to take into account often oversize strips in M7 layers which, due to their size, could not be placed side by side to provide bridges for adjacent strips 2012 without creating a short circuit therebetween.

Figure 22:
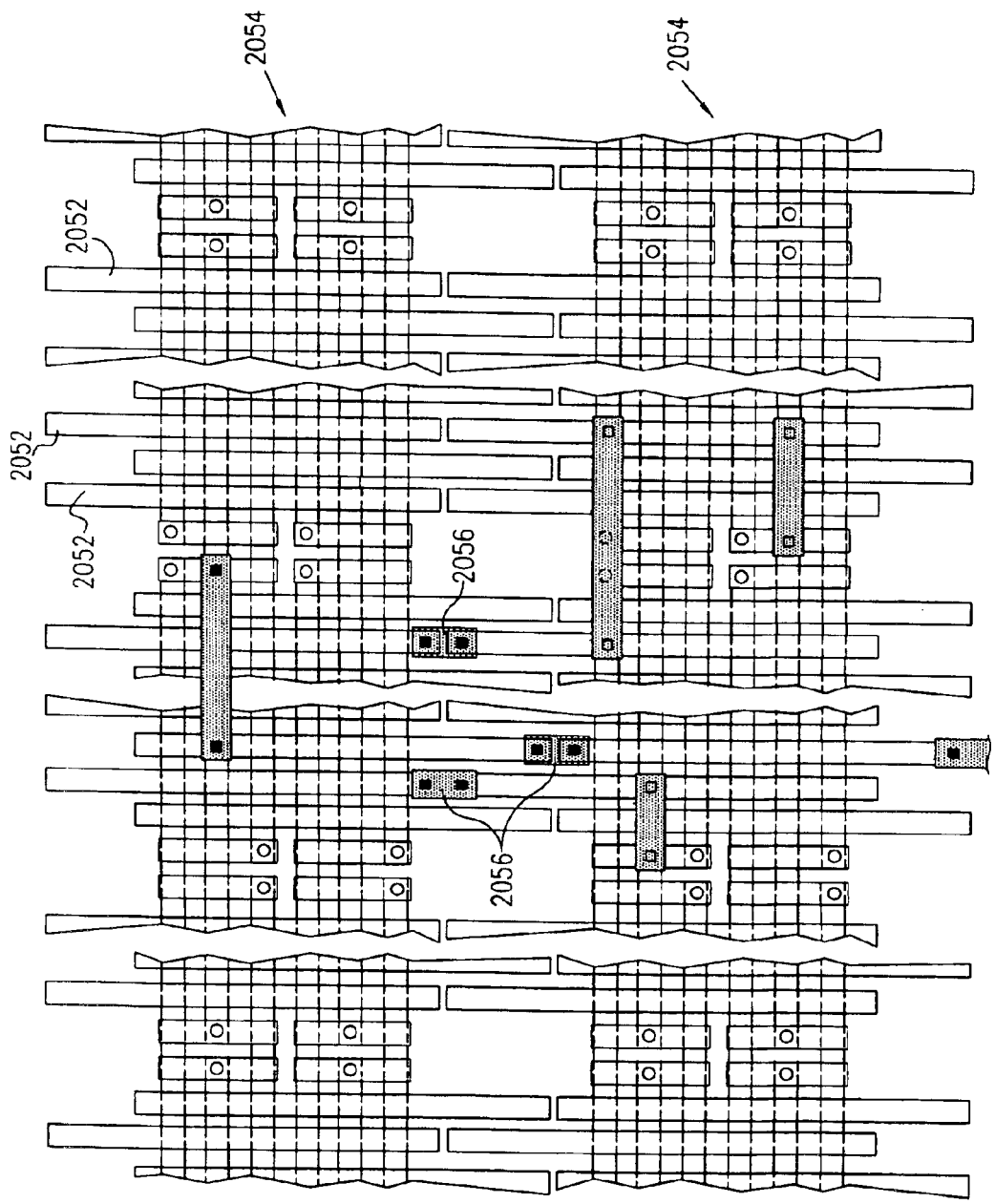
FIG. 22 is a schematic illustration corresponding to FIG. 21 following customization thereof in accordance with a preferred embodiment of the present invention.

The arrangement of FIG. 21 is distinguished from that of FIGS. 15 & 17 in that whereas in FIGS. 15 & 17, strips 2012 of each band 2010 all terminate in a line, defining an elongate edge of band 2010, which is spaced from the corresponding elongate edge of an adjacent band 2010, in FIG. 21, the strips 2052 of adjacent bands 2054 do not terminate at the same North-South location. Thus, in the embodiment of FIG. 21, the strips of adjacent bands 2054 are interlaced. As seen in FIG. 22, bridges 2056 between strips 2052 of adjacent bands 2054 are thus offset from each other, providing ample spacing therebetween notwithstanding the relatively large width of the bridges.

Reference is now made to FIGS. 23A and 23B, which together show a schematic illustration of the lower four of the top five metal layers of a cell array device constructed and operative in accordance with another preferred embodiment of the present invention, prior to customization.

In accordance with a preferred embodiment of the invention, the cell array device of FIGS. 23A and 23B, when customized, includes a total of seven metal layers, identified as M1–M7, the top metal layer being identified as M7. In FIGS. 23A and 23B, the top metal layer M7 is not shown, inasmuch as this metal layer is added during customization, as will be described hereinbelow with reference to FIGS. 24A and 24B.

The basic structure shown in FIGS. 23A and 23B comprises a M6 metal layer which comprises multiple spaced bands 2110 of parallel evenly spaced metal strips 2112, the center lines of which are preferably separated one from the other by a distance "a". Pair 2114 provides connections to long routing conductors in North-South directions, which are implemented by M4 strips 2132 and 2133 as described hereinbelow.

Underlying the M6 metal layer typically is an M5 metal layer comprising parallel evenly spaced metal strips 2122 extending East-West in the sense of FIGS. 23A and 23B in bands 2110. In the illustrated embodiment of FIGS. 23A and 23B, strips 2122 each extend across three pairs 2115 of short strips 2117 and are each connected at opposite ends thereof by means of an M5M6 via 2124 to a strip 2117. Pair 2115 provides connections to long routing conductors in East-West directions.

It is noted that adjacent ones of strips 2122 begin and end at strips 2117 of different pairs 2115, such that each pair 2115 of strips 2117 is connected to strips 2122 extending along a different axis. It is appreciated that each strip 2117 preferably is connected to only a single strip 2122. The portion of the pattern which provides long routing conductors in East-West directions along M5 strips 2122 is described hereinabove with reference to FIGS. 15 & 17. The M5 layer also comprises a plurality of bridge elements 2126 which extend parallel to strips 2122.

Underlying the M5 metal layer there is provided an M4 metal layer preferably comprising evenly spaced stepped strips 2132 and straight strips 2133, extending generally North-South in the sense of FIGS. 23A and 23B across multiple bands 2110. At a given periodicity, typically every four to seven strips 2112, a plurality of pairs 2114 of coaxial short strips 2116 is provided.

FIGS. 23A and 23B show a single band 2111 of parallel stepped strips 2132 and straight strips 2133. Multiple similar bands 2111 extending in the North-South directions are provided in a semiconductor device. Strips 2112 and 2116 are shown running North-South. The Southmost end of each strip 2132 is connected by an M4M5 via 2134 and an M5M6 via 2136 to a Northmost end of a strip 2116 of a pair 2114. A facing end of a second strip 2116 of pair 2114 is connected by an M5M6 via 2136 to an Westmost end of a bridge element 2126, the Eastmost end of which is connected by an M4M5 via 2134 to a Northmost end of a strip 2133.

The Southmost end of a strip 2133 is connected by an M3M4 via 2138 to the Northmost end of an L-shaped tunnel 2140 embodied in an M3 metal layer. The South-Westmost end of tunnel 2140 is connected by an M3M4 via 2138 to the Northmost end of a strip 2132.

Reference is now made to FIGS. 24A and 24B, which together show a schematic illustration corresponding to FIGS. 23A and 23B following customization thereof. It is seen that in FIGS. 24A and 24B an M7 layer is added for customization of the cell array. The M7 layer may include a bridge 2141 connected by M6M7 vias 2142 to adjacent strips 2116 of a pair 2114, thus effectively connecting two strips 2132.

The M7 layer may also provide another type of connection, such as connections 2153 between one of strips 2116 and a strip 2112, by means of M6M7 vias 2142. This type of connection provides a circuit connection between a strip 2132 and a strip 2112 employing short strip 2116, thereby to route signals over a relatively long distance in North-South directions. It is appreciated that the arrangement of FIGS. 24A and 24B enables all connections to North-South M4 strips 2132 and 2133 to be made generally along one North-South axis 2114.

The M7 layer may also provide a further type of connection, such as connections 2150 between strips 2112 in two adjacent bands 2110, by means of M6M7 vias 2142. This type of connection provides a North-South circuit connection by means of strips 2112. Connections 2152 between strips 2112 in the same band and a connection 2155 between strip 2117 and strips 2112 in the same band may also be provided. It is thus appreciated that the customized structure of FIGS. 24A and 24B enables a signal received along a strip 2122 to be conveyed in an East-West direction via strips 2122 and to be coupled to a strip 2132 at an appropriate East-West location by properly employing the M7 layer and the M6M7 vias 2142 using M6 strips 2112, 2116 and 2117. FIGS. 24A and 24B show such a structure employing M7 connections 2150,2153 and 2155.

Figures 25A, 25B, 25C:
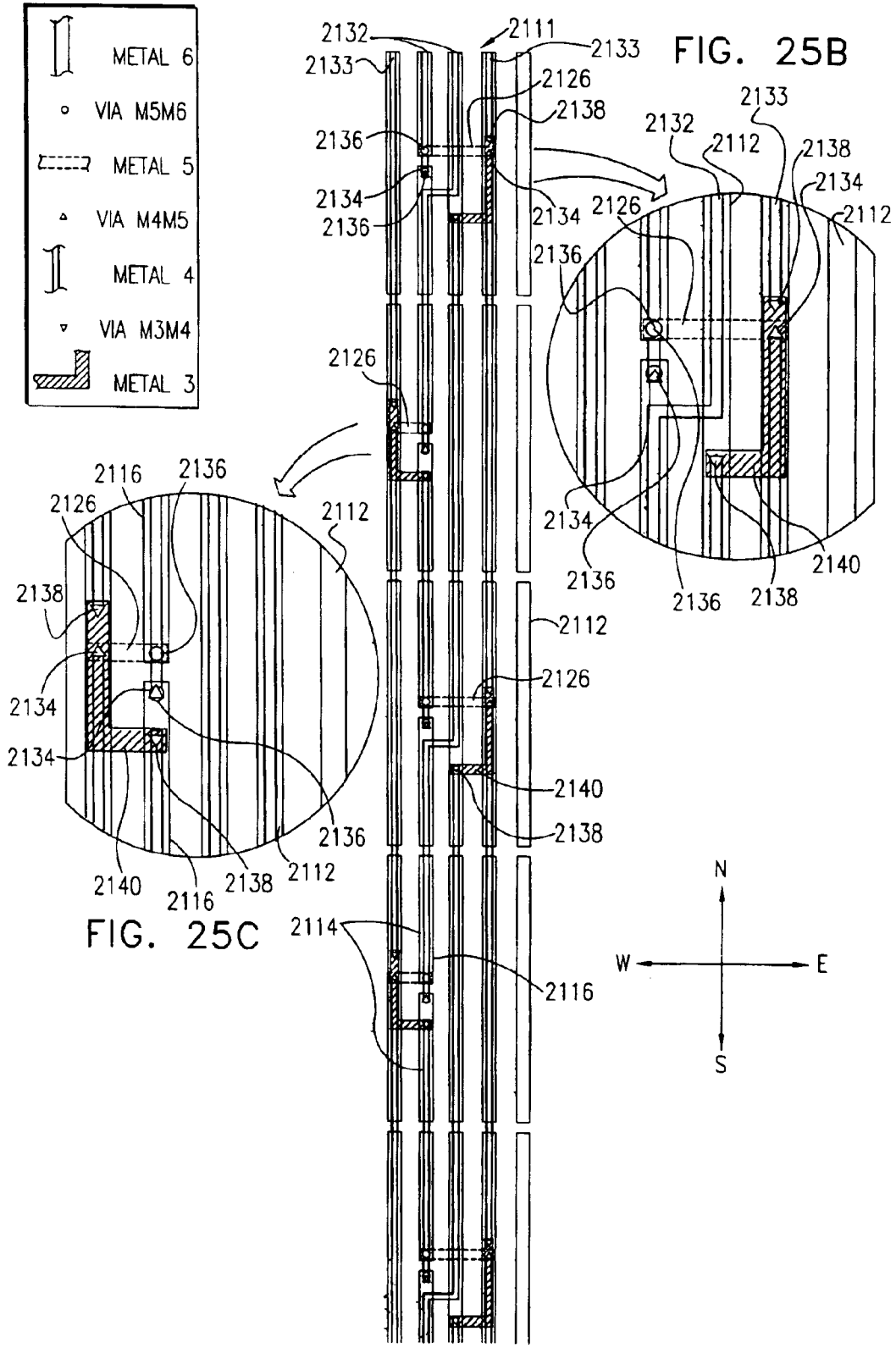
FIGS. 25A, 25B, and 25C schematically illustrate the lower four of the top five metal layers of a cell array device constructed and operative in accordance with yet another preferred embodiment of the present invention, prior to customization.

Reference is now made to FIGS. 25A, 25B, and 25C, which together show a schematic illustration corresponding to FIGS. 23A and 23B but showing a variation in the arrangement of the M3, M4 and M5 metal layers. This variation is provided principally to help overcome problems of signal crosstalk between signals traveling alongside each other along strips 2132 over a relatively long distance. In the arrangement of FIGS. 25A, 25B, and 25C, there is provided in the M4 metal layer an arrangement which enables shifting of the elongate axis of North-South extending conductors in both East and West directions, thus enabling crosstalk to be decreased by appropriate switching of the order of strips 2132. This is accomplished by limiting the distance that signals travel alongside each other by means of switching and mixing the order of the long routing conductors.

FIGS. 26A, 26B, and 26C show the configuration of FIGS. 25A, 25B, and 25C following exemplary customization by the addition of a via M6M7 2142 and M7 layers 2150 and 2153.

Figure 27:
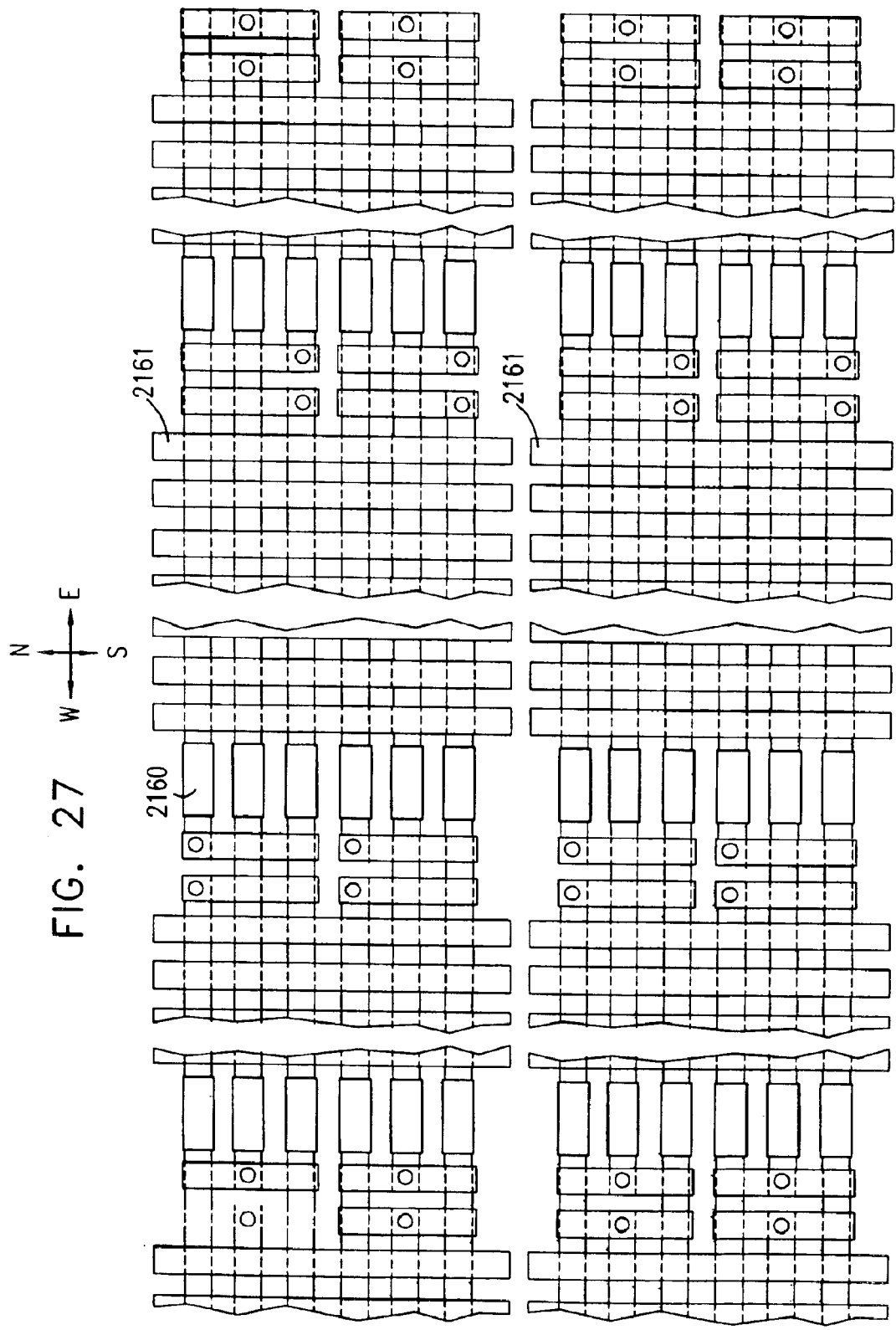
FIG. 27 is a schematic illustration corresponding to FIG. 15 with additional bridges in the middle of the top three metal layers.

Reference is now made to FIG. 27, which is a schematic illustration corresponding to FIGS. 15 & 17 with additional bridges 2160 in the M6 layer extending perpendicular to metal strips 2161, which correspond to strips 2012 in the embodiment of FIGS. 15 & 17.

FIG. 27 together with FIGS. 28 and 29, which is referred to hereinbelow, illustrate another preferred embodiment of the present invention wherein customization is effected only in M6M7 vias. This embodiment provides savings in customization tooling by keeping the M7 metal layer fixed.

Figure 28:
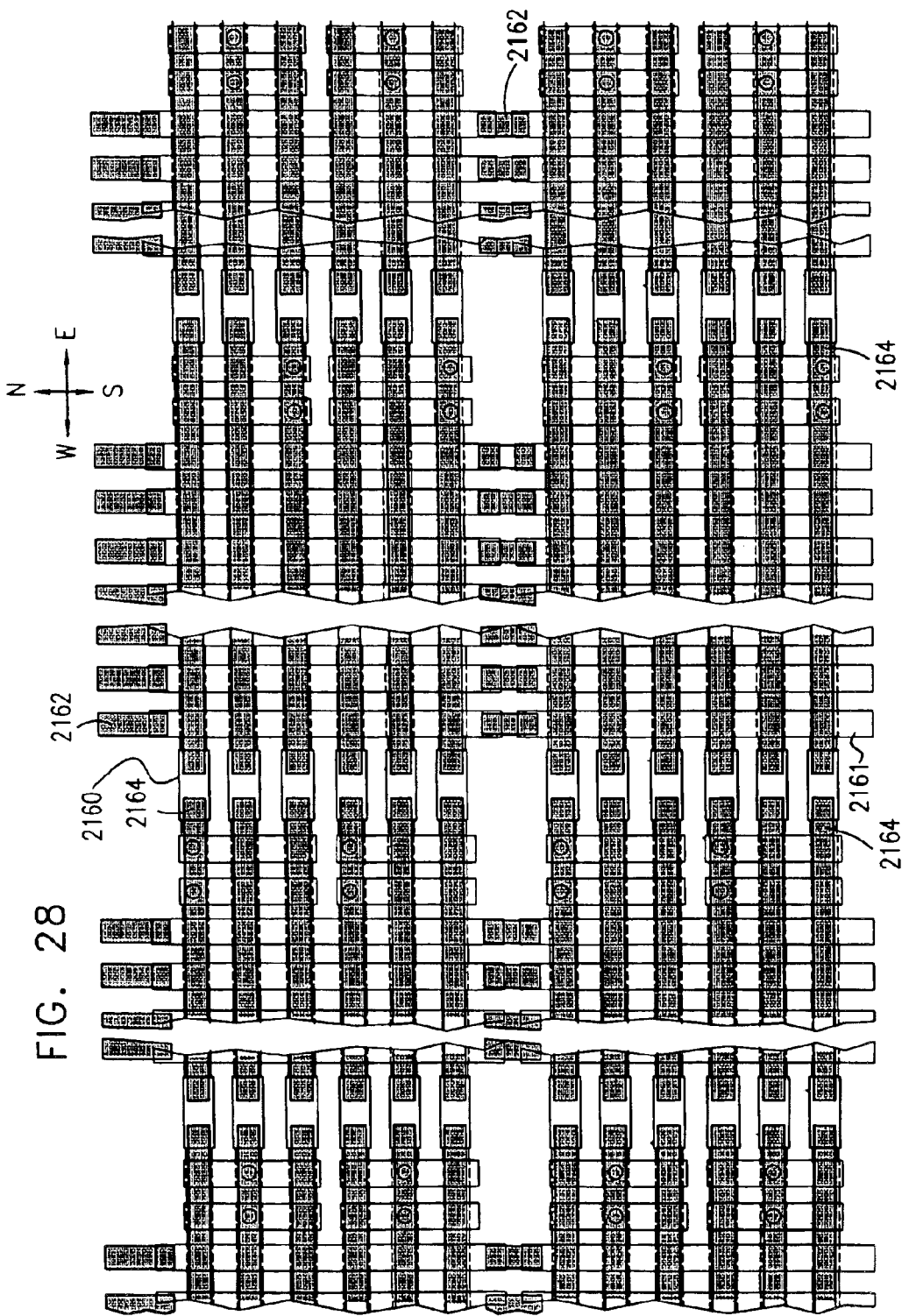
FIG. 28 is a schematic illustration corresponding to FIG. 27 and showing the top metal layer, prior to customization.

FIG. 28 is a schematic illustration corresponding to FIG. 27 and showing the top metal layer M7, prior to customization. As seen in FIG. 28, the M7 layer includes bridges 2162 extending North-South and relatively long strips 2164 extending East-West. Strips 2164 partially overlie bridges 2160 shown in FIG. 27 and bridges 2162 partially overlie strips 2161 shown in FIG. 27.

Figure 29:
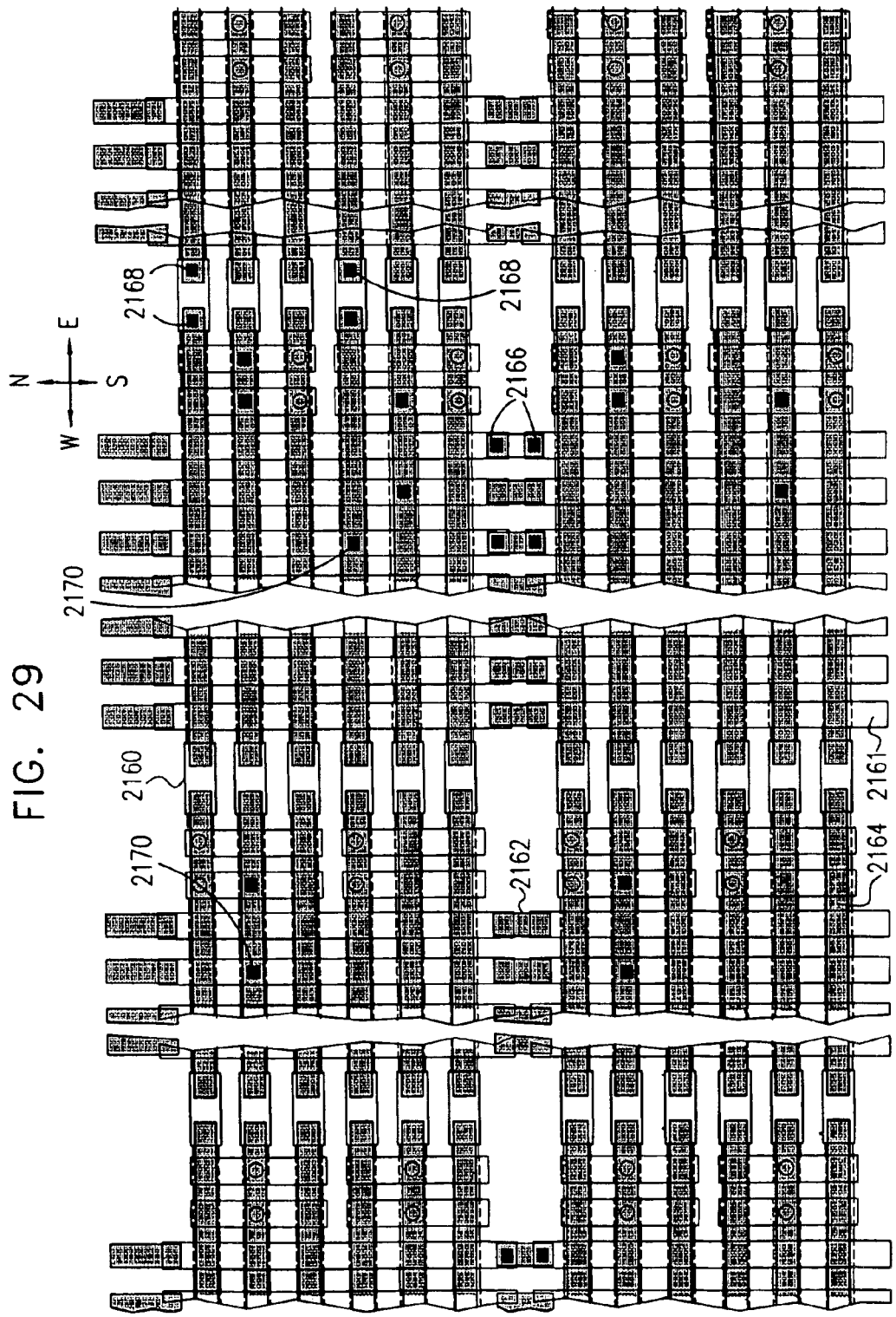
FIG. 29 is a schematic illustration corresponding to FIG. 28 having via customization in accordance with a preferred embodiment of the present invention.

FIG. 29 is a schematic illustration corresponding to FIG. 28 having via customization. It is seen that M6M7 vias 2166 interconnect strips 2161 (FIG. 27) by employing bridges 2162 as shown in (FIG. 28) in order to provide North-South routing. Other M6M7 vias 2168 interconnect strips 2164 (FIG. 28) by employing bridges 2160 (FIG. 27) in order to provide East-West routing. Additional M6M7 vias 2170 interconnect strips 2161 shown in FIG. 27, with strips 2164 shown in FIG. 28, in order to interconnect the East-West routing with the North-South routing.

The following drawings, FIGS. 30 to 36, show typical designs of the various layers constructed and operative in accordance with a preferred embodiment of the present invention.

Figure 31:
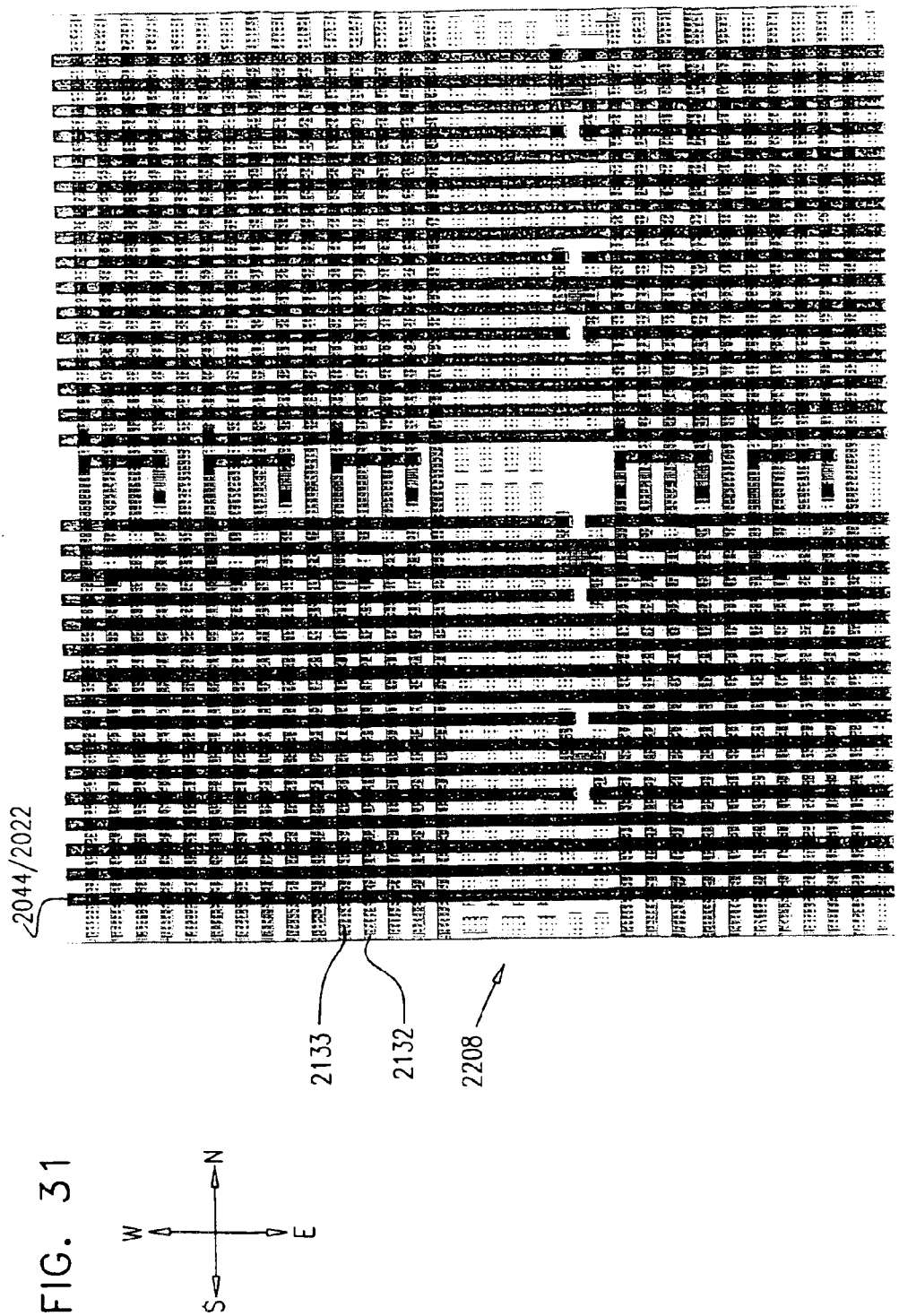
FIG. 31 illustrates a single routing cell unit of similar construction to the single cell routing unit of FIG. 30, but without the I/O contacts.

Reference is now made to FIG. 30, which illustrates a single routing cell unit 2200, comprising layers M4 to M6, constructed and operative in accordance with a preferred embodiment of the present invention. Preferably, the cell unit 2200 overlays a corresponding logic cell unit such as 1208, forming a cell array in accordance with a preferred embodiment of the invention. The routing cell unit 2200, illustrated in FIG. 30, comprises 3 I/O contacts 2202, 2204 and 2206 to the cell inputs and the cell outputs of the underlying logic cell (not shown) at layer M3. The routing cell unit 2200 in FIG. 30 also shows strips 2044/2022, typically located in an E-W direction, and corresponding to the strips 2044/2022 shown in FIGS. 17 and 19. The cell unit 2200 shows the strips 2044/2022 overlap the N-S strips 2132 and 2133, as described hereinabove with respect to FIGS. 23A and B and 25A–C. FIG. 31 shows a routing cell unit 2208, of similar construction to routing cell unit 2200 of FIG. 30, but without the I/O contacts 2202, 2204 and 2206.

Figure 32:
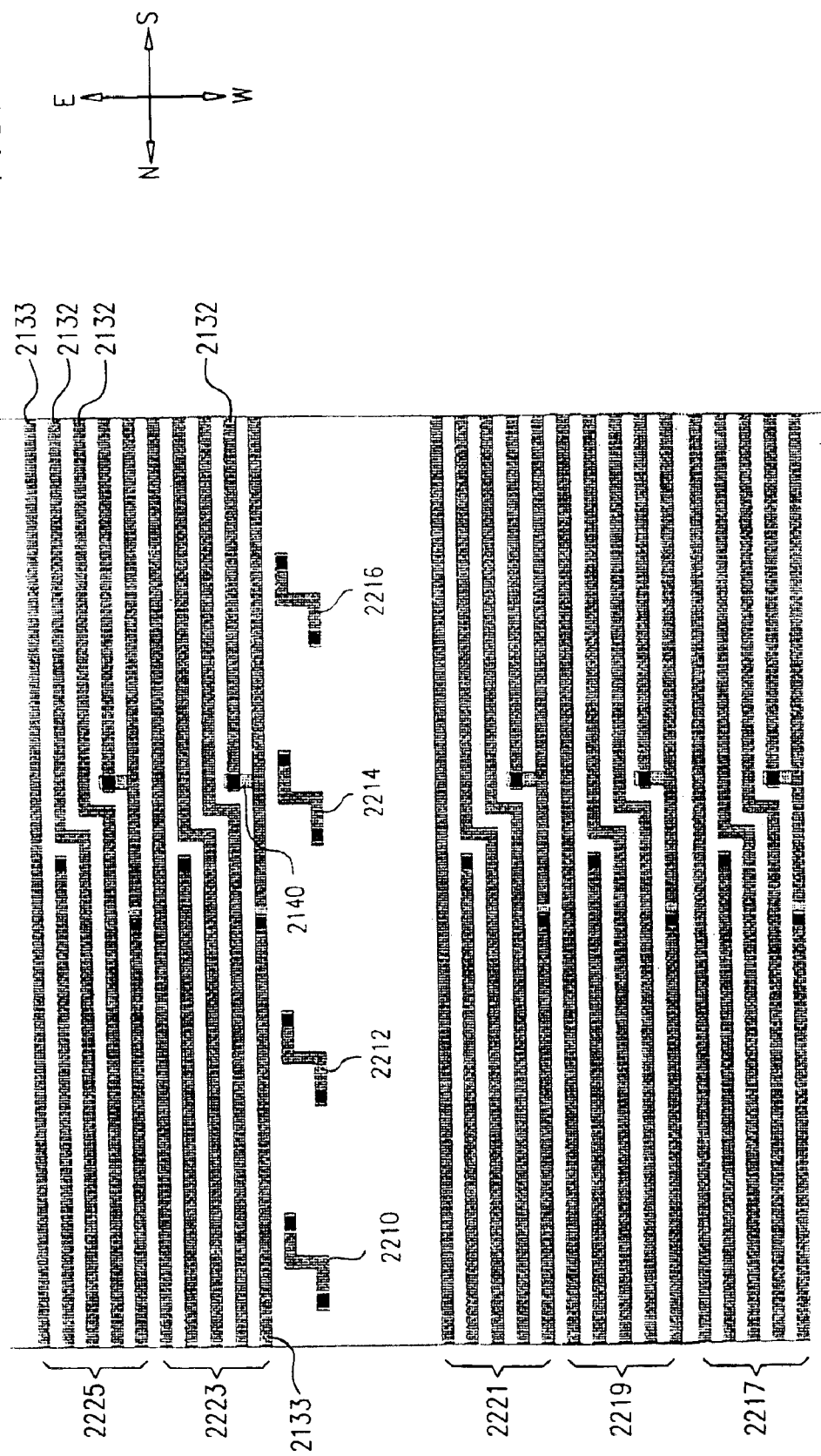
FIG. 32 illustrates typical routing connections in the M3 and M4 layers, and the M3M4 via and M4M5 via layers, of the single routing cell unit, in accordance with a preferred embodiment of the present invention.

Reference is now made to FIG. 32, which illustrates typical routing connections in the M3 and M4 layers, and the M3M4 via and M4M5 via layers, of the cell unit 2200. The routing connections shown in FIG. 32, correspond to the straight strips 2133 and the stepped strips 2132 shown in FIGS. 23A and B and 25A–C. FIG. 32 also shows the L-shaped tunnel 2140, embodied in the M3 layer, connecting the Southmost end of strip 2133 to the Northmost end of strip 2132. FIG. 32 further illustrates a series of S-shaped contacts 2210, 2212, 2214 and 2216, in layer M4, for providing a shift between strips 2044 of layer M5 using the M4M5 vias, as described hereinabove with respect to FIG. 19. The contacts 2210, 2212, 2214 and 2216, help to reduce the crosstalk between parallel strips, as discussed hereinabove with reference to FIG. 19. FIG. 32 also shows multiple bands 2217, 2219, 2221, 2223 and 2225, which run in the North-South direction, corresponding to the band 2111 of FIGS. 23A and B.

Figure 33:
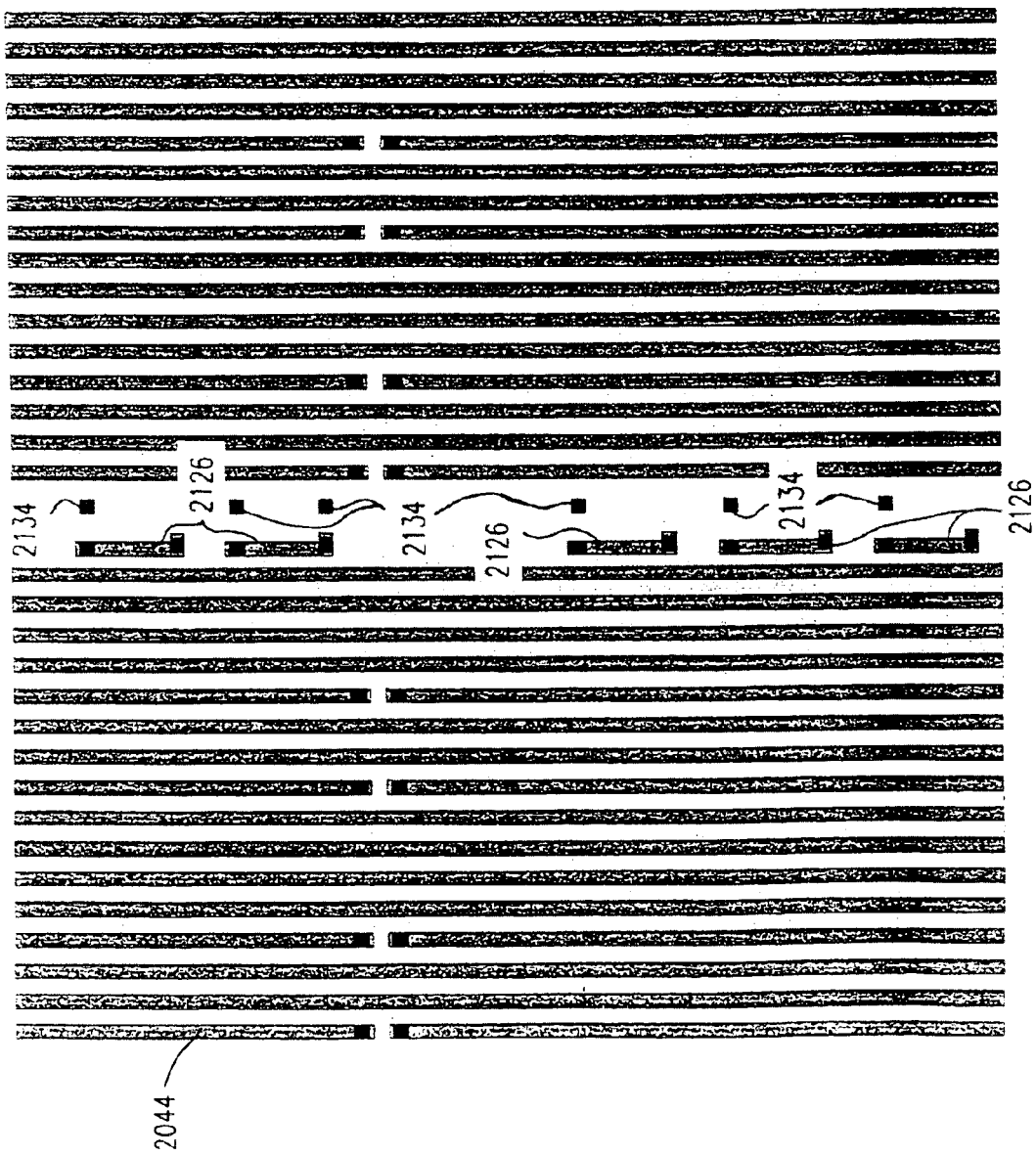
FIG. 33 illustrates an M5 layer corresponding to the arrangement described hereinabove with respect to FIG. 19.

Reference is now made to FIG. 33, which illustrates an M5 layer corresponding to the arrangement described hereinabove with respect to FIG. 19. The strips 2044 in the E-W direction, shown in FIG. 33, correspond to the strips 2044 of FIG. 33. FIG. 33 also shows bridging elements 2126 between strips 2116 and 2133 of FIGS. 23A and B and 25A–C, and a series of M4M5 vias 2134.

Figure 34:
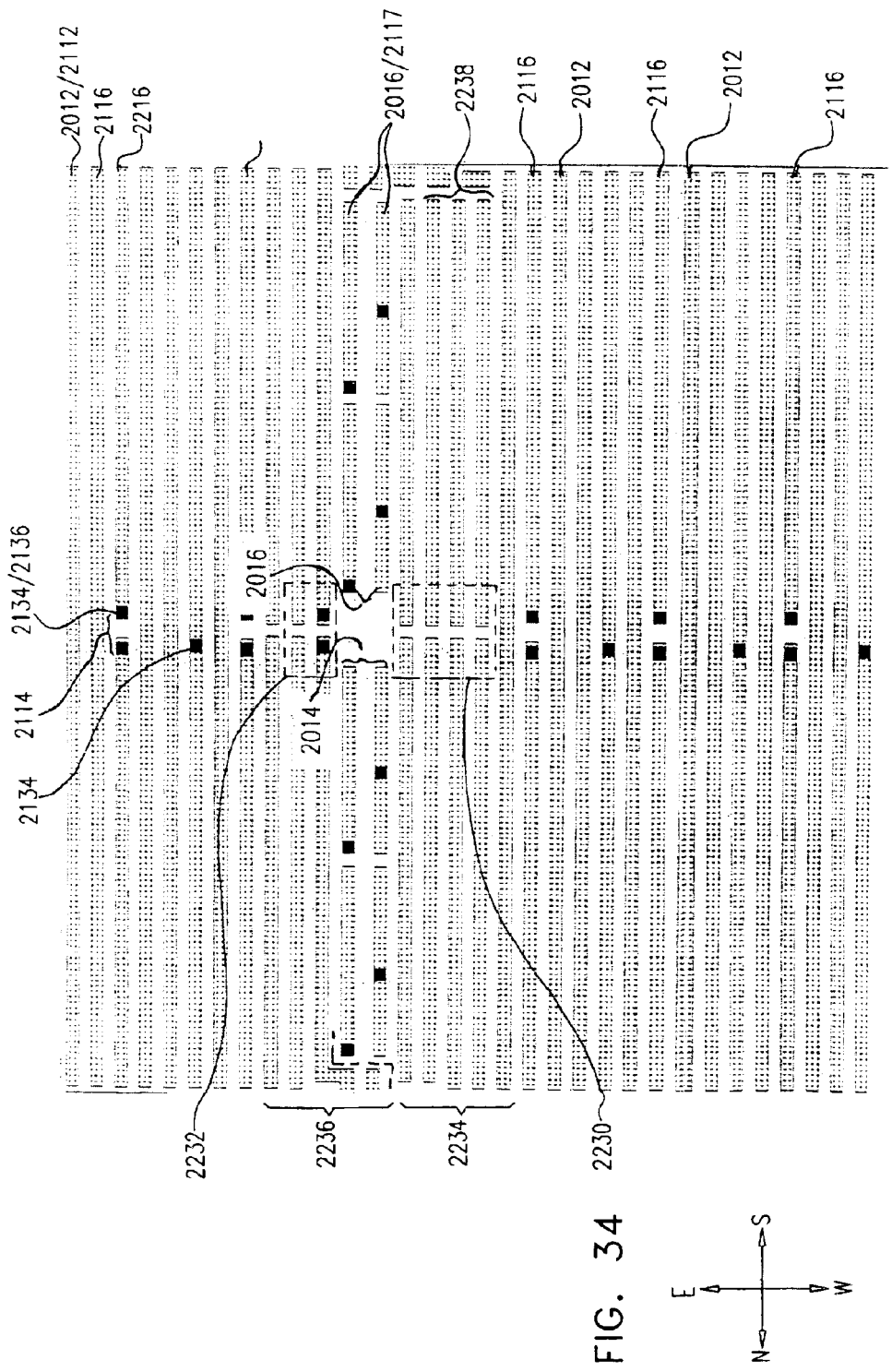
FIG. 34 illustrates an M6 layer with vias M5M6 corresponding to the M6 layers of FIG. 23.

Reference is now made to FIG. 34, which shows the M6 layer with vias M5M6, corresponding to the M6 layers of FIGS. 23A and B. Additionally, FIG. 34 shows the strips 2016/2117 and 2012/2112 corresponding to the strips in FIGS. 15 and 23A and B, and strip 2116 corresponding to the strips in FIGS. 23A and B. FIG. 34 also shows typical I/O connections 2230, 2232, 2234, 2236 and 2238.

Figure 35:
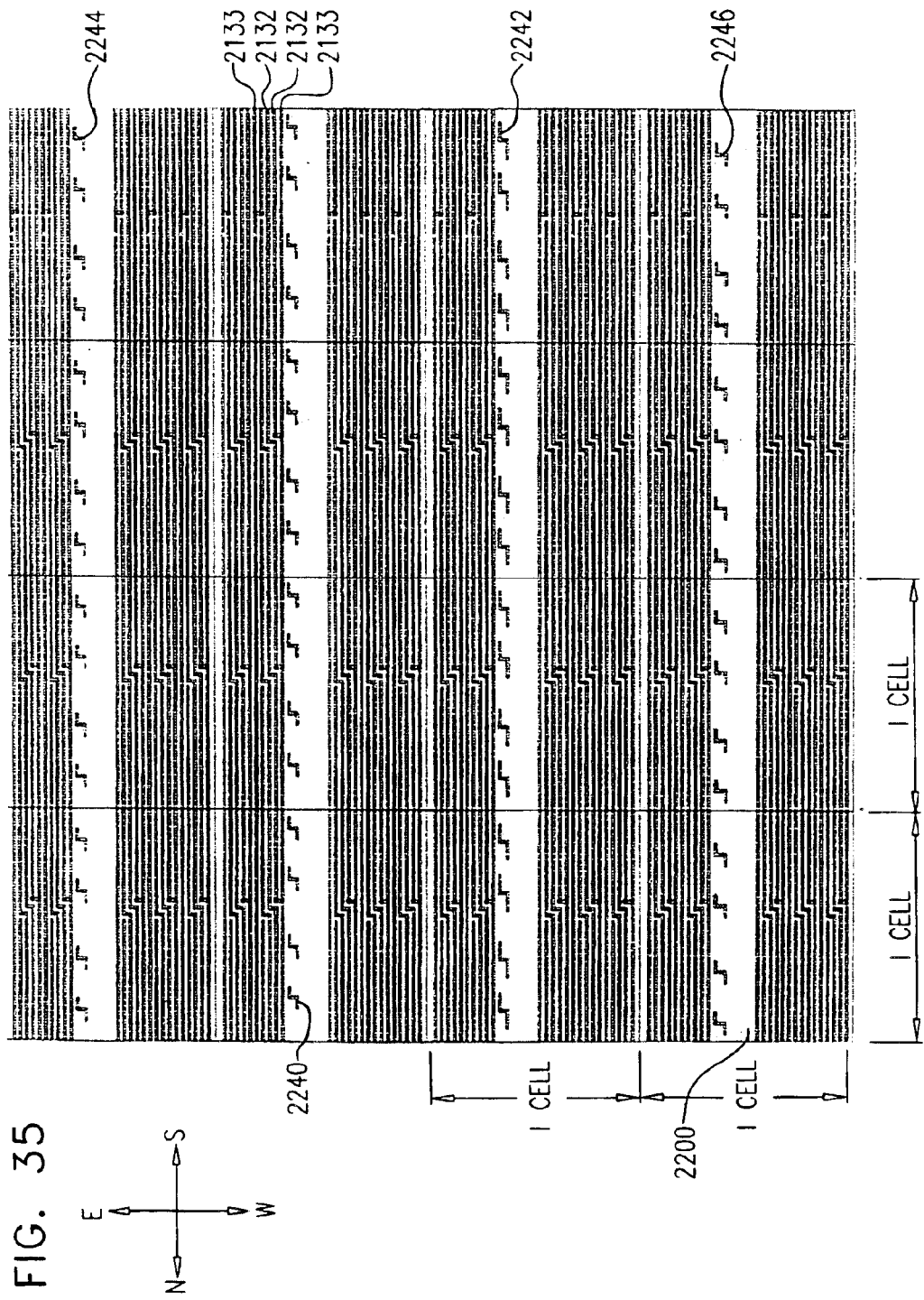
FIG. 35 illustrates a typical arrangement of 16 cells of M3 and M4 layers in a 4×4 matrix, in accordance with a preferred embodiment of the present invention.

Reference is now made to FIG. 35, and shows a typical arrangement of 16 cells 2200, as shown in FIG. 30, of M3 and M4 layers, and the M3M4 via and M4M5 via layers, in a 4×4 matrix, in accordance with a preferred embodiment of the present invention. FIG. 35 also shows the strips 2132 and 2133, corresponding to strips 2132 and 2133 of FIGS. 23A and B and 25A–C. FIG. 35 further illustrates a series of S-shaped contacts 2240, 2242, 2244, 2246 in layer M4, as described hereinabove with respect to FIG. 32, for providing a shift between strip 2044 of layer M5 using the M4M5 vias, as described hereinabove with respect to FIG. 19.

Figure 36:
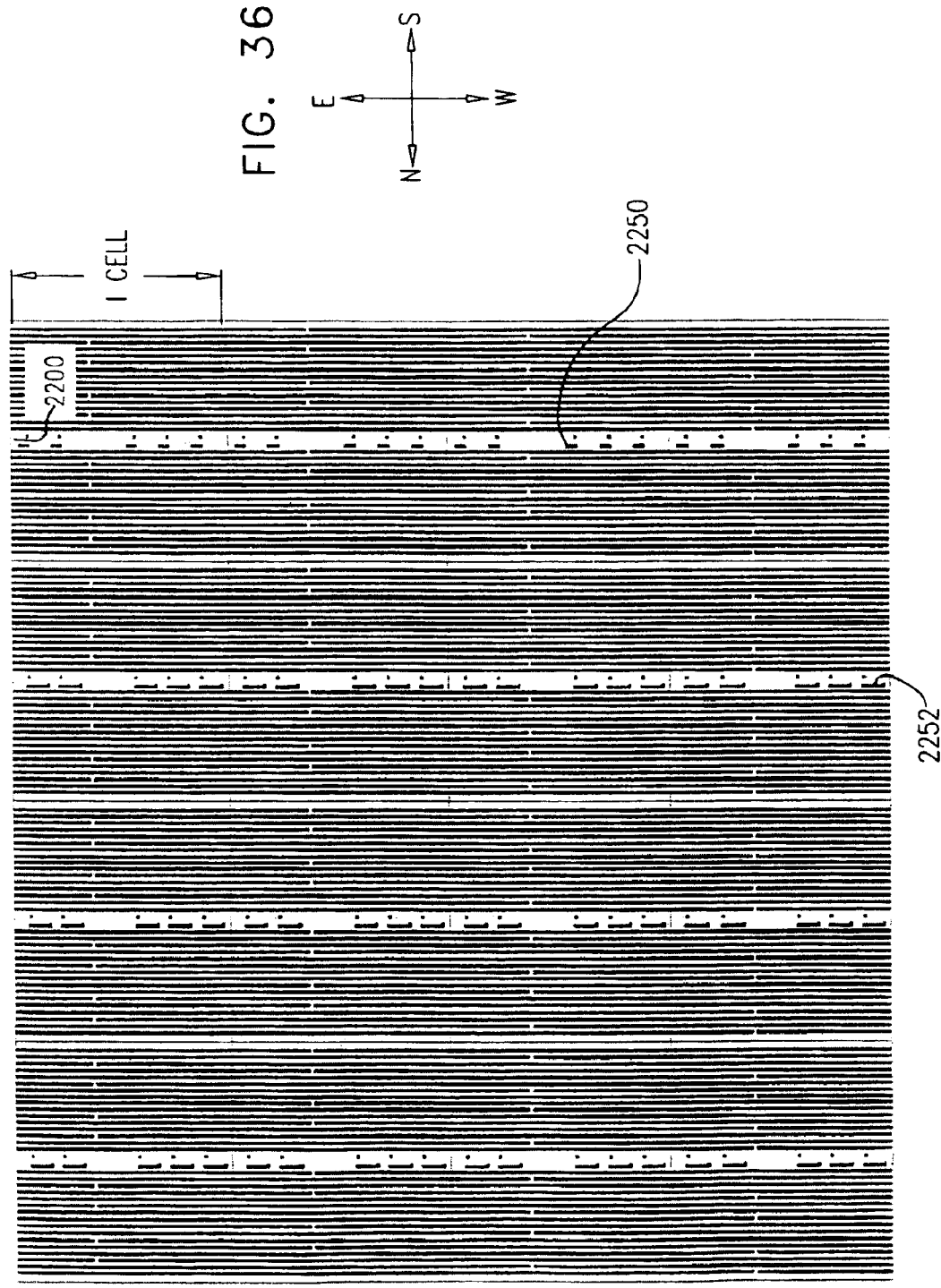
FIG. 36 illustrates an M5 layer comprising a 4×4 matrix of 16 cells, in accordance with a preferred embodiment of the present invention.

Reference is now made to FIG. 36, which illustrates an M5 layer comprising a 4×4 matrix of 16 cells 2200, in accordance with a preferred embodiment of the present invention. The M5 layer comprises strips 2044/2022, as shown in FIGS. 17 and 19, and also shows typical bridges 2250 and 2252, corresponding to the bridge 2126 of FIGS. 25A–C. The bridge 2250 is in the East direction and the bridge 2252 is in the West direction.

Figure 37:
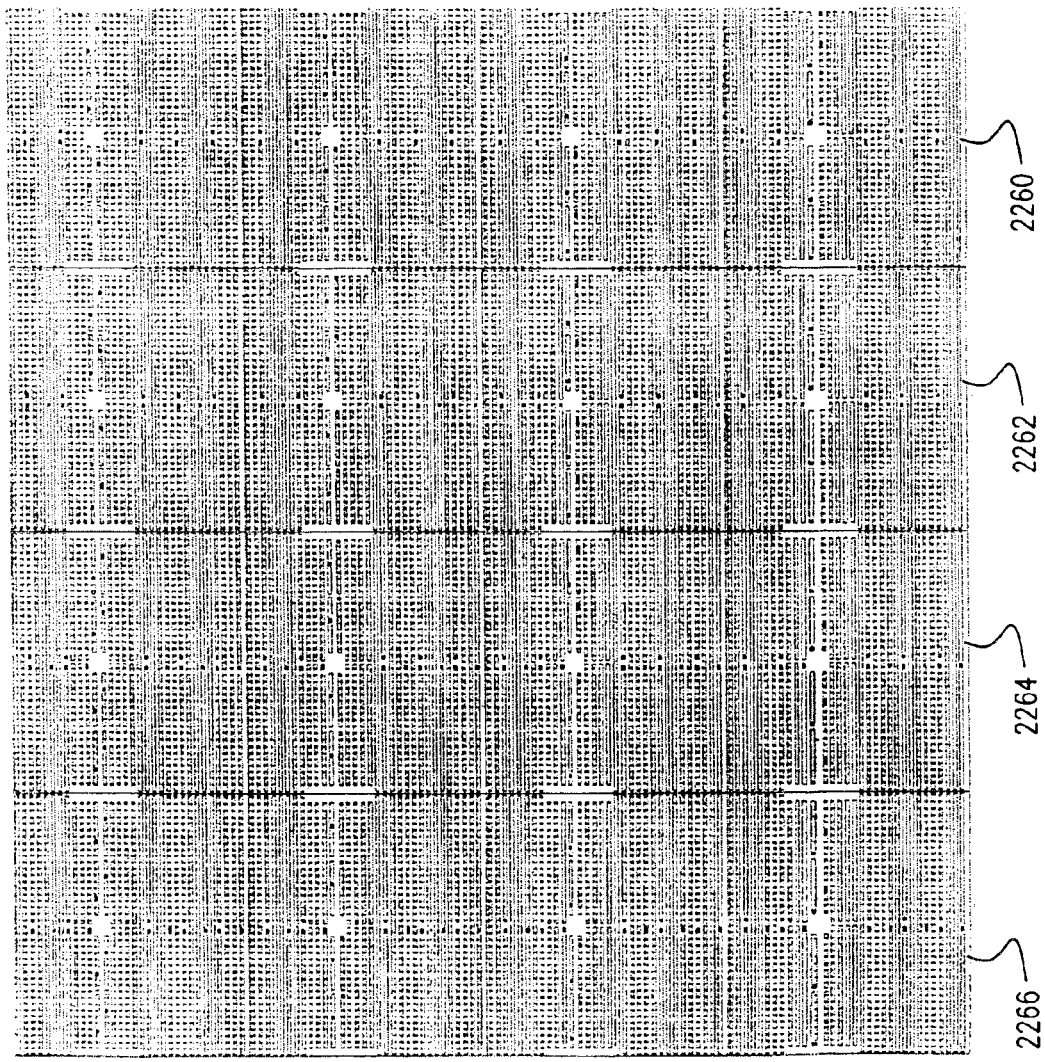
FIG. 37 illustrates an M6 layer and M5M6 via layer of a 4×4 cell matrix, in accordance with a preferred embodiment of the present invention.

Reference is now made to FIG. 37, which illustrates an M6 layer and M5M6 via layer of a 4×4 cell 2200, as shown in FIG. 30, matrix, in accordance with a preferred embodiment of the present invention. The M6 layer typically comprises multiple spaced bands 2260, 2262, 2264 and 2266, which run in the East-West direction. The multiple cells 2260 to 2266 correspond to the multiple spaced bands 2010 of FIG. 15, and to the E-W bands 2110 of FIGS. 23A and B.

Reference is now made to FIG. 38, which illustrates the layers M3, M4, M5, M6 and M7 in a 4×4 cell matrix, in accordance with a preferred embodiment of the present invention.

It is known in the art that as circuit complexity increases, test time becomes an important factor in device cost. Thus, in order to reduce test time and test costs, an easy-to-test functionality is loaded into the Look-Up-Tables of a cell array, in accordance with a preferred embodiment of the present invention. Such easy-to-test functionality may include XOR logic or NXOR logic.

An advantage of using XOR or NXOR logic is that it propagates any single change in the input to the output regardless of the logic state of the other input signals. NAND logic, for example, allows the input change to propagate only if the other inputs are at a high "1". This results in the requirement of 4 test vectors to test a NAND-3 device, including its input connections, versus 2 test vectors to test a XOR-3, including its input connections. Since many designs have 4 levels of logic between Flip/Flop (F/F) devices, the number of test vectors required to test a complex circuit could thus be reduced by an order of magnitude using this technique.

The test process includes loading all LUTs in all cells in the cell array (not shown) with a pattern equivalent to an XOR or NXOR, and run a standard ATPG program, such as provided by Mentor Graphics Corporation, Branch Office, San Jose, Calif., USA, or Synopsys, on the modified design.

Figure 39:
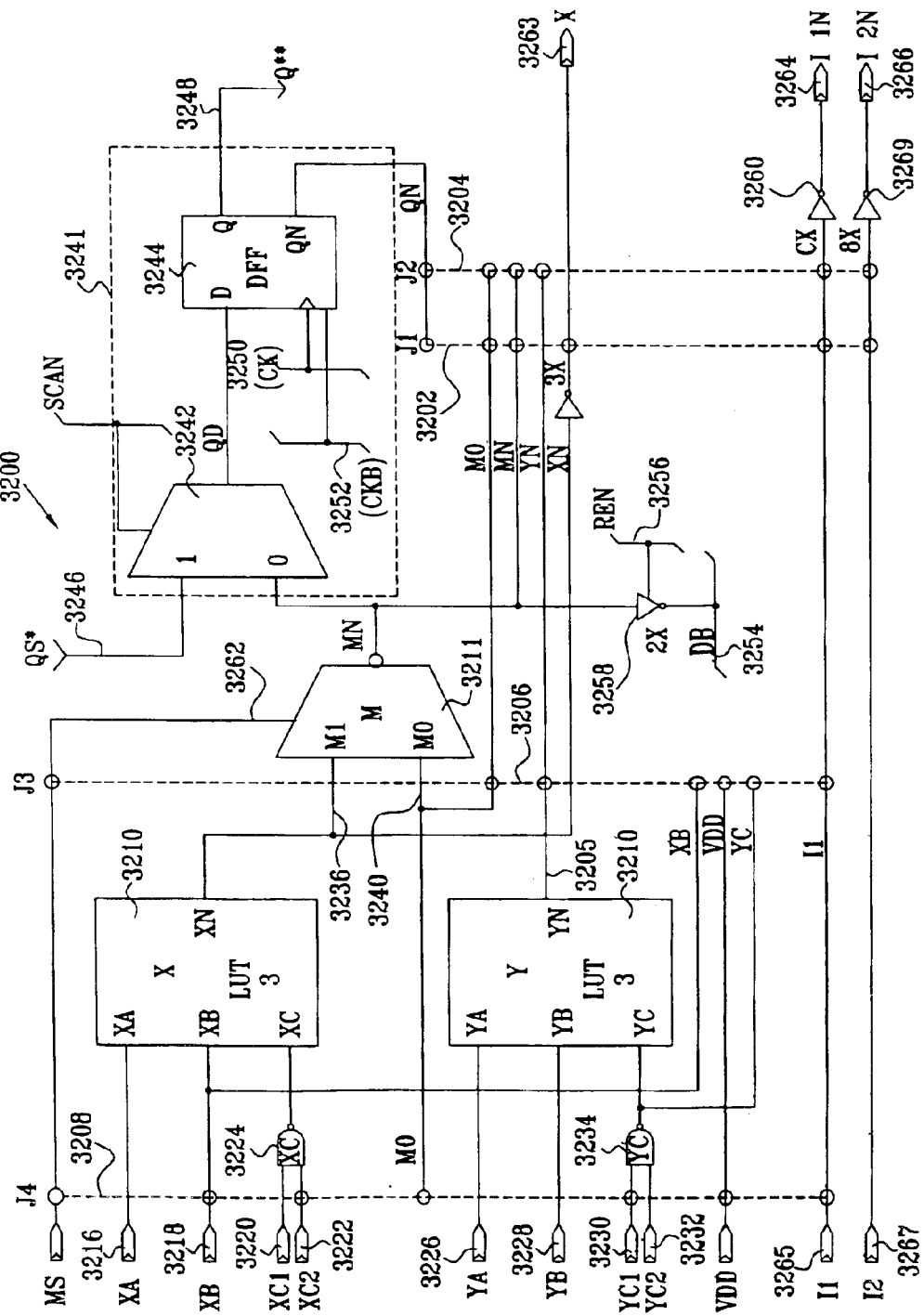
FIG. 39 illustrates a cell preferably forming part of a gate layer of a cell array device constructed and operative in accordance with yet another preferred embodiment of the present invention.

Reference is now made to FIG. 39, which illustrates a cell 3200 called eCell preferably forming part of a gate layer of a cell array device constructed and operative in accordance with yet another preferred embodiment of the present invention. It is appreciated that cell 3200 is the schematic equivalent of the gate layer underlying the interconnection layer of the routing cell unit 2200, illustrated in FIG. 30. The logic array device preferably comprises an array of cells, each cell typically including two 3-input look-up tables (LUT-3), respectively designated by reference numerals 3210 and 3212, a multiplexer 3211 and a scanned Dflip/Flop (S-DF/F) unit 3241.

Additionally, the cell unit 3200 comprises cell inputs 3262, 3216, 3218, 3220, 3222, 3226, 3228, 3230, 3232, and two inverters inputs 3265 and 3267. Additionally, the cell unit 3200 comprises cell outputs 3263, 3264, 3266 and 3254. The interconnections between various cells inputs and outputs are customized for any custom device by the metal interconnection layers preferably using interconnection structures such as 2200. Additionally the cell unit 3200 includes jumper connections 3202, 3204 3206 and 3208 for providing cell-customization connecting cell input and internal connections between the various components of the cell 3200. In accordance with a preferred embodiment of the present invention, the jumper connections 3202, 3204, 3206 and 3208 are customizable, so as to allow, for example, connecting the output signal of the LUT device 3212 to the multiplexer unit 3211. For such a case, the cell 3200 operates in a similar fashion to the unit described hereinabove (FIG. 10).

LUT 3210 includes 4 input lines 3216 (XA), 3218 (XB), 3220 (XC1) and 3222 (XC2). A first 2-input NAND gate 3224 couples the input lines 3220 and 3224 to the LUT 3210. Similarly, LUT 3212 receives input signals along lines 3226 (YA), 3228 (YB), 3230 (YC1) and 3232 (YC2) and a second 2-input NAND gate 3234 couples the inputs 3230 and 3232 to the LUT 3212.

The output from LUT 3210 is provided to a first input 3236 of the multiplexer 3211. The multiplexer 3211 also receives input signals on a second input line 3240. The multiplexer 3211 provides output signals to a scanned Dflip/Flop (S-DF/F) unit 3241 comprising a multiplexer 3242 and a Dflip/Flop (DF/F) unit 3244.

The scanned Dflip/Flop (S-DF/F) unit 3241 is used for providing the test feature ATPG (Automatic Test Program Generation), as is known in the art. Thus, an array of cells, such as cells 3200, includes a built-in scan chain for all flip-flop devices to support a full scan ATPG.

The scanned Dflip/Flop (S-DF/F) unit 3241 receives signals on input line 3246, from a previous DF/F circuit and outputs signals to the following scan circuit on line 3248. The DF/F 3244 receives clock input signals 3250 (CK) and 3252 (CKB).

The output from cell 3200, in the memory mode, is read on line 3254 (DB) when the Read-Enable signal 3256 (REN) operates on the 3-state inverter 3258, as explained hereinbelow.

The cell 3200 also includes 2 inverters 3260 and 3269, having cell inputs 3265 and 3267 and outputs 3264 and 3266, respectively.

Figure 40:
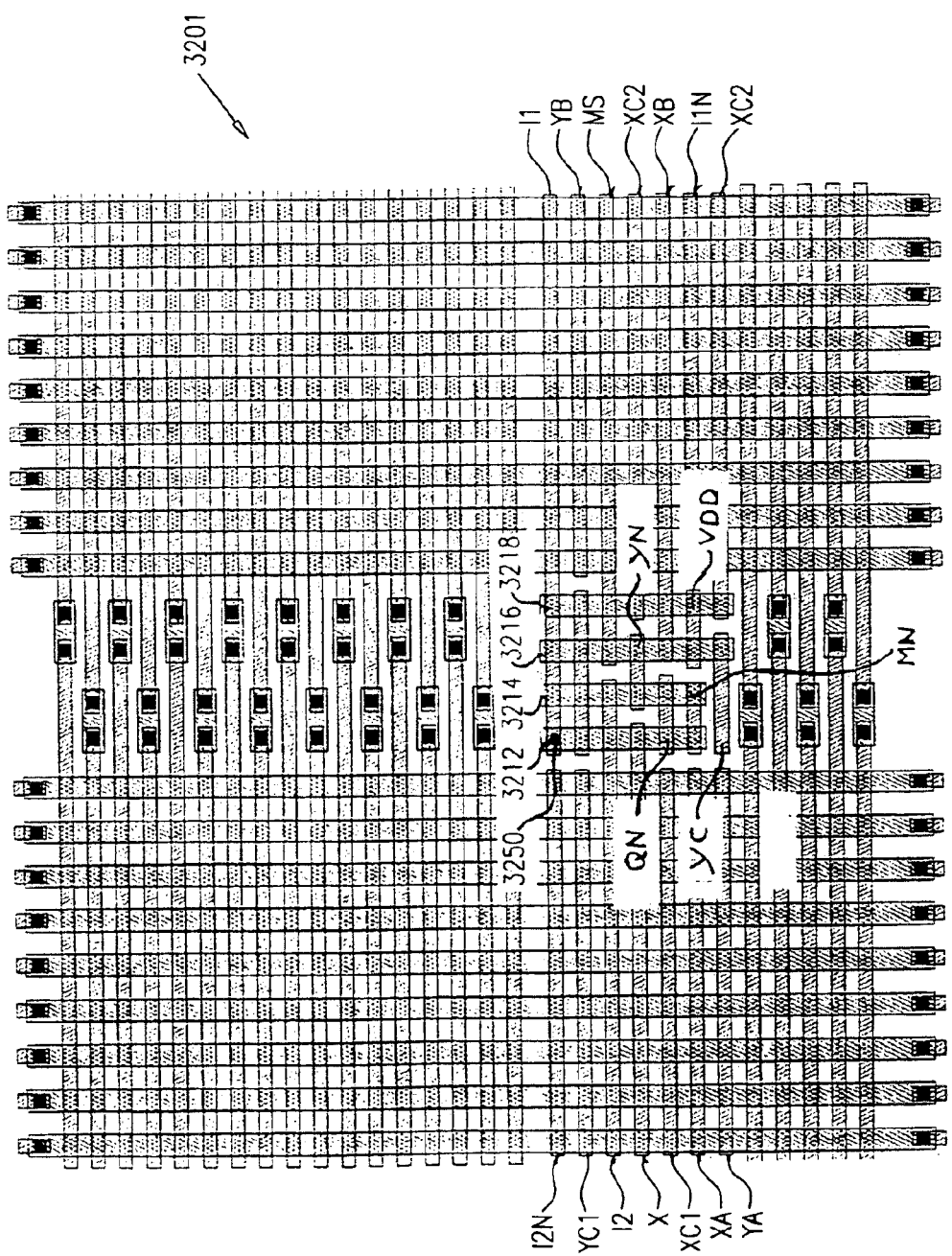
FIG. 40 shows routing cell overlaying cell 3200 including jumper connections for providing programmable connections between the components of the cell 3200 of FIG. 39.

Reference is now made to FIG. 40, which shows another preferred routing cell unit 3201 overlaying cell 3200, in accordance with a preferred embodiment of the present invention. Routing cell 3201 utilizes the two top metal layers M5, M6 and the via layer between M5M6. Routing cell 3201 also includes jumper connections for providing programmable connections between components of the cell 3200, for example, the multiplexer 3211 and the LUT 3212 (FIG. 39), constructed and operative in accordance with a preferred embodiment of the present invention.

FIG. 40 shows the layout of the connection bars 3272, 3274, 3276 and 3278, which corresponds to the jumper connections 3202, 3204, 3206 and 3208, respectively, in FIG. 39. By appropriately placing a via connection 3280 under connection bar 3272, various connections may be made to provide a required input to the inverter 3258 and/or to the inverter 3260 (FIG. 39). By means of the via connections such as that shown by 3280 to the bar 3272, one of the signals MN or QN may be outputted to the inverter 3258 and/or to the inverter 3260 (FIG. 39). FIG. 40 specifically shows QN connected to I1, the input to inverter 3260.

Connection bars 3272 and 3274 preferably provide the functionality of providing drive to the output of one or two of the cell internal signals MN, QN, YN, and YC. Furthermore, the connection bar 3278 (jumper 3208 in FIG. 39) provides the function of allowing pull-up of the inputs MS, XC2, YC1, XB and I1.

In addition, the connection bar 3276 (umper 3206 in FIG. 39) allows connecting the input signal M0 to the multiplexer 3211. This allows multiplexer 3211 to be used as a 2-input logic function. As shown in FIG. 39, jumper 3206 (connection bar 3276 in FIG. 40) allows the connection of signals YN, XB, VDD, YC, MS, or I1 to the M0 (3240) input of multiplexer 3211.

Furthermore, if YN is connected to input 3240 of multiplexer 3211 and to input I1, and signal I1N is connected to the select MS 3262 input of multiplexer 3211, then multiplexer 3211 becomes a logic NOR between XN and YN.

A further example of the use of the multiplexer 3211 as a 2-input logic function, includes connecting YN to input 3240 of multiplexer 3211, and to input 3262. In this case, multiplexer 3211 becomes a NAND logic gate between XN and YN.

Still yet a further example of the use of the connection bar 3274 and the multiplexer 3211, is to provide an enabled Flip/Flop (F/F) or set F/F. For example, for an enabled F/F, using bar 3274 to connect QN to input 3240 (M0 input in FIG. 39); the input MS 3262 becomes the F/F enable signal.

It is further appreciated that the inverters 3260 and 3269 as shown in FIG. 39, have different drive strengths. Proper selection of loading and drive strength provides performance advantages not available from equivalent structures with the same drive strength.

It is appreciated that in the following schematic drawings, the drawings include the transistor sizes. The transistor sizes are bases on 0.18 $\mu$M technology. In general, the "upper" number indicates the diffusion width of the p-transistor. The "lower" number indicates the diffusion width of the n-transistor. The poly gate is assumed to be 0.18 $\mu$M unless specifically indicated different sizes with a "/". It is appreciated that different transistor sizes may be appropriate to other techniques.

Figure 41:
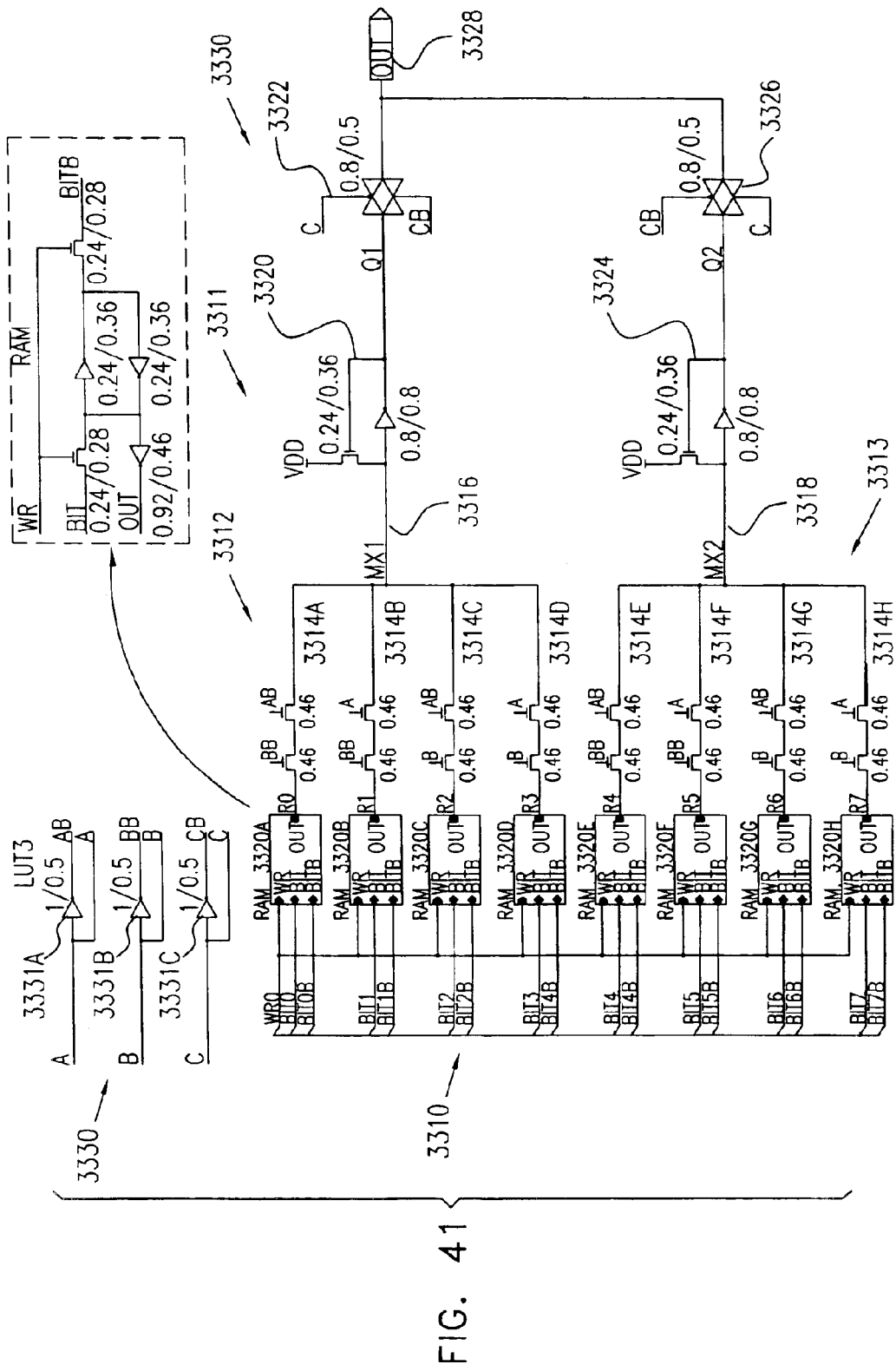
FIG. 41 presents a detailed configuration of a LUT-3 device, constructed and operative in accordance with a preferred embodiment of the present invention.

Reference is now made to FIG. 41, which shows a detailed configuration of a LUT-3 device 3300, constructed and operative in accordance with a preferred embodiment of the present invention. The LUT-3 device 3300 may be used as the LUT devices 3210 and 3212 shown in FIG. 39. The LUT-3 device 3300 comprises a memory section 3310 and a decoder section 3311. The memory section 3310 includes a set of 8 RAM cells 3320A–3320H, constructed and operative in accordance with a preferred embodiment of the present invention. The decoder section 3311 comprises an "upper" decoder unit 3312 and a "lower" decoder unit 3313. The "upper" decoder unit 3312 includes 4 transistor pairs 3314A–3314D, wherein each transistor pair comprises 2 n-transistors connected in series. Similarly, the "lower" decoder unit 3313 comprises 4 transistor pairs 3314E–3314H, wherein each transistor pair includes 2 n-transistors connected in series, as shown in FIG. 41.

The output signals from the "upper" decoder unit 3312 are applied along an output line 3316 to an "upper" sense amplifier unit 3320. The output from the "upper" amplifier unit 3320 is then applied to an "upper" transmission gate 3322. Similarly, the "lower" decoder unit 3313 applies its output signals to a "lower" sense amplifier unit 3324 via an output line 3318. The output from the "lower" amplifier unit 3324 is inputted to a "lower" transmission gate 3326.

The LUT-3 device 3300 also comprises an inverter section 3330 which applies the required gate signals to the upper and lower decoder units 3312 and 3313, and to the upper and lower transmission gates 3322 and 3326. The inverter section 3330 comprises a set of inverters 3331A–3331C for creating both polarities of the inputs A, B and C. The LUT-3 device 3300 receives input signals A, B, and C, which are also inverted to signals AB, BB, and CB, respectively. The output signals from inverter section 3330 are dependent on a polarity of the input signals A, B, C. The signals A, AB, B and BB are applied as gate signals to the decoders units 3312 and 3313, as shown in FIG. 41. Thus, the output signals 3316 and 3318 are dependent on the content of the RAM cell selected by A, AB, B and BB, as described hereinbelow.

The signals C and CB are applied to transmission gates 3322 and 3324, as shown in FIG. 41.

Each RAM cell receives 3 input signals comprising Word Lines WR0, WR1 and bit lines BIT0–BT7 and BIT0B to BIT7B, as shown in FIG. 41 and described hereinbelow.

The respective output signals AB, A, BB and B, from the inverter section 3330 are applied to the gates of the n-transistors of the decoder units 3312 and 3313, as shown in FIG. 41. These gate signals AB, A, BB and B, decode and/or select one of the 4 output signals, R0–R3 and R4–R7, from each of the decoder units 3312 and 3314

The C input signal is applied to transmission gates 3322 and 3324 in order to select which one of the 2 sensed signals 3316 or 3318 is to be outputted.

The output signal 3328, from the respective transmission gate, represents the output signal, XN or YN, from the LUT 3210 or 3212 in FIG. 39.

It is appreciated that a unique feature of the decoder circuit 3311 is its ability to provide a very high-speed response to the C input and a standard speed response to A and B inputs.

In most designs, a few circuit paths are on the critical path of the circuit. Accelerating the transition speed of those circuits increases the speed of the entire design. It is appreciated that in accordance with a preferred embodiment of the present invention, including one of the 3 logically equivalent inputs with fast response (signal C) enables the acceleration of the critical path, and therefore the acceleration of the operation of the LUT.

Figure 42:
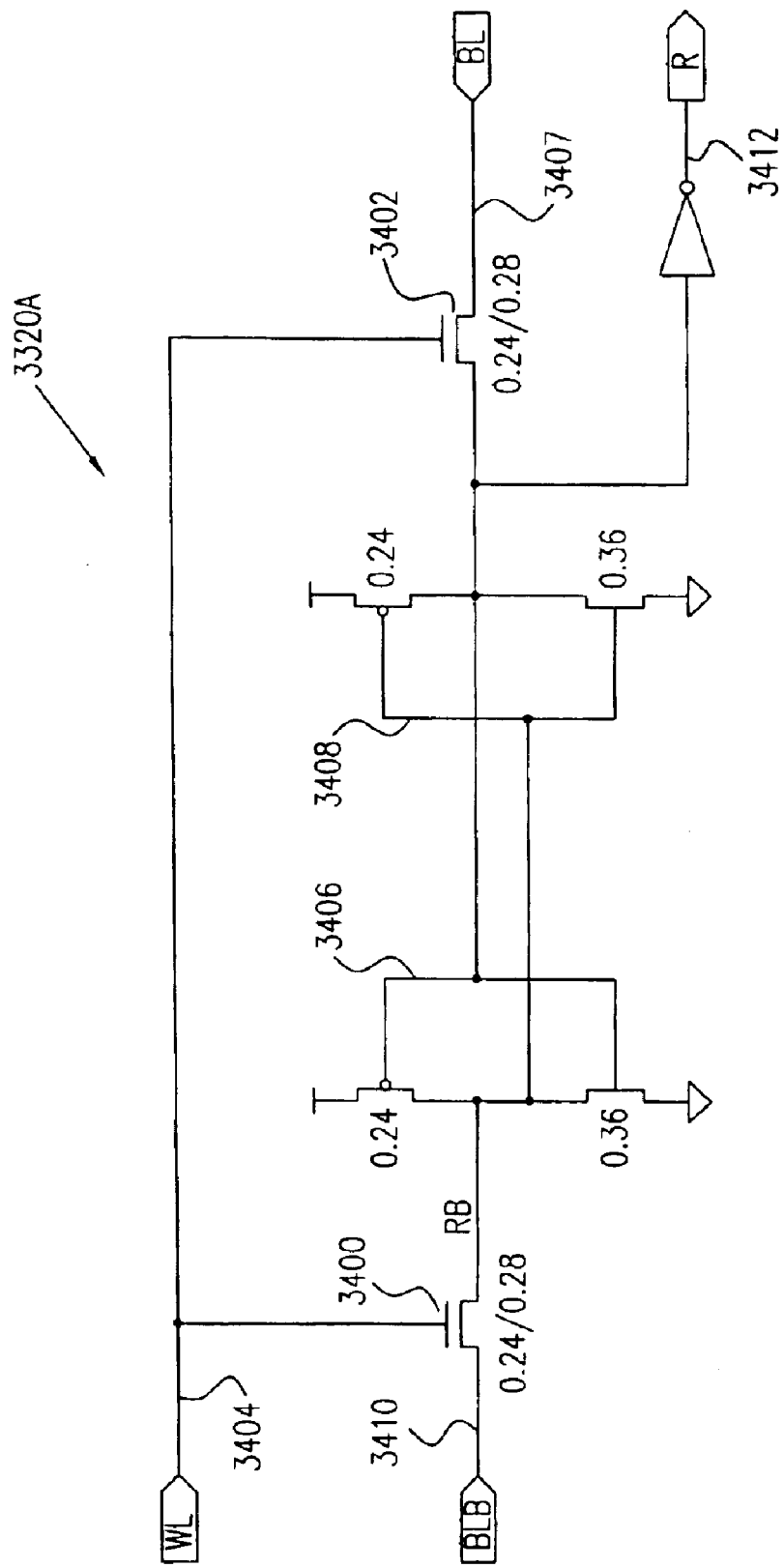
FIG. 42 is a schematic drawing of a single RAM cell 3110A of FIG. 41.

Reference is now made to FIG. 42, which is a schematic drawing of a single RAM cell, such as RAM cell 3320A of FIG. 41.

The RAM cell 3220A is conventional and known in the art as a "6-transistor RAM cell". The RAM cell 3320A comprises 2 n-transistors 3400 and 3402, and a data storage section comprising 2 inverters built by transistors 3406 and 3408. The inverters are connected in a "back-to-back" fashion, as is known in the art.

In operation, a gate input signal to the transistors 3400 and 3402 is received on Word Line WL (3404). When the gate signal WL is high, the transistors 3400 and 3402 are "open" and allow the input data on lines BL (3407) and BLB (3410) to be stored in the "storage" section. When WL is low, the transistors 3400 and 3402 are closed and input data does not effect the inverters built by transistors 3406 and 3408. Thus, the transistors 3406 and 3408 "remember" their previous state and the stored data may be read out onto output line R (3412).

Figure 43:
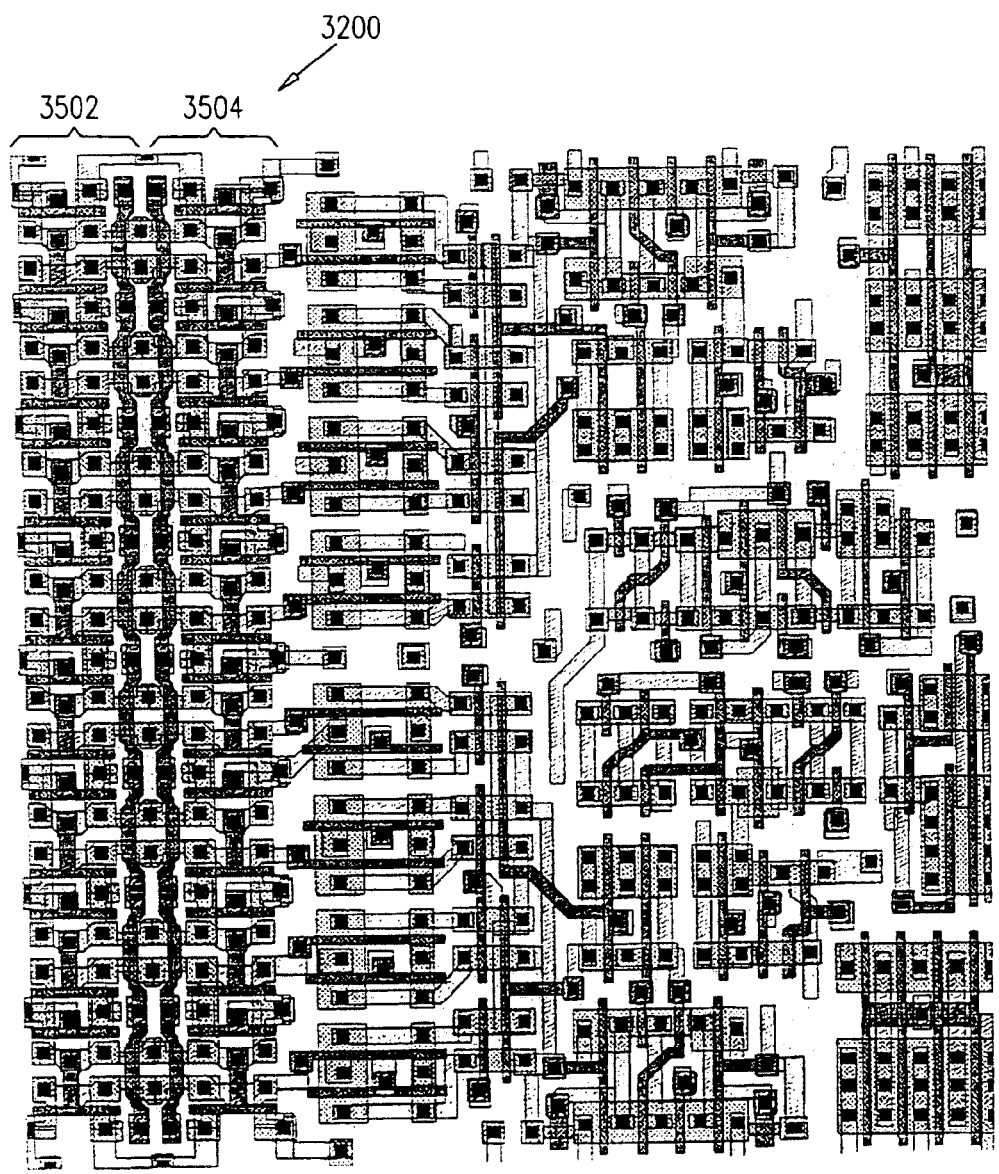
FIG. 43 is a typical layout of a single cell 3200 of FIG. 39.

Reference is now made to FIG. 43, which shows a typical layout of a single cell 3200 of FIG. 39. The cell 3200 comprises a column 3502 of eight RAM cells and a column 3504 of 8-RAM cells of LUT 3210 and of LUT 3212, (FIG. 39).

In the preferred embodiment of the present invention, the 16 RAM cells are connected in such a way so that the "upper" 8 RAM cells are arranged as two columns of four RAM cells of LUT 3210 (FIG. 39) and the "lower" 8 RAM cells are arranged as two columns of four RAM cells of LUT 3212 (FIG. 39).

Figure 44:
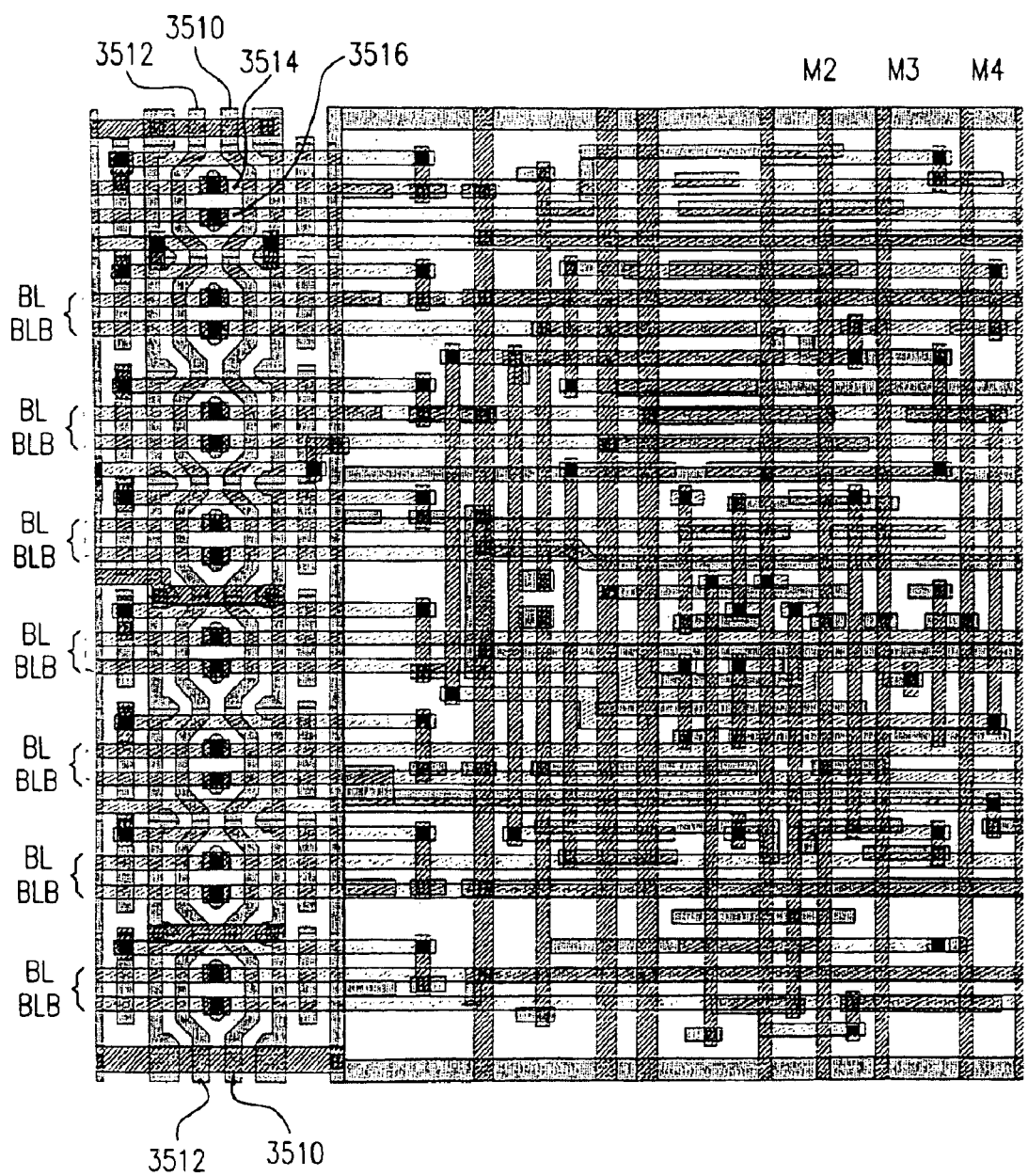
FIG. 44 shows the layout of Metal 2, Metal 3, and Metal 4 of the cell 3200, of FIG. 39, which is overlaying the layout of FIG. 43, in accordance with the preferred embodiment of the present invention.

Reference is now made to FIG. 44, which shows the layout of Metal 2, Metal 3, and Metal 4 of the eCell 3200 which is overlaying the layout of FIG. 43. FIG. 44 shows Word Lines WL 3510 and WL 3512 (FIG. 43) for applying the gate input signals, respectively, to the columns of 3502 and 3504 of the RAM cells (FIG. 43). FIG. 44 also shows the eight pairs of the bit lines (BL and BLB) for the 16 RAM cell. For example, 2-bit lines BL and BLB, 3514 and 3516 respectively, are the 2-bit lines of the two RAM cells at the top of columns 3502, 3504.

Figure 45A:
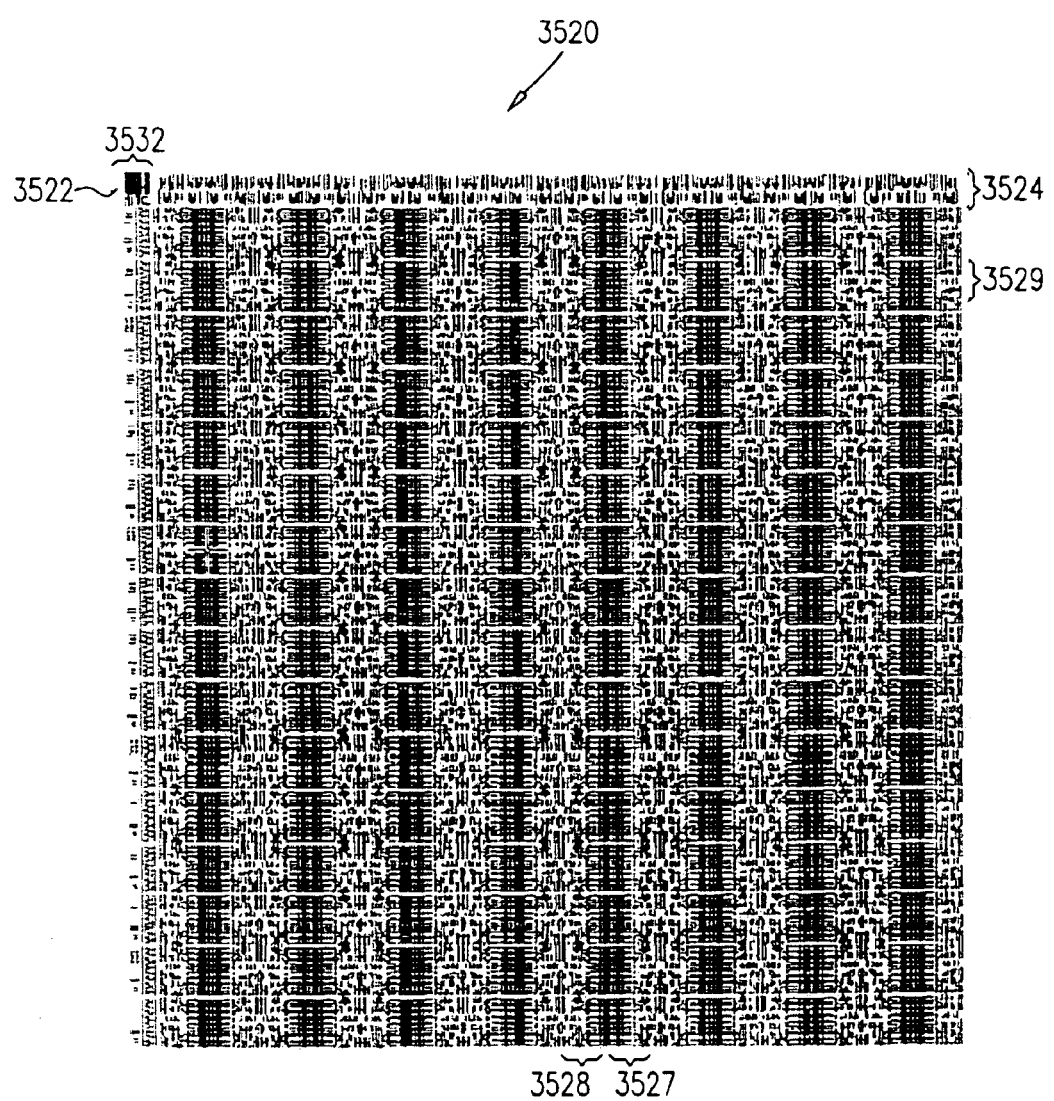
FIG. 45A presents a layout of an eUnit, comprising an array of 16×16 cells 3200, in accordance with the preferred embodiment of the present invention.

Reference is now made to FIG. 45, which shows a layout of an eUnit 3520, comprising an array of 16×16 cells 3200. By flipping over the structure of the cell 3200 (FIG. 39) and placing two cells 3200 "back-to-back", it is possible to obtain a four column RAM cell 3526. Column 3526 comprises 4 Word Lines (WL) and 16×8 pairs of bit lines (BL and BLB). The word lines and bit lines are used as a conventional 6-transistor SRAM to write and read data into the RAM cell of LUTs.

In accordance with an embodiment of the present invention, the word lines, WL, and the bit lines BL, BLB, may be used to generate a dual port SRAM from the RAM cell 3310 (FIG. 41) and the decoders 3312 and 3313 (FIG. 41) of the cell 3200.

The eUnit 3520 comprises a column structure 3532, called a "YDEC circuit". The YDEC circuit controls the bit lines, BL and BLB, for the dual-port SRAM. eUnit 3520 also comprises a row structure 3524 called the "XDEC" circuit for controlling the word lines, WL, for the dual-port RAM.

The WL, BL and BLB lines are used for a writing function in the dual-port SRAM mode. The reading function uses the decoder functions of LUTX 3210 and of LUTY 3212, and MUX 3211 and allows the decoding of 1 RAM cell out of the 16 RAM cells within the eCell 3200 of FIG. 39, when YN 3205 is connected to MO (3240) using jumper connector 3206

The eUnit 3520 when fully configured as a dual-port RAM provides a 4 k bit RAM structure as 256×16. Each row 3529 comprises 16 eCells 3200 and associated with one data line for read DB-line 3254 (FIG. 39) and one data line for write D1-line 3666 (FIG. 47). There are 16 rows 3529 in the eUnit 3520. The XDEC 3524 has 16 repeating circuits 3600 (FIG. 46) to control the 16 columns comprising the eUnit 3520. The YDEC 3532 has 16 repeating circuits each of which comprise 8 circuits 3650 (FIG. 47) to control the 16 rows comprising the eUnit 3520.

Figure 45B:
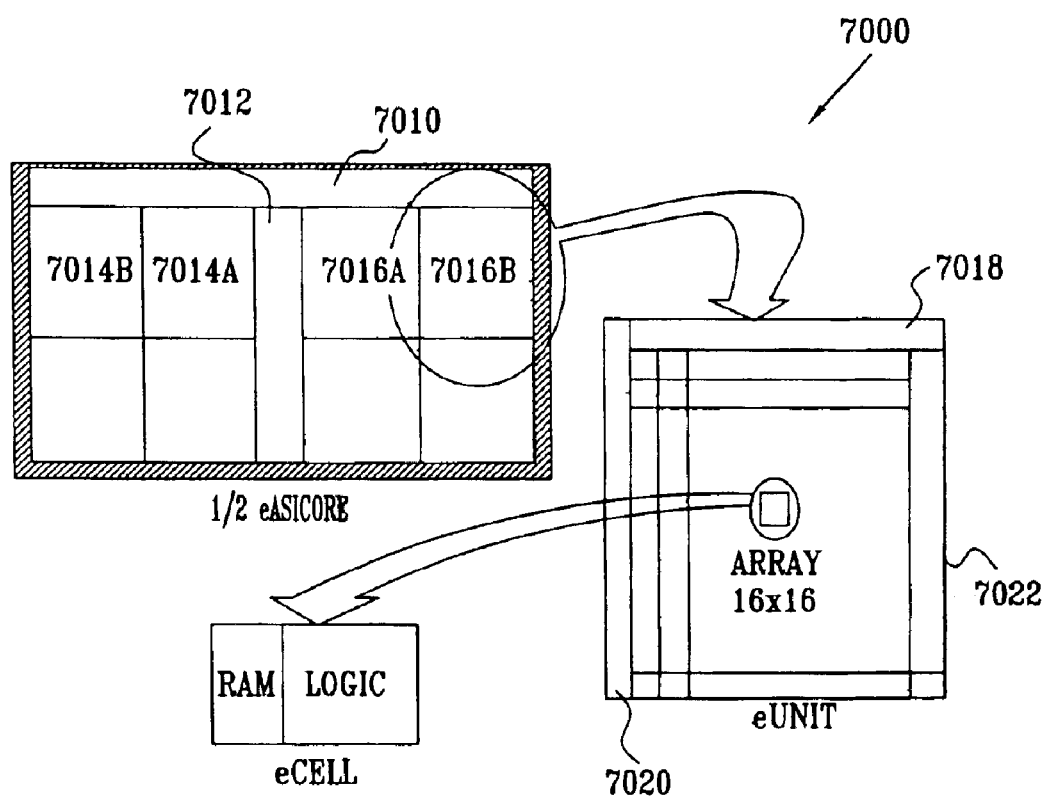
FIG. 45B shows a layout of a ½-eCore unit, in accordance with the preferred embodiment of the present invention.

Reference is now made to FIG. 45B, which shows a ½-eCore 7000 typically comprising an array of 4×2 eUnits. The ½-eCore 7000 includes additional circuits such as a X-Decoder 7010 and a Y-Decoder 7012 which are used for loading the LUTs. Loading of the LUTs is done in the set-up mode, which follows every power-up and allows the operation of the eCell as a logic function. For the set-up mode, the Bit lines are driven by the Y-Decoder 7012 as horizontal lines to 4 eUnits 7014A, 7014B, 7016A and 7016B, located "horizontally" relative to Y-Decoder 7012, in the sense of FIG. 45B, wherein the two eUnits 7014A and 7014B are located to the left of Y-Decoder 7012 and the two eUnits 7016A and 7016B are located to the right of Y-Decoder 7012. The word lines are driven by the X-Decoder 7012 to two eUnits as vertical lines, in the sense of FIG. 45B

FIG. 45B also shows the location of a XDEC circuit 7018 and a YDEC circuit 7020 in an eUnit 7022.

Figure 46:
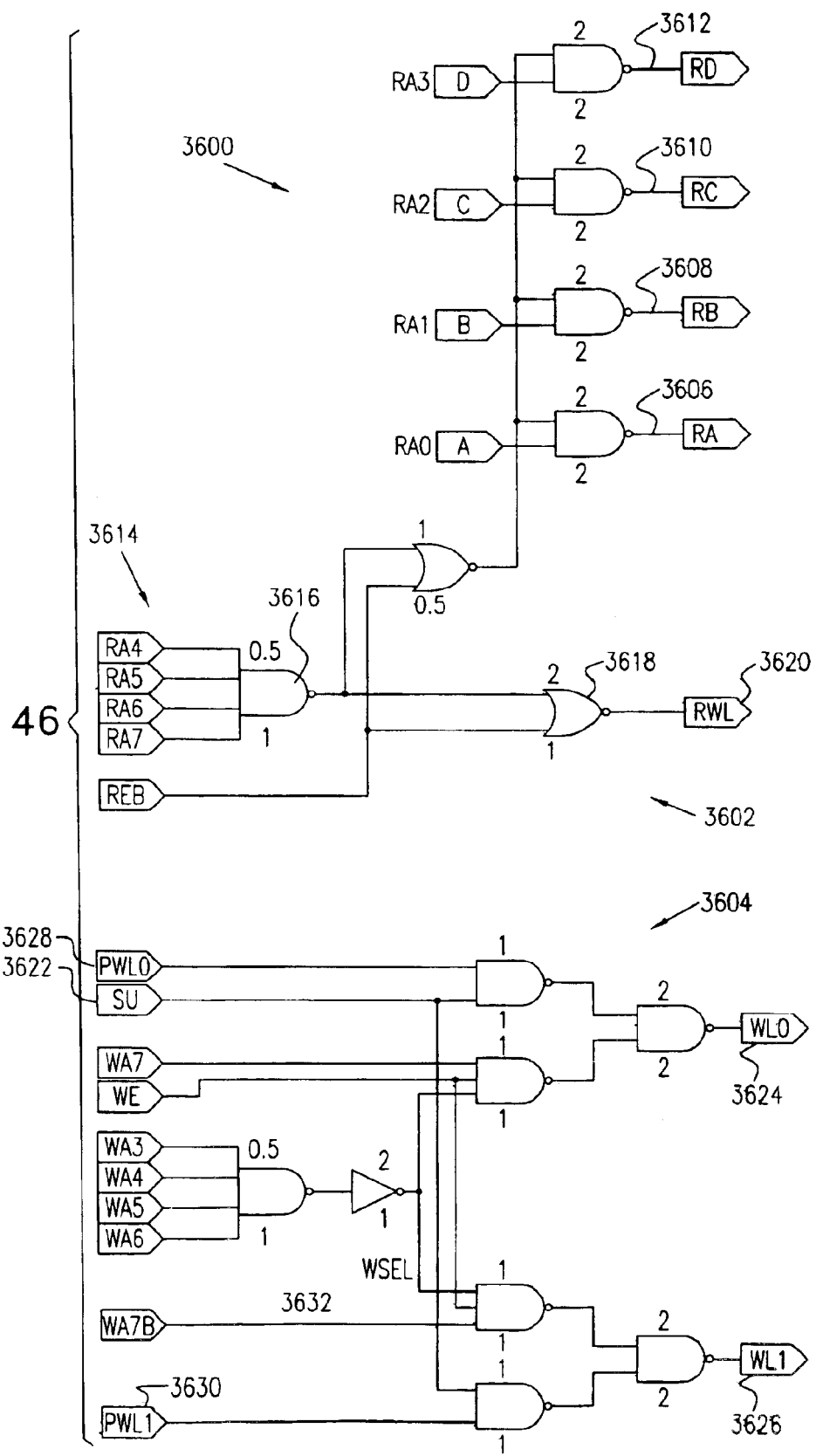
FIG. 46 illustrates a repeating circuit within the XDEC circuit for controlling the Word Lines WL, in accordance with the preferred embodiment of the present invention.
Figure 47:
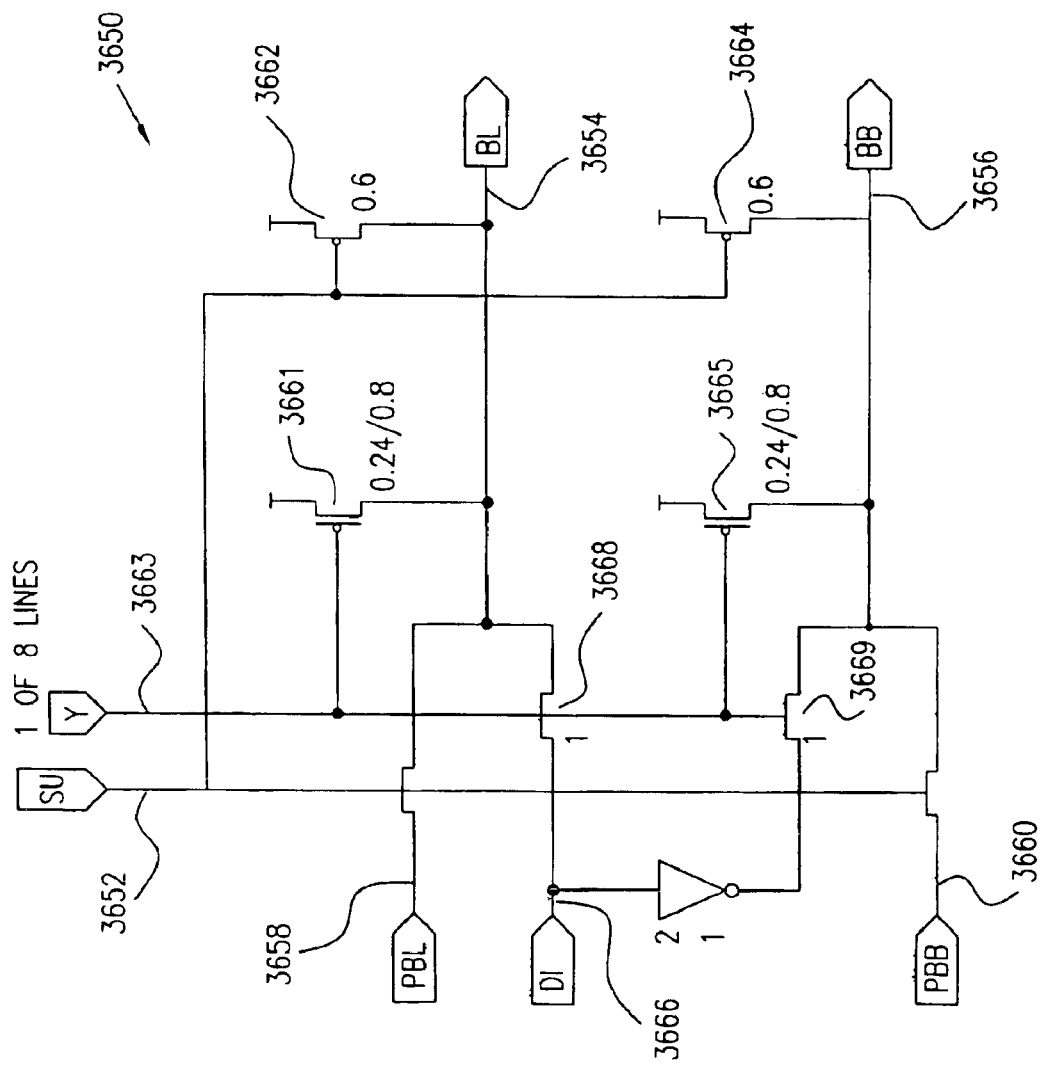
FIG. 47 illustrates a repeating circuit within YDEC circuit for providing the necessary control to the bit lines BL, BLB, in accordance with the preferred embodiment of the present invention.

Reference is now made to FIG. 46, which shows a repeating circuit within XDEC 3524 (FIG. 45) circuit 3600 for controlling the Word Lines, WL. The XDEC circuit 3600 comprises a Read port decoder 3602 and a Write port decoder 3604. Circuit 3600 is repeated 16 times to support the 16 columns within eUnit 3520.

The Read port decoder 3602 controls the drive of the 4 lowest significant bits of read address lines by driving lines RA, RB, RC, and RD, labelled 3606, 3608, 3610 and 3612, respectively. The eUnit 3520 comprises 16×16 eCells 3200 arranged as 16 columns each column comprising 16 eCells 3200. As described hereinabove, the eCells are placed "back-to-back" so that the 8 columns 3527 have the RAM cell on its left and the 8 columns 3528 have the RAM cell on its right. When the eUnit 3520 is configured as a dual-port RAM all the input lines of the eCell 3200, within a column 3527 or 3528, are connected in a way so as to enable the use of decoder logic within the eCell 3200 as part of the dual-port RAM read port. Thus, all the 16 XA inputs 3216 (FIG. 39) and the YA inputs 3226 are connected together to be driven by the read address 0-RA0-3606 (FIG. 46). Similarly, all the 16 XB input 3218 and the 16 YB input 3228 are connected together to be driven by the read address 1-RA1-3608. The 16 XC1 input 3220, the 16 XC2 input

3222, the 16 YC1 input 3230 and the 16 YC2 input 3232 are connected together to be driven by the read address 2-RA2-3610. Finally, the 16 MS inputs 3262 are connected together to be driven by read address 3-RA3-3612.

The motivation to segment these connections into columns is to save drive power. Since in the read operation the XDEC 3600 selects one column 3527/3528 only that column decoder circuits need to be activated.

In FIG. 46, the reference numeral 3614 labels the 8 read address lines RA4, RA5, RA6, RA7 and their inversions. The inverted read address lines are not shown in FIG. 46. The lines RA4, RA5, RA6, RA7 and their inversions are used to select one column out of the 16 columns in the eUnit 3520 using a NAND device 3616. The NAND device 3616 is connected to 4 out of the 8 read address lines 3614. This also enables unit 3618 to provide the READ/ENABLE signal RWL on line 3620. Line 3620 is connected to REN signals of the eCells 3200 of the particular column. This opens the 16 3-state inverters 3258 of the selected column to transfer the decoded RAM cell output to the 16 DB lines 3254 (FIG. 39).

The Write port decoder 3604 is only active when the set-up control signal SU (3622) is at logic "0" Otherwise, in a set-up mode, the word lines WL0 (3624) and WL1 (3626) are logically connected to the previous eUnit word lines PWL0 (3628) and PWL1 (3630). Thus, in the set-up mode, all the word lines are controlled by the set-up control logic X-Decoder 4010.

A 4-input NAND 3632 is connected to 4 of the 8 lines of the foremost significant write addresses and their inversions. A "0" logic is outputted by the NAND 3632 as per the 4 most significant write address bits as hereinabove, to select the cell column out of the 16 columns of the array of cells, for the write cycle. When the NAND 3632 output is "0", either WL0 3624 or WL1 3626 become high, according to the write port address line WA3 and its inversion WA3B.

Reference is now made to FIG. 47, which shows a repeating circuit 3650, within YDEC 3532 (FIG. 45), for providing the necessary control to the bit lines BL, BLB. Circuit 3650 is repeated 8 times for each of the 16 RAWs of the eUnit 3520.

FIG. 47 shows a typical circuit for each of the 8-pairs of bit lines BL, BLB, as provided for each eCell. In the set up mode, line SU 3652 is high, bit lines BL 3654 and BB 3656 are connected to the bit lines PBL 3658 and PBB 3660 of a previous eUnit (not shown) and are controlled by the set up logic Y-Decoder 4012. Otherwise, in the dual-port-RAM mode, the control line 3652 is low, and for one out of 8-pairs of bit lines BL 3654 and BB 3656 the control line 3663 is high. Thus, the BL 3654 is connected through transistor 3668 to the data-input line DI 3666 and the BB line 3656 is connected to the inverted data-input line 3663 through transistor 3669.

Figure 48:
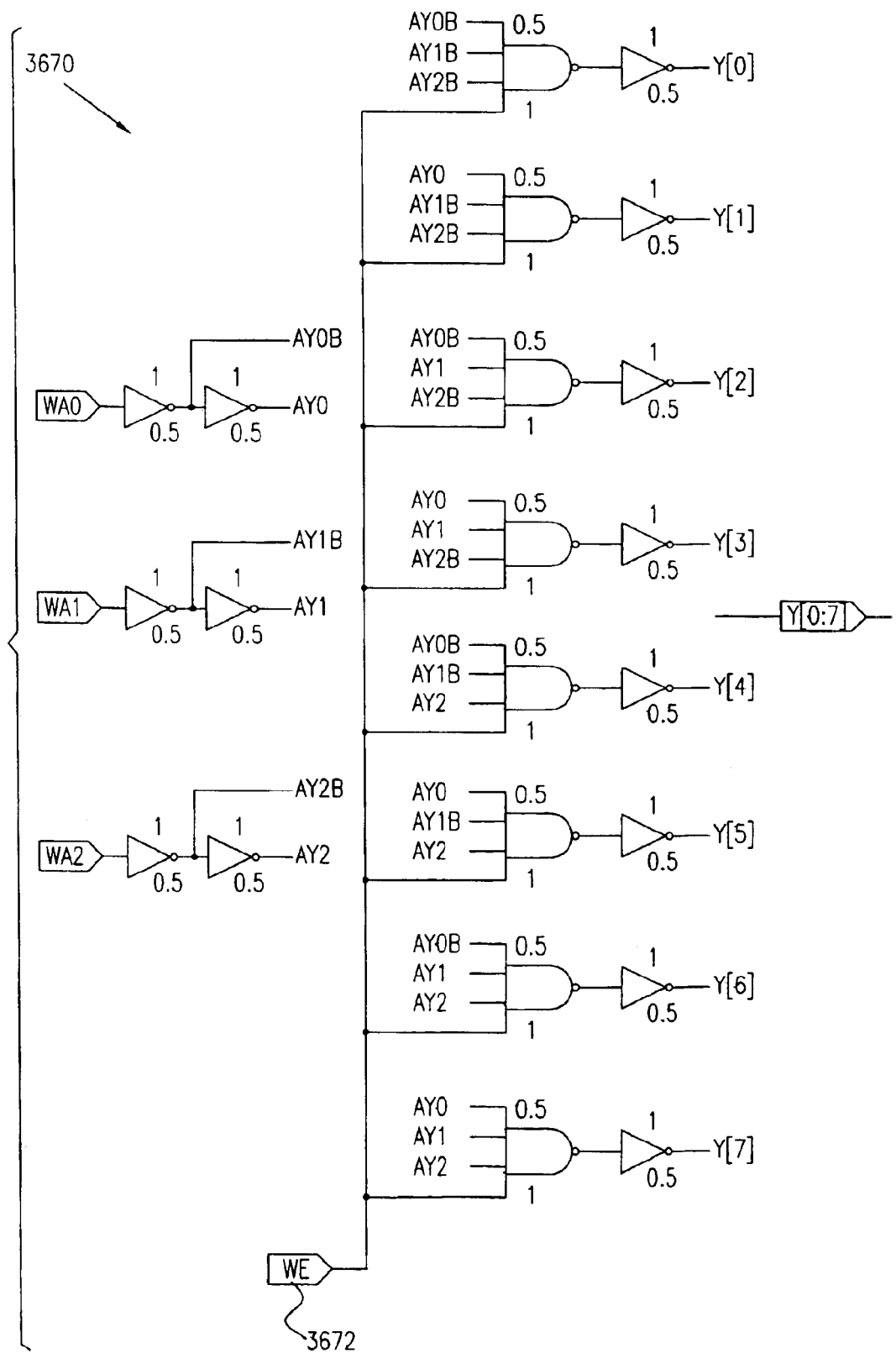
FIG. 48 shows the logic of the control line of FIG. 47, in accordance with the preferred embodiment of the present invention.

Reference is now made to FIG. 48, which shows logic of the control line 3663 (FIG. 47). The circuit 3670 decodes the 3 less significant write address lines WA0, WA1, and WA2, to select one of the 8 pairs. For each row of eCells 3200, there is 8 circuits 3650 of FIG. 47. Each circuit 3650 has its line 3663 connected to one of the 8 outputs, Y(0), Y(1), Y(2), Y(3), Y(4), Y(5), Y(6), and Y(7), of FIG. 47. Control line 3663 is high for the one of 8 circuits selected by 3670 (FIG. 48) and low for the other seven. When control line 3663 is low then transistors 3668 and 3669 are off and transistors 3661 and 3665 are on helping pulling-up the bit lines 3654 and 3656.

When bit lines BL (3407) and BLB (3410) (FIG. 42) are high then there is no write operation into the RAM cell 3320A even if the word line 3404 is high. This allows a proper selection of the RAM to be written into. The RAM cells whose word line is high and bit lines are not pulled-up but rather have one logic level on its bit line BL and inverted logic level on its BLB bit line, is performing an active write cycle. As can be seen in FIG. 45, word lines are vertical and bit lines are horizontal, which allows the proper selection to take place.

In the set-up mode, the Y-Decoder 7012 drives one pair of bit-lines out of 2×16×8 pairs while all the other bit-lines are pulled up by transistors 3661 and 3662 for the BL line and transistors 3665 and 3664 for the BLB line. For the dual-port-RAM mode, the YDEC 3532 of the eUnit, which is customized by the top metal layer to operate in such mode, drives one pair of bit-lines of the 8 within a RAW while all the other bit lines are pulled up by transistors 3661 and 3662 for the BL line and transistors 3665 and 3664 for the BLB line.

As shown in FIG. 47 for the circuit 3650, which has its control line 3663 selected by circuit 3670 (FIG. 48), transistors 3661 and 3665 are off and transistors 3668 and 3669 are on. In such a case the data in line 3666 drives the bit line BL 3654 while the inverted data of line 3666 drives through transistor 3669 to the other bit line BLB 3656 to allow a write cycle to take place.

At each write cycle, one word line is selected by XDEC 3524 and 16 bit line BL, BLB pairs are selected by YDEC 3532 to perform a write operation into the 16 RAM cells selected. In some applications, it may be preferred to have the dual-port-RAM structure with data input width of less than 16 bits. In such a case, the top metal customization should provide the disabling of the operation for some of the 16 circuits 3670 within the YDEC by tying the WE line 3672 to a low logic. This disables the write operation to those rows.

It is appreciated that the pull-up of the bit lines is divided between the two sets of transistors—the first pair of transistors 3662, 3664 and the second pair of transistors 3661, 3665 (FIG. 47). The reason for dividing the pull-up is to support the two modes of operation. The first mode of operation is the "set-up mode"; in which four eUnits are connected to the same bit lines, for example in FIG. 47 line 3658 is connected to 3654 and so forth for the four eUnits. Additionally, in FIG. 47, the bit line bar 3660 is connected to 3656 and so forth for the four eUnits. In the second mode of operation, namely the "dual-port RAM mode", the write cycle is performed only in a single eUnit 3520.

In the set-up mode, the pull-up is the sum of the pull-ups of the four circuits 3650, since in this mode, the Y-Decoder is driving the bit-lines for the 4 eUnits. By structuring the pull-up between the two sets of transistors in the circuit 3650, the pull-up may be correctly designed for each mode. Thus, in the set-up mode, in which the SU line 3652 is high, disconnecting transistors 3662 and 3664 leaves the pull-up to the relatively weak transistors 3661 and 3665, as indicated in FIG. 47. Since there are 4 pull-up circuits in parallel, the pull-up of 4 such weak transistors, is still sufficient and the drive circuit of the Y-Decoder 4012 can drive against the pull-up for the bit-lines that are selected for the write operation.

In the dual-port RAM mode, the SU line 3652 is low and transistors 3661 and 3656 provide the pull-up. For the write operation, it is desirable to reduce the pull-up against which the write operation needs to drive. This is done by having the line 3663, namely 1 out of the 8 lines disconnecting the second set of the pull-up transistors 3661 and 3665, while opening 3668 and 3669 to drive the data input against the remaining pull-ups. Having the data input on BL line 3654 and the inverted data input on BB line 3656 writes the data into the connected RAM bit whose word line is high. Thus, the sizes of the transistors in circuit 3650 are therefore selected to allow both modes of operation to be correctly controlled and operated.

The activation of the selection line is also conditional on the write signal WE 3672.

Thus in accordance with the preferred embodiment of the present invention, it is possible to provide dual usage of the RAM bits. By metal connection, the RAM cell may be customized as a Look-Up-Table (LUT) or as a Dual-Port memory. By providing a special circuit to control the word-lines and bit-lines, it is possible to allow two uses of the word lines and the bit lines in the set-up mode. Namely, to load the content of the LUT, and in the dual-port memory mode, to provide the write port. Furthermore, by utilizing the XDEC circuit, the built-in decoding circuit of the cell 3200 and the addition of a dedicated 3-state inverter 3258, it is possible to provide a Read Port for outputting the decoded RAM data.

It is also appreciated that the configuration of the eUnit 3520 could be made to be partially a logic and partially dual-port RAM. The dual-port RAM could be cut in a rectangle shape, starting from the top left-hand corner 3522 (FIG. 45). By having proper jumper connections and pull-ups (not shown) it could be configured that only a portion on the located to the left of XDEC is operative together with a portion located near to the top of the YDEC.

In accordance with another preferred embodiment of the present invention, an improvement in running a CK-tree is disclosed hereinbelow.

Conventionally, a well-balanced CK-tree is to pass clock signals to all F/Fs. Each F/F includes an inverter to create the CKB signals as required. However, this conventional technique is prone to use a significant amount of power, create RF noise as the clock frequency is increased and also to produce spikes on the power lines.

Taking advantage of the eCell 3200 structure, that provides the F/F as part of the eCell at fixed location, the CK-tree may be predesigned and included in the basic pattern of the cell. Thus, in accordance with a preferred embodiment of the present invention, CK-trees are produced for the CK signal and for the CKB signal.

Figure 49:
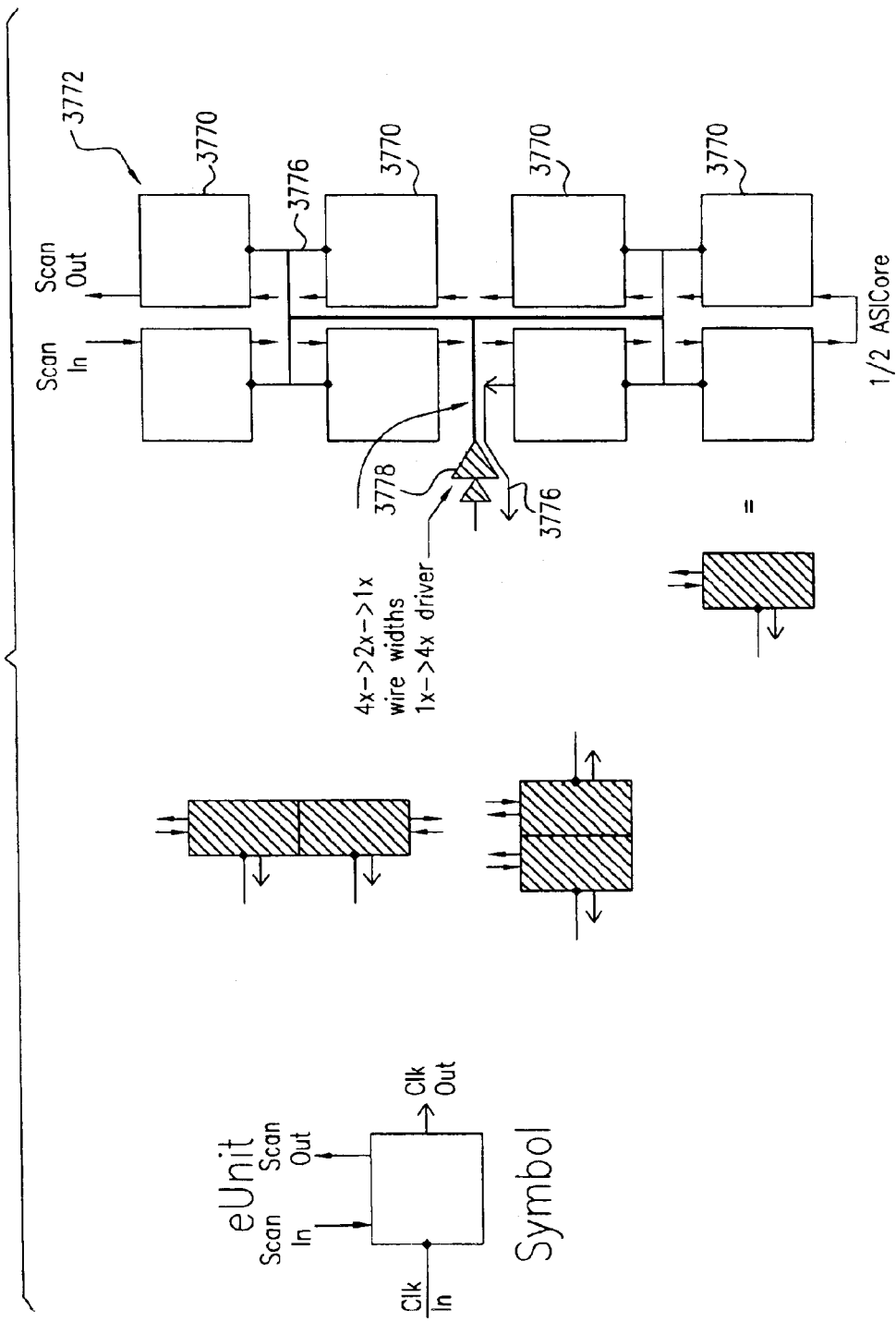
FIG. 49 illustrates eight eUnits arranged in a 2×4 array, constructed and operative in accordance with another preferred embodiment of the present invention.

Reference is now made to FIG. 49, which shows eight eUnits 3770 arranged in a 2×4 array 3772, constructed and operative in accordance with another preferred embodiment of the present invention. The eight eUnits 3770 as arranged in a 2×4 array 3772 is termed in the present specification and claims as "½-eCore". The ½-eCore 3772 includes an 8-eUnit cells 3770, each eUnit cell 3770 comprising a 16×16 array of cells 3200. The ½-eCore 3772 also comprises a built-in clock H-clock tree 3774. The clock tree 3774 feeds a secondary H-tree 3776. The ½-eCore 3772 also includes a drive 3778 to drive the clock tree 3774. A clock feedback 3776 is the CK feedback signal, and is provided in order to enable cancelling insertion delay by using a PLL.

The secondary H-trees 3776 feed each eUnit 3770 with a clock signal so that all eUnits within the same ½-eCore 3572 receive the clock signal at the same time with minimum skew.

Figure 50:
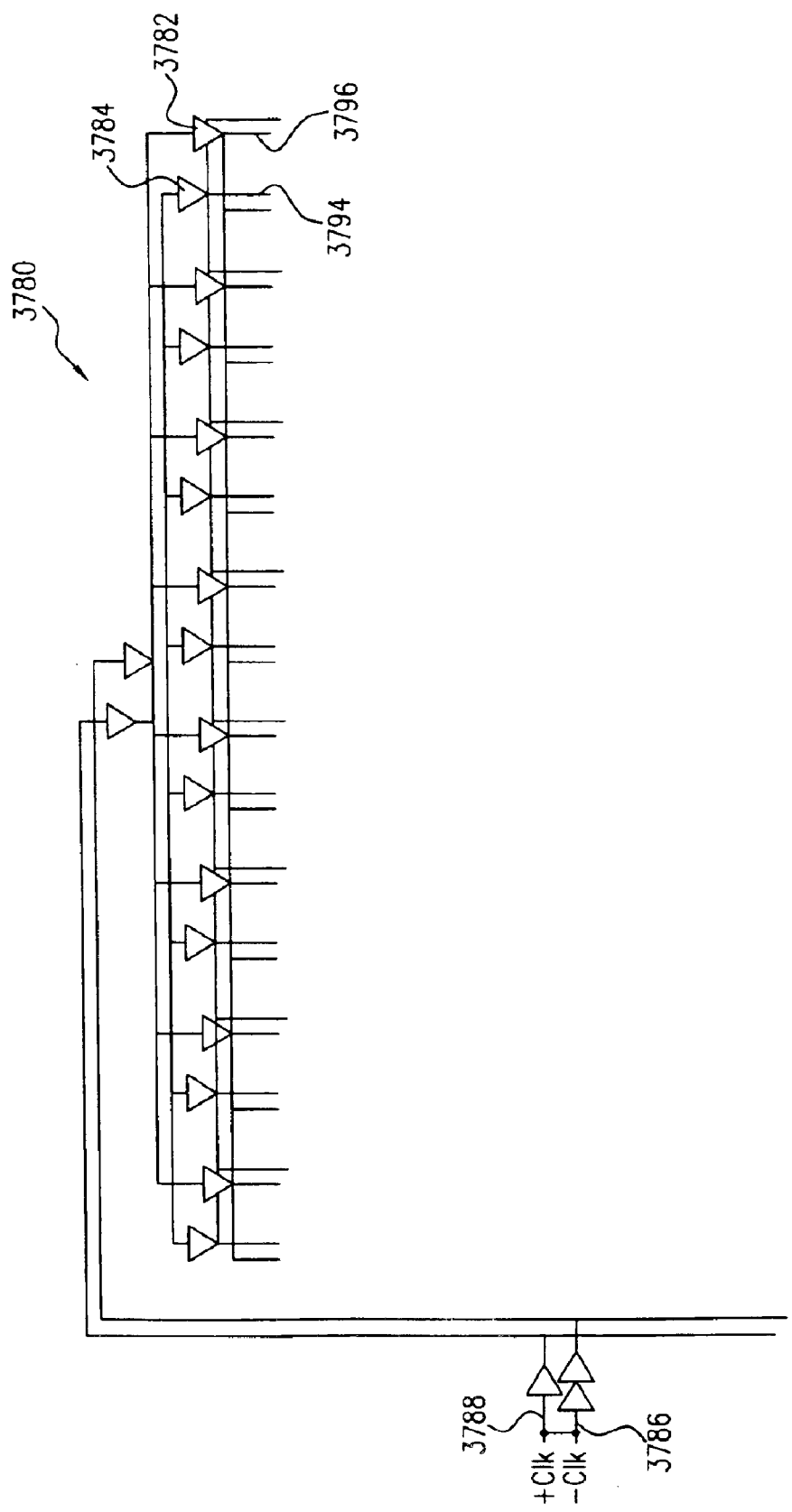
FIG. 50 shows a typical clock unit located within the eUnit, constructed and operative in accordance with another preferred embodiment of the present invention.

Reference is now made to FIG. 50, which shows a typical clock unit 3780 located within the eUnit 3770. The clock unit 3780 comprises driver inverter 3786 for generating the CKB signal, by inverting the CK signal 3788 and then to drive driver circuits 3782 and 3784 for the CK and CKB signals, respectively, which are applied to each of the 16 cell columns comprising the eUnit 3770 (FIG. 45).

Figure 51:
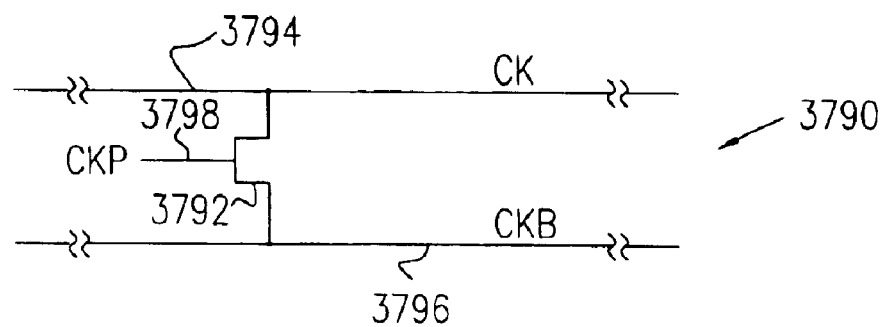
FIG. 51 presents a circuit for providing reduced power and supply noise reduction, constructed and operative in accordance with another preferred embodiment of the present invention.
Figure 52:
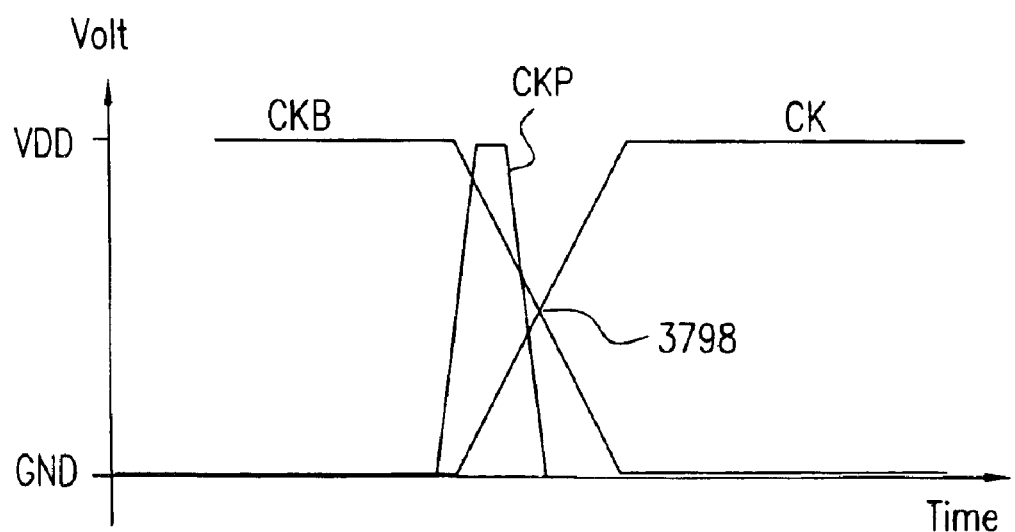
FIG. 52 illustrates the new charge of the CK and CKB drivers in accordance with another preferred embodiment of the present invention.

Using both the CK and CKB signals, the CK noise cancels the CKB noise and also reduces the spikes on the power lines. Furthermore, power consumption is also reduced by decreasing the number of inverters used for producing CKB signals Reference is now made to FIG. 51, which shows a circuit 3790 for providing reduced power and supply noise reduction. The circuit 3790 comprises a transistor 3792, which is connected between CK and CKB lines 3794 and 3796, respectively, and a timing line 3798 (CKP) for switching-on the transistor 3792. By turning on the transistor 3792 at the correct time and for the correct duration, the CK and CKB lines are shorted, thus allowing the exchange of electric charges, until the voltages on the CK and CKB lines are equal. Once the voltages on the CK and the CKB lines are equalized (3798), the transistor 3792 is turned-off and the CK and CKB drivers 3782 and 3784, respectively, charge the lines to their new levels, as shown in FIG. 52.

Figure 53:
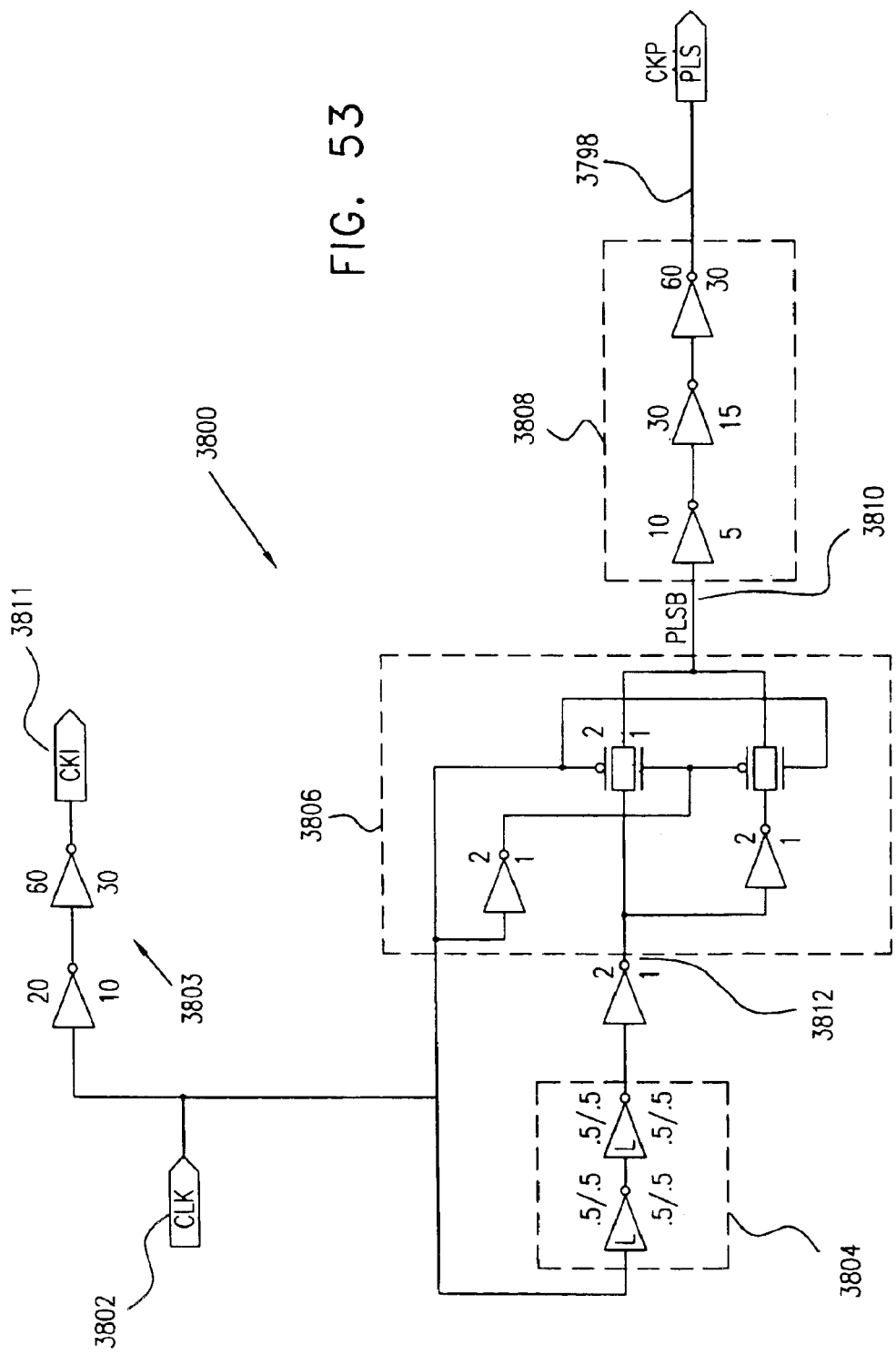
FIG. 53 presents a typical circuit useful for generating the timing line signal for turning-on and turning-off the transistor 3792 of FIG. 51, in accordance with a preferred embodiment of the present invention.

Reference is now made to FIG. 53, which shows a typical circuit 3800 useful for generating the timing signal 3798 for turning-on and turning-off the transistor 3792 (FIG. 51), operated and constructed in accordance with a preferred embodiment of the present invention. The input clock signal 3802 is fed, in parallel, to a clock driver circuit 3803 and to the CKP timing generator circuit 3800. The timing generator circuit 3800 comprises a delay chain section 3804, a XOR circuit 3806 and a final driver stage 3808. The delay circuit 3804 is designed to provide the required pulse width of the CKP signal 3798. The XOR circuit 3806 generates a pulse 3810 by XORing the input CLK signal 3802 with a delayed signal 3812, produced by delay circuit 3804. The signal 3810 is a pulse-type signal, which provides a pulse for each transition (going from high to low or from low to high) of the clock. The drive circuit 3808 introduces an additional delay to the pulse 3810 in order to provide the correct timing for the signal 3798 and strength to correctly drive the transistor 3792.

In FIG. 53, clock line CK1 3811 is driving the CLK line 3788 (FIG. 50).

Reference is now made to FIG. 54, which shows a flowchart 3900 illustrating a method for using the code "Design Compiler" for programming the cell 3200 (FIG. 39) to perform more than 32,000 different logic functions, in accordance with a preferred embodiment of the present invention. "Design Compiler" is available from Synopsys Inc., 700 E. Middlefield, Mountain View, Calif., USA.

The first step 3905 is to build a library, eLIB, of typically less than 1,000 logic functions. Then using eLIB and the synthesis tool "Design Compiler", synthesize a High-Level design (RTL) to gate level (step 3910). The logic level of the synthesis process is termed in the present specification and claims "e-netlist".

Step 3920 comprises mapping the function, within the e-netlist, into the logic element of the cell 3200 to perform the required logic function; this mapping process is termed in the present specification and claims as "e-mapping".

In the next step 3930, the logic elements are clustered into cells, termed "eCell-netlist". Step 3930 is termed in the present specification and claims as "e-packing".

Reference is now made to FIG. 55, which presents typical steps useful in implementing step 3905 for constructing the library eLIB, in accordance with a preferred embodiment of the present invention. Step 3905 comprises the following substeps:

Step 3940: In this step, the F/F function is constructed including the functions DFF; Enabling DFF ; and Synchromatic Reset DFF.

DFF is the cell 3244 (FIG. 39) known in the art as Dflip/Flop. Using the multiplexer 3211, the jumpers of the eCell 3200 could be configured to provide additional Flip/Flop functions.

Enabled Dflip/Flop is constructed by connecting the QN output of 3244 to M0 3240 of the multiplexer 3211 using jumper 3204 or 3202 (FIG. 39). In such a case, the MS input 3262 becomes the enable control line of the enabled F/F and as long as the MS 3262 is low, the F/F maintains its current data. In another configuration, VDD could be connected to the M0 input of the multiplexer 3211 by jumper 3206 or 3208. In such a configuration, the MS input 3262 becomes the synchronic reset signal. This means that when the input MS 3262 is low, the F/F 3244 is reset on the next clock.

Step 3950: In this step the inverter function is constructed and includes implementing the functions 6× inverter 3260 (FIG. 39) and 8× inverter 3269 (FIG. 39).

Step 3960: In this step, the 2-input function is constructed and includes the step of implementing the 16 logic functions, which can be implemented by LUT-3 when it is reduced to LUT-2.

Step 3970: In this step, the 3-input function is constructed and includes the step of implementing the 256 functions, which may be implemented by LUT-3.

Step 3980: In this step, the 4-input function in constructed and includes the step of implementing the 256 logic functions which may be implemented by LUT-3 with a NAND-2 on one of its input lines.

The construction of eLIB (step 3905) provides a library with typically less than 1,000 logic functions and therefore allows the use of the synthesis tool "Design Compiler".

In step 3920, the output of the synthesis tool, namely the e-netlist is mapped and packed into the cell 3200 and is termed in the present specification and claims as "eCell-netlist".

In accordance with a preferred embodiment of the present invention, configuring the multiplexer MUX 3211 (FIG. 39) to many 2-input functions allow the mapping of the 2-input function into MUX 3211. Additionally, in accordance with a preferred embodiment of the present invention, certain subset 3-input function which are in step 3970 may also be mapped into MUX 3211.

In accordance the preferred embodiment of the present invention, 2-input functions such as AND and NAND functions may also be mapped into the NAND device located in the input lines of LUT 3212 (FIG. 39).

In accordance with yet another preferred embodiment of the present invention, the 2-step process described hereinabove may also be used to improve performance of a logic design. For example, it is known in the art that a multiplexer such as MUX 3211 (FIG. 39) typically has a faster response time than a LUT unit, such as LUT 3210 and LUT 3212 of FIG. 39. By using the mapping method as described hereinabove, an improved design performance may be achieved in addition to improving the design of the silicon density.

In order to improve performance, the mapping step should first give priority to map the logic functions, which are on the critical path to MUX 3211. Reducing the response time of the critical path, is generally related to improving the performance of the design.

In accordance with a further embodiment of the present invention, a RAM cell, may be replaced by a non-volatile ferro-electric or ferro-magnetic memory cell.

An advantage of using ferro-electric and ferro-magnetic memory cells is that these cells do not lose data when power is switched-off. An additional advantage of ferro-electric and ferro-magnetic memory cells is that these cells are typically smaller than a RAM cell unit. Thus, ferro-electric and ferro-magnetic memory cells are more economical by requiring smaller quantities of silicon. A smaller cell provides faster LUT performance and consumes less power. U.S. Pat. No. 5,565,695, the disclosure of which is incorporated by reference, teaches the use of a magnetic spin transistor for a non-volatile memory In accordance with yet another preferred embodiment of the present invention, a memory structure may be provided that is laser programmable. Such methods are known in the art and described in U.S. Pat. No. 5,940,727, entitled "Technique For Producing Interconnecting Conductive Links", issued Aug. 17, 1999, inventor Joseph B. Bernstein, and assigned to Massachusetts Institute of Technology, Cambridge, Mass., USA, the disclosure of which is incorporated by reference. With such an approach high-density RAM cells may be manufactured with a good manufacturing turnaround time.

In accordance with yet another preferred embodiment of the present invention, the RAM cell 3320A (FIG. 42) may be replaced with a "fixed connection" device, by using "via programming" for creating a connection between 2 overlaying metal layers, such as Metal 3 and Metal 4 layers. In such a case, although the LUT device cannot be changed or reprogrammed, however, by using the "fixed connection" device there is a significant saving in silicon area.

Figure 56A:
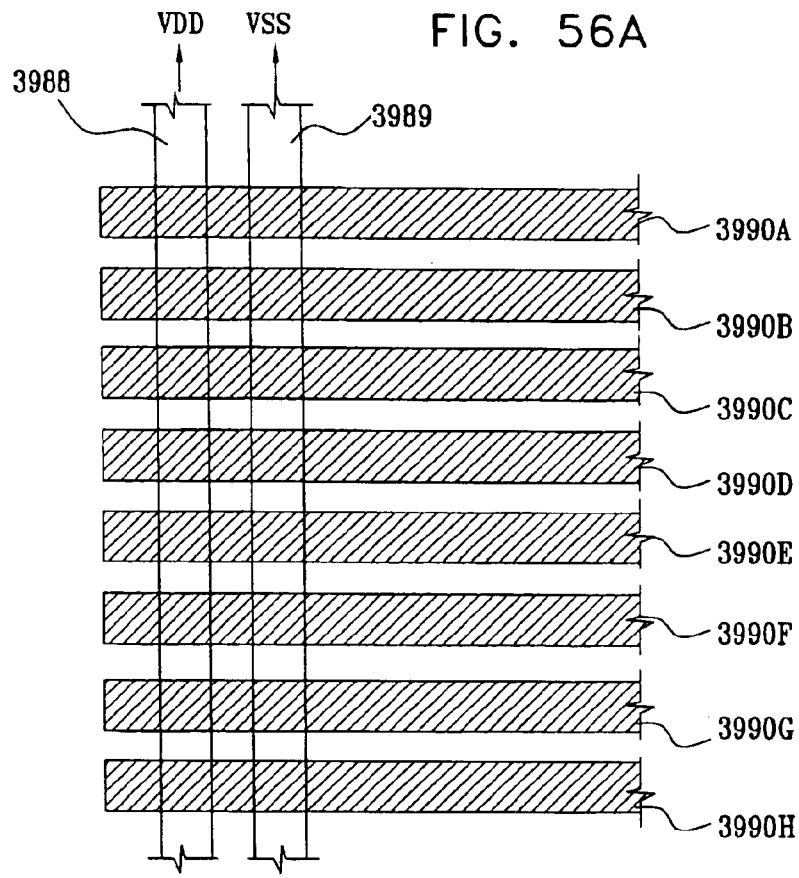
FIG. 56A is a schematic diagram of a "fixed connection" device, in accordance with another preferred embodiment of the present invention.

Reference is now made to FIG. 56A, which shows a typical layout of such a "fixed connection" device which is designed to replace the 8 RAM cells 3320A–3320H of FIG. 41. In FIG. 56A, the metal strips 3988 and 3989 are overlayed by the strips 3990A–3990H. The metal strip 3988 is preferably connected to the VDD line and the metal strip 3989 is preferably connected to the VSS line. The strips 3990A–3990H are identified with the output lines R(0) . . . R(7) from the 8 RAM cells 3320A–3320H (line 3412 in FIG. 42).

In operation of a specific logic configuration, the programming of the LUT is performed by connecting the via 3992A to the VDD line by means of the metal strip 3988 and the via 3992B to the VSS line by means of the metal strip 3989, respectively, as described hereinbelow. In preparation, such a task is preferably undertaken by using a mask with the required pattern.

Figure 56B:
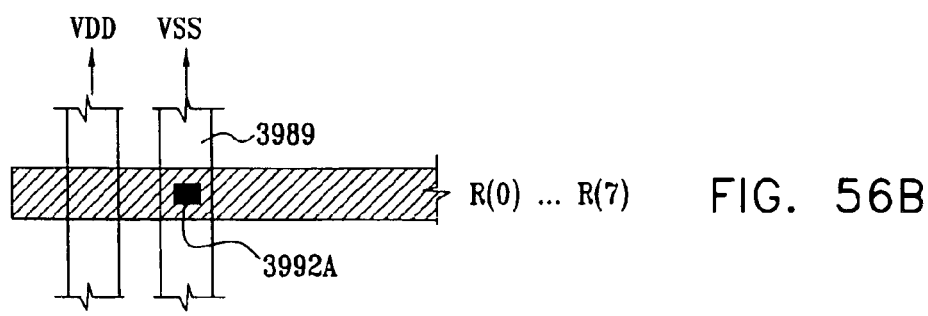
FIG. 56B is a schematic diagram of a "fixed connection" device for low level logic, in accordance with a preferred embodiment of the present invention.

Reference is now made to FIG. 56B, which shows the required configuration for low level logic. In the layout shown in FIG. 56B, the via 3992A connects between the relevant line from R(0) . . . R(7) with the VSS line.

Figure 56C:
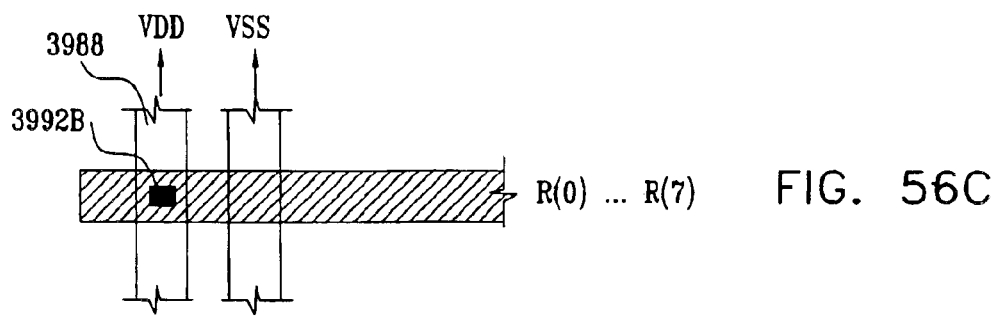
FIG. 56C is a schematic diagram of a "fixed connection" device for high level logic, in accordance with a preferred embodiment of the present invention.

Reference is further made to FIG. 56C, which shows the required configuration for high level logic. In the layout shown in FIG. 56C, the via 3992B connects between the relevant line from R(0) . . . R(7) with the VDD line.

Reference is now made to FIGS. 57A and 57B, which show a simplified illustration of a typical logic array comprising a plurality of identical logic array modules in accordance with a preferred embodiment of the present invention. FIGS. 57A and 57B show a typical application specific integrated circuit (ASIC) 4010 which includes therewithin on a single silicon substrate a number of components, such as a data memory 4012, a digital signal processor (DSP) 4014, an instruction memory 4016, reused logic 4018, a ROM 4020, a RAM 4022, and a CPU 4024. In accordance with a preferred embodiment of the present invention, also includes logic formed of a plurality of logic array modules 4030, which in this example, appear in a number of different forms.

It is a particular feature of the present invention that the logic array modules 4030, also termed modular logic array units, are arranged in a desired mutual arrangement without the requirement of compilation. The logic array modules 4030 are preferably physically arranged with respect to each other to define a desired aspect ratio.

In accordance with a preferred embodiment of the present invention, the logic of ASIC 4010 is preferably produced by using a data file for a modular logic array which comprises at least a reference to a plurality of identical modular data files, each corresponding to a logic array unit and data determining the physical arrangement of the logic units with respect to each other.

In the illustrated embodiment of FIGS. 57A and 57B, modules 4030 having 3 different configurations are provided. It is appreciated that one or any suitable number of different configurations of modules may be employed in any application.

In accordance with a preferred embodiment of the present invention the border between each modular logic array unit and its neighbor may be identified by at least one row 4040 of stitches 4042. In the illustrated embodiment of FIGS. 57A and 57B, stitches 4042 are embodied in removable conductive strips 4044 formed in a relatively high metal layer, such as a top metal layer. The strips 4044 are preferably connected by vias 4048 to strips 4040 in a relatively lower metal layer, such as a next-to-top metal layer, thereby to removably bridge gaps 4042 therebetween.

Preferably each logic array module 4030 comprises between 10,000 and 200,000 gates and has an area of between 0.5 square millimeter and 6 square millimeters.

Reference is now made to FIGS. 58A, 58B & 58C which illustrate three typical configurations of logic array modules in accordance with a preferred embodiment of the present invention. The module of FIG. 58A has a generally square configuration and typical dimensions of 2 mm×2 mm. The module of FIG. 58B has a generally rectangular configuration and typical dimensions of 4 mm×1 mm. The module of FIG. 58C has a generally rectangular configuration and typical dimensions of 1 mm×4 mm.

Reference is now made to FIGS. 59A and 59B, which are simplified illustrations of various different arrangements of identical logic array modules useful in accordance with the present invention. FIG. 59A illustrates two square modules 4050 arranged with their scan inputs and scan outputs in a parallel arrangement. FIG. 59B shows two square modules 4050, which may be identical to the modules of FIG. 59A, arranged with their scan inputs and scan outputs in a series arrangement.

FIGS. 60A and 60B are simplified illustrations of logic array modules tiled together in two different arrangements providing substantially rectangular arrays with different aspect ratios.

Reference is now made to FIG. 61, which shows a programmable Integrated Circuit (IC) device 5010 constructed and operative according to a preferred embodiment of the present invention. The integrated circuit device 5010 may be a stand-alone device or may, alternatively, be integrated into a larger device. In such a case, the device may constitute a programmable portion of a system on a chip.

The underlying architecture of the integrated circuit device 5010 is comprised of an array of LUT programmable blocks 5012 connected by fixed metal routing or by programmable routing. By controlling the content of the LUT of individual blocks 5012 of the device 5010 it is possible to identify and isolate both logical and circuit faults in circuits constructed from LUTs, while the device 5010 is operating in a functional working mode.

Reference is now made to FIG. 62A, which is a simplified representation of the layout of the input/output connections of a conventional 2-bit LUT device 5020 constructed and operative according to a preferred embodiment of the present invention it is appreciated that the LUT device 5020 may typically be an individual block 5012 in the array of the device 5010 of FIG. 61.

In FIG. 62A it is seen that the LUT 5020 comprises two input ports 5022 and 5024, and an output port 5026. FIG. 62B shows the typical truth table 5027 for the LUT device illustrated in FIG. 62A. "A" and "B" represent the binary input signals to LUT unit 5020 and "C" represents the binary output values, $b_1$, $b_2$, $b_3$, and $b_4$, from the unit 5020. In accordance with a preferred embodiment of the present invention, by reprogramming the unit 5020, it is possible to provide controllability as required for debugging.

Using NAND as an exemplary gate, the output values are given by the truth table 5028 as listed in FIG. 62C. After reprogramming, to provide a controlling value of "0", the output values are given by the truth table 5029, as shown in FIG. 62D.

Thus, in accordance with a preferred embodiment of the present invention, by isolating a particular LUT in a block, reprogramming and noting the input values to the device, and recording the output values, the designer is able to resolve the error in the design.

Figure 63A:
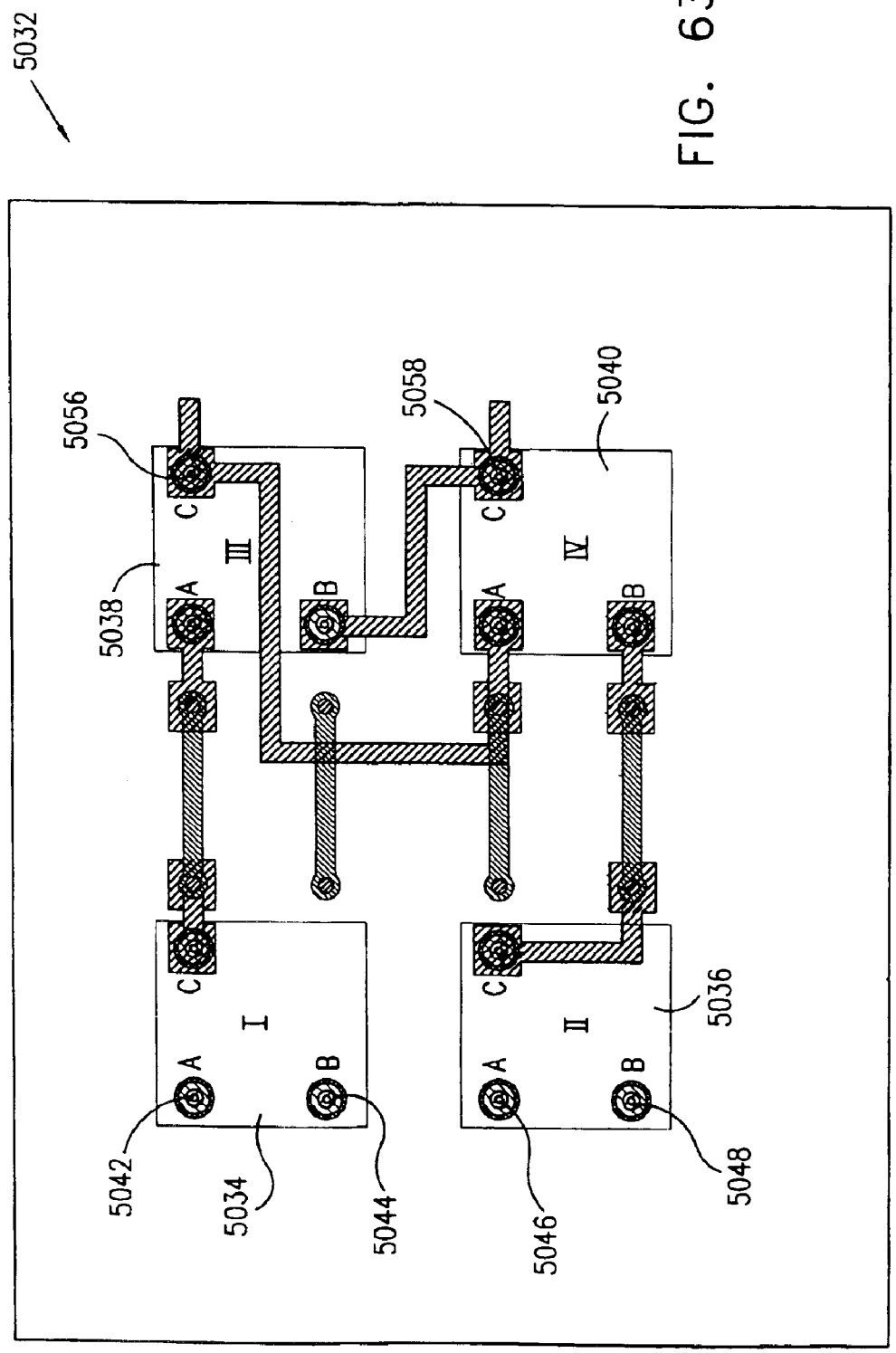
FIG. 63A illustrates the typical connections of a logic gate device.

Reference is now made to FIG. 63A, which shows a circuit 5032, which may be a portion of the array 5010 (FIG. 61), and comprising 4 LUT logic units 5034 (I), 5036 (II), 5038 (III) and 5040 (IV). The units 5034 and 5036 include input ports 5042 and 5044, and 5046 and 5048, respectively. The output signals from the device 5032 are outputted from output ports 5056 and 5058, respectively.

FIG. 63B is a schematic drawing of the device of FIG. 63A.

In normal operation, each of the 4 LUTs, comprising the device 5032, produce outputs as summarized in the truth table 5048 of FIG. 63C.

If for example, in the debugging process it is desired to control the output of the LUT unit 5034 of the device 5032, the LUT 5034 may be reprogrammed and the output of LUT 5034 forced to "0", as shown by the truth table 5050 in FIG. 64A. The truth table 5052 presents the unchanged truth table of the individual LUTs 5036, 5038 and 5040 (FIG. 64A). An equivalent schematic drawing 5054 is shown in FIG. 64B in which the LUT 5034 is substituted by a "0". Thus, in accordance with a preferred embodiment of the present invention, the output from a LUT device may be controlled to give a predicted result, as is shown in the present case for LUT 5034.

Figures 65A, 65B:
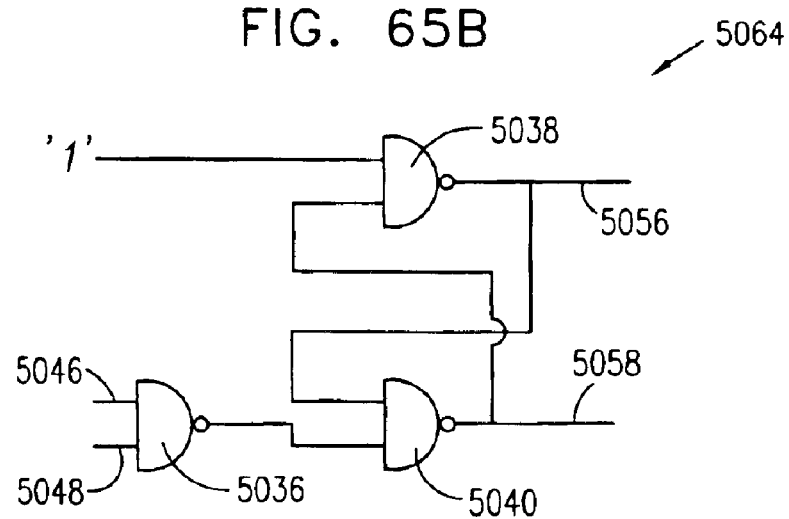
FIG. 65A shows the truth table of a LUT device of FIG. 64A after the LUT device 34 is forced to "1"
FIG. 65B is a schematic drawing of the device whose truth table is shown in FIG. 65A.

Similarly, in accordance with a preferred embodiment of the present invention, it is also possible to reprogram the inputs to LUT 5034 to force the output to "1", as shown in truth table 5060 of FIG. 65A. The truth table 5062, which presents the unchanged truth table of the individual LUTs 5036, 5038 and 5040, is also shown. An equivalent schematic 5064 is shown in FIG. 65B, in which the LUT 5034 is now substituted by a "1". As previously, the output from device 5032 is controllable and dependent on LUT 4034.

As described above, a substitution of truth tables in a LUT can make the LUT appear to have a fixed or "stuck-at" value on its inputs or output. By successively selecting both "stuck-at" values for every input and output, and executing the customized function's test vectors, a verification of the test vectors' fault coverage can be obtained.

Figures 66A, 66B:
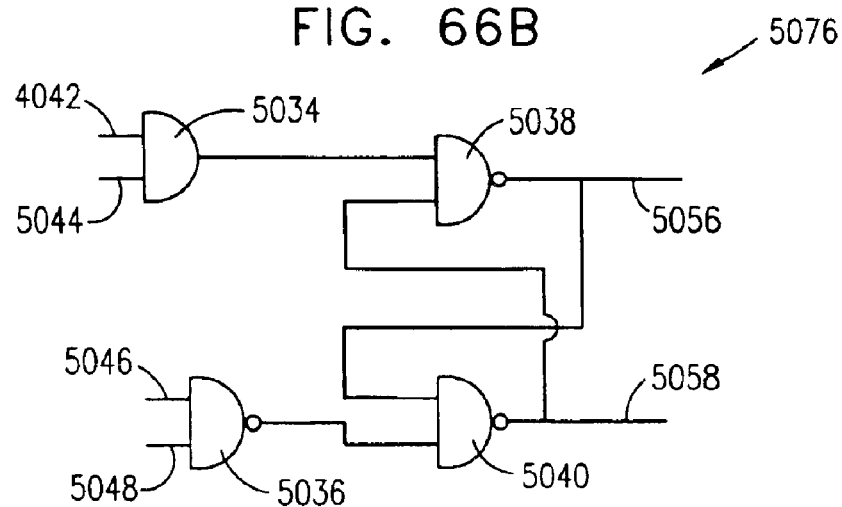
FIG. 66A presents the truth tables for the device after LUT 34 is forced to a first complementary function.
FIG. 66B is a schematic drawing of the LUT unit of FIG. 66A.

Reference is now made to FIG. 66A, which shows truth tables 5072 and 5074. FIG. 66A, shows a truth table 5072 for an AND gate, and a truth table 5074 for a NAND gate. Thus, if LUT 5034 is reprogrammed with truth table 5072, and the remaining units 5036, 5038 and 5040 are unchanged, a logic circuit 5076, as shown in FIG. 66B, may be achieved. In FIG. 66B, the NAND gate 5034 is changed from a NAND to an AND gate. A LUT can thus be reprogrammed to give an inverted result of the function of LUT 5034, as may be required in the debugging process.

Figures 67A, 67B:
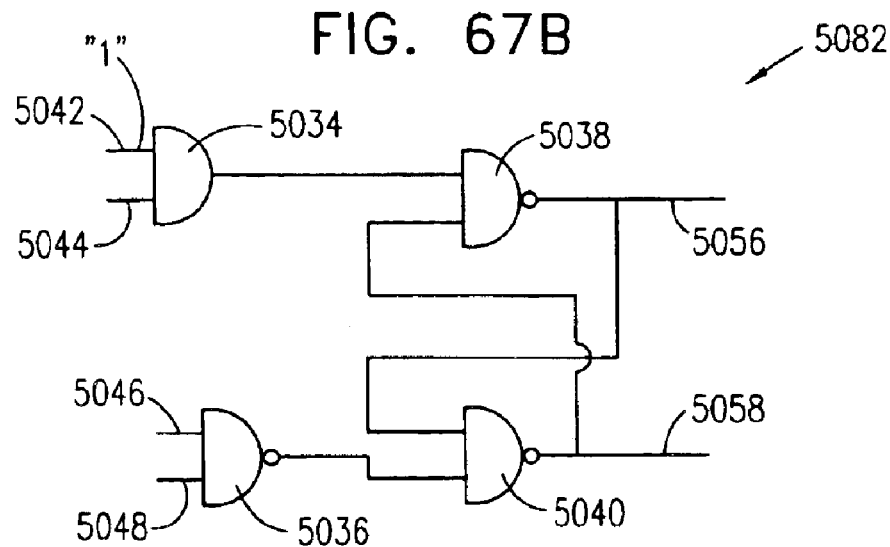
FIG. 67A presents the truth tables for the device after LUT 34 is forced to a second complementary function.
FIG. 67B is a schematic drawing of the LUT unit of FIG. 67A.

Reference is now made to FIG. 67A, which presents truth tables 5078 and 5080. The truth table 5078 is that of a NAND gate in which one of its inputs is tied to logic "1", or simply an inversion of the "B" input. Thus, if LUT 5034 is reprogrammed with truth table 5078, and the LUT units 5036, 5038 and 5040 are unchanged, a logic circuit 5082 (FIG. 67B) is achieved. Thus, a further type of controllability is obtained which may be required in a debugging process. This allows the effect of signal 5044 to be observed while signal 5042 is disconnected.

In a debugging operation, a user identifies the LUT unit to reprogram, by modifying a reference port of an object in the high-level data description. Once the port is identified, the user is offered a choice of changes to select, and on selection, an appropriate change is made in the machine readable data file which programs the device. The machine-readable file is downloaded to the integrated circuit and the desired change is effected. The debugging process is carried out by monitoring the result of the chosen unit.

Figure 68:
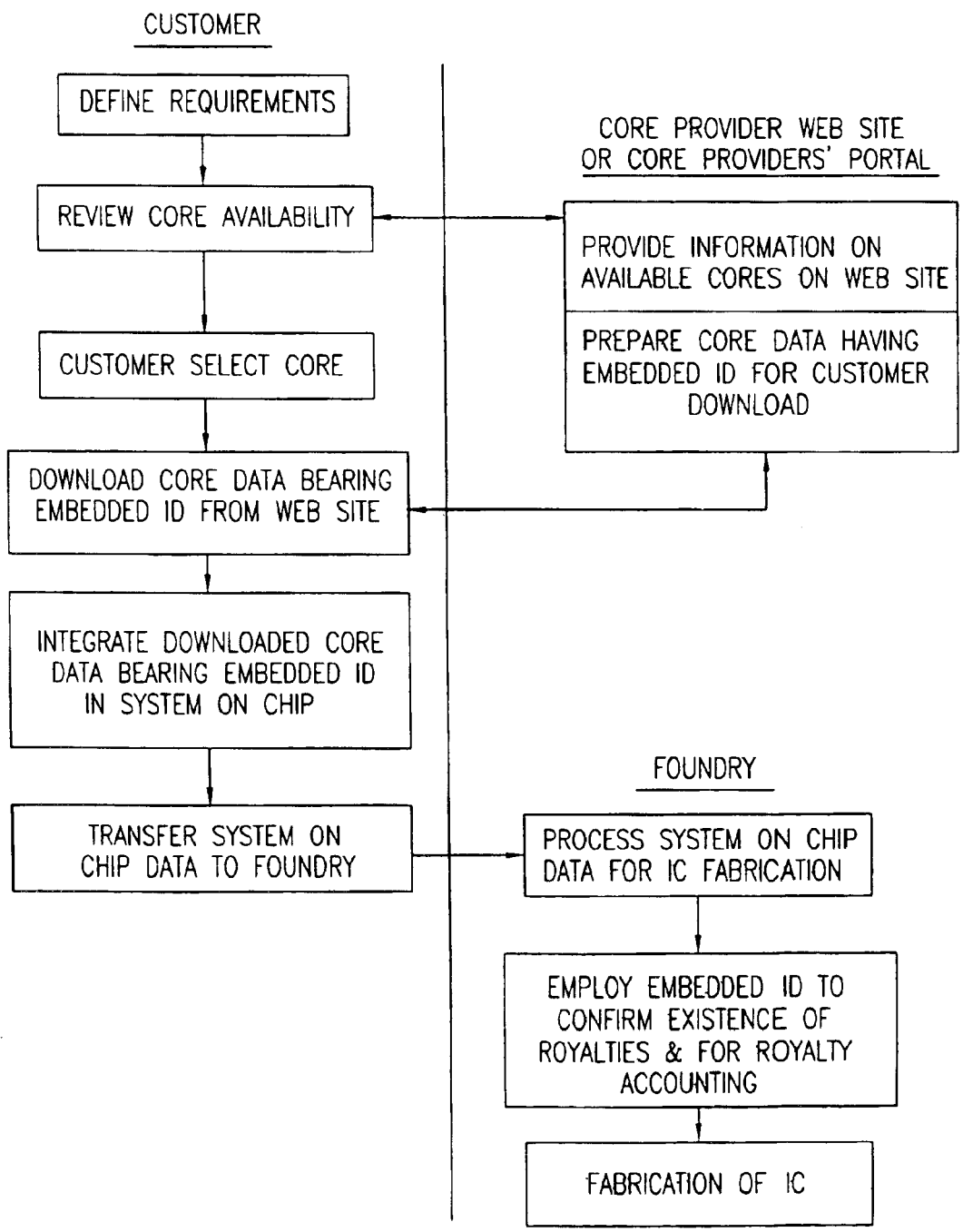
FIG. 68 is a simplified flowchart illustrating a preferred method of semiconductor design and fabrication in accordance with a preferred embodiment of the present invention.

Reference is now made to FIG. 68, which illustrates in very general terms a preferred method of semiconductor design and fabrication in accordance with a preferred embodiment of the present invention.

As seen in FIG. 68, in accordance with a preferred embodiment of the present invention, three entities participate in the semiconductor design and fabrication: the customer, a core provider's web site or core provider's portal and a foundry. In a preferred embodiment, the core provider may or may not be the actual developer of the core.

The core provider's web site or a portal providing access to a plurality of web sites of various core providers provides a searchable database describing various cores which are commercially available for use by designers as well as core data suitable for download. In accordance with a preferred embodiment of the present invention, the core data bears embedded identification indicia, which enables the presence of the core data to be readily identified downstream when the core is embedded in a chip design such as a system on a chip design.

The identification indicia may also include version identification indicia which enables updated versions of the core data to be readily cataloged and identified to ensure that the most updated version is incorporated in the chip design.

The cores which are provided via the core provider's web site may be static cores, such as those commercially available from ARM, Ltd. or alternatively customizable or customizable cores, such as those commercially available from eASIC of San Jose, Calif., USA.

In accordance with a preferred embodiment of the present invention, the customer after having defined his requirements dials up to the core provider's web site either directly or via a core providers' portal, identifies a core which appears to fit his requirements and downloads the core data, bearing the embedded identification indicia. It is a particular feature of the present invention that the customer works interactively with the core provider's web site in the core selection process, thus greatly increasing the efficiency of the core selection integration process.

Once the customer has received the core data, he integrates it, including the embedded identification indicia into a chip design, such as a system on a chip design. After carrying out suitable checks, the customer transfers the system on chip data, including the embedded identification indicia, to a foundry.

The foundry processes the system on chip data for integrated circuit fabrication and employs the embedded identification indicia to determine the existence and amount of royalties owed to the core providers. Using this information, the foundry provides required cost estimates for the customer. Once these are approved and payment of royalties to the core providers is arranged, fabrication of Ics based on the chip design is carried out.

Figure 69A:
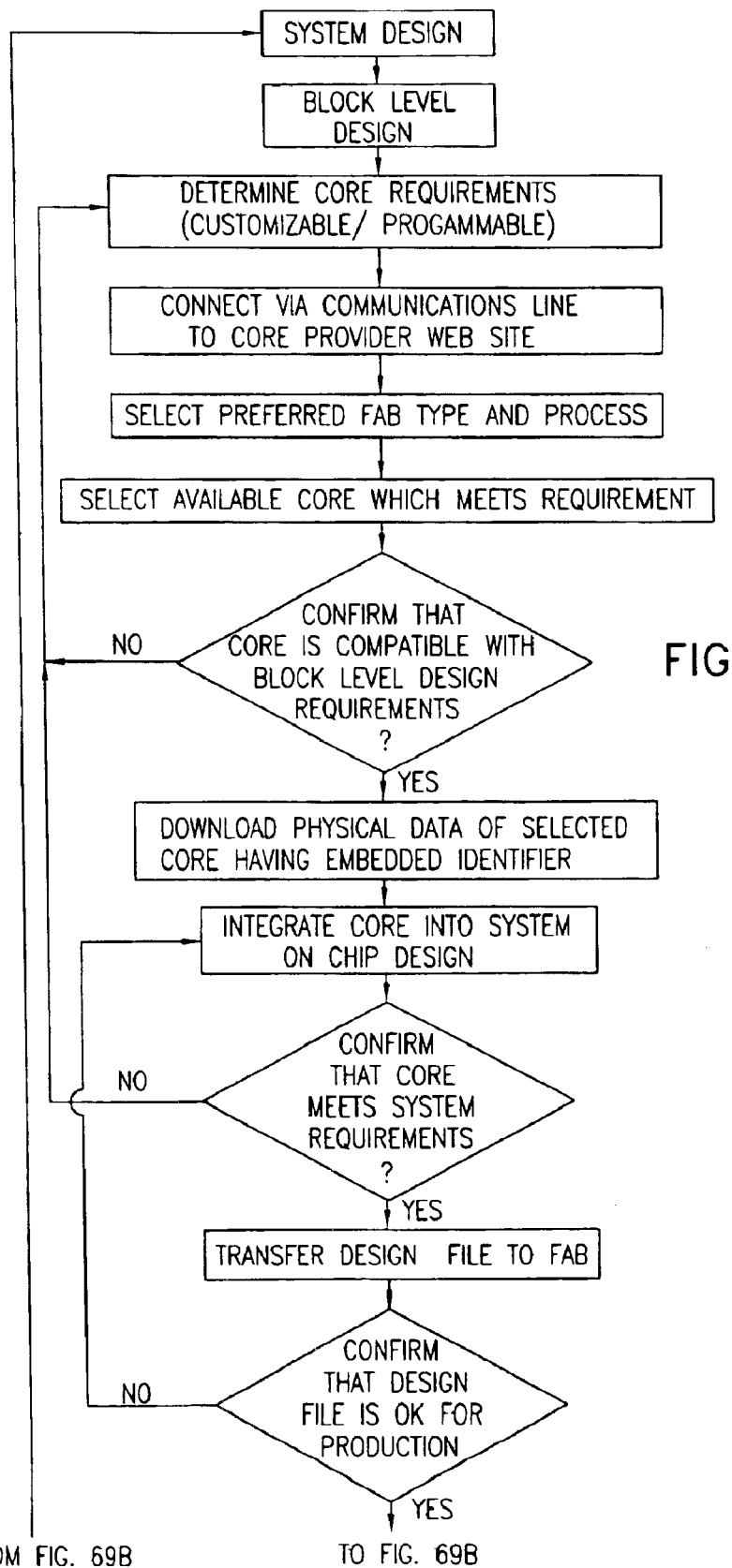
FIGS. 69A and 69B are together a flowchart illustrating a preferred method of semiconductor design and fabrication in accordance with a preferred embodiment of the present invention.
Figure 69B:
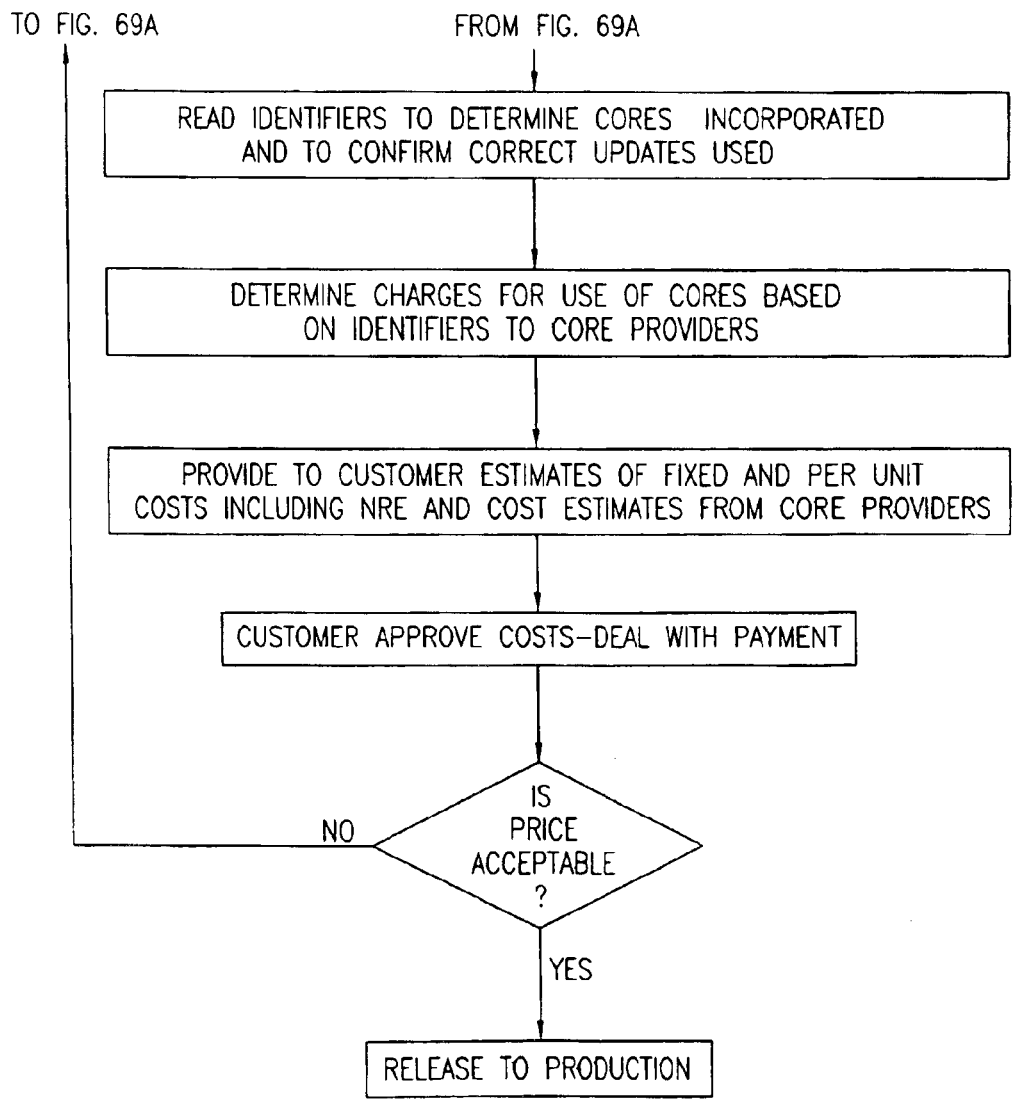

Reference is now made to FIGS. 69A and 69B, which are together a flowchart illustrating a preferred method of semiconductor design and fabrication in accordance with a preferred embodiment of the present invention.

As seen in greater detail in FIGS. 69A and 69B, prior to interaction with the core provider's web site, the customer completes an overall system design and a block level design in a conventional manner. The customer also determines his core requirements which include performance requirements and whether the core may be static or is required to be customizable and/or programmable.

Once the customer has determined his core requirements he preferably establishes communication with a web site of one or more core providers, preferably via the Internet. Using established menus and interactive searching and selection techniques, the customer selects require parameters of the cores, such as the fab type, for example TSMC and UMC, and the fab process, such as 0.25 micron or 0.18 micron.

The customer then selects an available core which appears to meet the customer's requirements and confirms that the selected core meets the customer's earlier defined block level design requirements. This confirmation is preferably carried out in an interactive manner via the Internet.

If there is an incompatibility between the block level design requirements and the selected core characteristics, the customer preferably revises the block level design to eliminate the incompatibility. This process continues until no incompatibility exists. At that stage the physical data, using industry standard format such as GDS-II, of the selected core is downloaded by the customer, preferably via the Internet.

As noted above, in accordance with a preferred embodiment of the present invention, the core data bears embedded identification indicia, which enables the presence of the core data to be readily identified downstream when the core is embedded in a chip design such as a system on a chip design.

Upon receiving the downloaded core data, the customer integrates it, including the embedded identification indicia, into a chip design, such as a system on a chip design. The customer then checks that the core, as integrated into the chip design, meets the system requirements earlier established by the customer.

If the system requirements are not met, the system design is revised, possibly interactively with the entire core process, preferably via the Internet. Once any necessary revisions in the system design have been made and it is determined that the core as integrated fulfills the system requirements, the customer transfers the system on chip data, including the embedded identification indicia, to a foundry. This transfer may also take place via the Internet.

Upon receiving the chip data from the customer, the foundry confirms that the chip data is ready for production. If the data is, for any reason, not ready for production, the foundry interacts with the customer to resolve whatever problems exist. This may require that the customer revise all of its design steps described hereinabove including interaction with the core provider via the Internet.

Once all producibility problems have been resolved, the foundry processes the system on chip data for integrated circuit fabrication and employs the embedded identification indicia to determine the existence and amount of royalties owed to the core providers. In accordance with a preferred embodiment of the present invention, the foundry also employs the embedded identification indicia to ensure that the most updated versions of the core data and chip design data are being employed.

Using the embedded indicia and other information, the foundry provides required cost estimates for the customer. These include NRE costs, which may include NRE payments to core providers, as well as anticipated per unit costs which include per unit royalties to core providers. Once the costs are approved and payment of royalties to the core providers is arranged, fabrication of Ics based on the chip design is carried out.

In another preferred embodiment of the invention, the NRE and/or royalty payments may be made directly to the core developer if the core developer is not the core provider, or the NRE and/or royalty payments may be made directly from the foundry, as opposed to the customer.

In another preferred embodiment of the invention, a fourth entity, the Mask Shop, may confirm the chip data is ready for production and employ the embedded identification indicia to determine the existence and amount of royalties owed to the core providers.

In yet another preferred embodiment of the invention, the embedded identification indicia may include encrypted data, which identifies the size, type and revision of the customizable core. One such method would be to add a mask layer, which contains data necessary to the fabrication of the part, as well as encrypted data for identification and sizing of the core. The necessary fabrication data is extracted and used by combining this layer with other appropriate layers when creating the masks for fabrication. The same process is followed to extract the identification and sizing information, only the choice of operations and mask layers changes. The choice of mask layers and the actual operations are contained within a proprietary process that is provided to the foundry or mask shop by the core developer.

In another preferred embodiment of the invention, the chip data provided by the customer is not sufficient to create the core. Rather, the embedded identification indicia contain references to library data that is provided to the foundry or mask shop by the core developer. The proprietary process would include addition of the appropriate library data, as defined by the embedded identification indicia, into the customer's chip data. In this embodiment the most updated version of the core data may be provided to the foundry or mask shop, by the core developer, within the library data. By including the appropriate library data, the most updated version of core data is thereby employed. In this embodiment, the core provider provides the customer with sufficient information to design and create the chip data, without providing sufficient information to fabricate the core.

Figure 70:
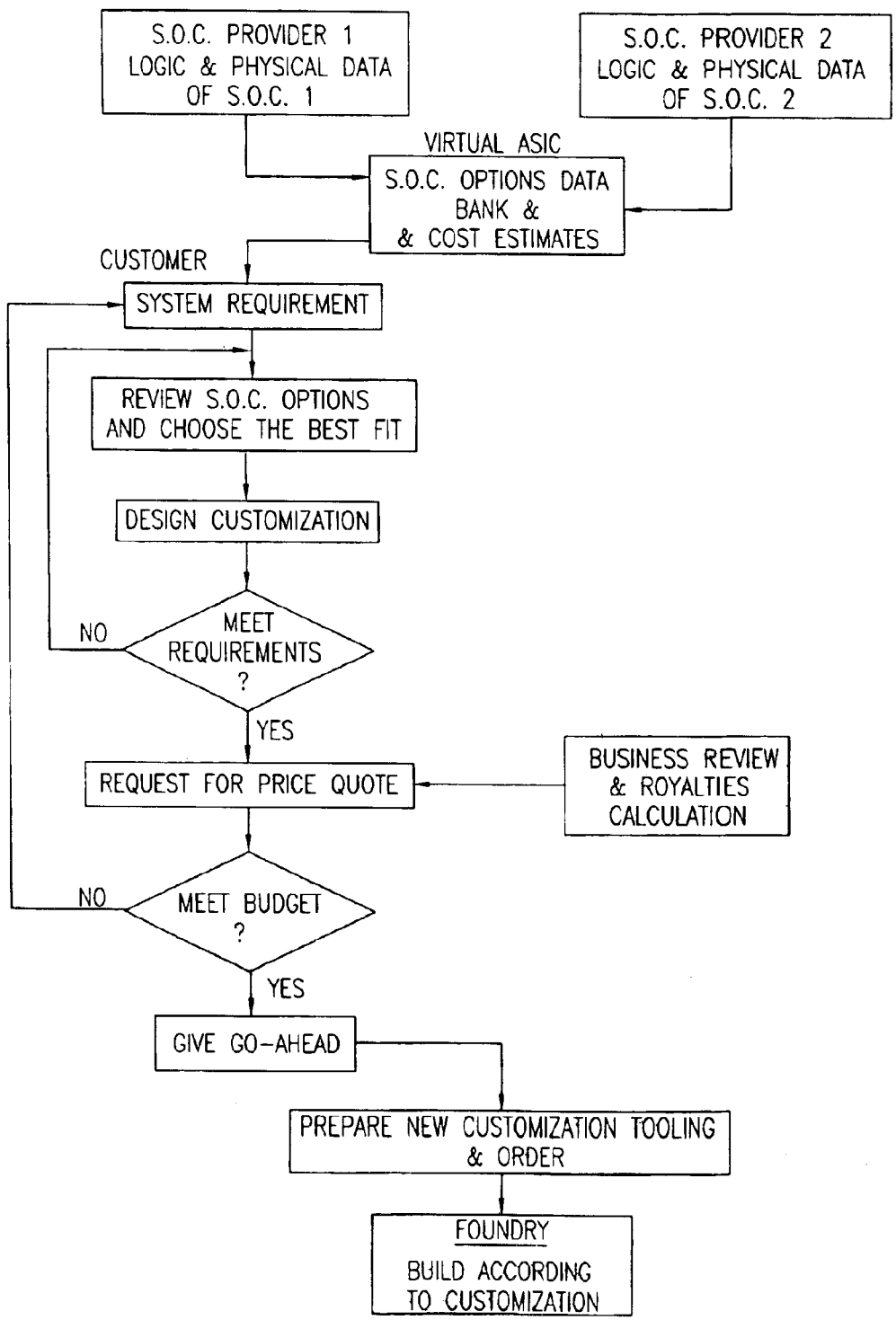
FIG. 70 is a simplified flowchart illustrating the method in which a Virtual ASIC entity interacts with a customer to provide cost effective chip production.

Reference is now made to FIG. 70 which presents a simplified flowchart showing the use of a Virtual ASIC entity, by a customer, to provide a custom-effective design of an S.O.C.

It is seen in FIG. 70, that various S.O.C. providers forward their programmable and/or customizable S.O.C. options to the Virtual ASIC entity. Based on the acquired data, the Virtual ASIC entity builds a S.O.C. data bank or library, which also includes the general data for the programmable and customizable portions of each S.O.C. Each entry into the data bank includes an identification code of the various cores provided with each S.O.C. Additionally, the data bank includes a code system for identifying the S.O.C. provider who have given permission to disclose the data, and make available the tooling of the specific S.O.C.

The Virtual ASIC entity also provides a cost estimate for the use of the various data options and elements. These cost estimates also include the cost of the wafer and the various cores which are part of the S.O.C.

A customer who wishes to use the data bank so as to integrate the available data into his particular design, for example so as to save on tooling costs, searches the data bank and reviews the various S.O.C. options available from the Virtual ASIC data bank which meet his design requirements.

The customer decides on the particular design available from the data bank, which closely as possible meets his technical requirements. The customer then finalizes his design which includes both programmable and customizable portions.

After confirming that the new S.O.C. design meets the technical requirements, the customer requests a cost estimate for the use of the required data and tooling, typically taking into consideration the costs of various additional factors, such as the cost of the wafer and the cores which form part of the proposed S.O.C., the cost of integrating the design into the S.O.C., and the cost of programming and/or the customization service required.

Additionally, the customer may also perform a business review with the Virtual ASIC entity, as to the turn around time of the development phase and NRE and the services costs required.

Once the customer is satisfied with the budgetary considerations, he places an order with the Virtual ASIC to provide the required data and release of the chosen S.O.C. tooling.

The foundry processes the silicon, as required, and delivers the chip to the Virtual ASIC for transfer to the customer.

As described hereinabove with reference to the cell array device of FIG. 23, after customization, the cell array includes a total of seven metal layers, identified as M1–M7, the top metal layer being identified as layer M7. In deep sub-micron processes it is preferable to have the top metal layer thicker than the lower metal layers. One advantage of a thick upper layer is to allow good bonding packaging process, as is known in the art. Therefore, the top metal layer (M7) typically comprises a coarser pitch than the lower metal layers (M1–M6). For example, for a "0.15-micron process", for the M2 to M6 metal layers, the pitch is about 0.48 micron. However, for the M7 metal layer, the pitch is about 0.90 micron.

In order to include more custom routing resources in the cell array, it is advantageous to use a metal layer with a fine pitch for the customization layer. Thus, in accordance with a preferred embodiment of the present invention, the via layer connecting between two layers, which has typically a fine pitch, is used as the custom layer. The coarse pitch layers, such as the M7 layer, are used as part of the long track layers.

Preferably, the M5M6 via layer, being of finer pitch, is used as the customization layer, the M5, M6 metal layers are used for long and short routing layers, respectively, and the M7 layer is used for long track routing.

It is appreciated that the time-to-market customization of the M5M6 via layer of the present embodiment of the invention, typically takes longer than the customization of the M6M7 via layer of the previous embodiments of the present invention described hereinabove However, the higher circuit density resulting from the higher pitch of the M5M6 layer makes the present embodiment commercially very attractive.

Figure 71:
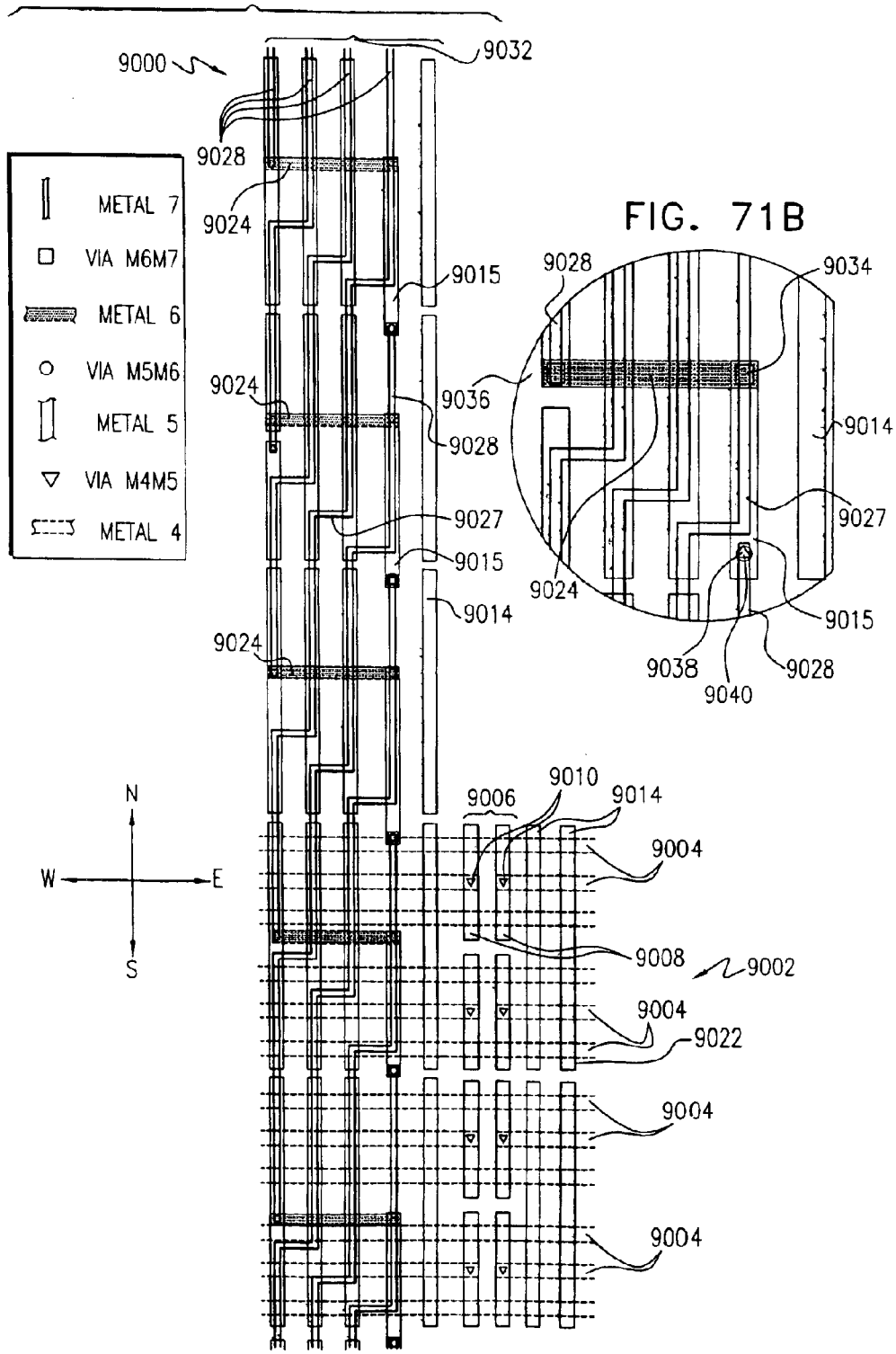
FIG. 71A is a schematic illustration of the top four metal layers of a cell array device constructed and operative in accordance with another preferred embodiment of the present invention, prior to customization.
FIG. 71B shows in more detail the periodic connections of FIG. 71A.

Reference is now made to FIG. 71A, which is a schematic illustration of interconnection structure 9000 of the 4 upper layers M4, M5, M6 and M7, prior to customization, constructed and operative in accordance with a preferred embodiment of the present invention. The structure of FIG. 71A is similar to the one in FIG. 23 but is modified in such a way so as to provide customization of the M5M6 via and the M6 layer.

In accordance with a preferred embodiment of the present invention, the interconnection structure 9000 comprises a M4 metal layer for long tracks in the East-West direction and a M5 layer comprising short strips for local interconnections in the North-South direction. A M5M6 via layer is the custom layer. The M6 layer is preferably used for short local interconnection strips in the West-East direction. Additionally or alternatively, the M6 layer may be a custom layer or a generic layer.

In addition, the M6 layer is used for short interconnections between the long North-South strips of M7 and to provide short interconnections, as described hereinbelow.

As shown in FIG. 71A, the interconnection structure 9000 comprises a M4 layer providing long tracks 9002 in the East-West direction. The long tracks 9002 comprise parallel evenly spaced bands of metal strips 9004. The strips 9004 typically extend across pairs 9006 of short strips 9008 of M5 layer and are connected by means of a M4M5 via 9010 to the short strips 9008. The pairs 9006 provide connections to the long routing conductors 9004 in the M4 layer, in the East-West directions.

It is noted that adjacent ones of strips 9004 begin and end at strips 9008 of different members of the pairs 9006, such that each pair 9006 of strips 9008 is connected to strips 9004 extending along a different axis. It is appreciated that each strip 9008 is preferably connected to only a single strip 9004.

FIG. 71A also shows that the M5 layer comprises multiple spaced bands of parallel evenly spaced metal strips 9014, in the North-South direction.

The interconnection structure 9000 also comprises multiple bands of stepped M7 metal strips extending generally in the North-South direction. FIG. 71A shows a single band 9032 of parallel stepped strips 9028.

Reference is now made to FIG. 71B, which shows in more detail the periodic connection of the North-South long tracks 9028 in the M7 layer and the North-South short bar 9015 in the M5 layer. The West-most/South-most end of stepped strip 9028 is connected to a M5 bar 9015 by means of the short M6 strip 9024. A M6M7 via 9036 provides connections between the M7 strips 9028 to short M6 strip 9024 and a M5M6 via 9034 connects between the M6 strip 9024 and the short M5 bar 9015.

The South-most end of the short M5 bar 9015 is connected to the East-most/North-most M7 layer step strip 9028 by means of a M5M6 via 9038. A M6M7 via 9040 is located above the M5M6 via 9038.

It is appreciated that the short M5 strips 9015 provide the connections to the short interconnection strips. The M5M6 vias 9034 and 9038, which are located at the respective ends of the M5 strip 9015, provide the means by which the M5 connections continue in the North or South directions.

It is also appreciated that although FIGS. 71A and 71B show the connections of a single band 9032, the 9000 pattern is repeated a multiplicity of times in both the East-West direction and in the North-South direction.

It is further appreciated that the number and lengths of the M7 step strips 9028, in a particular band 9032, may be modified and adjusted in order to fulfill the various implementations of the interconnection structure 9000.

Figure 72:
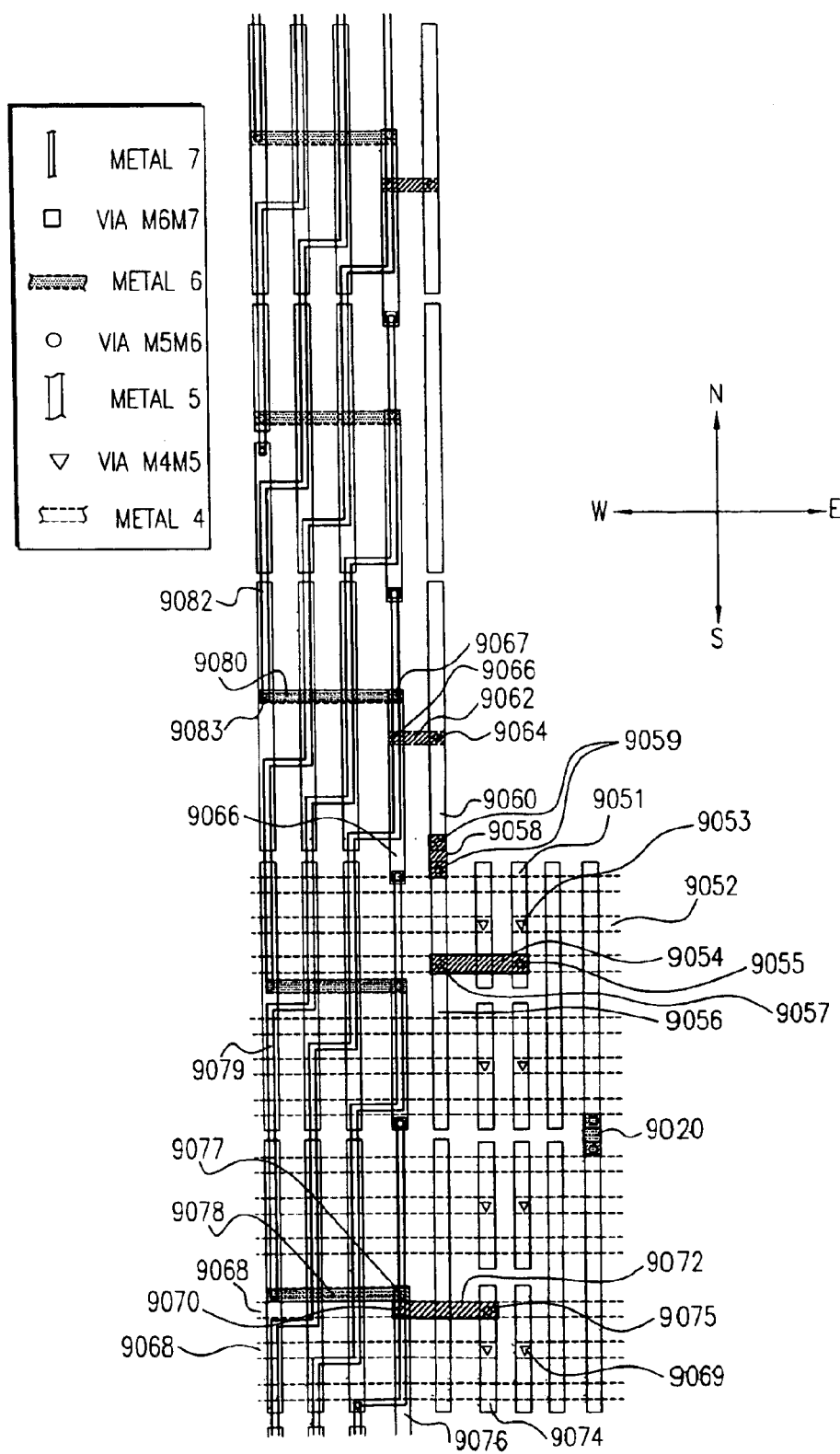
FIG. 72 is a schematic illustration corresponding to FIG. 71A following customization thereof in accordance with the present invention.

Reference is now made to FIG. 72, which provides an example of a custom routing, utilizing the pattern of FIG. 71A. In this preferred embodiment of the present invention, the customized layers used in FIGS. 72, are the MSM6 via and the M6 layers.

FIG. 72 shows an example of connecting long tracks in M4 layer to long tracks in M7 by using the custom layers M5M6 and M6. A M4 long strip 9052 is connected by a M4M5 via 9053 to a M5 strip 9054 and the MS strip 9051 is connected by means of a MSM6 via 9055 to a M6 strip 9054. The M6 strip 9054 connects by means of a M5M6 via 9057 to a M5 strip 9056. By using, a M6 bridging strip 9058 and M5M6 via 9059, MS strip 9060 is connected to MS strip 9056.

A M6 strip 9062, in the East-West direction, is connected to the M5 strip 9060 by means of a M5M6 via 9064. A M5M6 via 9066 connects between the M6 strip 9062 and the M5 short bar 9066. The short M5 bar 9066 is connected to a short M6 strip 9080 by a M5M6 via 9067. The M6 short strip 9080 is connected to a M7 stepped strip 9082 by means of a M6M7 via 9083. Thus, by connecting to the short bar 9066 and placing via 9067 the connection was made to the M7 long strips in the North-South direction.

Another example for connecting a M4 long strip to a M7 long strip is by using a M6 strip 9072. A M4 strip 9068 is connected by a M4M5 via 9069 to M5 strip 9074. The M5 strip 9074 is connected by Via MSM6 9075 to the M6 strip 9072 and the M6 strip 9072 is connected by M5M6 via 9070 to a MS short bar 9076. The MS short bar 9076 is connected by MSM6 via 9077 to M6 short strip 9078. The M6 strip 9078 is connected to a M7 long stepped strip 9079 by means of a M6M7 via, located above the MSM6 via 9077.

There are many ways to customize interconnections utilizing the pattern as described hereinabove in accordance with this preferred embodiment of the present invention. The M4 strips are used for the long routing in the West-East direction and each M4 strip is connected to the short interconnection strips. Each M4 strip is connected once to every three eCells, as described hereinabove with reference to FIG. 17. The M7 strip is used for long routing in the North-South direction and each M7 strip is connected to the short interconnection strips. Each M7 strip is connected once to every four eCells, as described hereinabove with reference to FIG. 71A. The MS strip is used for short routing in the North-South direction and each MS layer typically comprises equal size short strips arranged in parallel bands. Preferably, the long M5 strip covers one eCell. Additionally, the M5 strip includes a connecting strip to the M4 long strip, such as the M5 strips 9006 in FIG. 71A. The M5 strip also includes the short bar, (strip 9015 in FIG. 71A), for connecting to the M7 long strip, such as the M7 strip 9028 (FIG. 71A). The M6 strips are typically short strips in the direction West-East. The M6 strip also includes small bridges for connecting short M5 strips in the North-South direction, such as the M6 strip 9058 (FIG. 72). The M6 further includes short strips 9024 in FIGS. 71A and 71B, which connect between the M7 stepped strips 9028 and the M5 short bar 9015.

Alternatively, it is appreciated that in order to further reduce the cost of customization to a single custom mask, the M6 layer may be used as a generic layer. In such a case, the M5M6 via layer is the only customization layer and the M6 strip typically comprises a parallel band of short strip in the East-West direction and includes short bridges for connecting the M5 strips, which run in the North-South direction. Additionally, short bridges are preferably included in the M5 layer so as to allow the continuation of the M6 strips in the West-East direction, such as described hereinabove with respect FIGS. 27, 28 and 29.

Using a via layer as the customization layer may be very attractive from a commercial point-of-view. As is known in the art, the via layer is used for transferring signals between metal layers. Therefore, unlike the metal layers, the via layers are preferably very low in patterned area and typically use only one polygon fix in size and shape. Thus, Direct E-Beam writing technology is suitable for fast-low cost customization.

Direct E-Beam writing is a well-known technology and conventionally used for R&D purposes; Direct E-Beam writing is too time-consuming for commercial use. However, in accordance with the preferred embodiment of the present invention, customizing a via layer in a Cell-Array by using Direct E-Beam technology is a very effective method for utilizing a well-known technology. Using this familiar technology typically shortens time-to-market and allows wafer sharing by having many different designs sharing one wafer. This technology will also reduce the required NRE cost for prototypes.

Figure 73:
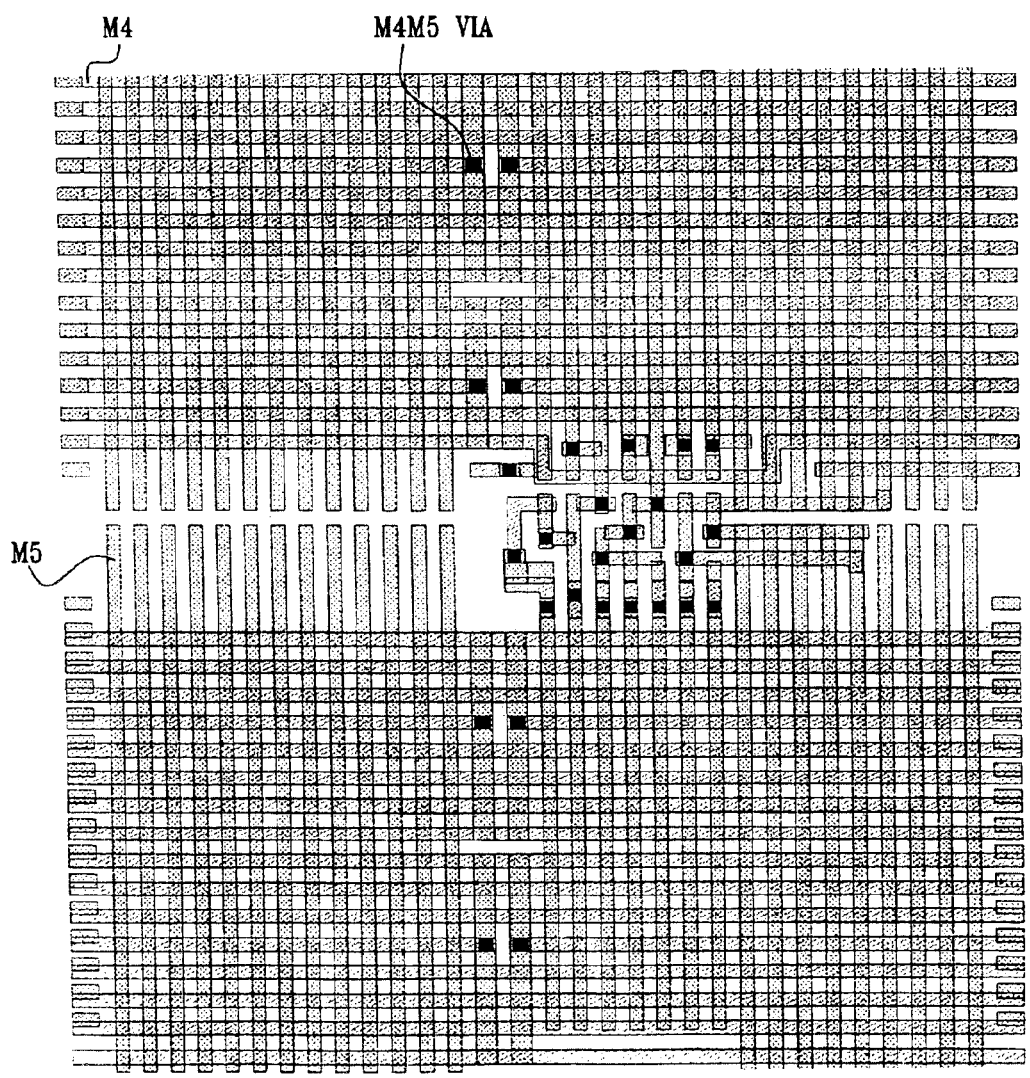
FIG. 73 illustrates a single routing cell unit, comprising M4 and M5 layers and a M4M5 via, in accordance with the preferred embodiment of the present invention.

Reference is now made to FIG. 73, which illustrates a single routing cell unit, comprising M4 and M5 layers and a M4M5 via, in accordance with the preferred embodiment of the present invention. It is appreciated that the single routing cell unit illustrated in FIG. 73 is drawn approximately to scale.

Figure 74:
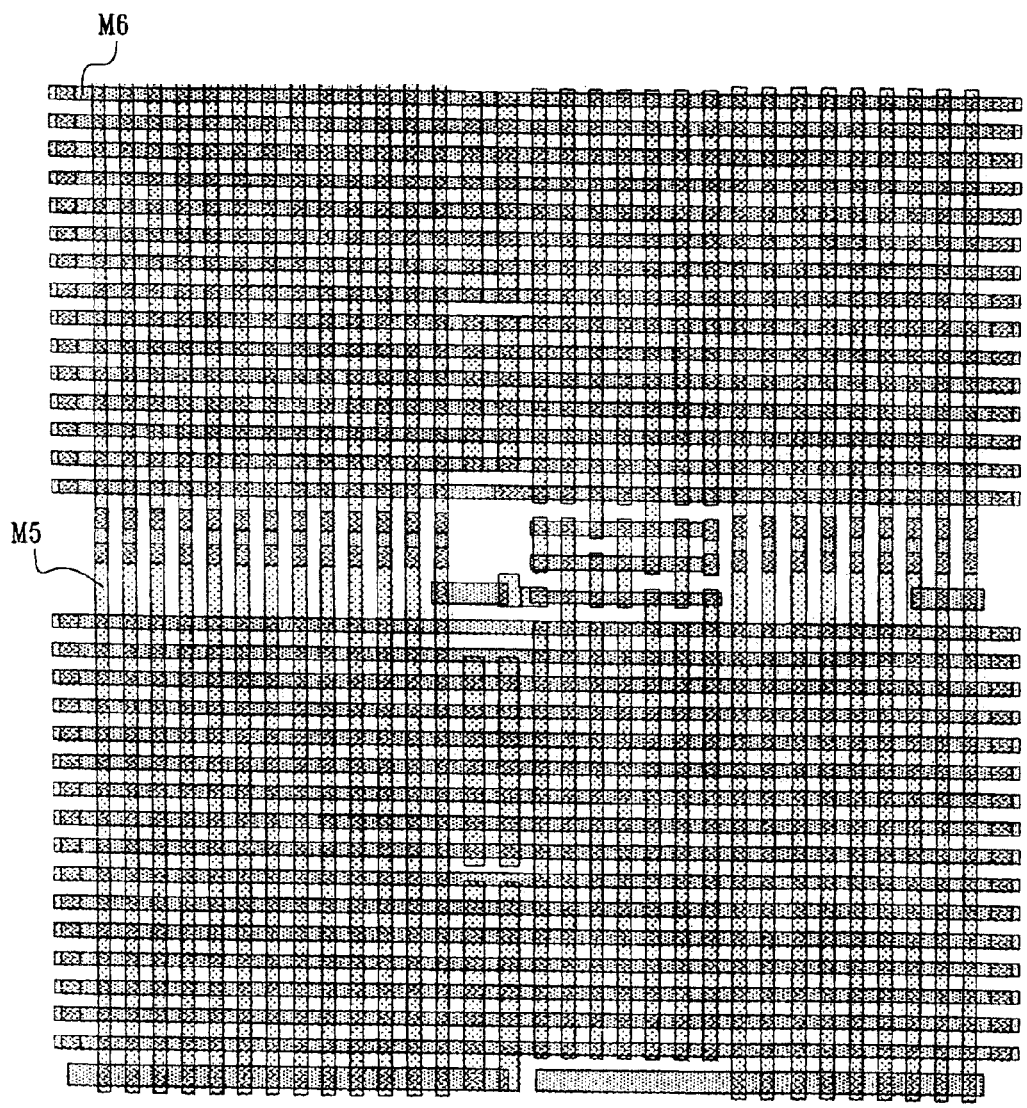
FIG. 74 illustrates a single routing cell unit, comprising M5 and M6 layers, in accordance with the preferred embodiment of the present invention.

Reference is now made to FIG. 74, which illustrates a single routing cell unit, comprising M5 and M6 layers, in accordance with the preferred embodiment of the present invention. It is appreciated that the single routing cell unit illustrated in FIG. 74 is drawn approximately to scale.

Figure 75:
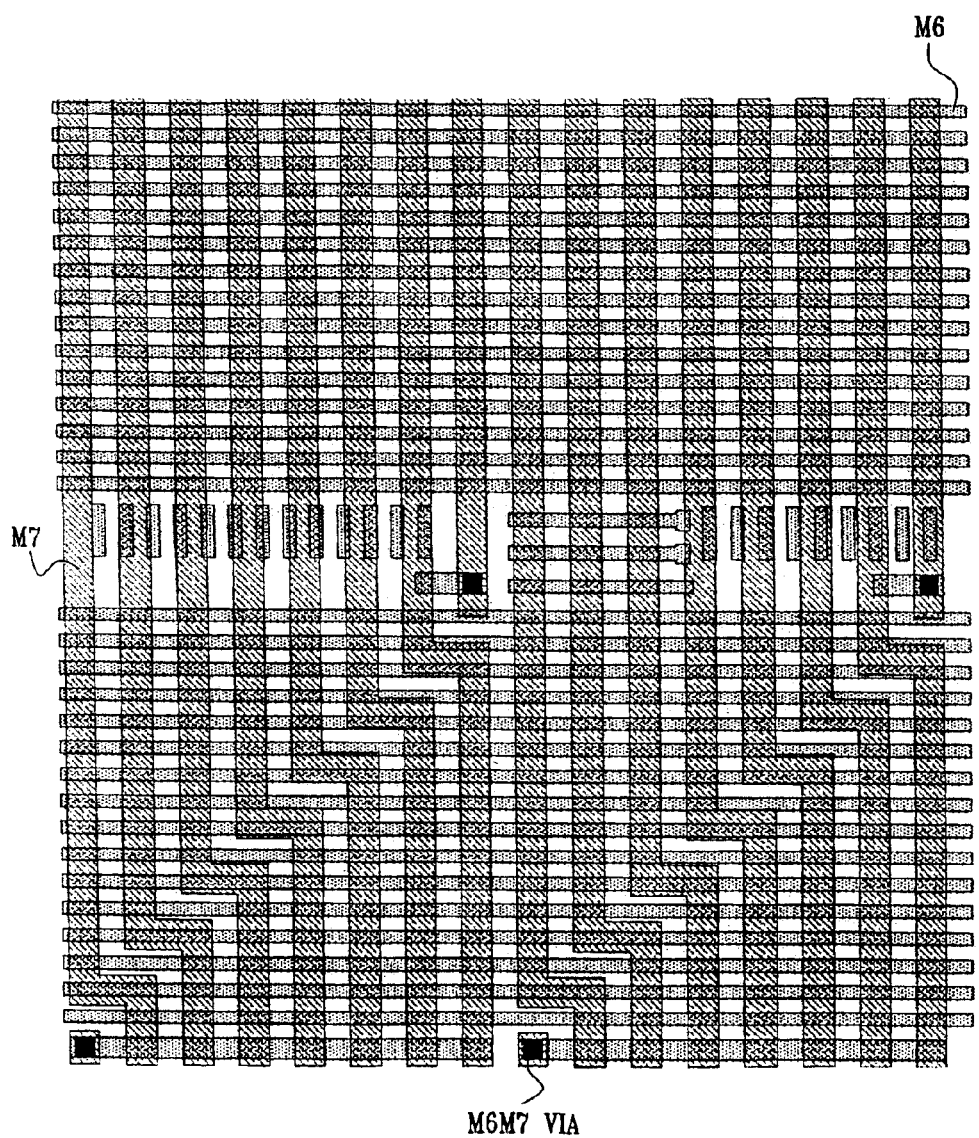
FIG. 75 illustrates a single routing cell unit, comprising M6 and M7 layers and a M6M7 via, in accordance with the preferred embodiment of the present invention.

Reference is now made to FIG. 75, which illustrates a single routing cell unit, comprising M6 and M7 layers and a M6M7 via, in accordance with the preferred embodiment of the present invention. It is appreciated that the single routing cell unit illustrated in FIG. 75 is drawn approximately to scale.

Figure 76:
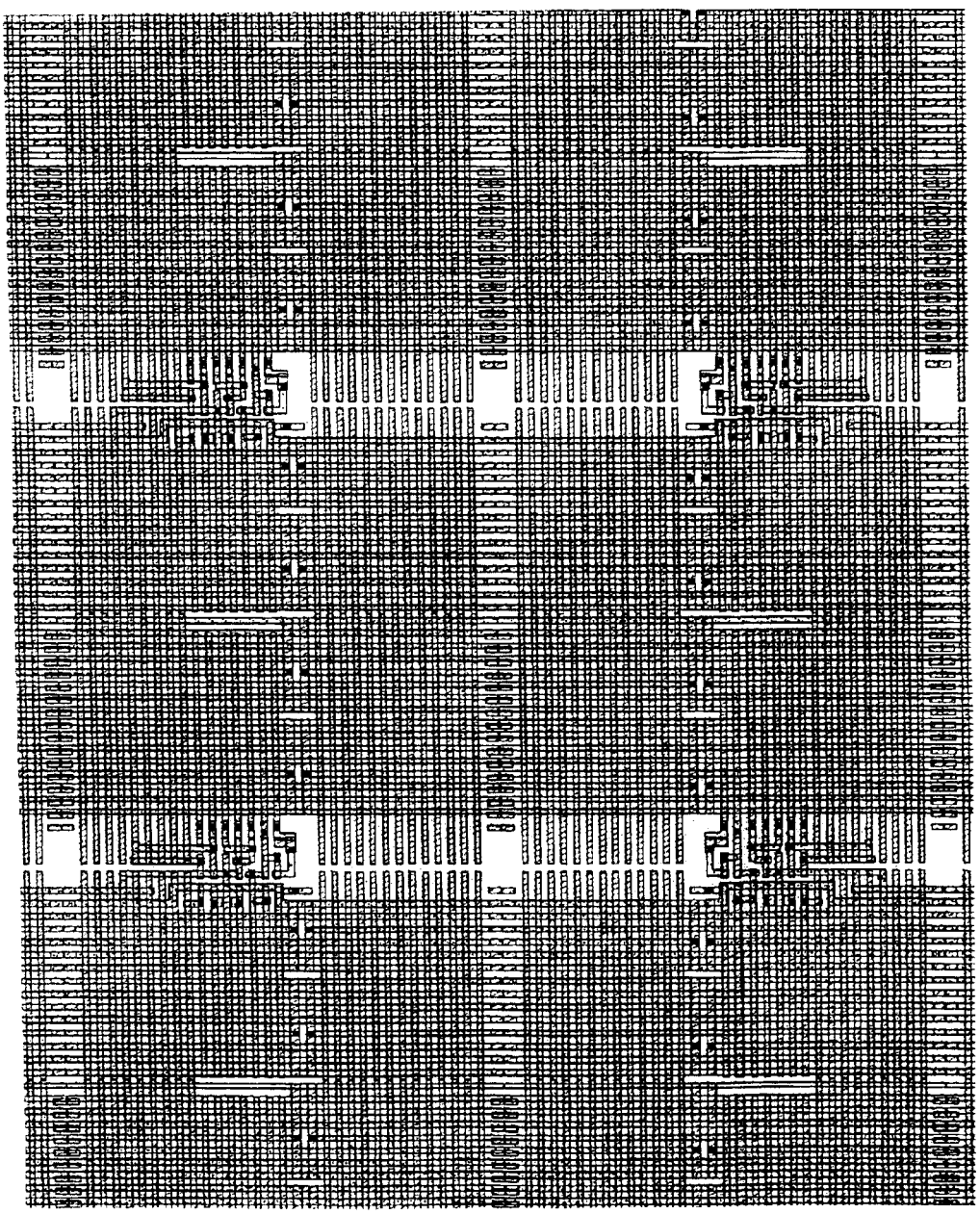
FIG. 76 illustrates a unit, comprising M4 and M5 layers and a M4M5 via of a 2×2 cell matrix, in accordance with a preferred embodiment of the present invention.

Reference is now made to FIG. 76, which illustrates a unit, comprising M4 and M5 layers and a M4M5 via of a 2×2 cell matrix, in accordance with a preferred embodiment of the present invention. It is appreciated that the unit illustrated in FIG. 76 is drawn approximately to scale.

Figure 77:
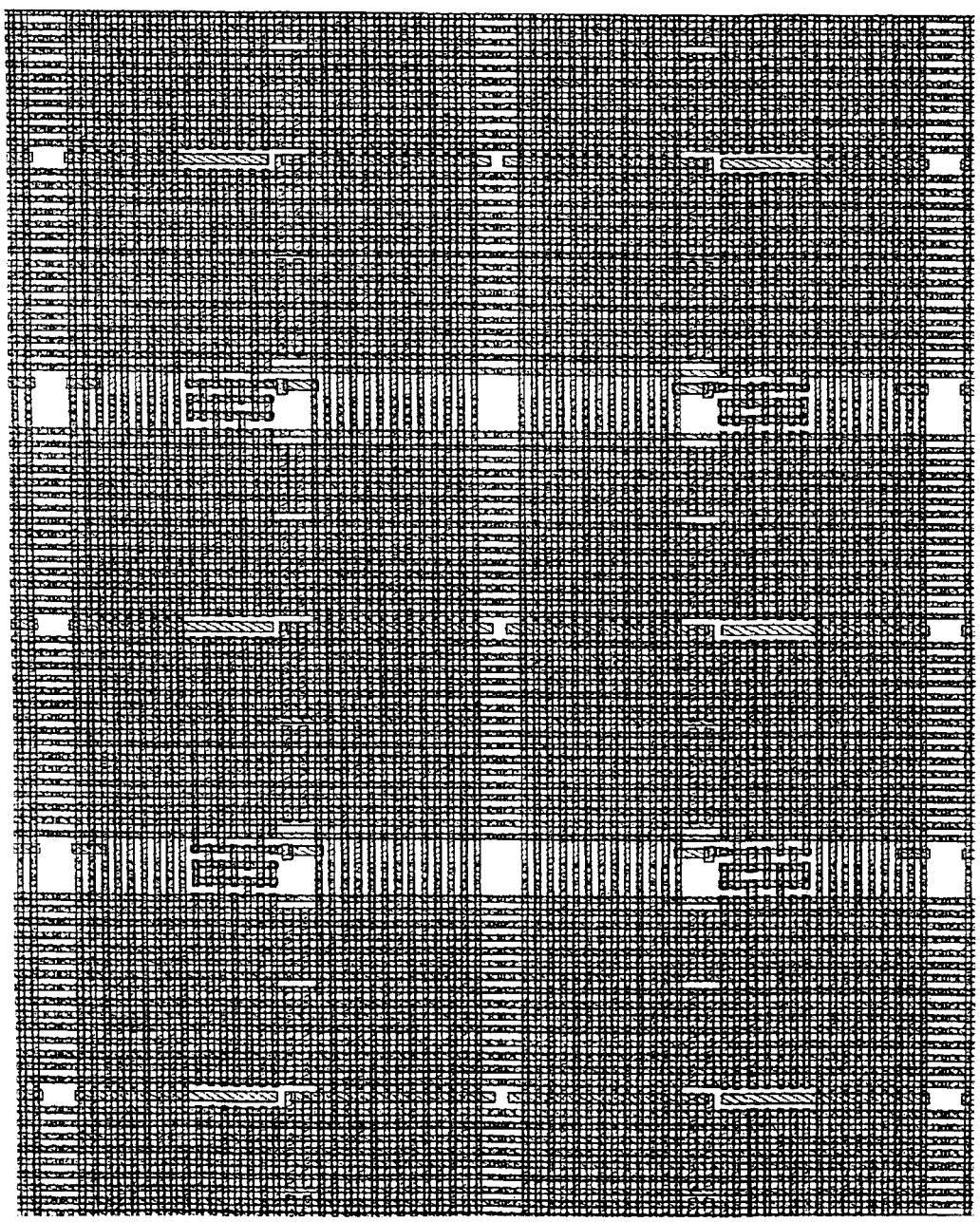
FIG. 77 illustrates a unit, comprising M5 and M6 layers of a 2×2 cell matrix, in accordance with a preferred embodiment of the present invention.

Reference is now made to FIG. 77 illustrates a unit, comprising M5 and M6 layers of a 2×2 cell matrix, in accordance with a preferred embodiment of the present invention. It is appreciated that the unit illustrated in FIG. 77 is drawn approximately to scale.

Figure 78:
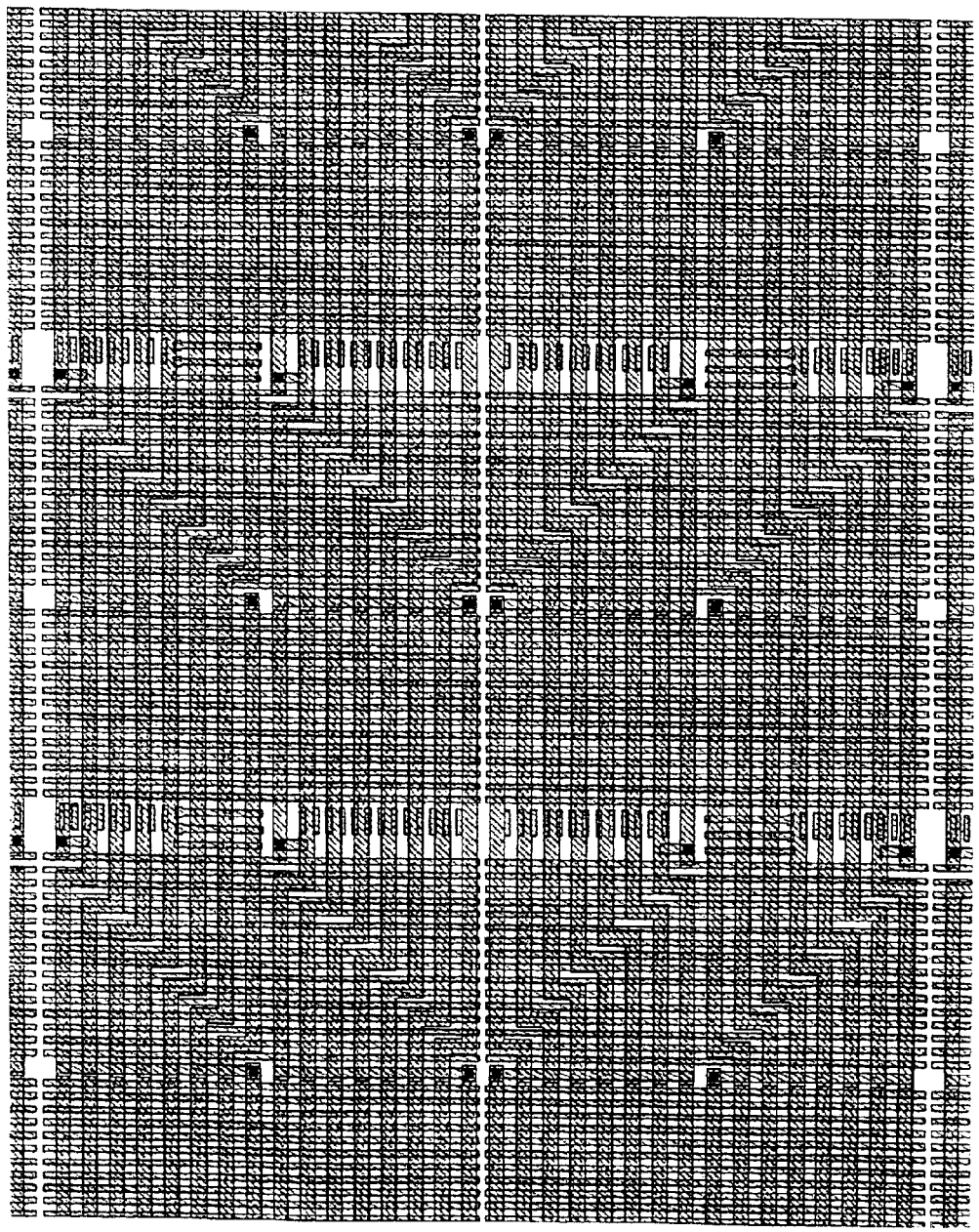
FIG. 78 illustrates a unit, comprising M6 and M7 layers and a M6M7 via of a 2×2 cell matrix, in accordance with a preferred embodiment of the present invention.

Reference is now made to FIG. 78 illustrates a unit, comprising M6 and M7 layers and a M6M7 via of a 2×2 cell matrix, in accordance with a preferred embodiment of the present invention. It is appreciated that the unit illustrated in FIG. 78 is drawn approximately to scale.

It will be appreciated by persons skilled in the art that the present invention is not limited by what has been particularly shown and described hereinabove. Rather the scope of the present invention includes both combinations and sub-combinations of various features described hereinabove as well as modifications and variations which would occur to persons skilled in the art upon reading the foregoing description and which are not in the prior art.

What is claimed is:

1. A logic array comprising:
   an array of programmable cells having a multiplicity of inputs and a multiplicity of outputs; and
   customized interconnections providing permanent direct interconnections among at least a plurality of said multiplicity of inputs and at least a plurality of said multiplicity of outputs;
   wherein:
   at least some of said programmable cells are programmable by means of electrical signals supplied thereto; and
   said customized interconnections comprise at least one metal layer comprising repeated subpatterns.

2. The logic array according to claim 1, wherein said programmable cells are customized by lithography.

3. A logic array comprising:
   an array of programmable cells having a multiplicity of inputs and a multiplicity of outputs; and
   customized interconnections providing interconnections among at least a plurality of said multiplicity of inputs and at least a plurality of said multiplicity of outputs;
   wherein:
   at least some of said programmable cells are programmable by means of electrical signals supplied thereto; and
   said programmable cell includes a plurality of inverters, each selectably connected to at least one of said multiplicity of outputs.

4. The logic array according to claim 3, wherein said programmable cells are customized by lithography.

5. A logic array comprising:
   an array of programmable cells having a multiplicity of inputs and a multiplicity of outputs; and
   customized interconnections providing interconnections among at least a plurality of said multiplicity of inputs and at least a plurality of said multiplicity of outputs;
   wherein:
   at least some of said programmable cells are programmable by means of electrical signals supplied thereto;
   at least some of said customized interconnections are customized by lithography; and
   the functionality of at least some of said programmable cells as being either logic or memory is determined by a configuration of said customized interconnections.

6. The logic array according to claim 5, wherein said programmable cells are customized by lithography.

7. A logic array comprising:

an array of logic cells having a multiplicity of inputs and a multiplicity of outputs;

at least first, second and third metal layers formed over said array of logic cells, said second metal layer comprising a plurality of generally parallel bands extending parallel to a first axis, each band comprising a multiplicity of second metal layer strips extending perpendicular to said first axis, and said first metal layer comprising a plurality of first metal layer strips extending perpendicular to a second axis; and at least one via connecting at least one second metal layer strip with said first metal layer, said first metal layer underlying said second metal layer;

wherein said at least first, second and third metal layers are part of a set of customized interconnections providing interconnections among at least a plurality of said multiplicity of inputs and at least a plurality of said multiplicity of outputs; and said third metal layer comprises at least one third metal layer strip extending generally perpendicular to said second metal layer strips and being connected thereto by a via.

8. The logic array according to claim 7, wherein said logic cells are programmable.

9. A logic array comprising:

an array of logic cells having a multiplicity of inputs and a multiplicity of outputs;

at least first, second and third metal layers formed over said array of logic cells, said second metal layer comprising a plurality of generally parallel bands extending parallel to a first axis, each band comprising a multiplicity of second metal layer strips extending perpendicular to said first axis, and said first metal layer comprising a plurality of first metal layer strips extending perpendicular to a second axis; and at least one via connecting at least one second metal layer strip with said first metal layer, said first metal layer underlying said second metal layer;

wherein said at least first, second and third metal layers are part of a set of customized interconnections providing interconnections among at least a plurality of said multiplicity of inputs and at least a plurality of said multiplicity of outputs; and said third metal layer comprises at least one third metal layer strip extending generally parallel to said second metal layer strips and connecting two coaxial second metal layer strips by vias.

10. The logic array according to claim 9, wherein said logic cells are programmable.

11. A logic array comprising:

an array of logic cells having a multiplicity of inputs and a multiplicity of outputs;

at least first, second and third metal layers formed over said array of logic cells, said second metal layer comprising a plurality of generally parallel bands extending parallel to a first axis, each band comprising a multiplicity of second metal layer strips extending perpendicular to said first axis, and said first metal layer comprising a plurality of first metal layer strips extending perpendicular to a second axis; and at least one via connecting at least one second metal layer strip with said first metal layer, said first metal layer underlying said second metal layer;

wherein said at least first, second and third metal layers are part of a set of customized interconnections providing interconnections among at least a plurality of said multiplicity of inputs and at least a plurality of said multiplicity of outputs; and each of at least some of said logic cells comprises at least one look-up table.

12. The logic array according to claim 11, wherein said logic cells are programmable.

13. A logic array comprising:

an array of programmable logic cells having a multiplicity of inputs and a multiplicity of outputs;

at least first, second and third metal layers formed over said array of logic cells, said second metal layer comprising a plurality of generally parallel bands extending parallel to a first axis, each band comprising a multiplicity of second metal layer strips extending perpendicular to said first axis, and said first metal layer comprising a plurality of first metal layer strips extending perpendicular to a second axis; and at least one via connecting at least one second metal layer strip with said first metal layer, said first metal layer underlying said second metal layer;

wherein said at least first, second and third metal layers are part of a set of customized interconnections providing permanent direct interconnections among at least a plurality of said multiplicity of inputs and at least a plurality of said multiplicity of outputs; and each of at least some of said logic cells includes at least one simple logic gate selectably connected to at least one of said multiplicity of outputs.

14. The logic array according to claim 13, wherein said programmable cells are customized by lithography.

15. A logic array comprising:

an array of logic cells having a multiplicity of inputs and a multiplicity of outputs;

at least first, second and third metal layers formed over said array of logic cells, said second metal layer comprising a plurality of generally parallel bands extending parallel to a first axis, each band comprising a multiplicity of second metal layer strips extending perpendicular to said first axis, and said first metal layer comprising a plurality of first metal layer strips extending perpendicular to a second axis; and at least one via connecting at least one second metal layer strip with said first metal layer, said first metal layer underlying said second metal layer;

wherein said at least first, second and third metal layers are part of a set of customized interconnections providing interconnections among at least a plurality of said multiplicity of inputs and at least a plurality of said multiplicity of outputs; and each of at least some of said logic cells comprises at least one flip-flop.

16. The logic array according to claim 15, wherein said logic cells are programmable.

17. A semiconductor device comprising:

a logic array comprising a multiplicity of logic cells, said logic cells having a multiplicity of inputs and a multiplicity of outputs, each logic cell including at least one flip-flop, said logic array also comprising at least one standard metal layer, said standard metal layer comprises at least one metal strip, said metal strip having at least two vias overlying it; and metal connection layers overlying said logic array for interconnecting various inputs and outputs thereof in a customized manner; wherein at least one interconnection within said logic cell is made by said metal connection layers; and said logic cells also comprise at least one inverter, said inverter having an inverter input and an inverter output, wherein said inverter input and inverter output are part of said multiplicity of inputs and multiplicity of outputs.

18. The semiconductor device according to claim 17, wherein said logic cells are programmable.

* * * * *